US012466820B2

(12) United States Patent
Bruno et al.

(10) Patent No.: US 12,466,820 B2
(45) Date of Patent: *Nov. 11, 2025

(54) AMINO QUINAZOLINE DERIVATIVES AS P2X3 INHIBITORS

(71) Applicant: CHIESI FARMACEUTICI S.p.A., Parma (IT)

(72) Inventors: Paolo Bruno, Parma (IT); Matteo Biagetti, Parma (IT); Claudio Fiorelli, Parma (IT); Daniela Pizzirani, Parma (IT); Daniele Pala, Parma (IT); Paolo Ronchi, Parma (IT); Charles Baker-Glenn, Parma (IT); Hervè Van De Poël, Parma (IT); Kim Louise Hirst, Parma (IT); Sara Guariento, Parma (IT)

(73) Assignee: CHIESI FARMACEUTICI S.P.A., Parma (IT)

( * ) Notice: Subject to any disclaimer, the term of this patent is extended or adjusted under 35 U.S.C. 154(b) by 1004 days.

This patent is subject to a terminal disclaimer.

(21) Appl. No.: 17/615,017

(22) PCT Filed: May 28, 2020

(86) PCT No.: PCT/EP2020/064914
§ 371 (c)(1),
(2) Date: Nov. 29, 2021

(87) PCT Pub. No.: WO2020/239952
PCT Pub. Date: Dec. 3, 2020

(65) Prior Publication Data
US 2022/0227749 A1 Jul. 21, 2022

(30) Foreign Application Priority Data
May 31, 2019 (EP) .................................. 19177604
Oct. 2, 2019 (EP) .................................. 19201168

(51) Int. Cl.
C07D 417/12 (2006.01)
C07D 239/94 (2006.01)
C07D 401/12 (2006.01)
C07D 401/14 (2006.01)
C07D 403/12 (2006.01)
C07D 403/14 (2006.01)
C07D 405/14 (2006.01)
C07D 409/12 (2006.01)
C07D 409/14 (2006.01)
C07D 413/12 (2006.01)
C07D 413/14 (2006.01)
C07D 417/14 (2006.01)
C07D 487/04 (2006.01)
C07F 5/02 (2006.01)

(52) U.S. Cl.
CPC ......... C07D 417/12 (2013.01); C07D 239/94 (2013.01); C07D 401/12 (2013.01); C07D 401/14 (2013.01); C07D 403/12 (2013.01); C07D 403/14 (2013.01); C07D 405/14 (2013.01); C07D 409/12 (2013.01); C07D 409/14 (2013.01); C07D 413/12 (2013.01); C07D 413/14 (2013.01); C07D 417/14 (2013.01); C07D 487/04 (2013.01); C07F 5/02 (2013.01)

(58) Field of Classification Search
CPC .. C07D 417/12; C07D 239/94; C07D 401/12; C07D 401/14; C07D 403/12; C07D 403/14; C07D 405/14; C07D 409/12; C07D 409/14; C07D 413/12; C07D 413/14; C07D 417/14; C07D 487/04; C07D 405/12; C07D 239/95; C07D 471/08; C07D 413/04; C07D 451/00; C07D 471/04; C07F 5/02; A61P 11/00; A61P 11/14; A61P 11/06; A61K 31/517; A61K 31/5377
USPC .......................................................... 548/181
See application file for complete search history.

(56) References Cited

U.S. PATENT DOCUMENTS 5,707,998 A    1/1998  Takase et al.
2012/0122838 A1  5/2012  Ren et al.
(Continued)

FOREIGN PATENT DOCUMENTS

EA    030198 B1    7/2018
JP    4342007 B2    10/2009
(Continued)

OTHER PUBLICATIONS

Kabri, Y., et al., "Efficient Access to 2,6,8-Trisubstituted 4-Aminoquinazolines through Microwave-Assisted One-Pot Chemoselective Tris-Suzuki-Miyaura or SNAr/Bis-Suzuki-Miyaura Reactions in Water," Eur. J. Org. Chem. 2015(17):3806-3817, European Chemical Societies Publishing, United Kingdom (Jun. 2015).

(Continued)

Primary Examiner — Taylor V Oh
(74) Attorney, Agent, or Firm — Sterne, Kessler, Goldstein &Fox P.L.L.C.

(57) ABSTRACT

The present invention relates to compounds of formula I inhibiting P2X purinoceptor 3; particularly the invention relates to compounds that are amino quinazoline derivatives, methods of preparing such compounds, pharmaceutical compositions containing them and therapeutic use thereof. The compounds of the invention may be useful in the treatment of many disorders associated with P2X$_3$ receptors mechanisms, such as respiratory diseases including cough, asthma, idiopathic pulmonary fibrosis (IPF) and chronic obstructive pulmonary disease (COPD).

9 Claims, No Drawings

(56) References Cited

U.S. PATENT DOCUMENTS

| | | |
|---|---|---|
| 2016/0115151 A1 | 4/2016 | Kai |
| 2018/0311240 A1 | 11/2018 | Broka et al. |

FOREIGN PATENT DOCUMENTS

| | | |
|---|---|---|
| WO | WO-2008000645 A1 | 1/2008 |
| WO | WO-2008123963 A1 | 10/2008 |
| WO | WO-2008130481 A1 | 10/2008 |
| WO | WO-2009110985 A2 | 9/2009 |
| WO | WO-2010033168 A2 | 3/2010 |
| WO | WO-2014102233 A1 | 7/2014 |
| WO | WO-2016053794 A1 | 4/2016 |
| WO | WO-2016084922 A1 | 6/2016 |
| WO | WO-2016088838 A1 | 6/2016 |
| WO | WO-2016091776 A1 | 6/2016 |
| WO | WO-2017011729 A1 | 1/2017 |
| WO | WO-2017058645 A1 | 4/2017 |
| WO | WO-2017091661 A1 | 6/2017 |
| WO | WO-2018005435 A1 | 1/2018 |
| WO | WO-2018035061 A1 | 2/2018 |
| WO | WO-2018115380 A1 | 6/2018 |
| WO | WO-2018134685 A2 | 7/2018 |
| WO | WO-2018204775 A1 | 11/2018 |
| WO | WO-2020239951 A1 | 12/2020 |
| WO | WO-2020239952 A1 | 12/2020 |
| WO | WO-2020239953 A1 | 12/2020 |

OTHER PUBLICATIONS

Abdulqawi, R., et al., "P2X3 receptor antagonist (AF-219) in refractory chronic cough: a randomised, double-blind, placebo-controlled phase 2 study," Lancet 385(9974):1198-205, Elsevier Ltd., United Kingdom (2015).

Basoglu, O. K., et al., "Effects of aerosolized adenosine 5'-triphosphate vs adenosine 5'-monophosphate on dyspnea and airway caliber in healthy nonsmokers and patients with asthma," Chest 128(4):1905-1909, Elsevier, Netherlands (2005).

Bo, X., et al., "Localization of ATP-gated P2X2 and P2X3 receptor immunoreactive nerves in rat taste buds," NeuroReport 10(5):1107-11, Lippincott Williams and Wilkins Ltd., United States (1999).

Canda, A. E., et al., "Physiology and pharmacology of the human ureter: basis for current and future treatments," Urol Int 78(4):289-298, S. Karger AG, Switzerland (2007).

Cheung, K.-K., and Burnstock, G., "Localization of P2X3 receptors and coexpression with P2X2 receptors during rat embryonic neurogenesis," J Comp Neurol 443(4):368-386, Wiley-Liss, United States (2002).

Finlay, H. J., et al., "Discovery of 5-Phenyl-N-(pyridin-2-ylmethyl)-2-(pyrimidin-5-yl)quinazolin-4-amine as a Potent I Kur Inhibitor," ACS Med Chem Lett 7(9):831-834, American Chemical Society, United States (2016).

Ford, A. P., "In pursuit of P2X3 antagonists: novel therapeutics for chronic pain and afferent sensitization," Purinergic Signal 8(Suppl 1):3-26, Springer, Netherlands (2012).

Ford, A. P., and Undem, B. J., "The therapeutic promise of ATP antagonism at P2X3 receptors in respiratory and urological disorders," Front Cell Neurosci 7:267, 10 pages, Frontiers Media S.A., Switzerland (2013).

Garcia-Guzman, M., et al., "Molecular characterization and pharmacological properties of the human P2X3 purinoceptor," Brain Res Mol Brain Res 47(1-2):59-66, Elsevier, Netherlands (1997).

Guo, J., et al., "Contributions of purinergic P2X3 receptors within the midbrain periaqueductal gray to diabetes-induced neuropathic pain," J Physiol Sci 65(1):99-104, BioMed Central Ltd., United Kingdom (2015).

Haffner, C. D., et al., "Discovery, Synthesis, and Biological Evaluation of Thiazoloquin(az)olin(on)es as Potent CD38 Inhibitors," J Med Chem 58(8):3548-3571, American Chemical Society, United States (2015).

Huang, H.-C., et al., "A novel one-pot conversion of methyl sulfones to sulfonamides," Tetrahedron Letters 35(39):7201-7204, Elsevier, Netherlands (1994).

Kaczmarek-Hajek, K., et al., "Molecular and functional properties of P2X receptors—recent progress and persisting challenges," Purinergic Signal 8(3):375-417, Springer, Netherlands (2012).

Kamei, J., and Takahashi, Y., "Involvement of ionotropic purinergic receptors in the histamine-induced enhancement of the cough reflex sensitivity in guinea pigs," Eur J Pharmacol 547(1-3):160-164, Elsevier, Netherlands (2006).

Li, C.-L., et al., "Effects of intracavernous injection of P2X3 and NK1 receptor antagonists on erectile dysfunction induced by spinal cord transection in rats," Andrologia 47(1):25-29, Wiley-Blackwell Publishing Ltd., United Kingdom (2015).

Lloyd, R. F., et al., "4-(Substituted)pteridines, analogues of kinetin," Canadian Journal of Chemistry 45(19):2213-2216, 4 pages, NRC Research Press, Canada (1967).

Maynard, J. P., et al., "P2X3 purinergic receptor overexpression is associated with poor recurrence-free survival in hepatocellular carcinoma patients," Oncotarget 6(38):41162-41179, Impact Journals LLC, United States (2015).

North, R. A., "Molecular physiology of P2X receptors," Physiol Rev 82(4):1013-1067, The American Physiological Society, United States (2002).

North, R. A., and Jarvis, M. F., "P2X receptors as drug targets," Mol Pharmacol 83(4):759-69, American Society for Pharmacology and Experimental Therapeutics, United States (2013).

Pan, Y., et al., "Pharmacophore and 3D-QSAR characterization of 6-arylquinazolin-4-amines as Cdc2-like kinase 4 (Clk4) and dual specificity tyrosine-phosphorylation-regulated kinase 1A (Dyrk1A) inhibitors ," J Chem Inf Model 53(4):938-947, American Chemical Society, United States (2013).

RegistryNov. 16, 1984 (Nov. 16, 1984), Database accession No. RN 74173-76-5, RN 26850-60-2, RN 20028-68-6 Retrieved from the Internet: URL:Chemical Abstracts Service, Columbus, Ohio, US XP002796884.

RegistryMay 26, 1986 (May 26, 1986), Database accession No. RN 102393-82-8 Retrieved from the Internet: URL:Chemical Abstracts Service, Columbus, Ohio, US XP002796887.

RegistryDec. 17, 2007 (Dec. 17, 2007), Database accession No. RN 958360-30-0 Retrieved from the Internet: URL:Chemical Abstracts Service, Columbus, Ohio, US XP002796883.

RegistryJul. 28, 2008 (Jul. 28, 2008), Database accession No. RN 1036738-12-1 Retrieved from the Internet: URL:Chemical Abstracts Service, Columbus, Ohio, US XP002796882.

RegistryApr. 27, 2010 (Apr. 27, 2010), Database accession No. RN 1220518-09-1 Retrieved from the Internet: URL:Chemical Abstracts Service, Columbus, Ohio, US XP002796881.

RegistryAug. 3, 2010 (Aug. 3, 2010), Database accession No. RN 1234616-70-6 Retrieved from the Internet: URL:Chemical Abstracts Service, Columbus, Ohio, US XP002796880.

RegistryJan. 27, 2011 (Jan. 27, 2011), Database accession No. RN 1260665-43-7 Retrieved from the Internet: URL:Chemical Abstracts Service, Columbus, Ohio, US XP002796879.

RegistryNov. 17, 2017 (Nov. 17, 2017), Database accession No. RN 2143878-49-1 Retrieved from the Internet: URL:Chemical Abstracts Service, Columbus, Ohio, US XP002796469.

RegistryJun. 28, 1991 (Jun. 28, 1991), Database accession No. RN 2379641-82-2 Retrieved from the Internet: URL:Chemical Abstracts Service, Columbus, Ohio, US XP002796886.

RegistryOct. 21, 2014 (2014-10-21), Database accession No. RN 2387320-34-3 Retrieved from the Internet: URL:Chemical Abstracts Service, Columbus, Ohio, US XP002796885.

Spulák, M., et al., "Novel bronchodilatory quinazolines and quinoxalines: synthesis and biological evaluation," Eur J Med Chem 74:65-72, Elsevier, Netherlands (2014).

Szántó, G., et al., "New P2X3 receptor antagonists. Part 2: Identification and SAR of quinazolinones," Bioorg Med Chem Lett 26(16):3905-3912, Elsevier, Netherlands (2016).

Teixeira, J. M., et al., "P2X3 and P2X2/3 Receptors Play a Crucial Role in Articular Hyperalgesia Development Through Inflammatory Mechanisms in the Knee Joint Experimental Synovitis," Mol Neurobiol 54(8):6174-6186, Springer Science+Business Media, Germany (2017).

(56) References Cited

OTHER PUBLICATIONS

Undem, B. J., and Nassenstein, C., "Airway nerves and dyspnea associated with inflammatory airway disease," Respir Physiol Neurobiol 167(1):36-44, Elsevier, Netherlands (2009).

Vandenbeuch, A., et al., "Role of the ectonucleotidase NTPDase2 in taste bud function," Proc Natl Acad Sci USA 110(36):14789-94, National Academy of Sciences, United States (2013).

Zhang, Q., et al., "Design, synthesis and biological evaluation of novel histone deacetylase inhibitors incorporating 4-aminoquinazolinyl systems as capping groups," Bioorg Med Chem Lett 27(21):4885-4888, Elsevier, Netherlands (2017).

International Search Report and Written Opinion for International Application No. PCT/EP2020/064914, European Patent Office, Netherlands, mailed on Jul. 2, 2020, 14 pages.

Co-pending U.S. Appl. No. 17/615,012, inventors Bruno, P., et al., international filing date: May 28, 2020 (Not yet Published).

Co-pending U.S. Appl. No. 17/615,056, inventors Bruno, P., et al., international filing date: May 28, 2020 (Not yet Published).

RegistryMay 7, 2015 (May 7, 2015), Database accession No. RN 1700636-78-7 Retrieved from the Internet: URL:Chemical Abstracts Service, Columbus, Ohio, US XP002796590.

RegistryJul. 24, 2014 (Jul. 24, 2014), Database accession No. RN 1616828-53-5 Retrieved from the Internet: URL:Chemical Abstracts Service, Columbus, Ohio, US XP002796899.

RegistryMay 11, 2014 (May 11, 2014), Database accession No. RN 1602300-56-0 Retrieved from the Internet: URL:Chemical Abstracts Service, Columbus, Ohio, US XP002796900.

RegistryMar. 12, 2014 (Mar. 12, 2014), Database accession No. RN 1566729-83-6 Retrieved from the Internet: URL:Chemical Abstracts Service, Columbus, Ohio, US XP002796901.

RegistryMar. 11, 2014 (Mar. 11, 2014), Database accession No. RN 1566199-66-3 Retrieved from the Internet: URL:Chemical Abstracts Service, Columbus, Ohio, US XP002796902.

RegistryJan. 24, 1987 (Jan. 24, 1987), Database accession No. RN 106319-77-1, RN 106319-93-1 Retrieved from the Internet: URL:Chemical Abstracts Service, Columbus, Ohio, US XP002796903.

RegistryMar. 22, 1986 (Mar. 22, 1986), Database accession No. RN 100949-33-5, RN 100948-96-7 Retrieved from the Internet: URL:Chemical Abstracts Service, Columbus, Ohio, US XP002796904.

RegistryNov. 16, 1984 (Nov. 16, 1984), Database accession No. RN 19815-13-5 Retrieved from the Internet: URL:Chemical Abstracts Service, Columbus, Ohio, US XP002796905.

AMINO QUINAZOLINE DERIVATIVES AS P2X3 INHIBITORS

FIELD OF THE INVENTION

The present invention relates to compounds inhibiting P2X purinoceptor 3 (hereinafter P2X$_3$ inhibitors); particularly the invention relates to compounds that are amino quinazoline derivatives, methods of preparing such compounds, pharmaceutical compositions containing them and therapeutic use thereof.

The compounds of the invention may be useful in the treatment of many disorders associated with P2X$_3$ receptors mechanisms, such as respiratory diseases including cough, asthma, idiopathic pulmonary fibrosis (IPF) and chronic obstructive pulmonary disease (COPD).

BACKGROUND OF THE INVENTION

P2X receptors are cell surface ion channels activated by extracellular Adenosine 5-TriPhosphate (ATP). P2X receptor family are trimeric assemblies composed of seven distinct subunit subtypes (P2X$_1$-7) that assemble as homomeric and heteromeric channels. All subunits share a common topology containing intracellular termini, two transmembrane helices forming the ion channels and a large extracellular domain containing the ATP binding site. Homomeric P2X$_1$, P2X$_2$, P2X$_3$, P2X$_4$, P2X$_5$, and P2X$_7$ channels and heteromeric P2X$_{2/3}$ and P2X$_{1/5}$ channels have been fully characterized following heterologous expression. P2X receptors are abundantly distributed, and functional responses are seen in neurons, glia, epithelia, endothelia, bone, muscle, and hemopoietic tissues. On smooth muscles, P2X receptors respond to ATP released from sympathetic motor nerves (e.g., in ejaculation). On sensory nerves, they are involved in the initiation of afferent signals in several viscera (e.g., bladder, intestine) and play a key role in sensing tissue-damaging and inflammatory stimuli. Paracrine roles for ATP signaling through P2X receptors are likely in neurohypophysis, ducted glands, airway epithelia, kidney, bone and hemopoietic tissues. (R A. North: Molecular Physiology of P2X Receptors; Physiol Rev, Vol 82, October 2002). All P2X receptors are non-selective cation channels permeable to Na+ and Ca+ ions and are activated by ATP; however, the pharmacology of the receptor subtypes varies with respect to sensitivity to ATP and to small molecules antagonists. (K Kaczmarek-Hajek et al: Molecular and functional properties of P2X receptors—recent progress and persisting challenges; Purinergic Signalling 8:375-417, 2012)

In humans, the P2X$_3$ receptor has been reported in heart and spinal cord at the mRNA level and in DRG, intestine (myenteric plexus neurons), urinary bladder (urothelium and suburothelium), and dental pulp at the protein level (Garcia-Guzman M et al: Molecular characterization and pharmacological properties of the human P2X$_3$ purinoceptor: Brain Res Mol Brain Res. 1997; 47(1-2):59-66).

The neurophysiological role of P2X$_3$ receptors in sensory nerve function in the airways is similar to that mediating somatic nociception (Undem B J and Nassenstein C: Airway nerves and dyspnea associated with inflammatory airway disease, Respir Physiol Nerobiol 167: 36-44, 2009). This similarity has driven hypotheses concerning the involvement of P2X$_3$ receptors in the symptoms of airway dysfunction including cough and bronchial hyper-reactivity (Ford A P: In pursuit of P2X$_3$ antagonists: novel therapeutics for chronic pain and afferent sensitization, Purinergic signal 8 (suppl 1):3-26, 2012; North R A, Jarvis M F P2X Receptors as Drug Targets; Mol Pharmacol, 83:759-769, 2013). P2X$_3$ subunits are also co-localized in many neurons, particularly within DRG, nodose ganglia, nucleus tractus solitarius, and taste buds (Cheung K K, Burnstock G: Localization of P2X$_3$ receptors and coexpression with P2X$_2$ receptors during rat embryonic neurogenesis. J Comp Neurol 443(4):368-382 2002)

P2X$_3$ antagonists have been proposed for the treatment of diabetic neuropathic pain (Guo J et al: Contributions of purinergic P2X$_3$ receptors within the midbrain periaqueductal gray to diabetes-induced neuropathic pain, J Physiol Sci January; 65(1):99-104 2015).

P2X$_3$ and P2X$_{2/3}$ channels play an important role in the development of articular hyperalgesia of arthritic joints (Teixeira J M et al: P2X$_3$ and P2X$_{2/3}$ Receptors Play a Crucial Role in Articular Hyperalgesia Development Through Inflammatory Mechanisms in the Knee Joint Experimental Synovitis, Mol Neurobiol October; 54(8): 6174-6186, 2017).

P2X$_3$ are also a potential target for therapeutic treatment of bladder pain. They were also proposed to be analgesic targets to treat ureteral colicky pain and to facilitate ureteral stone passage (Canda A E et al: Physiology and pharmacology of the human ureter: basis for current and future treatments, Urol Int. 78(4):289-98, 2007).

P2X$_3$ over-expression is involved in poor recurrence-free survival in hepatocellular carcinoma patients and identifies the P2X$_3$ as a potential therapeutic target (Maynard J P et al: P2X$_3$ purinergic receptor overexpression is associated with poor recurrence-free survival in hepatocellular carcinoma patients Oncotarget December 1; 6(38):41162-79, 2015).

It has been suggested that P2X$_3$ antagonists may improve recovery of erectile function (Li C L et al: Effects of intracavernous injection of P2X$_3$ and NK1 receptor antagonists on erectile dysfunction induced by spinal cord transection in rats, Andrologia. February; 47(1):25-9, 2015).

ATP enhances citric acid-evoked and histamine-evoked cough in preclinical models, effects that can be attenuated by P2X$_3$ selective antagonists (Kamei J and Takahashi Y: Involvement of ionotropic purinergic receptors in the histamine-induced enhancement of the cough reflex sensitivity in guinea pigs, October 10; 547(1-3):160-4, 2006).

In humans, local delivery of ATP initiates cough and bronchospasm (Basoglu O K et al: Effects of aerosolized adenosine 5'-triphosphate vs adenosine 5'-monophosphate on dyspnea and airway caliber in healthy nonsmokers and patients with asthma, Chest. October; 128(4):1905-9, 2005).

The therapeutic promise of P2X$_3$ antagonists for the treatment of chronic cough was first recognized by Ford and Undem (Ford A P, Undem B J: The therapeutic promise of ATP antagonism at P2X$_3$ receptors in respiratory and urological disorders, Front Cell Neurosci, December 19; 7:267, 2013). P2X$_3$ are expressed by airway afferent nerves and mediate hypersensitivity of the cough reflex, which is dramatically reduced by the oral P2X$_3$ antagonist, AF-219 (Abdulqawi et al: P2X$_3$ receptor antagonist (AF-219) in refractory chronic cough: a randomised, double-blind, placebo-controlled phase 2 study, Lancet 385, 1198-205, 2015).

ATP is a key neurotransmitter in the taste system, acting largely via P2X$_{2/3}$ heteromultimer receptors. Consequently, disruption of taste function may be an unintentional consequence of therapeutic trials of pain, chronic cough and other conditions using purinergic P2X$_3$ antagonists (Vandenbeuch A et al: Role of the ectonucleotidase NTPDase2 in taste bud function, Proc Natl Acad Sci USA, September 3; 110(36): 14789-94, 2013. Bo X et al: Localization of ATP-gated P2X$_2$ and P2X₃ receptor immunoreactive nerves in rat taste buds, Neuroreport, 10(5):1107-11, 1999).

Various compounds have been described in the literature as P2X₃ and/or P2X$_{2/3}$ Inhibitors.

WO2017058645 (Afferent Pharmaceuticals INC) discloses the use of diaminopyrimidine P2X₃/P2X$_{2/3}$ antagonists for the treatment of disorders including cough, chronic cough and urge to cough, including cough associated with a respiratory disease or disorder, administering an efficacious amount of the compound disclosed. However, amino quinazoline derivatives are not disclosed.

WO2017011729 (Patara Pharma LLC), discloses the use of cromolyn or a pharmaceutically acceptable salt thereof and P2X₃ and/or a P2X$_{2/3}$ receptor antagonist as antitussive agent, for the treatment of lung diseases and conditions. WO2016091776, (Evotec AG), discloses 1,3-thiazol-2-yl substituted benzamide compounds that inhibit P2X₃ receptor and to pharmaceutical compositions containing such compounds, and the use of compounds for the treatment of several disorders, including the respiratory diseases.

WO2016088838 (Shionogi), discloses purine derivatives compounds having a novel P2X₃ and/or P2X$_{2/3}$ receptor antagonizing effect.

WO2016084922, (Shionogi), discloses triazine derivatives compounds having a novel P2X₃ and/or P2X$_{2/3}$ receptor antagonizing effect WO2008123963 (Renovis) relates to fused heterocyclic compounds of the class tetrahydropyrido[4,3-d]pyrimidines and pharmaceutical compositions comprising such compounds. Also provided are methods for preventing and/or treating several disorders, such as neurodegenerative disorders, pain, asthma, autoimmune disorders administering the disclosed compounds.

WO2008130481 (Renovis) discloses 2-cyanophenyl fused heterocyclic compounds of the class tetrahydropyrido[4,3-d]pyrimidines and pharmaceutical compositions comprising such compounds.

WO2010033168 (Renovis) discloses a series of benzamides substituted with phenyl or pyridyl which are stated to be useful for treatment of diseases associated with P2X purinergic receptors, and more particularly to P2X₃ receptor and/or P2X$_{2/3}$ receptor antagonists. However, amino quinazoline derivatives are not disclosed.

WO2009110985 (Renovis) relates to phenyl- and pyridyl-substituted benzamide compounds and pharmaceutical compositions comprising such compounds, but not thiazole-substituted benzamides, rendering said compounds different from the compounds of the present invention.

WO2008000645 (Roche) discloses tetrazole substituted arylamides compounds antagonists of P2X₃ and/or P2X$_{2/3}$ receptors, useful for the treatment of genitourinary, pain, gastrointestinal and respiratory diseases, conditions and disorders.

Despite the above cited prior art, there is still the need of novel amino quinazoline compounds for treatment of diseases associated with P2X₃ receptors in many therapeutic areas such as in particular the respiratory diseases, preferably having a selective action on the P2X₃ receptor.

Of note, the state of the art does not describe or suggest amino quinazoline derivatives compounds of general formula (I) of the present invention which represent a solution to the aforementioned need.

SUMMARY OF THE INVENTION

The present invention refers to compounds of formula (I)

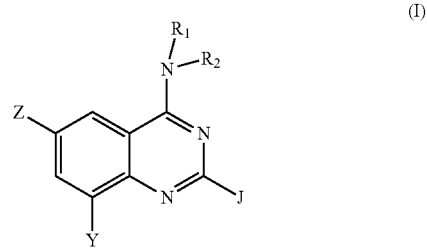

(I)

wherein
Z is selected from the group consisting of $(C_3-C_8)$heterocycloalkyl, $(R^A R^B)N$—, heteroaryl, aryl, wherein any of such alkyl, heteroaryl, heterocycloalky and aryl may be optionally substituted by one or more groups selected from $(C_1-C_3)$alkyl-, halo, CN, $(R^A R^B)NC(O)$—, $(C_1-C_6)$haloalkyl-, $R^A O$—, $(R^A R^B)N(C_1-C_6)$alkylene-, $(C_3-C_7)$cycloalkyl-, $R^C SO_2$—, $(R^A R^B)N$—;
$R_1$ is H or $(C_1-C_4)$alkyl;
$R_2$ is selected from the group consisting of $(C_1-C_6)$alkyl-, heteroaryl$(C_1-C_4)$alkyl-, $(C_3-C_8)$heterocycloalkyl-$(C_1-C_6)$alkyl-, heteroaryl-$(C_1-C_6)$hydroxyalkyl-, $(C_3-C_8)$heterocycloalkyl, $(C_3-C_8)$cycloalkyl-$(C_1-C_6)$alkyl-, aryl-$(C_1-C_4)$alkyl-, $(R^A R^B)N(C_1-C_6)$alkylene-, $(R^A R^B)N(O)C(C_1-C_4)$alkylene-, $R^A O(C_1-C_4)$alkylene- wherein any of such alkyl, alkylene, aryl, heteroaryl and heterocycloalkyl may be optionally substituted by one or more groups selected from $(C_1-C_3)$alkyl, $R^A O(C_1-C_4)$alkylene-, $(C_1-C_6)$haloalkyl, halo, oxo, $R^A O$—, $(C_3-C_8)$heterocycloalkyl-$(C_1-C_6)$alkyl-, heteroaryl, $(R^A R^B)N$—, —NHC(O)$R^C$, —C(O)N($R^A R^B$), —SO$_2$N($R^A R^B$), —O($C_1-C_4$)alkylene-N($R^A R^B$), aryl optionally substituted by halo, —O$R^C$, aryl-$(C_1-C_4)$alkyl-, —C(O)$R^A$;
$R^A$ and $R^B$ are at each occurrence independently H or selected from the group consisting of $(C_1-C_4)$alkyl-, $(C_3-C_8)$cycloalkyl, $(C_1-C_6)$ haloalkyl, or
$R^A$ and $R^B$ may form together with the nitrogen atom to which they are attached a or 6 membered saturated heterocyclic monocyclic ring system optionally containing a further heteroatom which is nitrogen or oxygen, which may be optionally substituted by one or more groups selected $(C_1-C_4)$alkyl and oxo;
$R^C$ is at each occurrence H or selected from the group consisting of $(C_1-C_6)$alkyl, $(R^A R^B)N$—, aryl-$(C_1-C_4)$alkyl-;
Y is selected from the group consisting of H, —O$R^D$, $R^C SO_2$, halo, —NHSO$_2 R^C$, heteroaryl, $(C_3-C_8)$heterocycloalkyl, wherein any of such heteroaryl and heterocycloalkyl may be optionally substituted by one or more groups selected from $(C_1-C_3)$alkyl and —C(O)N($R^A R^B$);
$R^D$ is selected from the group consisting of H, $(C_1-C_6)$alkyl, $(C_3-C_8)$heterocycloalkyl-$(C_1-C_6)$alkyl-, $R^C OC(O)(C_1-C_4)$alkylene-, $(R^A R^B)N(C_1-C_6)$alkylene-, $(C_3-C_8)$heterocycloalkyl, $(C_3-C_8)$cycloalkyl-$(C_1-C_6)$alkyl-, $R^C O(C_1-C_4)$alkylene-, $(R^A R^B)N(O)C(C_1-C_4)$alkylene-, wherein any of such heterocycloalkyl may be optionally substituted by one or more groups selected from $(C_1-C_3)$alkyl;

J is H or selected from the group consisting of $(C_1$-$C_6)$ alkyl, $(R^AR^B)N$—, $(C_1$-$C_6)$ haloalkyl, —$OR^C$ and halo.

In a second aspect, the invention refers to a pharmaceutical composition comprising a compound of formula (I) or pharmaceutically acceptable salt thereof, either alone or in combination with another one or more active ingredient, in admixture with one or more pharmaceutically acceptable carrier or excipient.

In a third aspect, the invention provides a compound of formula (I) for the use as a medicament.

In a further aspect, the invention provides the use of a compound of formula (I) for use in treatment of any disease wherein the $P2X_3$ receptors are involved.

In a further aspect, the invention refers to a compound of formula (I) for use in the prevention and/or treatment of respiratory diseases including cough, sub-acute or chronic cough, treatment-resistant cough, idiopathic chronic cough, post-viral cough, iatrogenic cough, asthma, idiopathic pulmonary fibrosis (IPF), chronic obstructive pulmonary disease (COPD) and cough associated with respiratory diseases such as COPD, asthma and bronchospasm.

In a further aspect, the invention refers to a compound of formula Ib

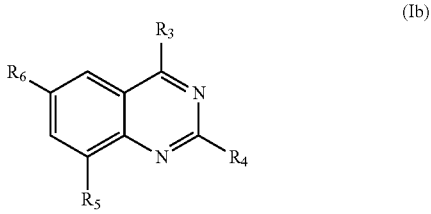

(Ib)

wherein
$R_3$ is OH or halo,
$R_4$ is H or OH,
$R_5$ is halo or —OMe,
$R_6$ is halo or Z,
Z is as defined above.

In a further aspect, the invention refers to the use of compound of formula (Ib) as intermediate in the preparation of compounds of formula (I).

DETAILED DESCRIPTION OF THE INVENTION

The invention relates to a compound of formula (I)

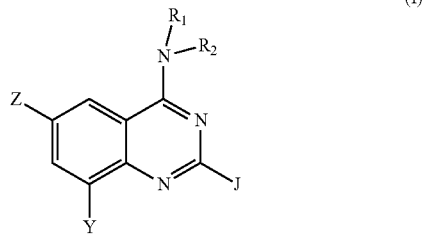

(I)

wherein
Z is selected from the group consisting of $(C_3$-$C_8)$heterocycloalkyl, $(R^AR^B)N$—, heteroaryl, aryl, wherein any of such alkyl, heteroaryl, heterocycloalky and aryl may be optionally substituted by one or more groups selected from $(C_1$-$C_3)$alkyl-, halo, CN, $(R^AR^B)NC(O)$—, $(C_1$-$C_6)$haloalkyl-, $R^AO$—, $(R^AR^B)N(C_1$-$C_6)$alkylene-, $(C_3$-$C_7)$cycloalkyl-, $R^CSO_2$—, $(R^AR^B)N$—;

$R_1$ is H or $(C_1$-$C_4)$alkyl;

$R_2$ is selected from the group consisting of $(C_1$-$C_6)$alkyl-, heteroaryl$(C_1$-$C_4)$alkyl-, $(C_3$-$C_8)$heterocycloalkyl-$(C_1$-$C_6)$alkyl-, heteroaryl-$(C_1$-$C_6)$hydroxyalkyl-, $(C_3$-$C_8)$heterocycloalkyl, $(C_3$-$C_8)$cycloalkyl-$(C_1$-$C_6)$alkyl-, aryl-$(C_1$-$C_4)$alkyl-, $(R^AR^B)N(C_1$-$C_6)$alkylene-, $(R^AR^B)N(O)C(C_1$-$C_4)$alkylene-, $R^AO(C_1$-$C_4)$alkylene- wherein any of such alkyl, alkylene, aryl, heteroaryl and heterocycloalkyl may be optionally substituted by one or more groups selected from $(C_1$-$C_3)$alkyl, $R^AO(C_1$-$C_4)$alkylene-, $(C_1$-$C_6)$haloalkyl, halo, oxo, $R^AO$—, $(C_3$-$C_8)$heterocycloalkyl-$(C_1$-$C_6)$alkyl-, heteroaryl, $(R^AR^B)N$—, —$NHC(O)R^C$, —$C(O)N(R^AR^B)$, —$SO_2N(R^AR^B)$, —$O(C_1$-$C_4)$alkylene-$N(R^AR^B)$, aryl optionally substituted by halo, —$OR^C$, aryl-$(C_1$-$C_4)$alkyl-, —$C(O)R^A$;

$R^A$ and $R^B$ are at each occurrence independently H or selected from the group consisting of $(C_1$-$C_4)$alkyl-, $(C_3$-$C_8)$cycloalkyl-, $(C_1$-$C_6)$ haloalkyl, or $R^A$ and $R^B$ may form together with the nitrogen atom to which they are attached a or 6 membered saturated heterocyclic monocyclic ring system optionally containing a further heteroatom which is nitrogen or oxygen, which may be optionally substituted by one or more groups selected $(C_1$-$C_4)$alkyl and oxo;

$R^C$ is at each occurrence H or selected from the group consisting of $(C_1$-$C_6)$alkyl, $(R^AR^B)N$—, aryl-$(C_1$-$C_4)$alkyl-;

Y is selected from the group consisting of H, —$OR^D$, $R^CSO_2$, halo, —$NHSO_2R^C$, heteroaryl, $(C_3$-$C_8)$heterocycloalkyl, wherein any of such heteroaryl and heterocycloalkyl may be optionally substituted by one or more groups selected from $(C_1$-$C_3)$alkyl, —$C(O)N(R^AR^B)$;

$R^D$ is at each occurrence selected from the group consisting of H, $(C_1$-$C_6)$alkyl, $(C_3$-$C_8)$heterocycloalkyl-$(C_1$-$C_6)$alkyl-, $R^COC(O)(C_1$-$C_4)$alkylene-, $(R^AR^B)N(C_1$-$C_6)$alkylene-, $(C_3$-$C_8)$heterocycloalkyl, $(C_3$-$C_8)$cycloalkyl-$(C_1$-$C_6)$alkyl-, $R^CO(C_1$-$C_4)$alkylene-, $(R^AR^B)N(O)C(C_1$-$C_4)$alkylene, wherein any of such heterocycloalkyl may be optionally substituted by one or more groups selected from $(C_1$-$C_3)$alkyl;

J is H or selected from the group consisting of $(C_1$-$C_6)$ alkyl, $(R^AR^B)N$—, $(C_1$-$C_6)$ haloalkyl, —$OR^C$ and halo.

Definitions

The term "pharmaceutically acceptable salts", as used herein, refers to derivatives of compounds of formula (I) wherein the parent compound is suitably modified by converting any of the free acid or basic group, if present, into the corresponding addition salt with any base or acid conventionally intended as being pharmaceutically acceptable.

Suitable examples of said salts may thus include mineral or organic acid addition salts of basic residues such as amino groups, as well as mineral or organic basic addition salts of acid residues such as carboxylic groups.

Cations of inorganic bases which can be suitably used to prepare salts comprise ions of alkali or alkaline earth metals such as potassium, sodium, calcium or magnesium.

Those obtained by reacting the main compound, functioning as a base, with an inorganic or organic acid to form a salt comprise, for example, salts of hydrochloric acid, hydrobromic acid, sulfuric acid, phosphoric acid, methane sulfonic acid, camphor sulfonic acid, acetic acid, oxalic acid, maleic acid, fumaric acid, succinic acid and citric acid.

The term "halogen" or "halogen atoms" as used herein includes fluorine, chlorine, bromine, and iodine atom, preferably chlorine or fluorine.

The term "$(C_x$-$C_y)$ alkyl" wherein x and y are integers, refers to a straight or branched chain alkyl radical having from x to y carbon atoms. Thus, when x is 1 and y is 6, for example, the term includes methyl, ethyl, n-propyl, isopropyl, n-butyl, isobutyl, sec-butyl, t-butyl, n-pentyl and n-hexyl.

As used herein, the term "$(C_x$-$C_y)$alkylene" wherein x and y are integers, refers to a $C_x$-$C_y$alkyl radical having in total two unsatisfied valencies, such as a divalent methylene radical.

The expressions "$(C_x$-$C_y)$ haloalkyl" wherein x and y are integers, refer to the above defined "$C_x$-$C_y$alkyl" groups wherein one or more hydrogen atoms are replaced by one or more halogen atoms, which can be the same or different.

Examples of said "$(C_x$-$C_y)$ haloalkyl" groups may thus include halogenated, poly-halogenated and fully halogenated alkyl groups wherein all of the hydrogen atoms are replaced by halogen atoms, e.g. trifluoromethyl or difluoro methyl, trifluoroethyl groups.

By way of analogy, the terms "$(C_1$-$C_6)$ hydroxyalkyl" or "$(C_1$-$C_6)$ aminoalkyl" refer to the above defined "$(C_1$-$C_6)$ alkyl" groups wherein one or more hydrogen atoms are replaced by one or more hydroxy (OH) or amino group respectively. Examples include respectively hydroxymethyl, aminomethyl, dimethylaminopropyl and the like.

In the present description, unless otherwise provided, the aminoalkyl encompasses alkyl groups (i.e. "$(C_1$-$C_6)$ alkyl" groups) substituted by one or more amino group (—$NR^A R^B$). Thus, an example of aminoalkyl is a mono-aminoalkyl group such as $R^A R^B N$—$(C_1$-$C_6)$ alkyl.

With reference to the substituent $R^A$ and $R^B$ as defined above and below, when $R^A$ and $R^B$ are taken together with the nitrogen atom they are linked to form 5 to 6 membered heterocyclic radical, at least one further ring carbon atom in the said heterocyclic radical is optionally replaced by at least one heteroatom (e.g. N, S or O) and/or may bear -oxo (=O) substituent groups. It is understood that the said heterocyclic radical might be further optionally substituted on any available position in the ring, namely on a carbon atom, or on any heteroatom available for substitution. Substitution on a carbon atom includes spiro disubstitution as well as substitution on two adjacent carbon atoms, in both cases thus form an additional 5 to 6 membered heterocyclic ring. Examples of said heterocycle radicals are 1-pyrrolidinyl, 1-piperidinyl, 1-piperazinyl, 4-methylpiperazinyl, piperazin-4yl-2-one, 4-morpholinyl, morpholinyl-3-one, 1-(piperazin-1-yl)ethe-none.

The term "$(C_x$-$C_y)$ cycloalkyl" wherein x and y are integers, refers to saturated cyclic hydrocarbon groups containing the indicated number of ring carbon atoms. Examples include cyclopropyl, cyclobutyl, cyclopentyl, cyclohexyl, cycloheptyl.

The term "aryl" refers to mono cyclic carbon ring systems which have 6 ring atoms wherein the ring is aromatic. Examples of suitable aryl monocyclic ring systems include, for instance, phenyl.

The term "heteroaryl" refers to a mono- or bi-cyclic aromatic radical containing one or more heteroatoms selected from S, N and O, and includes radicals having two such monocyclic rings, or one such monocyclic ring and one monocyclic aryl ring, which are fused through a common bond. Examples of suitable 5,6-membered heteroaryl are: are thienyl, furyl, pyrrolyl, imidazolyl, thiazolyl, isothiazolyl, pyrazolyl, oxazolyl, isoxazolyl, isothiazolyl, triazolyl, thiadiazolyl, oxadiazolyl, pyridinyl, pyridazinyl, pyrimidinyl, pyrazinyl, tetrazolyl and triazinyl.

The term "heterocyclyl" or "heterocyclic" relate to a saturated mono-, bi- or tri-cyclic non-aromatic radical containing one or more heteroatoms selected from S, N and O. In the case of bicyclic heterocyclic systems, included within the scope of the term are fused, spiro and bridged bicyclic systems.

The term "$(C_x$-$C_y)$ heterocycloalkyl" wherein x and y are integers, refers to saturated or partially unsaturated monocyclic ($C_x$-$C_y$) cycloalkyl groups in which at least one ring carbon atom is replaced by at least one heteroatom (e.g. N, S or O) or may bear an -oxo (=O) substituent group. Said heterocycloalkyl (i.e. heterocyclic radical or group) may be further optionally substituted on the available positions in the ring, namely on a carbon atom, or on an heteroatom available for substitution. Substitution on a carbon atom includes spiro disubstitution as well as substitution on two adjacent carbon atoms, in both cases thus form additional condensed 5 to 6 membered heterocyclic ring. Examples of ($C_x$-$C_y$) heterocycloalkyl are represented by: pyrrolidinyl, imidazolidinyl, thiazolidinyl, piperazinyl, piperidinyl, morpholinyl, thiomorpholinyl, dihydro- or tetrahydro-pyridinyl, tetrahydrothiophenyl, azetidinyl, oxetanyl, tetrahydropyranyl, pyranyl, 2H- or 4H-pyranyl, dihydro- or tetrahydrofuranyl, dihydroisoxazolyl, pyrrolidin-2-one-yl, dihydropyrrolyl radicals and the like.

Specific examples of said heterocycle radicals are tetrahydrothiophene 1,1-dioxide, 3,3-difluoropyrrolidinyl, 1-pyrrolidinyl, 1-methyl-2-pyrrolidinyl, 1-piperidinyl, 1-piperazinyl, 4-morpholinyl.

The expressions "Aryloxyl" and "Aryl ($C_1$-$C_6$) alkoxyl" likewise "heteroAryloxyl" and "Heteroaryl ($C_1$-$C_6$) alkoxyl" refer to Aryl or Heteroaryl groups attached through an oxygen bridge and chained Aryl-alkoxyl or HeteroAryl-alkoxyl groups. Examples of such groups are phenyloxy, benzyloxy and pyridinyloxy respectively.

The term "aryl ($C_1$-$C_6$) alkyl" refers to an aryl ring linked to a straight-chained or branched alkyl groups wherein the number of carbon atoms is from 1 to 6, e.g. phenylmethyl (i.e. benzyl), phenylethyl or phenylpropyl.

The term ($C_z$-$C_k$)heterocycloalkyl-($C_x$-$C_y$)alkyl wherein z and k are integers, refers to an heterocyclic ring linked to a straight-chained or branched alkyl groups having from x to y carbon atoms.

Likewise, the term "heteroaryl ($C_x$-$C_y$)alkyl" or "aryl ($C_x$-$C_y$)alkyl" refers to an heteroaryl or aryl ring linked to a straight-chained or branched alkyl groups having from x to y carbon atoms.

The expression "ring system" refers to mono- or bicyclic or polycyclic ring systems which may be saturated, partially unsaturated or unsaturated, such as aryl, ($C_3$-$C_{10}$) cycloalkyl, ($C_3$-$C_6$)heterocycloalkyl or heteroaryl.

The terms "group", "radical" or "fragment" or "substituent" are synonymous and are intended to indicate functional groups or fragments of molecules attachable to a bond or other fragments or molecules. Thus, as an example, a "heterocyclic radical" herein refers to a mono- or bi-cyclic saturated or partially saturated heterocyclic moiety (group, radical), preferably a 4 to 11 membered monocyclic radical, at least one further ring carbon atom in the said heterocyclic radical is optionally replaced by at least one further heteroatom independently selected from N, S or O and/or may bear an -oxo (=O) substituent group, said heterocyclic radical is further optionally including spiro disubstitution as well as substitution on two adjacent or vicinal atoms forming an additional 5 to 6 membered cyclic or heterocyclic, saturated, partially saturated or aromatic ring. Examples of said heterocycle radicals are 1-pyrrolidinyl, 1-piperidinyl, 1-piperazinyl, 4-morpholinyl and the like.

A dash ("-") that is not between two letters or symbols is meant to represent the point of attachment for a substituent. When graphically represented the point of attachment in a cyclic functional group is indicated with a dot ("•") localized in one of the available ring atom where the functional group is attachable to a bond or other fragment of molecules.

An oxo moiety is represented by (O) as an alternative to the other common representation, e.g. (=O). Thus, in terms of general formula, the carbonyl group is herein represented as —C(O)—, in general, the bracketed group is a lateral group, not included into the chain, and brackets are used, when deemed useful, to help disambiguating linear chemical formulas; e.g. the sulfonyl group —SO$_2$— might be also represented as —S(O)$_2$— to disambiguate e.g. with respect to the sulfinic group —S(O)O—.

Whenever basic amino or quaternary ammonium groups are present in the compounds of formula I, physiologically acceptable anions may be present, selected among chloride, bromide, iodide, trifluoroacetate, formate, sulfate, phosphate, methanesulfonate, nitrate, maleate, acetate, citrate, fumarate, tartrate, oxalate, succinate, benzoate, p-toluenesulfonate, pamoate and naphthalene disulfonate. Likewise, in the presence of acidic groups such as COOH groups, corresponding physiological cation salts may be present as well, for instance including alkaline or alkaline earth metal ions.

It will be apparent that compounds of formula (I) when contain one or more stereogenic center, may exist as optical stereoisomers.

Where the compounds according to the invention have at least one stereogenic center, they may accordingly exist as enantiomers. Where the compounds according to the invention possess two or more stereogenic centers, they may additionally exist as diastereoisomers. All such single enantiomers, diastereoisomers and mixtures thereof in any proportion are encompassed within the scope of the present invention. The absolute configuration (R) or (S) for carbon bearing a stereogenic center is assigned on the basis of Cahn-Ingold-Prelog nomenclature rules based on groups' priorities.

The invention further concerns the corresponding deuterated derivatives of compounds of formula (I).

All preferred groups or embodiments described above and herebelow for compounds of formula I may be combined among each other and apply as well mutatis mutandis.

In a preferred embodiment, the invention is directed to compounds of formula (I) as defined above

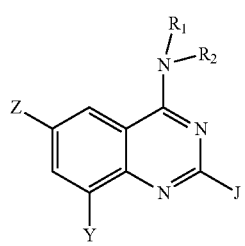

(I)

wherein

Z is selected from the group consisting of heteroaryl, aryl, $(R^AR^B)N$—, $(C_3-C_8)$heterocycloalkyl, wherein any of such heteroaryl, aryl and heterocycloalkyl may be optionally substituted by one or more groups selected from $(C_1-C_3)$alkyl, halo, CN, $(R^AR^B)NC(O)$—;

$R_1$ is H or $(C_1-C_4)$alkyl;

$R_2$ is selected from the group consisting of heteroaryl($C_1$-$C_4$)alkyl-, $(R^AR^B)N(O)C(C_1-C_4)$alkylene-, wherein any of such heteroaryl may be optionally substituted by one or more groups selected from $(C_1-C_3)$alkyl, halo, $(C_1-C_6)$ haloalkyl;

$R^A$ and $R^B$ are at each occurrence independently H, $(C_1-C_4)$alkyl- and $(C_3-C_8)$cycloalkyl-, or $R^A$ and $R^B$ may form together with the nitrogen atom to which they are attached a 5 or 6 membered saturated heterocyclic monocyclic ring system optionally containing a further heteroatom which is oxygen or nitrogen, which may be optionally substituted by one or more groups selected from oxo, $(C_1-C_4)$alkyl;

Y is H;

J is H or selected from the group consisting of $(C_1-C_4)$ alkyl, $(R^AR^B)N$—, halo, $(C_1-C_6)$haloalkyl.

In another preferred embodiment, the invention refers to compounds of formula (I) wherein Z is selected from the group consisting of heteroaryl and aryl, wherein any of such heteroaryl and aryl may be optionally substituted by one or more groups selected from $(C_1-C_3)$alkyl and halo;

$R_1$ is H;

$R_2$ is selected from the group consisting of $(C_3-C_8)$heterocycloalkyl-$(C_1-C_6)$alkyl-, preferably (piperidinyl)methyl;

heteroaryl($C_1$-$C_4$)alkyl-, preferably (pyridinyl)methyl, (pyridinyl)ethyl, (pyridazinyl)methyl, (pyridazinyl) ethyl (pyrimidinyl)methyl, (pyrimidinyl)ethyl, (oxadiazolyl)ethyl, (thiadiazolyl)ethyl ([1,2,4]triazolo[4,3-a]pyrimidin-3-yl)methyl, and wherein any of such alkyl, heteroaryl and heterocycloalkyl may be optionally substituted by one or more groups selected from $(C_1-C_3)$alkyl, $(C_1-C_6)$haloalkyl and —OH;

Y is selected from the group consisting of H and —OR$^D$,

R$^D$ is at each occurrence selected from the group consisting of $(C_1-C_6)$alkyl, preferably methyl, $(C_3-C_8)$heterocycloalkyl-$(C_1-C_6)$alkyl-, preferably (oxetanyl)methyl, (morpholinyl)methyl, R$^C$OC(O)($C_1-C_4$)alkylene-, preferably —CH$_2$C(O) OH;

$(C_3-C_8)$heterocycloalkyl, preferably tetrahydropyranyl, pyrrolidinyl, and

R$^C$O($C_1-C_4$)alkylene-, preferably methoxyethyl;

J is at each occurrence selected from the group consisting of H and —OR$^C$, preferably is H or —OH;

R$^C$ is at each occurrence selected from the group consisting of H and $(C_1-C_6)$alkyl.

According to a preferred embodiment, the invention refers to at least one of the compounds listed in the Table 1 below and pharmaceutical acceptable salts thereof.

TABLE 1

List of preferred compounds having Formula (I)

| Ex. N. | Chemical Name |
|---|---|
| Example 1 | 6-(1-((6-(4-Fluorophenyl)-8-methoxyquinazolin-4-yl)amino)ethyl)pyridin-2(1H)-one |
| Example 2 | 6-(5-fluoropyridin-2-yl)-8-methoxy-N-(1-(3-methyl-1,2,4-oxadiazol-5-yl)ethyl)quinazolin-4-amine |
| Example 3 | 6-(5-fluoropyrimidin-2-yl)-8-methoxy-N-(1-(3-methyl-1,2,4-oxadiazol-5-yl)ethyl)quinazolin-4-amine |
| Example 4 | ((R)-6-(5-fluoropyrimidin-2-yl)-8-methoxy-N-(1-(6-methylpyridazin-3-yl)ethyl)quinazolin-4-amine |
| Example 5 | (R)-8-methoxy-N-(1-(6-methylpyridazin-3-yl)ethyl)-6-(5-methylthiazol-2-yl)quinazolin-4-amine |
| Example 7 | 8-Methoxy-N-[(1R)-1-(5-methyl-1,2,4-oxadiazol-3-yl)ethyl]-6-(5-methylpyrimidin-2-yl)quinazolin-4-amine |
| Example 28 | single enantiomer 1 of N-[1-(6-methylpyridazin-3-yl)ethyl]-6-(5-methylpyrimidin-2-yl)-8-tetrahydropyran-4-yloxy-quinazolin-4-amine |
| Example 29 | single enantiomer 2 of N-[1-(6-methylpyridazin-3-yl)ethyl]-6-(5-methylpyrimidin-2-yl)-8-tetrahydropyran-4-yloxy-quinazolin-4-amine |
| Example 30 | 6-(5-fluoro-2-pyridyl)-N-[(6-methylpyridazin-3-yl)methyl]-8-tetrahydropyran-4-yloxy-quinazolin-4-amine |
| Example 31 | N-[(6-methylpyridazin-3-yl)methyl]-6-(5-methylpyrimidin-2-yl)-8-tetrahydropyran-4-yloxy-quinazolin-4-amine |
| Example 32 | (R)-6-(1-methyl-1H-pyrazol-3-yl)-N-(1-(6-methylpyridazin-3-yl)ethyl)-8-((tetrahydro-2H-pyran-4-yl)oxy)quinazolin-4-amine |
| Example 33 | (R)-6-(5-methylthiazol-2-yl)-N-(1-(pyridazin-3-yl)ethyl)-8-((tetrahydro-2H-pyran-4-yl)oxy)quinazolin-4-amine |
| Example 35 | 8-(2-methoxyethoxy)-N-((6-methylpyridazin-3-yl)methyl)-6-(5-methylthiazol-2-yl)quinazolin-4-amine |
| Example 36 | 2-((4-(((6-methylpyridazin-3-yl)methyl)amino)-6-(5-methylthiazol-2-yl)quinazolin-8-yl)oxy)ethan-1-ol |
| Example 37 | N-((6-methylpyridazin-3-yl)methyl)-6-(5-methylthiazol-2-yl)-8-(oxetan-3-ylmethoxy)quinazolin-4-amine |
| Example 38 | N-[(6-methylpyridazin-3-yl)methyl]-6-(5-methylthiazol-2-yl)-8-tetrahydropyran-4-yloxy-quinazolin-4-amine |
| Example 44 | (R)-2-((6-(4-fluorophenyl)-4-((1-(2-(trifluoromethyl)pyrimidin-5-yl)ethyl)amino)quinazolin-8-yl)oxy)acetic acid |
| Example 55 | 2-((4-(((6-methylpyridazin-3-yl)methyl)amino)-6-(5-methylpyrimidin-2-yl)quinazolin-8-yl)oxy)acetic acid dihydrochloride |
| Example 57 | 2-((6-(4-fluorophenyl)-4-(((1-methylpiperidin-4-yl)methyl)amino)quinazolin-8-yl)oxy)acetic acid hydrochloride |
| Example 74 | 6-(4-fluorophenyl)-N-((6-methylpyridazin-3-yl)methyl)-8-(oxetan-3-yloxy)quinazolin-4-amine |
| Example 81 | N-[1-(5-methyl-1,3,4-thiadiazol-2-yl)ethyl]-6-(5-methylthiazol-2-yl)-8-tetrahydropyran-4-yloxy-quinazolin-4-amine |
| Example 82 | 6-(5-fluoro-2-pyridyl)-N-[(1R)-1-(5-methyl-1,2,4-oxadiazol-3-yl)ethyl]-8-tetrahydropyran-4-yloxy-quinazolin-4-amine |
| Example 83 | Single enantiomer 1 of 6-(5-methyl-2-pyridyl)-N-[1-(5-methyl-1,3,4-thiadiazol-2-yl)ethyl]-8-tetrahydropyran-4-yloxy-quinazolin-4-amine |
| Example 84 | Single enantiomer 2 of 6-(5-methyl-2-pyridyl)-N-[1-(5-methyl-1,3,4-thiadiazol-2-yl)ethyl]-8-tetrahydropyran-4-yloxy-quinazolin-4-amine |
| Example 85 | Single enantiomer 1 of 6-(5-fluoro-2-pyridyl)-N-[1-(3-methyl-1,2,4-oxadiazol-5-yl)ethyl]-8-tetrahydropyran-4-yloxy-quinazolin-4-amine |
| Example 95 | 6-(3-Chloro-1H-pyrazol-1-yl)-8-methoxy-N-(1-(2-(trifluoromethyl)pyrimidin-5-yl)ethyl)quinazolin-4-amine |
| Example 96 | 6-(3-chloro-1H-pyrazol-1-yl)-8-methoxy-N-(1-(6-methylpyridazin-3-yl)ethyl)quinazolin-4-amine |
| Example 97 | (R)-6-(4-fluoro-1H-pyrazol-1-yl)-8-methoxy-N-(1-(2-(trifluoromethyl)pyrimidin-5-yl)ethyl)quinazolin-4-amine |
| Example 98 | (R)-6-(4-fluoro-1H-pyrazol-1-yl)-8-methoxy-N-(1-(6-methylpyridazin-3-yl)ethyl)quinazolin-4-amine |
| Example 99 | (R)-8-methoxy-6-(4-methyl-1H-pyrazol-1-yl)-N-(1-(6-methylpyridazin-3-yl)ethyl)quinazolin-4-amine |
| Example 100 | (R)-6-(4-chloro-1H-pyrazol-1-yl)-8-methoxy-N-(1-(6-methylpyridazin-3-yl)ethyl)quinazolin-4-amine |
| Example 101 | (R)-6-(3-fluoro-1H-pyrazol-1-yl)-8-methoxy-N-(1-(6-methylpyridazin-3-yl)ethyl)quinazolin-4-amine |
| Example 102 | (R)-8-methoxy-6-(5-methyl-1H-pyrazol-1-yl)-N-(1-(6-methylpyridazin-3-yl)ethyl)quinazolin-4-amine |
| Example 103 | (R)-8-methoxy-6-(3-methyl-1H-pyrazol-1-yl)-N-(1-(6-methylpyridazin-3-yl)ethyl)quinazolin-4-amine |
| Example 104 | (R)-6-(4-chloro-1H-pyrazol-1-yl)-8-methoxy-N-(1-(2-(trifluoromethyl)pyrimidin-5-yl)ethyl)quinazolin-4-amine |
| Example 105 | (8-methoxy-N-(1-(5-methyl-1,3,4-oxadiazol-2-yl)ethyl)-6-(1-methyl-1H-pyrazol-3-yl)quinazolin-4-amine |
| Example 106 | 8-methoxy-N-(1-(5-methyl-1,3,4-thiadiazol-2-yl)ethyl)-6-(5-methylthiazol-2-yl)quinazolin-4-amine |
| Example 107 | 8-methoxy-N-(1-(5-methyl-1,2,4-oxadiazol-3-yl)ethyl)-6-(5-methylthiazol-2-yl)quinazolin-4-amine |
| Example 108 | 6-(5-fluoropyrimidin-2-yl)-8-methoxy-N-(1-(5-methyl-1,2,4-oxadiazol-3-yl)ethyl)quinazolin-4-amine |
| Example 109 | 6-(5-fluoropyrimidin-2-yl)-8-methoxy-N-(1-(5-methyl-1,3,4-thiadiazol-2-yl)ethyl)quinazolin-4-amine |
| Example 110 | 6-(5-fluoropyrimidin-2-yl)-8-methoxy-N-(1-(5-methyl-1,3,4-oxadiazol-2-yl)ethyl)quinazolin-4-amine |
| Example 111 | 8-methoxy-N-[(3-methylisoxazol-5-yl)methyl]-6-(5-methylthiazol-2-yl)quinazolin-4-amine |
| Example 112 | 8-methoxy-6-(5-methylthiazol-2-yl)-N-[[3-(trifluoromethyl)-1,2,4-oxadiazol-5-yl]methyl]quinazolin-4-amine |
| Example 113 | 8-methoxy-N-[(3-methyl-1,2,4-oxadiazol-5-yl)methyl]-6-(5-methylthiazol-2-yl)quinazolin-4-amine |
| Example 114 | 8-methoxy-N-((5-methyl-1,3,4-thiadiazol-2-yl)methyl)-6-(5-methylthiazol-2-yl)quinazolin-4-amine |
| Example 115 | 4-(((8-methoxy-6-(5-methylthiazol-2-yl)quinazolin-4-yl)amino)methyl)-1-methylpyridin-2(1H)-one |
| Example 116 | 8-methoxy-6-(5-methylthiazol-2-yl)-N-((5-(trifluoromethyl)pyridin-2-yl)methyl)quinazolin-4-amine |
| Example 117 | N-((5-chloropyridin-2-yl)methyl)-8-methoxy-6-(5-methylthiazol-2-yl)quinazolin-4-amine |
| Example 118 | N-((3,5-difluoropyridin-2-yl)methyl)-8-methoxy-6-(5-methylthiazol-2-yl)quinazolin-4-amine |
| Example 119 | N-((5-fluoropyridin-2-yl)methyl)-8-methoxy-6-(5-methylthiazol-2-yl)quinazolin-4-amine |
| Example 120 | Single enantiomers of 8-methoxy-6-(5-methylpyrimidin-2-yl)-N-[1-[6-(trifluoromethyl)pyridazin-3-yl]ethyl]quinazolin-4-amine |
| Example 121 | Single enantiomers of 8-methoxy-6-(5-methylpyrimidin-2-yl)-N-[1-[6-(trifluoromethyl)pyridazin-3-yl]ethyl]quinazolin-4-amine |
| Example 122 | Single enantiomer 1 of 8-Methoxy-N-[1-(3-methyl-1,2,4-oxadiazol-5-yl)ethyl]-6-(5-methylpyrimidin-2-yl)quinazolin-4-amine |
| Example 123 | Single enantiomer 2 of 8-Methoxy-N-[1-(3-methyl-1,2,4-oxadiazol-5-yl)ethyl]-6-(5-methylpyrimidin-2-yl)quinazolin-4-amine |
| Example 124 | Single enantiomer 1 of 8-Methoxy-6-(5-methylpyrimidin-2-yl)-N-[1-(5-methyl-1,3,4-thiadiazol-2-yl)ethyl]quinazolin-4-amine |
| Example 125 | Single enantiomer 2 of 8-Methoxy-6-(5-methylpyrimidin-2-yl)-N-[1-(5-methyl-1,3,4-thiadiazol-2-yl)ethyl]quinazolin-4-amine |
| Example 126 | Single enantiomer 1 of 8-methoxy-6-(5-methyl-2-pyridyl)-N-[1-(5-methyl-1,3,4-thiadiazol-2-yl)ethyl]quinazolin-4-amine |
| Example 127 | Single enantiomer 2 of 8-methoxy-6-(5-methyl-2-pyridyl)-N-[1-(5-methyl-1,3,4-thiadiazol-2-yl)ethyl]quinazolin-4-amine |
| Example 128 | Single enantiomer 1 of 8-methoxy-N-[(1R)-1-(5-methyl-1,3,4-oxadiazol-2-yl)ethyl]-6-(5-methylpyrimidin-2-yl)quinazolin-4-amine |
| Example 129 | Single enantiomer 2 of 8-methoxy-N-[(1R)-1-(5-methyl-1,3,4-oxadiazol-2-yl)ethyl]-6-(5-methylpyrimidin-2-yl)quinazolin-4-amine |
| Example 132 | 6-(5-Fluoropyridin-2-yl)-8-methoxy-N-((5-methyl-1,2,4-oxadiazol-3-yl)methyl)quinazolin-4-amine |
| Example 133 | 6-(5-fluoropyridin-2-yl)-8-methoxy-N-((3-methyl-1,2,4-oxadiazol-5-yl)methyl)quinazolin-4-amine |
| Example 134 | 6-(5-fluoropyridin-2-yl)-8-methoxy-N-((5-methyl-1,3,4-oxadiazol-2-yl)methyl)quinazolin-4-amine |
| Example 135 | 6-(5-fluoropyridin-2-yl)-8-methoxy-N-((3-methylisoxazol-5-yl)methyl)quinazolin-4-amine |
| Example 136 | 8-methoxy-N-((5-methyl-1,2,4-oxadiazol-3-yl)methyl)-6-(5-methylpyridin-2-yl)quinazolin-4-amine |
| Example 137 | 8-methoxy-N-((3-methylisoxazol-5-yl)methyl)-6-(5-methylpyridin-2-yl)quinazolin-4-amine |
| Example 138 | 6-(5-fluoro-2-pyridyl)-N-[(5-methylisoxazol-3-yl)methyl]quinazolin-4-amine |

TABLE 1-continued

List of preferred compounds having Formula (I)

| Ex. N. | Chemical Name |
|---|---|
| Example 139 | 8-methoxy-N-[(5-methylisoxazol-3-yl)methyl]-6-(5-methyl-2-pyridyl)quinazolin-4-amine |
| Example 140 | 6-(5-fluoro-2-pyridyl)-8-methoxy-N-[(1-methylpyrazol-3-yl)methyl]quinazolin-4-amine |
| Example 141 | 8-methoxy-N-[(1-methylpyrazol-3-yl)methyl]-6-(5-methyl-2-pyridyl)quinazolin-4-amine |
| Example 142 | 8-methoxy-N-[(3-methyl-1,2,4-oxadiazol-5-yl)methyl]-6-(5-methyl-2-pyridyl)quinazolin-4-amine |
| Example 143 | 8-methoxy-N-[(5-methyl-1,3,4-oxadiazol-2-yl)methyl]-6-(5-methyl-2-pyridyl)quinazolin-4-amine |
| Example 144 | 8-methoxy-6-(5-methylpyrimidin-2-yl)-N-[[3-(trifluoromethyl)-1,2,4-oxadiazol-5-yl]methyl]quinazolin-4-amine |
| Example 145 | 8-methoxy-6-(5-methylpyrimidin-2-yl)-N-[[2-(trifluoromethyl)pyrimidin-5-yl]methyl]quinazolin-4-amine |
| Example 146 | 6-(5-fluoropyridin-2-yl)-8-methoxy-N-((2-(trifluoromethyl)pyrimidin-5-yl)methyl)quinazolin-4-amine |
| Example 147 | 4-(((6-(5-fluoropyridin-2-yl)-8-methoxyquinazolin-4-yl)amino)methyl)-1-methylpyridin-2(1H)-one |
| Example 148 | 4-(((6-(5-fluoropyridin-2-yl)-8-methoxyquinazolin-4-yl)amino)methyl)pyridin-2(1H)-one |
| Example 149 | 6-(5-fluoropyridin-2-yl)-8-methoxy-N-((6-methylpyridin-3-yl)methyl)quinazolin-4-amine |
| Example 150 | 6-(5-fluoropyridin-2-yl)-8-methoxy-N-((6-(trifluoromethyl)pyridin-3-yl)methyl)quinazolin-4-amineamine |
| Example 151 | 4-(((8-methoxy-6-(5-methylpyrimidin-2-yl)quinazolin-4-yl)amino)methyl)-1-methylpyridin-2(1H)-one |
| Example 152 | 6-(((8-methoxy-6-(5-methylpyrimidin-2-yl)quinazolin-4-yl)amino)methyl)pyridin-2(1H)-one |
| Example 153 | 8-methoxy-N-((5-methyl-1,3,4-thiadiazol-2-yl)methyl)-6-(5-methylpyrimidin-2-yl)quinazolin-4-amine |
| Example 154 | 8-methoxy-N-((6-methylpyridin-3-yl)methyl)-6-(5-methylpyrimidin-2-yl)quinazolin-4-amine |
| Example 155 | 6-(5-fluoropyridin-2-yl)-8-methoxy-N-((6-(trifluoromethyl)pyridin-3-yl)methyl)quinazolin-4-amineamine |
| Example 156 | 8-Methoxy-N-((3-methyl-1,2,4-oxadiazol-5-yl)methyl)-6-(5-methylpyrimidin-2-yl)quinazolin-4-amine |
| Example 157 | 6-(3-fluoro-5-methyl-2-pyridyl)-8-methoxy-N-[(1R)-1-(5-methyl-1,2,4-oxadiazol-3-yl)ethyl] quinazolin-4-amine |
| Example 158 | 6-(5-fluoro-2-pyridyl)-8-methoxy-N-[(1R)-1-(1-methylpyrazol-3-yl)ethyl]quinazolin-4-amine |
| Example 159 | 8-methoxy-N-[(1R)-1-(1-methylpyrazol-3-yl)ethyl]-6-(5-methyl-2-pyridyl)quinazolin-4-amine |
| Example 161 | 6-(4-Fluorophenyl)-N-[(5-fluoro-2-pyridyl)methyl]-8-methoxy-quinazolin-4-amine |
| Example 162 | Single enantiomer 1 of 8-Methoxy-N-[1-(3-methyl-1,2,4-oxadiazol-5-yl)ethyl]-6-(5-methyl-2-pyridyl)quinazolin-4-amine |
| Example 163 | Single enantiomer 2 of 8-Methoxy-N-[1-(3-methyl-1,2,4-oxadiazol-5-yl)ethyl]-6-(5-methyl-2-pyridyl)quinazolin-4-amine |
| Example 164 | Single enantiomer 1 of 8-methoxy-N-(1-(5-methyl-1,3,4-thiadiazol-2-yl)ethyl)-6-(5-methylthiazol-2-yl)quinazolin-4-amine |
| Example 165 | Single enantiomer 2 of 8-methoxy-N-(1-(5-methyl-1,3,4-thiadiazol-2-yl)ethyl)-6-(5-methylthiazol-2-yl)quinazolin-4-amine |
| Example 166 | Single enantiomer 2 of 2-((8-methoxy-6-(5-methylpyrimidin-2-yl)quinazolin-4-yl)amino)-2-(3-methyl-1,2,4-oxadiazol-5-yl)ethan-1-ol |
| Example 169 | Single enantiomer 1 of 6-(5-fluoro-2-pyridyl)-8-methoxy-N-[1-[6-(trifluoromethyl)pyridazin-3-yl]ethyl]quinazolin-4-amine |
| Example 170 | Single enantiomer 2 of 6-(5-fluoro-2-pyridyl)-8-methoxy-N-[1-[6-(trifluoromethyl)pyridazin-3-yl]ethyl]quinazolin-4-amine |
| Example 171 | Single enantiomer 1 of N-[1-(5-methyl-1,3,4-thiadiazol-2-yl)ethyl]-6-(5-methylthiazol-2-yl)-8-tetrahydropyran-4-yloxy-quinazolin-4-amine |
| Example 172 | Single enantiomer 2 of N-[1-(5-methyl-1,3,4-thiadiazol-2-yl)ethyl]-6-(5-methylthiazol-2-yl)-8-tetrahydropyran-4-yloxy-quinazolin-4-amine |
| Example 173 | Single enantiomer 1 of 6-(5-fluoropyridin-2-yl)-8-methoxy-N-(1-(5-methyl-1,3,4-thiadiazol-2-yl)ethyl)quinazolin-4-amine |
| Example 174 | Single enantiomer 2 of 6-(5-fluoropyridin-2-yl)-8-methoxy-N-(1-(5-methyl-1,3,4-thiadiazol-2-yl)ethyl)quinazolin-4-amine |
| Example 175 | Single enantiomer 1 of 6-(5-fluoropyridin-2-yl)-8-methoxy-N-(1-(3-methyl-1,2,4-oxadiazol-5-yl)ethyl)quinazolin-4-amine |
| Example 176 | Single enantiomer 2 of 6-(5-fluoropyridin-2-yl)-8-methoxy-N-(1-(3-methyl-1,2,4-oxadiazol-5-yl)ethyl)quinazolin-4-amine |
| Example 185 | 6-(4-fluorophenyl)-8-methoxy-N-[(1S)-1-[2-(trifluoromethyl)pyrimidin-5-yl]ethyl]quinazolin-4-amine formate |
| Example 190 | Single enantiomer 1 of 6-(1-(((6-(4-Fluorophenyl)-8-methoxyquinazolin-4-yl)amino)ethyl)pyridin-2(1H)-one |
| Example 191 | Single enantiomer 2 of 6-(1-(((6-(4-Fluorophenyl)-8-methoxyquinazolin-4-yl)amino)ethyl)pyridin-2(1H)-one |

In a further preferred embodiment, the invention refers to compound of formula (I) wherein Z is selected from the group consisting of heteroaryl, preferably pyrimidinyl, thiazolyl, pyridinyl, thiophenyl, aryl, preferably phenyl, $(R^A R^B)N$—, wherein $R^A$ and $R^B$ form together with the nitrogen atom to which they are attached a 5 or 6 membered saturated heterocyclic monocyclic ring system containing a further heteroatom which is oxygen or nitrogen, said heterocyclic radical being optionally in its turn further substituted with one or more oxo, methyl and fluorine; any of such heteroaryl and aryl is further optionally substituted by one or more groups selected from methyl, fluorine, $R^C SO_2$— wherein $R^C$ is selected form the group consisting of fluorine, —OH and $(R^A R^B)N$— wherein $R^A$ and $R^B$ are H,

CN, $(R^A R^B)NC(O)$— wherein $R^A$ and $R^B$ are H, $R_1$ is H or methyl;

$R_2$ is selected from the group consisting of heteroaryl($C_1$-$C_4$)alkyl-, preferably (pyridinyl)methyl, (pyridazyl)methyl, (pyrimidinyl)ethyl, (oxadiazolyl)ethyl $(R^A R^B)N(O)C(C_1$-$C_4)$alkylene-, preferably $R^A R^B$ are H, cyclopropyl;

any of said heteroaryl may be optionally substituted by one or more groups selected from methyl, fluorine, and trifluoromethyl.

Y is H;

J is H or selected from the group consisting of halo, preferably chlorine, $(C_1$-$C_4)$alkyl, preferably methyl, $(C_1$-$C_6)$haloalkyl preferably trifluoromethyl, $(R^A R^B)N$— wherein $R^A$ and $R^B$ are at each occurrence independently H, cyclopropyl and methyl or, in alternative, $R^A$ and $R^B$ form together with the nitrogen atom to which they are attached a 6 membered saturated heterocyclic monocyclic ring system containing a further heteroatom which is oxygen.

In a preferred embodiment, the invention refers to a compound of formula (I) as defined above

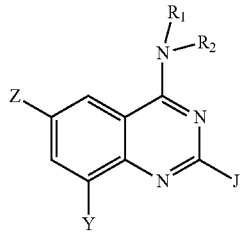

(I)

wherein
- Z is selected from the group consisting of heteroaryl and aryl, wherein any of such heteroaryl and aryl may be optionally substituted by one or more groups selected from $(C_1-C_3)$alkyl, halo, CN, $(R^AR^B)NC(O)$—, $(C_1-C_6)$haloalkyl, $R^AO$—, $(R^AR^B)N(C_1-C_6)$alkylene-, $(C_3-C_7)$cycloalkyl-, $R^CSO_2$—, $(R^AR^B)N$—;
- $R_1$ is H or $(C_1-C_6)$alkyl;
- $R_2$ is selected from the group consisting of $(C_1-C_6)$alkyl, heteroaryl$(C_1-C_4)$alkyl-, $(C_3-C_8)$heterocycloalkyl-$(C_1-C_6)$alkyl, heteroaryl-$(C_1-C_6)$hydroxyalkyl, aryl-$(C_1-C_4)$alkyl-, $(C_3-C_8)$heterocycloalkyl, $(C_3-C_8)$cycloalkyl-$(C_1-C_6)$alkyl-, $(R^AR^B)N(C_1-C_6)$alkylene-; $R^AO(C_1-C_4)$alkylene, wherein any of such alkyl, alkylene, aryl, heteroaryl, cycloalkyl and heterocycloalkyl may be optionally substituted by one or more groups selected from $(C_1-C_3)$alkyl, $R^AO(C_1-C_4)$alkylene, $(C_1-C_6)$haloalkyl, oxo, $R^AO$—, $(C_3-C_5)$heterocycloalkyl-$(C_1-C_6)$alkyl, heteroaryl, aryl optionally substituted by halo, $R^CO$—, $(R^AR^B)N$—, —NHC(O)$R^C$, —C(O)N($R^AR^B$), halo, —SO$_2$N($R^AR^B$), —O($R^AO(C_1-C_4)$alkylene-N($R^AR^B$), aryl-$(C_1-C_4)$alkyl-, —C(O)$R^A$;
- $R^A$ and $R^B$ are at each occurrence independently H or selected from the group consisting of $(C_1-C_4)$alkyl-, aryl, $(C_1-C_6)$ haloalkyl, or
- $R^A$ and $R^B$ may form together with the nitrogen atom to which they are attached a 6 membered saturated heterocyclic monocyclic ring system optionally containing a further heteroatom which is nitrogen or oxygen, which may be optionally substituted by $(C_1-C_4)$alkyl- and oxo;
- $R^C$ is H or selected from the group consisting of $(C_1-C_6)$alkyl, $(R^AR^B)N$—, aryl-$(C_1-C_4)$alkyl,
- Y is selected from the group consisting of —$OR^D$, $R^CSO_2$—, halo, —NHSO$_2R^C$, heteroaryl, $(C_3-C_8)$heterocycloalkyl, wherein any of such heteroaryl and heterocycloalkyl may be optionally substituted by one or more groups selected from $(C_1-C_3)$alkyl, —C(O)N($R^AR^B$);
- J is H or selected from the group consisting of $(C_1-C_6)$alkyl, —$OR^C$;
- $R^D$ is H or $(C_1-C_6)$alkyl.

In a still preferred embodiment, the invention refers to a compound of formula (I) as defined above

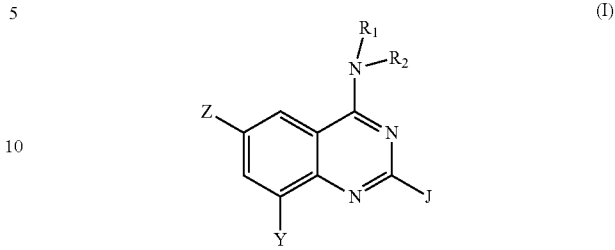

(I)

wherein
- Z is selected from the group consisting of heteroaryl and aryl, wherein any of such heteroaryl and aryl may be optionally substituted by one or more groups selected from $(C_1-C_3)$alkyl, halo, CN, $(R^AR^B)NC(O)$—, $(C_1-C_6)$haloalkyl, $R^AO$—, $(R^AR^B)N(C_1-C_6)$alkylene-, $(C_3-C_7)$cycloalkyl-, $R^CSO_2$—, $(R^AR^B)N$—;
- $R_1$ is H;
- $R_2$ is selected from the group consisting of $(C_1-C_6)$alkyl, heteroaryl$(C_1-C_4)$alkyl-, $(C_3-C_8)$heterocycloalkyl-$(C_1-C_6)$alkyl, heteroaryl-$(C_1-C_6)$hydroxyalkyl, aryl-$(C_1-C_4)$alkyl-, $(C_3-C_8)$heterocycloalkyl, $(C_3-C_8)$cycloalkyl-$(C_1-C_6)$alkyl-, $(R^AR^B)N(C_1-C_6)$alkylene-; $R^AO(C_1-C_4)$alkylene,
  wherein any of such alkyl, alkylene, aryl, heteroaryl, cycloalkyl and heterocycloalkyl may be optionally substituted by one or more groups selected from $(C_1-C_3)$alkyl, $R^AO(C_1-C_4)$alkylene, $(C_1-C_6)$haloalkyl, oxo, $R^AO$—, $(C_3-C_8)$heterocycloalkyl-$(C_1-C_6)$alkyl, heteroaryl, aryl optionally substituted by halo, $R^CO$—, $(R^AR^B)N$—, —NHC(O)$R^C$, —C(O)N($R^AR^B$), halo, —SO$_2$N($R^AR^B$), —O($R^AO(C_1-C_4)$alkylene-N($R^AR^B$), aryl-$(C_1-C_4)$alkyl-, —C(O)$R^A$;
- $R^A$ and $R^B$ are at each occurrence independently H or selected from the group consisting of $(C_1-C_4)$alkyl-, aryl, $(C_1-C_6)$ haloalkyl, or
- $R^A$ and $R^B$ may form together with the nitrogen atom to which they are attached a 6 membered saturated heterocyclic monocyclic ring system optionally containing a further heteroatom which is nitrogen or oxygen, which may be optionally substituted by $(C_1-C_4)$alkyl- and oxo;
- $R^C$ is H or selected from the group consisting of $(C_1-C_6)$alkyl, $(R^AR^B)N$—, aryl-$(C_1-C_4)$alkyl-,
- Y is selected from the group consisting of —$OR^D$, $R^CSO_2$, halo, —NHSO$_2R^C$, heteroaryl, $(C_3-C_8)$heterocycloalkyl, wherein any of such heteroaryl and heterocycloalkyl may be optionally substituted by one or more groups selected from $(C_1-C_3)$alkyl, —C(O)N($R^AR^B$);
- J is H or selected from the group consisting of $(C_1-C_6)$alkyl, $OR^C$;
- $R^D$ is H or $(C_1-C_6)$alkyl.

In a further preferred embodiment, the invention is addressed to compound of formula (I) wherein
- Z is H or selected from the group consisting of
  - $(R^AR^B)N$—,
  - heteroaryl, preferably thiadiazolyl, thiazolyl, pyrazolyl, pyridazyl, oxadiazolyl, pyridinyl, pyrimidinyl,
  - aryl, preferably phenyl,
  - $R^AO$—, wherein $R^A$ is H,
  each of said heteroaryl and aryl may be optionally substituted by one or more groups selected from
  - methyl,
  - halo, preferably fluorine and chlorine, CN,
(R$^A$R$^B$)NC(O)—, wherein R$^A$ and R$^B$ are at each occurrence independently H or methyl,
C$_1$-C$_6$)haloalkyl, preferably trifluoromethyl and difluoromethyl,
R$^A$O—, wherein R$^A$ is H or selected from methyl, trifluoromethyl and difluoromethyl,
(R$^A$R$^B$)N(C$_1$-C$_6$)alkylene-, wherein R$^A$ and R$^B$ are methyl,
cyclopropyl,
R$^C$SO$_2$—, wherein R$^C$ is methyl,
(R$^A$R$^B$)N— wherein R$^A$ and R$^B$ are independently H and methyl;
R$_1$ is H;
R$_2$ is selected from the group consisting of
  heteroaryl(C$_1$-C$_4$)alkyl-, preferably ([1,2,4]triazolo[4,3-a]pyrimidin-3-yl)methyl, (triazolyl)methyl, (triazolyl)ethyl, (imidazo[1,2-a]pyrimidinyl)methyl, (pyrimidinyl)ethyl, (pyrimidinyl)methyl, (pyrazolyl)methyl, (pyridazinyl)methyl, (pyridazinyl)ethyl (oxadiazolyl)methyl, (oxadiazolyl)propyl, (pyridinyl)methyl, (pyridinyl)ethyl, (oxadiazolyl)ethyl,
  (C$_3$-C$_8$)heterocycloalkyl-(C$_1$-C$_6$)alkyl, preferably (piperidinyl)methyl, (tetrazolyl)methyl, (morpholinyl)ethyl,
  heteroaryl(C$_1$-C$_6$)hydroxyalkyl-, preferably (oxadiazolyl)methanol,
  (C$_3$-C$_8$)cycloalkyl(C$_1$-C$_6$)alkyl-, preferably (cyclopropyl)methyl,
  aryl-(C$_1$-C$_4$)alkyl-, preferably (phenyl)methyl,
  (R$^A$R$^B$)N(C$_1$-C$_6$)alkylene-, preferably dimethylaminobuthyl, dimethylaminopropyl, each of said aryl, heteroaryl, cycloalkyl and heterocycloalkyl is optionally further substituted by one or more groups selected from
  (C$_1$-C$_3$)alkyl, preferably methyl and ethyl,
  trifluoromethyl,
  oxo,
  chlorine,
  R$^A$O—, wherein R$^A$ is selected from the group of trifluoroethyl, difluoroethyl, methyl and ethyl,
  (C$_3$-C$_8$)heterocycloalkyl-(C$_1$-C$_6$)alkyl-, preferably (piperidinyl)methyl,
  (C$_3$-C$_8$)heterocycloalkyl, preferably piperazinyl optionally further substituted by methyl,
  heteroaryl, preferably pyridinyl,
  —NHC(O)R$^C$, wherein R$^C$ is methyl,
  (R$^A$R$^B$)N—, wherein R$^A$ and R$^B$ are methyl,
  R$^C$O—, wherein R$^C$ is methyl,
  —C(O)N(R$^A$R$^B$); wherein R$^A$ is H and R$^B$ is methyl;
Y is selected from the group consisting of —OR$^D$, R$^C$SO$_2$, halo, —NHSO$_2$R$^C$, heteroaryl wherein any of such heteroaryl may be optionally substituted by one or more groups selected from (C$_1$-C$_3$)alkyl, CC(O)N(R$^A$R$^B$);
R$^D$ is (C$_1$-C$_6$)alkyl, preferably methyl;
J is selected from the group consisting of
  (C$_1$-C$_6$)alkyl, preferably methyl,
  OR$^C$ wherein R$^C$ is H or (C$_1$-C$_6$)alkyl, preferably methyl.

According to all the above specific embodiments, the invention refers to at least one compound as listed in the Table 2 below and pharmaceutical acceptable salts thereof.

TABLE 2

List of preferred compounds having Formula (I)

| Ex. N. | Structure | Chemical Name |
| --- | --- | --- |
| 1 |  | 6-(1-((6-(4-Fluorophenyl)-8-methoxyquinazolin-4-yl)amino)ethyl)pyridin-2(1H)-one |
| 2 |  | 6-(5-fluoropyridin-2-yl)-8-methoxy-N-(1-(3-methyl-1,2,4-oxadiazol-5-yl)ethyl)quinazolin-4-amine |

TABLE 2-continued

List of preferred compounds having Formula (I)

| Ex. N. | Structure | Chemical Name |
|---|---|---|
| 3 | | 6-(5-fluoropyrimidin-2-yl)-8-methoxy-N-(1-(3-methyl-1,2,4-oxadiazol-5-yl)ethyl)quinazolin-4-amine |
| 4 | | ((R)-6-(5-fluoropyrimidin-2-yl)-8-methoxy-N-(1-(6-methylpyridazin-3-yl)ethyl)quinazolin-4-amine |
| 5 | | (R)-8-methoxy-N-(1-(6-methylpyridazin-3-yl)ethyl)-6-(5-methylthiazol-2-yl)quinazolin-4-amine |
| 6 | | 8-methoxy-6-(5-methylpyrimidin-2-yl)-N-(1-(3-(pyridin-4-yl)-1,2,4-oxadiazol-5-yl)ethyl)quinazolin-4-amine |
| 7 | | 8-Methoxy-N-[(1R)-1-(5-methyl-1,2,4-oxadiazol-3-yl)ethyl]-6-[5-methylpyrimidin-2-yl)quinazolin-4-amine |

TABLE 2-continued

List of preferred compounds having Formula (I)

| Ex. N. | Structure | Chemical Name |
|---|---|---|
| 8 | | (R)-6-(4-fluorophenyl)-N-(1-(6-methylpyridazin-3-yl)ethyl)-8-(morpholinosulfonyl)quinazolin-4-amine |
| 9 | | ((R)-6-(4-fluorophenyl)-8-(morpholinosulfonyl)-N-(1-(2-(trifluoromethyl)pyrimidin-5-yl)ethyl)quinazolin-4-amine |
| 10 | | (Rac)-6-(4-fluorophenyl)-N-(1-(5-methyl-1,3,4-thiadiazol-2-yl)ethyl)-8-(morpholinosulfonyl)quinazolin-4-amine |
| 11 | | (R)-6-(4-fluorophenyl)-N,N-dimethyl-4-((1-(6-methylpyridazin-3-yl)ethyl)amino)quinazoline-8-sulfonamide |

TABLE 2-continued

List of preferred compounds having Formula (I)

| Ex. N. | Structure | Chemical Name |
|---|---|---|
| 12 | | 6-(4-fluorophenyl)-N,N-dimethyl-4-((1-(5-methyl-1,3,4-thiadiazol-2-yl)ethyl)amino)quinazoline-8-sulfonamide |
| 13 | | 6-(4-fluorophenyl)-N,N-dimethyl-4-((1-(5-methyl-1,2,4-oxadiazol-3-yl)ethyl)amino)quinazoline-8-sulfonamide |
| 19 | | (R)-6-(4-fluorophenyl)-N-methyl-4-((1-(6-methylpyridazin-3-yl)ethyl)amino)quinazoline-8-sulfonamide |
| 20 | | (R)-6-(4-fluorophenyl)-N-methyl-4-((1-(5-methyl-1,2,4-oxadiazol-3-yl)ethyl)amino)quinazoline-8-sulfonamide |
| 21 | | (6-(4-fluorophenyl)-N-methyl-4-((1-(5-methyl-1,3,4-thiadiazol-2-yl)ethyl)amino)quinazoline-8-sulfonamide |

TABLE 2-continued

List of preferred compounds having Formula (I)

| Ex. N. | Structure | Chemical Name |
|---|---|---|
| 22 | | (R)-6-(4-fluorophenyl)-N-(1-(6-methylpyridazin-3-yl)ethyl)-8-(piperazin-1-ylsulfonyl)quinazolin-4-amine |
| 23 | | (R)-6-(4-fluorophenyl)-N-(1-(5-methyl-1,2,4-oxadiazol-3-yl)ethyl)-8-(piperazin-1-ylsulfonyl)quinazolin-4-amine |
| 24 | | (R)-6-(4-fluorophenyl)-8-(pyridazin-4-yl)-N-(1-(2-(trifluoromethyl)pyrimidin-5-yl)ethyl)quinazolin-4-amine |
| 25 | | (R)-6-(4-fluorophenyl)-8-(pyrimidin-5-yl)-N-(1-(2-(trifluoromethyl)pyrimidin-5-yl)ethyl)quinazolin-4-amine |

TABLE 2-continued

List of preferred compounds having Formula (I)

| Ex. N. | Structure | Chemical Name |
| --- | --- | --- |
| 26 | | (R)-6-(4-fluorophenyl)-8-(tetrahydro-2H-pyran-4-yl)-N-(1-(2-(trifluoromethyl) pyrimidin-5-yl)ethyl)quinazolin-4-amine |
| 27 | | (R)-6-(4-fluorophenyl)-8-(1,2,3,6-tetrahydropyridin-4-yl)-N-(1-(2-(trifluoro-methyl)pyrimidin-5-yl)ethyl)quinazolin-4-amine |
| 28 | | single enantiomer 1 of N-[1-(6-methylpyridazin-3-yl)ethyl]-6-(5-methylpyrimidin-2-yl)-8-tetrahydropyran-4-yloxy-quinazolin-4-amine |
| 29 | | single enantiomer 2 of N-[1-(6-methylpyridazin-3-yl)ethyl]-6-(5-methylpyrimidin-2-yl)-8-tetrahydropyran-4-yloxy-quinazolin-4-amine |

TABLE 2-continued

List of preferred compounds having Formula (I)

| Ex. N. | Structure | Chemical Name |
| --- | --- | --- |
| 30 | | 6-(5-fluoro-2-pyridyl)-N-[(6-methylpyridazin-3-yl)methyl]-8-tetrahydropyran-4-yloxy-quinazolin-4-amine |
| 31 | | N-[(6-methylpyridazin-3-yl)methyl]-6-(5-methylpyrimidin-2-yl)-8-tetrahydropyran-4-yloxy-quinazolin-4-amine |
| 32 | | (R)-6-(1-methyl-1H-pyrazol-3-yl)-N-(1-(6-methylpyridazin-3-yl)ethyl)-8-((tetrahydro-2H-pyran-4-yl)oxy)quinazolin-4-amine |
| 33 | | (R)-6-(5-methylthiazol-2-yl)-N-(1-(pyridazin-3-yl)ethyl)-8-((tetrahydro-2H-pyran-4-yl)oxy)quinazolin-4-amine |

TABLE 2-continued

List of preferred compounds having Formula (I)

| Ex. N. | Structure | Chemical Name |
|---|---|---|
| 34 | 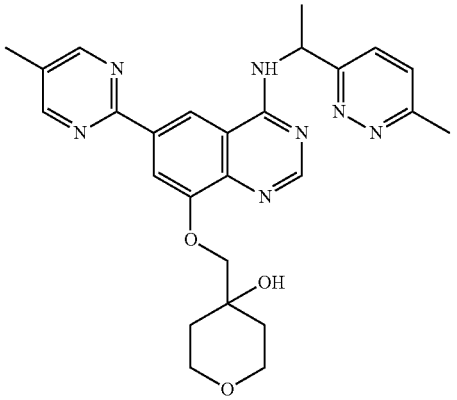 | 4-[[4-[1-(6-methylpyridazin-3-yl)ethylamino]-6-(5-methylpyrimidin-2-yl)quinazolin-8-yl]oxymethyl]tetrahydropyran-4-ol |
| 35 | 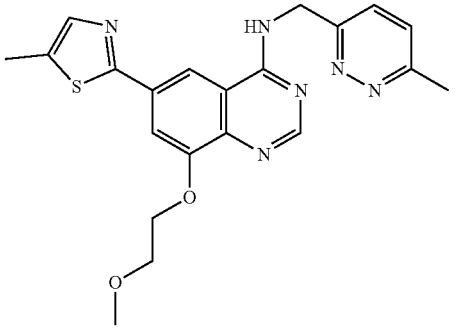 | 8-(2-methoxyethoxy)-N-((6-methylpyridazin-3-yl)methyl)-6-(5-methylthiazol-2-yl)quinazolin-4-amine |
| 36 | 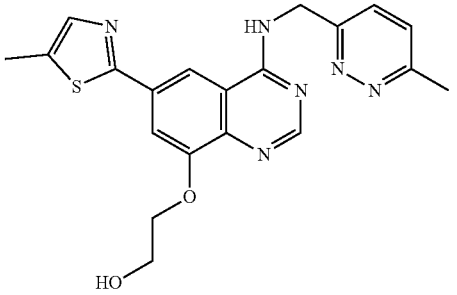 | 2-((4-(((6-methylpyridazin-3-yl)methyl)amino)-6-(5-methylthiazol-2-yl)quinazolin-8-yl)oxy)ethan-1-ol |
| 37 | 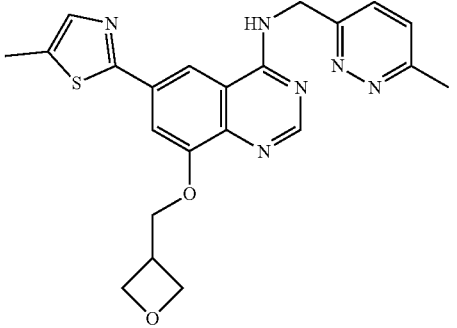 | N-((6-methylpyridazin-3-yl)methyl)-6-(5-methylthiazol-2-yl)-8-(oxetan-3-ylmethoxy)quinazolin-4-amine |

TABLE 2-continued

List of preferred compounds having Formula (I)

| Ex. N. | Structure | Chemical Name |
|---|---|---|
| 38 | | N-[(6-methylpyridazin-3-yl)methyl]-6-(5-methylthiazol-2-yl)-8-tetrahydropyran-4-yloxy-quinazolin-4-amine |
| 39 | | 8-(5-azaspiro[3.5]nonan-8-yloxy)-6-(4-fluorophenyl)-N-[(1R)-1-[2-(trifluoromethyl)pyrimidin-5-yl]ethyl]quinazolin-4-amine |
| 41 | | 8-((2-azabicyclo[2.2.1]heptan-5-yl)oxy)-6-(4-fluorophenyl)-N-((R)-1-(2-(trifluoromethyl)pyrimidin-5-yl)ethyl)quinazolin-4-amine |
| 44 | | (R)-2-((6-(4-fluorophenyl)-((1-(2-(trifluoromethyl)pyrimidin-5-yl)ethyl)amino)quinazolin-8-yl)oxy)acetic acid |

TABLE 2-continued

List of preferred compounds having Formula (I)

| Ex. N. | Structure | Chemical Name |
|---|---|---|
| 55 | 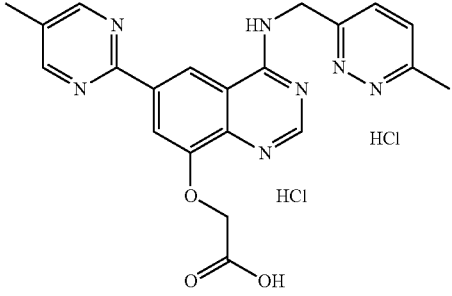 | 2-((4-(((6-methylpyridazin-3-yl)methyl)amino)-6-(5-methylpyrimidin-2-yl)quinazolin-8-yl)oxy)acetic acid dihydrochloride |
| 57 | 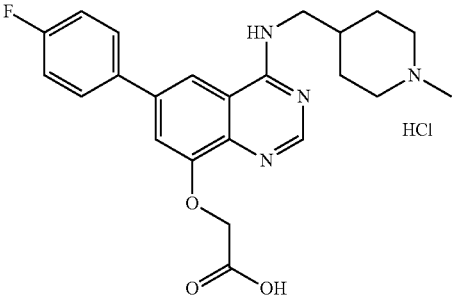 [SMILES: CN1CCC(CNc2ncnc3c(OCC(=O)O)cc(-c4ccc(F)cc4)cc23)CC1 ; Cl] | 2-((6-(4-fluorophenyl)-4-(((1-methylpiperidin-4-yl)methyl)amino)quinazolin-8-yl)oxy)acetic acid hydrochloride |
| 61 | 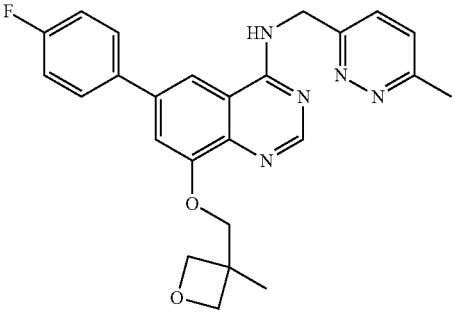 | 6-(4-fluorophenyl)-8-[(3-methyloxetan-3-yl)methoxy]-N-[(6-methylpyridazin-3-yl)methyl]quinazolin-4-amine |
| 67 | 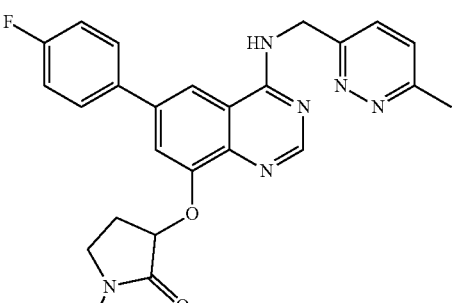 | 3-[6-(4-fluorophenyl)-4-[(6-methylpyridazin-3-yl)methylamino]quinazolin-8-yl]oxy-1-methyl-pyrrolidin-2-one |

TABLE 2-continued

List of preferred compounds having Formula (I)

| Ex. N. | Structure | Chemical Name |
|---|---|---|
| 72 | | 2-[6-(4-fluorophenyl)-4-[(6-methylpyridazin-3-yl)methylamino]quinazolin-8-yl]oxy-N-(2,2,2-trifluoroethyl)acetamide |
| 74 | | 6-(4-fluorophenyl)-N-((6-methylpyridazin-3-yl)methyl)-8-(oxetan-3-yloxy)quinazolin-4-amine |
| 81 | | N-[1-(5-methyl-1,3,4-thiadiazol-2-yl)ethyl]-6-(5-methylthiazol-2-yl)-8-tetrahydropyran-4-yloxy-quinazolin-4-amine |
| 82 | | 6-(5-fluoro-2-pyridyl)-N-[(1R)-1-(5-methyl-1,2,4-oxadiazol-3-yl)ethyl]-8-tetrahydropyran-4-yloxy-quinazolin-4-amine |

TABLE 2-continued

List of preferred compounds having Formula (I)

| Ex. N. | Structure | Chemical Name |
|---|---|---|
| 83 | | Single enantiomer 1 of 6-(5-methyl-2-pyridyl)-N-[1-(5-methyl-1,3,4-thiadiazol-2-yl)ethyl]-8-tetrahydropyran-4-yloxy-quinazolin-4-amine |
| 84 | | Single enantiomer 2 of 6-(5-methyl-2-pyridyl)-N-[1-(5-methyl-1,3,4-thiadiazol-2-yl)ethyl]-8-tetrahydropyran-4-yloxy-quinazolin-4-amine |
| 85 | | Single enantiomer 1 of 6-(5-fluoro-2-pyridyl)-N-[1-(3-methyl-1,2,4-oxadiazol-5-yl)ethyl]-8-tetrahydropyran-4-yloxy-quinazolin-4-amine |
| 94 | | 6-(4-fluorophenyl)-8-(2-methylpyrazol-3-yl)-N-[(6-methylpyridazin-3-yl)methyl]quinazolin-4-amine |
| 95 | | 6-(3-Chloro-1H-pyrazol-1-yl)-8-methoxy-N-(1-(2-(trifluoromethyl)pyrimidin-5-yl)ethyl)quinazolin-4-amine |

TABLE 2-continued

List of preferred compounds having Formula (I)

| Ex. N. | Structure | Chemical Name |
| --- | --- | --- |
| 96 | | 6-(3-chloro-1H-pyrazol-1-yl)-8-methoxy-N-(1-(6-methylpyridazin-3-yl)ethyl)quinazolin-4-amine |
| 97 | | (R)-6-(4-fluoro-1H-pyrazol-1-yl)-8-methoxy-N-(1-(2-(trifluoromethyl)pyrimidin-5-yl)ethyl)quinazolin-4-amine |
| 98 | | (R)-6-(4-fluoro-1H-pyrazol-1-yl)-8-methoxy-N-(1-(6-methylpyridazin-3-yl)ethyl)quinazolin-4-amine |
| 99 | | (R)-8-methoxy-6-(4-methyl-1H-pyrazol-1-yl)-N-(1-(6-methylpyridazin-3-yl)ethyl)quinazolin-4-amine |
| 100 | | (R)-6-(4-chloro-1H-pyrazol-1-yl)-8-methoxy-N-(1-(6-methylpyridazin-3-yl)ethyl)quinazolin-4-amine |

TABLE 2-continued

List of preferred compounds having Formula (I)

| Ex. N. | Structure | Chemical Name |
|---|---|---|
| 101 | | (R)-6-(3-fluoro-1H-pyrazol-1-yl)-8-methoxy-N-(1-(6-methylpyridazin-3-yl)ethyl)quinazolin-4-amine |
| 102 | | (R)-8-methoxy-6-(5-methyl-1H-pyrazol-1-yl)-N-(1-(6-methylpyridazin-3-yl)ethyl)quinazolin-4-amine |
| 103 | | (R)-8-methoxy-6-(3-methyl-1H-pyrazol-1-yl)-N-(1-(6-methylpyridazin-3-yl)ethyl)quinazolin-4-amine |
| 104 | | (R)-6-(4-chloro-1H-pyrazol-1-yl)-8-methoxy-N-(1-(2-(trifluoromethyl)pyrimidin-5-yl)ethyl)quinazolin-4-amine |
| 105 | | (8-methoxy-N-(1-(5-methyl-1,3,4-oxadiazol-2-yl)ethyl)-6-(1-methyl-1H-pyrazol-3-yl)quinazolin-4-amine |

TABLE 2-continued

List of preferred compounds having Formula (I)

| Ex. N. | Structure | Chemical Name |
| --- | --- | --- |
| 106 | | 8-methoxy-N-(1-(5-methyl-1,3,4-thiadiazol-2-yl)ethyl)-6-(5-methylthiazol-2-yl)quinazolin-4-amine |
| 107 | | 8-methoxy-N-(1-(5-methyl-1,2,4-oxadiazol-3-yl)ethyl)-6-(5-methylthiazol-2-yl)quinazolin-4-amine |
| 108 | | 6-(5-fluoropyrimidin-2-yl)-8-methoxy-N-(1-(5-methyl-1,2,4-oxadiazol-3-yl)ethyl)quinazolin-4-amine |
| 109 | | 6-(5-fluoropyrimidin-2-yl)-8-methoxy-N-(1-(5-methyl-1,3,4-thiadiazol-2-yl)ethyl)quinazolin-4-amine |
| 110 | | 6-(5-fluoropyrimidin-2-yl)-8-methoxy-N-(1-(5-methyl-1,3,4-oxadiazol-2-yl)ethyl)quinazolin-4-amine |

TABLE 2-continued

List of preferred compounds having Formula (I)

| Ex. N. | Structure | Chemical Name |
|---|---|---|
| 111 | | 8-methoxy-N-[(3-methylisoxazol-5-yl)methyl]-6-(5-methylthiazol-2-yl)quinazolin-4-amine |
| 112 | | 8-methoxy-6-(5-methylthiazol-2-yl)-N-[[3-(trifluoromethyl)-1,2,4-oxadiazol-5-yl]methyl]quinazolin-4-amine |
| 113 | | 8-methoxy-N-[(3-methyl-1,2,4-oxadiazol-5-yl)methyl]-6-(5-methylthiazol-2-yl)quinazolin-4-amine |
| 114 | | 8-methoxy-N-((5-methyl-1,3,4-thiadiazol-2-yl)methyl)-6-(5-methylthiazol-2-yl)quinazolin-4-amine |
| 115 | | 4-(((8-methoxy-6-(5-methylthiazol-2-yl)quinazolin-4-yl)amino)methyl)-1-methylpyridin-2(1H)-one |
| 116 | | 8-methoxy-6-(5-methylthiazol-2-yl)-N-((5-(trifluoromethyl)pyridin-2-yl)methyl)quinazolin-4-amine |

TABLE 2-continued

List of preferred compounds having Formula (I)

| Ex. N. | Structure | Chemical Name |
|---|---|---|
| 117 | | N-((5-chloropyridin-2-yl)methyl)-8-methoxy-6-(5-methylthiazol-2-yl)quinazolin-4-amine |
| 118 | | N-((3,5-difluoropyridin-2-yl)methyl)-8-methoxy-6-(5-methylthiazol-2-yl)quinazolin-4-amine |
| 119 | | N-((5-fluoropyridin-2-yl)methyl)-8-methoxy-6-(5-methylthiazol-2-yl)quinazolin-4-amine |
| 120 | | Single enantiomers of 8-methoxy-6-(5-methylpyrimidin-2-yl)-N-[1-[6-(trifluoromethyl)pyridazin-3-yl]ethyl]quinazolin-4-amine |
| 121 | | Single enantiomers of 8-methoxy-6-(5-methylpyrimidin-2-yl)-N-[1-[6-(trifluoromethyl)pyridazin-3-yl]ethyl]quinazolin-4-amine |

TABLE 2-continued

List of preferred compounds having Formula (I)

| Ex. N. | Structure | Chemical Name |
|---|---|---|
| 122 | | Single enantiomer 1 of 8-Methoxy-N-[1-(3-methyl-1,2,4-oxadiazol-5-yl)ethyl]-6-(5-methylpyrimidin-2-yl)quinazolin-4-amine |
| 123 | | Single enantiomer 2 of 8-Methoxy-N-[1-(3-methyl-1,2,4-oxadiazol-5-yl)ethyl]-6-(5-methylpyrimidin-2-yl)quinazolin-4-amine |
| 124 | | Single enantiomer 1 of 8-Methoxy-6-(5-methylpyrimidin-2-yl)-N-[1-(5-methyl-1,3,4-thiadiazol-2-yl)ethyl]quinazolin-4-amine |
| 125 | | Single enantiomer 2 of 8-Methoxy-6-(5-methylpyrimidin-2-yl)-N-[1-(5-methyl-1,3,4-thiadiazol-2-yl)ethyl]quinazolin-4-amine |
| 126 | | Single enantiomer 1 of 8-methoxy-6-(5-methyl-2-pyridyl)-N-[1-(5-methyl-1,3,4-thiadiazol-2-yl)ethyl]quinazolin-4-amine |

TABLE 2-continued

List of preferred compounds having Formula (I)

| Ex. N. | Structure | Chemical Name |
|---|---|---|
| 127 | | Single enantiomer 2 of 8-methoxy-6-(5-methyl-2-pyridyl)-N-[1-(5-methyl-1,3,4-thiadiazol-2-yl)ethyl]quinazolin-4-amine |
| 128 | | Single enantiomer 1 of 8-methoxy-N-[(1R)-1-(5-methyl-1,3,4-oxadiazol-2-yl)ethyl]-6-(5-methylpyrimidin-2-yl)quinazolin-4-amine |
| 129 | | Single enantiomer 2 of 8-methoxy-N-[(1R)-1-(5-methyl-1,3,4-oxadiazol-2-yl)ethyl]-6-(5-methylpyrimidin-2-yl)quinazolin-4-amine |
| 132 | | 6-(5-Fluoropyridin-2-yl)-8-methoxy-N-((5-methyl-1,2,4-oxadiazol-3-yl)methyl)quinazolin-4-amine |
| 133 | | 6-(5-fluoropyridin-2-yl)-8-methoxy-N-((3-methyl-1,2,4-oxadiazol-5-yl)methyl)quinazolin-4-amine |
| 134 | | 6-(5-fluoropyridin-2-yl)-8-methoxy-N-((5-methyl-1,3,4-oxadiazol-2-yl)methyl)quinazolin-4-amine |

TABLE 2-continued

List of preferred compounds having Formula (I)

| Ex. N. | Structure | Chemical Name |
|---|---|---|
| 135 | | 6-(5-fluoropyridin-2-yl)-8-methoxy-N-((3-methylisoxazol-5-yl)methyl)quinazolin-4-amine |
| 136 | | 8-methoxy-N-((5-methyl-1,2,4-oxadiazol-3-yl)methyl)-6-(5-methylpyridin-2-yl)quinazolin-4-amine |
| 137 | | 8-methoxy-N-((3-methylisoxazol-5-yl)methyl)-6-(5-methylpyridin-2-yl)quinazolin-4-amine |
| 138 | | 6-(5-fluoro-2-pyridyl)-8-methoxy-N-[(5-methylisoxazol-3-yl)methyl]quinazolin-4-amine |
| 139 | | 8-methoxy-N-[(5-methylisoxazol-3-yl)methyl]-6-(5-methyl-2-pyridyl)quinazolin-4-amine |
| 140 | | 6-(5-fluoro-2-pyridyl)-8-methoxy-N-[(1-methylpyrazol-3-yl)methyl]quinazolin-4-amine |

TABLE 2-continued

List of preferred compounds having Formula (I)

| Ex. N. | Structure | Chemical Name |
|---|---|---|
| 141 | | 8-methoxy-N-[(1-methylpyrazol-3-yl)methyl]-6-(5-methyl-2-pyridyl)quinazolin-4-amine |
| 142 | | 8-methoxy-N-[(3-methyl-1,2,4-oxadiazol-5-yl)methyl]-6-(5-methyl-2-pyridyl)quinazolin-4-amine |
| 143 | | 8-methoxy-N-[(5-methyl-1,3,4-oxadiazol-2-yl)methyl]-6-(5-methyl-2-pyridyl)quinazolin-4-amine |
| 144 | | 8-methoxy-6-(5-methylpyrimidin-2-yl)-N-[[3-(trifluoromethyl)-1,2,4-oxadiazol-5-yl]methyl]quinazolin-4-amine |
| 145 | | 8-methoxy-6-(5-methylpyrimidin-2-yl)-N-[[2-(trifluoromethyl)pyrimidin-5-yl]methyl]quinazolin-4-amine |
| 146 | | 6-(5-fluoropyridin-2-yl)-8-methoxy-N-((2-(trifluoromethyl)pyrimidin-5-yl)methyl)quinazolin-4-amine |

TABLE 2-continued

List of preferred compounds having Formula (I)

| Ex. N. | Structure | Chemical Name |
|---|---|---|
| 147 | | 4-(((6-(5-fluoropyridin-2-yl)-8-methoxyquinazolin-4-yl)amino)methyl)-1-methylpyridin-2(1H)-one |
| 148 | | 4-(((6-(5-fluoropyridin-2-yl)-8-methoxyquinazolin-4-yl)amino)methyl)pyridin-2(1H)-one |
| 149 | | 6-(5-fluoropyridin-2-yl)-8-methoxy-N-((6-methylpyridin-3-yl)methyl)quinazolin-4-amine |
| 150 | | 6-(5-fluoropyridin-2-yl)-8-methoxy-N-((6-(trifluoromethyl)pyridin-3-yl)methyl)quinazolin-4-amineamine |
| 151 | | 4-(((8-methoxy-6-(5-methylpyrimidin-2-yl)quinazolin-4-yl)amino)methyl)-1-methylpyridin-2(1H)-one |
| 152 | | 6-(((8-methoxy-6-(5-methylpyrimidin-2-yl)quinazolin-4-yl)amino)methyl)pyridin-2(1H)-one |

TABLE 2-continued

List of preferred compounds having Formula (I)

| Ex. N. | Structure | Chemical Name |
|---|---|---|
| 153 | | 8-methoxy-N-((5-methyl-1,3,4-thiadiazol-2-yl)methyl)-6-(5-methylpyrimidin-2-yl)quinazolin-4-amine |
| 154 | | 8-methoxy-N-((6-methylpyridin-3-yl)methyl)-6-(5-methylpyrimidin-2-yl)quinazolin-4-amine |
| 155 | | 6-(5-fluoropyridin-2-yl)-8-methoxy-N-((6-(trifluoromethyl)pyridin-3-yl)methyl)quinazolin-4-amineamine |
| 156 | | 8-Methoxy-N-((3-methyl-1,2,4-oxadiazol-5-yl)methyl)-6-(5-methylpyrimidin-2-yl)quinazolin-4-amine |
| 157 | | 6-(3-fluoro-5-methyl-2-pyridyl)-8-methoxy-N-[(1R)-1-(5-methyl-1,2,4-oxadiazol-3-yl)ethyl] quinazolin-4-amine |
| 158 | | 6-(5-fluoro-2-pyridyl)-8-methoxy-N-[(1R)-1-(1-methylpyrazol-3-yl)ethyl]quinazolin-4-amine |

TABLE 2-continued

| List of preferred compounds having Formula (I) | | |
|---|---|---|
| Ex. N. | Structure | Chemical Name |
| 159 | | 8-methoxy-N-[(1R)-1-(1-methylpyrazol-3-yl)ethyl]-6-(5-methyl-2-pyridyl)quinazolin-4-amine |
| 160 | | 2-((8-methoxy-6-(5-methylpyrimidin-2-yl)quinazolin-4-yl)amino)-1-morpholinoethan-1-one |
| 161 | | 6-(4-Fluorophenyl)-N-[(5-fluoro-2-pyridyl)methyl]-8-methoxy-quinazolin-4-amine |
| 162 | | Single enantiomer 1 of 8-Methoxy-N-[1-(3-methyl-1,2,4-oxadiazol-5-yl)ethyl]-6-(5-methyl-2-pyridyl)quinazolin-4-amine |
| 163 | | Single enantiomer 2 of 8-Methoxy-N-[1-(3-methyl-1,2,4-oxadiazol-5-yl)ethyl]-6-(5-methyl-2-pyridyl)quinazolin-4-amine |

TABLE 2-continued

List of preferred compounds having Formula (I)

| Ex. N. | Structure | Chemical Name |
|---|---|---|
| 164 | | Single enantiomer 1 of 8-methoxy-N-(1-(5-methyl-1,3,4-thiadiazol-2-yl)ethyl)-6-(5-methylthiazol-2-yl)quinazolin-4-amine |
| 165 | | Single enantiomer 2 of 8-methoxy-N-(1-(5-methyl-1,3,4-thiadiazol-2-yl)ethyl)-6-(5-methylthiazol-2-yl)quinazolin-4-amine |
| 166 | | Single enantiomer 2 of 2-((8-methoxy-6-(5-methylpyrimidin-2-yl)quinazolin-4-yl)amino)-2-(3-methyl-1,2,4-oxadiazol-5-yl)ethan-1-ol |
| 167 | | Single enantiomer 1 of 8-methoxy-6-(5-methylpyrimidin-2-yl)-N-(1-(3-(pyridin-4-yl)-1,2,4-oxadiazol-5-yl)ethyl)quinazolin-4-amine |
| 168 | | Single enantiomer 2 of 8-methoxy-6-(5-methylpyrimidin-2-yl)-N-(1-(3-(pyridin-4-yl)-1,2,4-oxadiazol-5-yl)ethyl)quinazolin-4-amine |

TABLE 2-continued

List of preferred compounds having Formula (I)

| Ex. N. | Structure | Chemical Name |
|---|---|---|
| 169 | 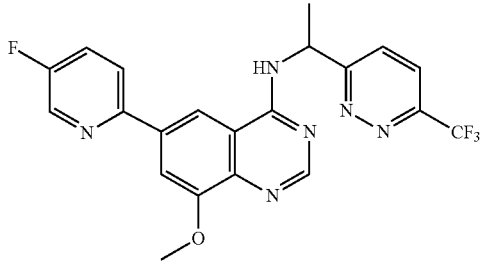 [SMILES: COc1cc(-c2ccc(F)cn2)cc2c(NC(C)c3ccc(C(F)(F)F)nn3)ncnc12] | Single enantiomer 1 of 6-(5-fluoro-2-pyridyl)-8-methoxy-N-[1-[6-(trifluoromethyl)pyridazin-3-yl]ethyl]quinazolin-4-amine |
| 170 | 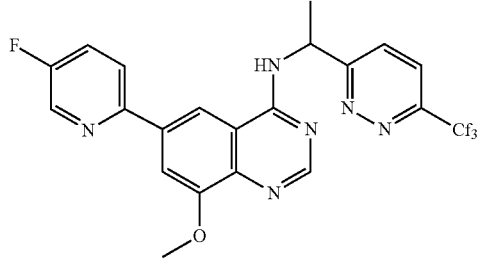 | Single enantiomer 2 of 6-(5-fluoro-2-pyridyl)-8-methoxy-N-[1-[6-(trifluoromethyl)pyridazin-3-yl]ethyl]quinazolin-4-amine |
| 171 | 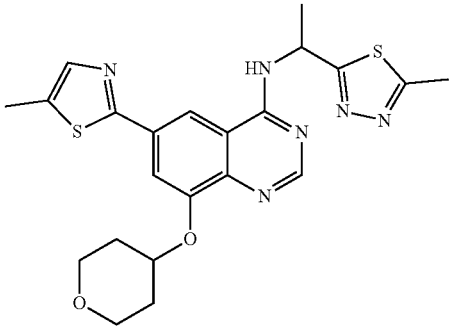 | Single enantiomer 1 of N-[1-(5-methyl-1,3,4-thiadiazol-2-yl)ethyl]-6-(5-methylthiazol-2-yl)-8-tetrahydropyran-4-yloxy-quinazolin-4-amine |
| 172 | 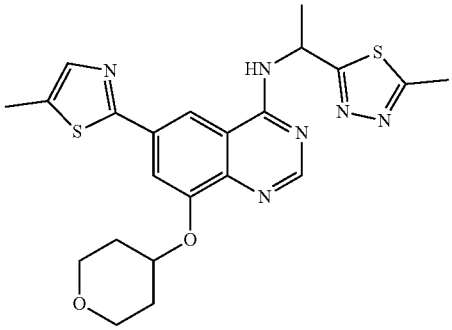 | Single enantiomer 2 of N-[1-(5-methyl-1,3,4-thiadiazol-2-yl)ethyl]-6-(5-methylthiazol-2-yl)-8-tetrahydropyran-4-yloxy-quinazolin-4-amine |
| 173 | 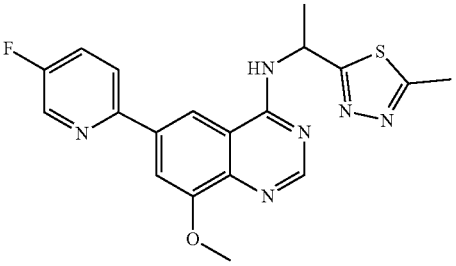 [SMILES: COc1cc(-c2ccc(F)cn2)cc2c(NC(C)c3nnc(C)s3)ncnc12] | Single enantiomer 1 of 6-(5-fluoropyridin-2-yl)-8-methoxy-N-(1-(5-methyl-1,3,4-thiadiazol-2-yl)ethyl)quinazolin-4-amine |

TABLE 2-continued

List of preferred compounds having Formula (I)

| Ex. N. | Structure | Chemical Name |
|---|---|---|
| 174 | | Single enantiomer 2 of 6-(5-fluoropyridin-2-yl)-8-methoxy-N-(1-(5-methyl-1,3,4-thiadiazol-2-yl)ethyl)quinazolin-4-amine |
| 175 | | Single enantiomer 1 of 6-(5-fluoropyridin-2-yl)-8-methoxy-N-(1-(3-methyl-1,2,4-oxadiazol-5-yl)ethyl)quinazolin-4-amine |
| 176 | | Single enantiomer 2 of 6-(5-fluoropyridin-2-yl)-8-methoxy-N-(1-(3-methyl-1,2,4-oxadiazol-5-yl)ethyl)quinazolin-4-amine |
| 185 | | 6-(4-fluorophenyl)-8-methoxy-N-[(1S)-1-[2-(trifluoromethyl)pyrimidin-5-yl]ethyl]quinazolin-4-amine formate |
| 188 | | 6-(3,6-Dihydro-2H-pyran-4-yl)-8-methoxy-N-((6-methylpyridazin-3-yl)methyl)quinazolin-4-amine |

TABLE 2-continued

List of preferred compounds having Formula (I)

| Ex. N. | Structure | Chemical Name |
|---|---|---|
| 190 | | Single enantiomer 1 of 6-(1-((6-(4-Fluorophenyl)-8-methoxyquinazolin-4-yl)amino)ethyl)pyridin-2(1H)-one |
| 191 | | Single enantiomer 2 of 6-(1-((6-(4-Fluorophenyl)-8-methoxyquinazolin-4-yl)amino)ethyl)pyridin-2(1H)-one |
| 192 | | Single enantiomer 1 of 6-(4-fluorophenyl)-8-methoxy-N-(1-(3-(pyridin-4-yl)-1,2,4-oxadiazol-5-yl)ethyl)quinazolin-4-amine |
| 193 | | Single enantiomer 2 of 6-(4-fluorophenyl)-8-methoxy-N-(1-(3-(pyridin-4-yl)-1,2,4-oxadiazol-5-yl)ethyl)quinazolin-4-amine |

In a further preferred embodiment, the invention is addressed to compound of formula (I) wherein
Z is aryl, wherein any of such aryl may be optionally substituted by one or more groups selected from ($C_1$-$C_3$)alkyl, halo, CN,
$R_1$ is H;
$R_2$ is selected from the group consisting of heteroaryl($C_1$-$C_4$)alkyl-, ($C_3$-$C_8$)heterocycloalkyl-($C_1$-$C_6$)alkyl, ($C_3$-$C_8$)heterocycloalkyl, ($C_3$-$C_8$)cycloalkyl-($C_1$-$C_6$)alkyl-, wherein any of such alkyl, heteroaryl may be optionally substituted by one or more groups selected from ($C_1$-$C_3$)alkyl, ($C_1$-$C_6$)haloalkyl, oxo, $R^AO$—, aryl, ($R^AR^B$)N— and halo;
$R^A$ and $R^B$ are at each occurrence independently H or selected from the group consisting of ($C_1$-$C_4$)alkyl-, ($C_1$-$C_6$) haloalkyl;
Y is selected from the group consisting of —$OR^D$, $R^CSO_2$, halo and —$NHSO_2R^C$, heteroaryl, heterocycloalkyl, wherein any of such heteroaryl may be optionally substituted by one or more groups selected from ($C_1$-$C_3$)alkyl, —C(O)N($R^AR^B$);
J is H or selected from the group consisting of $OR^C$;
$R^C$ is H, or selected form the group consisting of ($C_1$-$C_6$) alkyl, ($R^AR^B$)N—;
$R^D$ is H or ($C_1$-$C_6$)alkyl.

According to a preferred embodiment, the invention refers to at least one compound of Table 3 selected from:

TABLE 3

List of preferred compounds having Formula (I)

| Ex. N. | Chemical Name |
|---|---|
| Example 1 | 6-(1-((6-(4-Fluorophenyl)-8-methoxyquinazolin-4-yl)amino)ethyl)pyridin-2(1H)-one |

TABLE 3-continued

List of preferred compounds having Formula (I)

| Ex. N. | Chemical Name |
|---|---|
| Example 11 | (R)-6-(4-fluorophenyl)-N,N-dimethyl-4-((1-(6-methylpyridazin-3-yl)ethyl)amino)quinazoline-8-sulfonamide |
| Example 12 | 6-(4-fluorophenyl)-N,N-dimethyl-4-((1-(5-methyl-1,3,4-thiadiazol-2-yl)ethyl)amino)quinazoline-8-sulfonamide |
| Example 13 | 6-(4-fluorophenyl)-N,N-dimethyl-4-((1-(5-methyl-1,2,4-oxadiazol-3-yl)ethyl)amino)quinazoline-8-sulfonamide |
| Example 19 | (R)-6-(4-fluorophenyl)-N-methyl-4-((1-(6-methylpyridazin-3-yl)ethyl)amino)quinazoline-8-sulfonamide |
| Example 20 | (R)-6-(4-fluorophenyl)-N-methyl-4-((1-(5-methyl-1,2,4-oxadiazol-3-yl)ethyl)amino)quinazoline-8-sulfonamide |
| Example 21 | (6-(4-fluorophenyl)-N-methyl-4-((1-(5-methyl-1,3,4-thiadiazol-2-yl)ethyl)amino)quinazoline-8-sulfonamide |
| Example 24 | (R)-6-(4-fluorophenyl)-8-(pyridazin-4-yl)-N-(1-(2-(trifluoromethyl)pyrimidin-5-yl)ethyl)quinazolin-4-amine |
| Example 25 | (R)-6-(4-fluorophenyl)-8-(pyrimidin-5-yl)-N-(1-(2-(trifluoromethyl)pyrimidin-5-yl)ethyl)quinazolin-4-amine |
| Example 26 | (R)-6-(4-fluorophenyl)-8-(tetrahydro-2H-pyran-4-yl)-N-(1-(2-(trifluoromethyl) pyrimidin-5-yl)ethyl)quinazolin-4-amine |
| Example 27 | (R)-6-(4-fluorophenyl)-8-(1,2,3,6-tetrahydropyridin-4-yl)-N-(1-(2-(trifluoro-methyl)pyrimidin-5-yl)ethyl)quinazolin-4-amine |
| Example 94 | 6-(4-fluorophenyl)-8-(2-methylpyrazol-3-yl)-N-[(6-methylpyridazin-3-yl)methyl]quinazolin-4-amine |
| Example 190 | Single enantiomer 1 of 6-(1-((6-(4-Fluorophenyl)-8-methoxyquinazolin-4-yl)amino)ethyl)pyridin-2(1H)-one |
| Example 191 | Single enantiomer 2 of 6-(1-((6-(4-Fluorophenyl)-8-methoxyquinazolin-4-yl)amino)ethyl)pyridin-2(1H)-one |

In a further preferred embodiment, the invention is addressed to compound of formula (I) wherein Z is heteroaryl wherein any of such heteroaryl may be optionally substituted by one or more groups selected from $(C_1$-$C_3)$alkyl, halo, CN, $(C_1$-$C_6)$haloalkyl;
R1 is H;
$R_2$ is selected from the group consisting of heteroaryl$(C_1$-$C_4)$alkyl-, wherein any of such alkyl, heteroaryl may be optionally substituted by one or more groups selected from $(C_1$-$C_3)$alkyl, $(C_1$-$C_6)$haloalkyl and -oxo;
Y is $OR^D$;
J is H;
$R^D$ is $(C_1$-$C_6)$alkyl.

According to a preferred embodiment, the invention refers to at least one compound of Table 4, selected from:

TABLE 4

List of preferred compounds having Formula (I)

| Ex. N. | Chemical Name |
|---|---|
| Example 2 | 6-(5-fluoropyridin-2-yl)-8-methoxy-N-(1-(3-methyl-1,2,4-oxadiazol-5-yl)ethyl)quinazolin-4-amine |
| Example 3 | 6-(5-fluoropyrimidin-2-yl)-8-methoxy-N-(1-(3-methyl-1,2,4-oxadiazol-5-yl)ethyl)quinazolin-4-amine |
| Example 4 | ((R)-6-(5-fluoropyrimidin-2-yl)-8-methoxy-N-(1-(6-methylpyridazin-3-yl)ethyl)quinazolin-4-amine |
| Example 5 | (R)-8-methoxy-N-(1-(6-methylpyridazin-3-yl)ethyl)-6-(5-methylthiazol-2-yl)quinazolin-4-amine |
| Example 7 | 8-Methoxy-N-[(1R)-1-(5-methyl-1,2,4-oxadiazol-3-yl)ethyl]-6-(5-methylpyrimidin-2-yl)quinazolin-4-amine |
| Example 95 | 6-(3-Chloro-1H-pyrazol-1-yl)-8-methoxy-N-(1-(2-(trifluoromethyl)pyrimidin-5-yl)ethyl)quinazolin-4-amine |
| Example 96 | 6-(3-chloro-1H-pyrazol-1-yl)-8-methoxy-N-(1-(6-methylpyridazin-3-yl)ethyl)quinazolin-4-amine |
| Example 97 | (R)-6-(4-fluoro-1H-pyrazol-1-yl)-8-methoxy-N-(1-(2-(trifluoromethyl)pyrimidin-5-yl)ethyl)quinazolin-4-amine |
| Example 98 | (R)-6-(4-fluoro-1H-pyrazol-1-yl)-8-methoxy-N-(1-(6-methylpyridazin-3-yl)ethyl)quinazolin-4-amine |
| Example 99 | (R)-8-methoxy-6-(4-methyl-1H-pyrazol-1-yl)-N-(1-(6-methylpyridazin-3-yl)ethyl)quinazolin-4-amine |
| Example 100 | (R)-6-(4-chloro-1H-pyrazol-1-yl)-8-methoxy-N-(1-(6-methylpyridazin-3-yl)ethyl)quinazolin-4-amine |
| Example 101 | (R)-6-(3-fluoro-1H-pyrazol-1-yl)-8-methoxy-N-(1-(6-methylpyridazin-3-yl)ethyl)quinazolin-4-amine |
| Example 102 | (R)-8-methoxy-6-(5-methyl-1H-pyrazol-1-yl)-N-(1-(6-methylpyridazin-3-yl)ethyl)quinazolin-4-amine |
| Example 103 | (R)-8-methoxy-6-(3-methyl-1H-pyrazol-1-yl)-N-(1-(6-methylpyridazin-3-yl)ethyl)quinazolin-4-amine |
| Example 104 | (R)-6-(4-chloro-1H-pyrazol-1-yl)-8-methoxy-N-(1-(2-(trifluoromethyl)pyrimidin-5-yl)ethyl)quinazolin-4-amine |
| Example 105 | (8-methoxy-N-(1-(5-methyl-1,3,4-oxadiazol-2-yl)ethyl)-6-(1-methyl-1H-pyrazol-3-yl)quinazolin-4-amine |
| Example 106 | 8-methoxy-N-(1-(5-methyl-1,3,4-thiadiazol-2-yl)ethyl)-6-(5-methylthiazol-2-yl)quinazolin-4-amine |
| Example 107 | 8-methoxy-N-(1-(5-methyl-1,2,4-oxadiazol-3-yl)ethyl)-6-(5-methylthiazol-2-yl)quinazolin-4-amine |
| Example 108 | 6-(5-fluoropyrimidin-2-yl)-8-methoxy-N-(1-(5-methyl-1,2,4-oxadiazol-3-yl)ethyl)quinazolin-4-amine |
| Example 109 | 6-(5-fluoropyrimidin-2-yl)-8-methoxy-N-(1-(5-methyl-1,3,4-thiadiazol-2-yl)ethyl)quinazolin-4-amine |
| Example 110 | 6-(5-fluoropyrimidin-2-yl)-8-methoxy-N-(1-(5-methyl-1,3,4-oxadiazol-2-yl)ethyl)quinazolin-4-amine |
| Example 111 | 8-methoxy-N-[(3-methylisoxazol-5-yl)methyl]-6-(5-methylthiazol-2-yl)quinazolin-4-amine |
| Example 112 | 8-methoxy-6-(5-methylthiazol-2-yl)-N-[[3-(trifluoromethyl)-1,2,4-oxadiazol-5-yl]methyl]quinazolin-4-amine |
| Example 113 | 8-methoxy-N-[(3-methyl-1,2,4-oxadiazol-5-yl)methyl]-6-(5-methylthiazol-2-yl)quinazolin-4-amine |
| Example 114 | 8-methoxy-N-((5-methyl-1,3,4-thiadiazol-2-yl)methyl)-6-(5-methylthiazol-2-yl)quinazolin-4-amine |
| Example 115 | 4-(((8-methoxy-6-(5-methylthiazol-2-yl)quinazolin-4-yl)amino)methyl)-1-methylpyridin-2(1H)-one |
| Example 116 | 8-methoxy-6-(5-methylthiazol-2-yl)-N-((5-(trifluoromethyl)pyridin-2-yl)methyl)quinazolin-4-amine |
| Example 117 | N-((5-chloropyridin-2-yl)methyl)-8-methoxy-6-(5-methylthiazol-2-yl)quinazolin-4-amine |
| Example 118 | N-((3,5-difluoropyridin-2-yl)methyl)-8-methoxy-6-(5-methylthiazol-2-yl)quinazolin-4-amine |
| Example 119 | N-((5-fluoropyridin-2-yl)methyl)-8-methoxy-6-(5-methylthiazol-2-yl)quinazolin-4-amine |
| Example 120 | Single enantiomers of 8-methoxy-6-(5-methylpyrimidin-2-yl)-N-[1-[6-(trifluoromethyl)pyridazin-3-yl]ethyl]quinazolin-4-amine |
| Example 121 | Single enantiomers of 8-methoxy-6-(5-methylpyrimidin-2-yl)-N-[1-[6-(trifluoromethyl)pyridazin-3-yl]ethyl]quinazolin-4-amine |
| Example 122 | Single enantiomer 1 of 8-Methoxy-N-[1-(3-methyl-1,2,4-oxadiazol-5-yl)ethyl]-6-(5-methylpyrimidin-2-yl)quinazolin-4-amine |
| Example 123 | Single enantiomer 2 of 8-Methoxy-N-[1-(3-methyl-1,2,4-oxadiazol-5-yl)ethyl]-6-(5-methylpyrimidin-2-yl)quinazolin-4-amine |
| Example 124 | Single enantiomer 1 of 8-Methoxy-6-(5-methylpyrimidin-2-yl)-N-[1-(5-methyl-1,3,4-thiadiazol-2-yl)ethyl]quinazolin-4-amine |
| Example 125 | Single enantiomer 2 of 8-Methoxy-6-(5-methylpyrimidin-2-yl)-N-[1-(5-methyl-1,3,4-thiadiazol-2-yl)ethyl]quinazolin-4-amine |
| Example 126 | Single enantiomer 1 of 8-methoxy-6-(5-methyl-2-pyridyl)-N-[1-(5-methyl-1,3,4-thiadiazol-2-yl)ethyl]quinazolin-4-amine |
| Example 127 | Single enantiomer 2 of 8-methoxy-6-(5-methyl-2-pyridyl)-N-[1-(5-methyl-1,3,4-thiadiazol-2-yl)ethyl]quinazolin-4-amine |
| Example 128 | Single enantiomer 1 of 8-methoxy-N-[(1R)-1-(5-methyl-1,3,4-oxadiazol-2-yl)ethyl]-6-(5-methylpyrimidin-2-yl)quinazolin-4-amine |
| Example 129 | Single enantiomer 2 of 8-methoxy-N-[(1R)-1-(5-methyl-1,3,4-oxadiazol-2-yl)ethyl]-6-(5-methylpyrimidin-2-yl)quinazolin-4-amine |
| Example 132 | 6-(5-Fluoropyridin-2-yl)-8-methoxy-N-((5-methyl-1,2,4-oxadiazol-3-yl)methyl)quinazolin-4-amine |

TABLE 4-continued

List of preferred compounds having Formula (I)

| Ex. N. | Chemical Name |
|---|---|
| Example 133 | 6-(5-fluoropyridin-2-yl)-8-methoxy-N-((3-methyl-1,2,4-oxadiazol-5-yl)methyl)quinazolin-4-amine |
| Example 134 | 6-(5-fluoropyridin-2-yl)-8-methoxy-N-((5-methyl-1,3,4-oxadiazol-2-yl)methyl)quinazolin-4-amine |
| Example 135 | 6-(5-fluoropyridin-2-yl)-8-methoxy-N-((3-methylisoxazol-5-yl)methyl)quinazolin-4-amine |
| Example 136 | 8-methoxy-N-((5-methyl-1,2,4-oxadiazol-3-yl)methyl)-6-(5-methylpyridin-2-yl)quinazolin-4-amine |
| Example 137 | 8-methoxy-N-((3-methylisoxazol-5-yl)methyl)-6-(5-methylpyridin-2-yl)quinazolin-4-amine |
| Example 138 | 6-(5-fluoro-2-pyridyl)-8-methoxy-N-[(5-methylisoxazol-3-yl)methyl]quinazolin-4-amine |
| Example 139 | 8-methoxy-N-[(5-methylisoxazol-3-yl)methyl]-6-(5-methyl-2-pyridyl)quinazolin-4-amine |
| Example 140 | 6-(5-fluoro-2-pyridyl)-8-methoxy-N-[(1-methylpyrazol-3-yl)methyl]quinazolin-4-amine |
| Example 141 | 8-methoxy-N-[(1-methylpyrazol-3-yl)methyl]-6-(5-methyl-2-pyridyl)quinazolin-4-amine |
| Example 142 | 8-methoxy-N-[(3-methyl-1,2,4-oxadiazol-5-yl)methyl]-6-(5-methyl-2-pyridyl)quinazolin-4-amine |
| Example 143 | 8-methoxy-N-[(5-methyl-1,3,4-oxadiazol-2-yl)methyl]-6-(5-methyl-2-pyridyl)quinazolin-4-amine |
| Example 144 | 8-methoxy-6-(5-methylpyrimidin-2-yl)-N-[[3-(trifluoromethyl)-1,2,4-oxadiazol-5-yl]methyl]quinazolin-4-amine |
| Example 145 | 8-methoxy-6-(5-methylpyrimidin-2-yl)-N-[[2-(trifluoromethyl)pyrimidin-5-yl]methyl]quinazolin-4-amine |
| Example 146 | 6-(5-fluoropyridin-2-yl)-8-methoxy-N-((2-(trifluoromethyl)pyrimidin-5-yl)methyl)quinazolin-4-amine |
| Example 147 | 4-(((6-(5-fluoropyridin-2-yl)-8-methoxyquinazolin-4-yl)amino)methyl)-1-methylpyridin-2(1H)-one |
| Example 148 | 4-(((6-(5-fluoropyridin-2-yl)-8-methoxyquinazolin-4-yl)amino)methyl)pyridin-2(1H)-one |
| Example 149 | 6-(5-fluoropyridin-2-yl)-8-methoxy-N-((6-methylpyridin-3-yl)methyl)quinazolin-4-amine |
| Example 150 | 6-(5-fluoropyridin-2-yl)-8-methoxy-N-((6-(trifluoromethyl)pyridin-3-yl)methyl)quinazolin-4-amineamine |
| Example 151 | 4-(((8-methoxy-6-(5-methylpyrimidin-2-yl)quinazolin-4-yl)amino)methyl)-1-methylpyridin-2(1H)-one |
| Example 152 | 6-(((8-methoxy-6-(5-methylpyrimidin-2-yl)quinazolin-4-yl)amino)methyl)pyridin-2(1H)-one |
| Example 153 | 8-methoxy-N-((5-methyl-1,3,4-thiadiazol-2-yl)methyl)-6-(5-methylpyrimidin-2-yl)quinazolin-4-amine |
| Example 154 | 8-methoxy-N-((6-methylpyridin-3-yl)methyl)-6-(5-methylpyrimidin-2-yl)quinazolin-4-amine |
| Example 155 | 6-(5-fluoropyridin-2-yl)-8-methoxy-N-((6-(trifluoromethyl)pyridin-3-yl)methyl)quinazolin-4-amineamine |
| Example 156 | 8-Methoxy-N-((3-methyl-1,2,4-oxadiazol-5-yl)methyl)-6-(5-methylpyrimidin-2-yl)quinazolin-4-amine |
| Example 157 | 6-(3-fluoro-5-methyl-2-pyridyl)-8-methoxy-N-[(1R)-1-(5-methyl-1,2,4-oxadiazol-3-yl)ethyl] quinazolin-4-amine |
| Example 158 | 6-(5-fluoro-2-pyridyl)-8-methoxy-N-[(1R)-1-(1-methylpyrazol-3-yl)ethyl]quinazolin-4-amine |
| Example 159 | 8-methoxy-N-[(1R)-1-(1-methylpyrazol-3-yl)ethyl]-6-(5-methyl-2-pyridyl)quinazolin-4-amine |
| Example 161 | 6-(4-Fluorophenyl)-N-[(5-fluoro-2-pyridyl)methyl]-8-methoxy-quinazolin-4-amine |
| Example 162 | Single enantiomer 1 of 8-Methoxy-N-[1-(3-methyl-1,2,4-oxadiazol-5-yl)ethyl]-6-(5-methyl-2-pyridyl)quinazolin-4-amine |
| Example 163 | Single enantiomer 2 of 8-Methoxy-N-[1-(3-methyl-1,2,4-oxadiazol-5-yl)ethyl]-6-(5-methyl-2-pyridyl)quinazolin-4-amine |
| Example 164 | Single enantiomer 1 of 8-methoxy-N-(1-(5-methyl-1,3,4-thiadiazol-2-yl)ethyl)-6-(5-methylthiazol-2-yl)quinazolin-4-amine |
| Example 165 | Single enantiomer 2 of 8-methoxy-N-(1-(5-methyl-1,3,4-thiadiazol-2-yl)ethyl)-6-(5-methylthiazol-2-yl)quinazolin-4-amine |
| Example 166 | Single enantiomer 2 of 2-((8-methoxy-6-(5-methylpyrimidin-2-yl)quinazolin-4-yl)amino)-2-(3-methyl-1,2,4-oxadiazol-5-yl)ethan-1-ol |
| Example 169 | Single enantiomer 1 of 6-(5-fluoro-2-pyridyl)-8-methoxy-N-[1-[6-(trifluoromethyl)pyridazin-3-yl]ethyl]quinazolin-4-amine |
| Example 170 | Single enantiomer 2 of 6-(5-fluoro-2-pyridyl)-8-methoxy-N-[1-[6-(trifluoromethyl)pyridazin-3-yl]ethyl]quinazolin-4-amine |
| Example 173 | Single enantiomer 1 of 6-(5-fluoropyridin-2-yl)-8-methoxy-N-(1-(5-methyl-1,3,4-thiadiazol-2-yl)ethyl)quinazolin-4-amine |
| Example 174 | Single enantiomer 2 of 6-(5-fluoropyridin-2-yl)-8-methoxy-N-(1-(5-methyl-1,3,4-thiadiazol-2-yl)ethyl)quinazolin-4-amine |
| Example 175 | Single enantiomer 1 of 6-(5-fluoropyridin-2-yl)-8-methoxy-N-(1-(3-methyl-1,2,4-oxadiazol-5-yl)ethyl)quinazolin-4-amine |
| Example 176 | Single enantiomer 2 of 6-(5-fluoropyridin-2-yl)-8-methoxy-N-(1-(3-methyl-1,2,4-oxadiazol-5-yl)ethyl)quinazolin-4-amine |
| Example 185 | 6-(4-fluorophenyl)-8-methoxy-N-[(1S)-1-[2-(trifluoromethyl)pyrimidin-5-yl]ethyl]quinazolin-4-amine formate |

In a further preferred embodiment, the invention is directed to a compound of formula (I) as defined above, wherein Y is $-OR^D$, represented by formula (Ia)

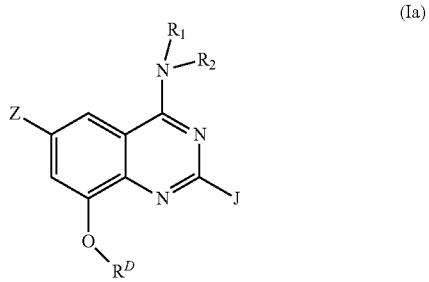

(Ia)

wherein

Z is selected from the group consisting of aryl, wherein any of such aryl may be optionally substituted by one or more groups selected from halo;

$R_1$ is H;

$R_2$ is selected from the group consisting of heteroaryl($C_1$-$C_4$)alkyl-, wherein any of such heteroaryl may be optionally substituted by one or more groups selected from ($C_1$-$C_3$)alkyl, $C_1$-$C_6$)haloalkyl;

$R^A$ and $R^B$ are at each occurrence independently H or selected from the group consisting of ($C_1$-$C_4$)alkyl-;

$R^C$ is at each occurrence H or selected from the group consisting of ($C_1$-$C_6$)alkyl;

$R^D$ is selected in the group consisting of H, ($C_1$-$C_6$)alkyl, ($C_3$-$C_8$)heterocycloalkyl-($C_1$-$C_6$)alkyl-, $R^COC(O)(C_1$-$C_4$)alkylene-, $(R^AR^B)N(C_1$-$C_6$)alkylene-, $(C_3$-$C_8$)heterocycloalkyl, $R^CO(C_1$-$C_4$)alkylene-, $(R^AR^B)N(O)C(C_1$-$C_4$)alkylene, $(C_3$-$C_8$)cycloalkyl-($C_1$-$C_6$)alkyl-, wherein any of such heterocycloalkyl may be optionally substituted by one or more groups selected from ($C_1$-$C_3$)alkyl;

J is H.

In a further preferred embodiment, the invention is addressed to compound of formula (Ia) wherein Z is H or selected from the group consisting of
aryl, preferably phenyl, each of said aryl may be optionally substituted by one or more groups selected from halo, preferably fluorine, $R_1$ is H;

$R_2$ is selected from the group consisting of
heteroaryl($C_1$-$C_4$)alkyl-, (pyrimidinyl)ethyl, (pyridazinyl)methyl, each of said heteroaryl is optionally further substituted by one or more groups selected from ($C_1$-$C_3$)alkyl, preferably methyl trifluoromethyl, $R^D$ is H or selected in the group consisting of, ($C_1$-$C_6$)alkyl, preferably methyl, propyl, ($C_3$-$C_8$)heterocycloalkyl-($C_1$-$C_6$)alkyl-, preferably (azetidinyl)methyl, (morpholinyl)methyl, (morpholinyl)ethyl, (oxetanyl)methyl, $R^C$OC(O)($C_1$-$C_4$)alkylene-, wherein $R^C$ is selected form the group of H and ethyl, ($R^A R^B$)N($C_1$-$C_6$)alkylene-, preferably dimethylaminopropyl, ($C_3$-$C_8$)heterocycloalkyl, preferably tetrahydropyranyl, $R^C$O($C_1$-$C_4$)alkylene-, preferably selected from the group of methoxyethyl, propanoyl, ($R^A R^B$)N(O)C($C_1$-$C_4$)alkylene, preferably dimethylacetylamide, tetrahydrofuranyl, ($C_3$-$C_8$)cycloalkyl-($C_1$-$C_6$)alkyl-, preferably (cyclopropyl)methyl, each of said heterocycloalkyl may be optionally substituted by one or more groups selected from methyl, ethyl and propyl;

J is H.

According to specific embodiments, the invention provides at least one compound listed in the Table 5 below and pharmaceutical acceptable salts thereof.

TABLE 5

List of preferred compounds having Formula (Ia)

| Ex. N. | Chemical name |
|---|---|
| Example 44 | (R)-2-((6-(4-fluorophenyl)-4-((1-(2-(trifluoromethyl)pyrimidin-5-yl)ethyl)amino)quinazolin-8-yl)oxy)acetic acid |
| Example 61 | 6-(4-fluorophenyl)-8-[(3-methyloxetan-3-yl)methoxy]-N-[(6-methylpyridazin-3-yl)methyl]quinazolin-4-amine |
| Example 67 | 3-[6-(4-fluorophenyl)-4-[(6-methylpyridazin-3-yl)methylamino]quinazolin-8-yl]oxy-1-methyl-pyrrolidin-2-one |
| Example 74 | 6-(4-fluorophenyl)-N-((6-methylpyridazin-3-yl)methyl)-8-(oxetan-3-yloxy)quinazolin-4-amine |
| Example 190 | Single enantiomer 1 of 6-(1-((6-(4-Fluorophenyl)-8-methoxyquinazolin-4-yl)amino)ethyl)pyridin-2(1H)-one |
| Example 191 | Single enantiomer 2 of 6-(1-((6-(4-Fluorophenyl)-8-methoxyquinazolin-4-yl)amino)ethyl)pyridin-2(1H)-one |

The compounds of formula (I) including all the compounds or at least one of the here above listed can be generally prepared according to the procedure outlined in detail in the Schemes shown below using generally known methods.

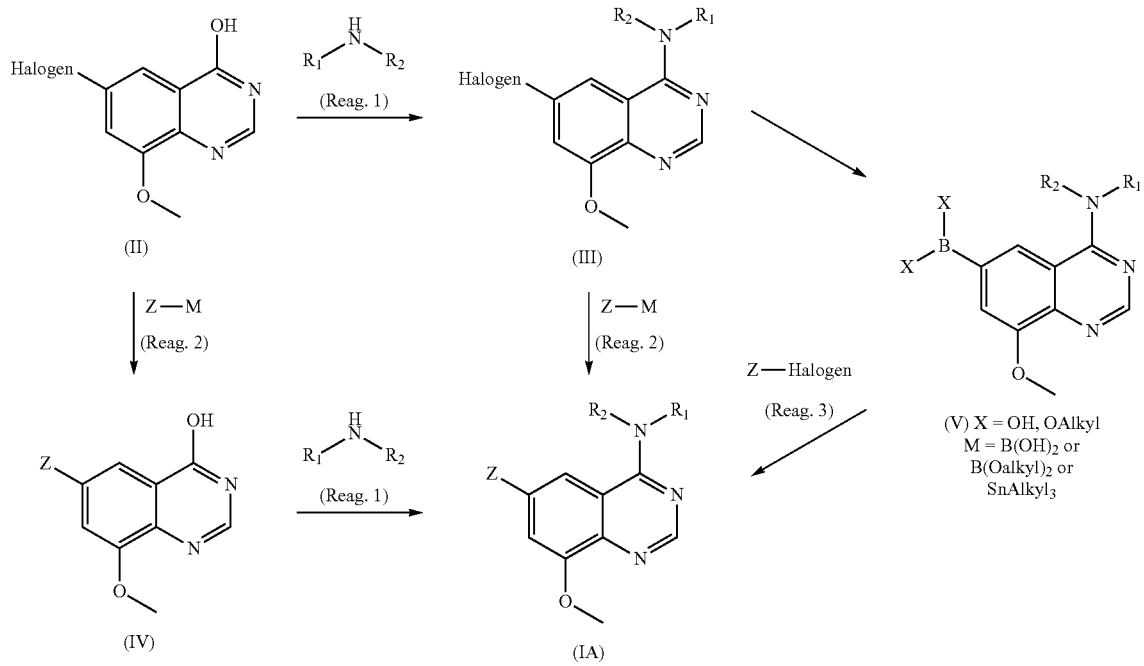

Scheme 1

In one embodiment of the present invention, compound (IA) may be prepared according to SCHEME 1 from compound (II). Compound (II) was prepared following the procedure described in *J. Med Chem.*, 2015, 58 (8), 3548-3571.

Compound (III) may be prepared from Compound (II) by a deoxyamination reaction mediated by coupling reagents like PyBOP with a suitable amine (Reag.1).

Compound (IA) may be prepared from Compound (III) by a metal-catalyzed cross coupling reactions like Stille or Suzuki or similar as described in "Transition Metals for Organic Synthesis", 2nd Ed, 1, 2004 with a suitable reagent like (Reag. 2).

Alternatively Compound (V) may be prepared from Compound (III) by metal-catalyzed Miyaura borylation reaction.

Compound (IA) may be prepared from Compound (V) by a metal-catalyzed cross coupling reactions like Stille, Suzuki or similar as described in "Transition Metals for Organic Synthesis", 2nd Ed, 1, 2004 with a suitable organohalogen compound like (Reag. 3).

In another embodiment, compound (IV) was prepared starting from compound (II) by a metal-catalyzed cross coupling reactions like Stille, Suzuki or similar as described in "Transition Metals for Organic Synthesis", 2nd Ed, 1, 2004 with a suitable Organometallic reagent like (Reag.2).

Compound (IA) may be prepared from Compound (V) by deoxyamination reaction mediated by reagents like PyBOP or similar with a suitable amine (Reag.1).

Some compounds (IA) may contain a protected hydroxyl or amino group which were then removed under well known procedures.

Scheme 2

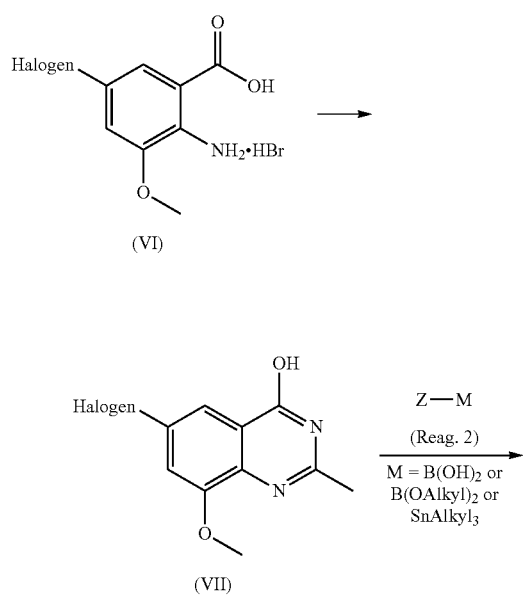

(VI)

(VII)

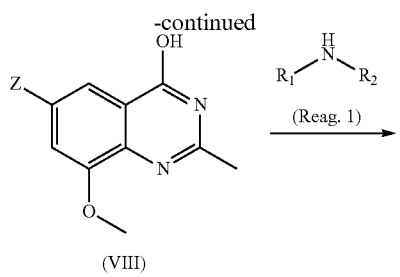

(VIII)

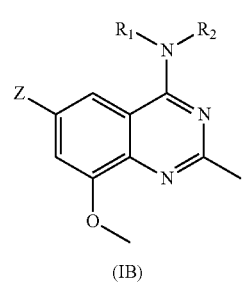

(IB)

In another embodiment of the present invention, compound (IB) may be prepared according to SCHEME 2 from compounds (VI).

Compound (VII) may be prepared from Compound (VI) by means of a quinazoline ring construction reaction mediated by suitable reagents like triethylorthoacetate or similar.

Compound (VIII) may be prepared from Compound (VII) by metal-catalyzed cross coupling reactions like Stille, Suzuki or similar ones with suitable organometallic reagents (Reag.2) like, for example, organoboron compounds.

Compounds (IB) may be prepared from compound (VIII) by deoxyamination reaction mediated by reagents like PyBOP or similar in the presence of a suitable amine (Reag.1).

Some compounds (IB) may contain a protected hydroxyl or amino group which were then removed under well known procedures.

Scheme 3

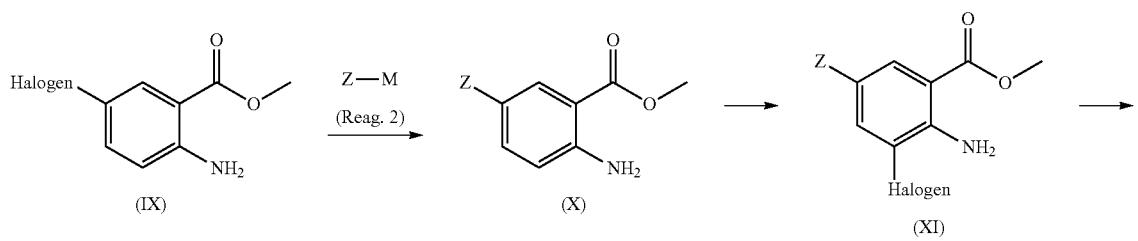

(IX)  (X)  (XI)

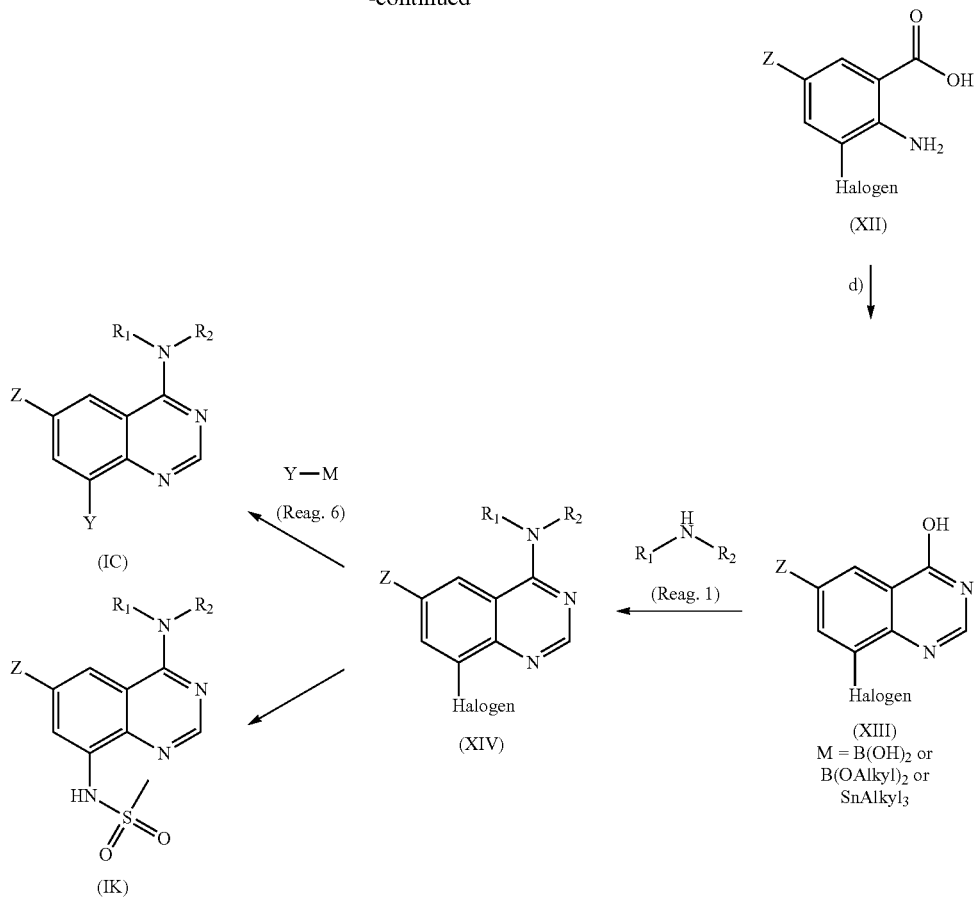

In another embodiment of the present invention, compound (IC) may be prepared according to SCHEME 3 from compound (IX).

Compound (X) may be prepared from Compound (IX) by metal-catalyzed cross coupling reactions like Stille, Suzuki or similar ones with suitable organometallic reagents (Reag.2) like, for example, organoboron compounds.

Compound (XI) may be prepared from Compound (X) by Halogenation with suitable reagents like Bromine, NBS, NIS, Iodine, iodonium salts or similar.

Compound (XII) may be prepared from Compound (XI) by hydrolysis in a basic or acidic medium.

Compound (XIII) may be prepared from Compound (XII) by quinazoline ring construction reaction with suitable reagents like formamide or similar.

Compound (XIV) may be prepared from Compound (XIII) by deoxyamination reaction mediated by reagents like PyBOP or similar in the presence of a suitable amine (Reag.1).

Compound (IC) may be prepared from Compound (XIV) by metal-catalyzed cross coupling reactions like Stille, Suzuki or similar ones with suitable organometallic reagents (Reag. 6) like, for example, organoboron compounds. Some compounds (IC) may contain a protected hydroxyl or amino group which were then removed under well known procedures.

Compound (IK) may be prepared from Compound (XIV) by amination reactions in the presence of a suitable reagent like, for example, methanesulfonamide. Some compounds (IK) may contain a protected hydroxyl or amino group which were then removed under well known procedures.

Scheme 4

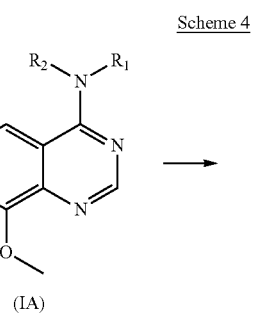

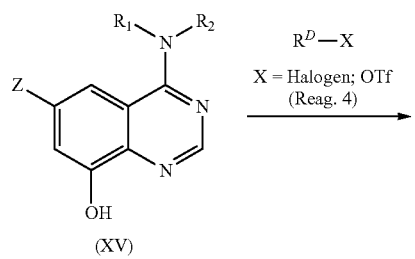

-continued

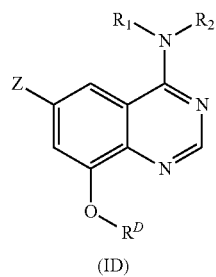

(ID)

In another embodiment of the present invention, compounds (ID) may be prepared according to SCHEME 4 from compounds (IA).

Compound (XV) may be prepared from Compound (IA) by means of dealkylation reactions mediated by strong Lewis acids like BBr$_3$ or similar.

Compounds (ID) were prepared from compounds (XV) by alkylation with a suitable alkylating agent (Reag. 4) like, alkyl chlorides, bromides, iodides, mesylates, tosylates or similar.

Alternatively, compounds (ID) may be prepared from compounds (XV) and a suitable alcohol by Mitsunobu-like reactions mediated, for example, by DEAD/PPh3, DIAD/PPh$_3$ or CMT.

Some compounds (ID) may contain a protected hydroxyl or amino group which were then removed under well-known procedures.

Scheme 5

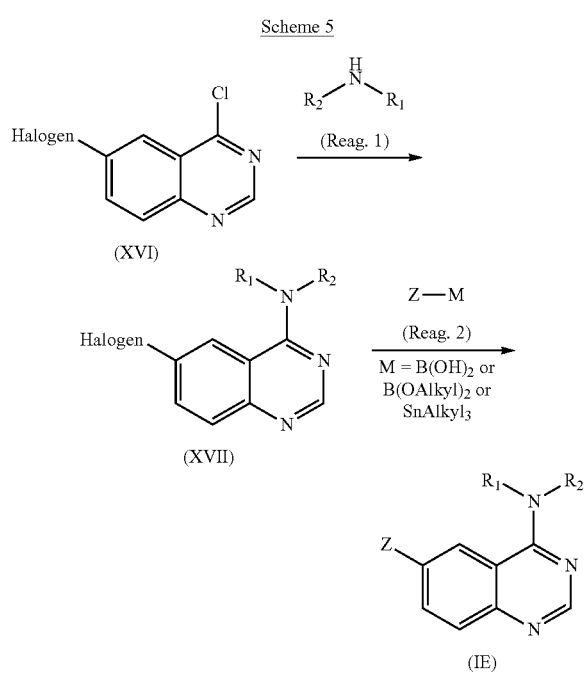

In another embodiment of the present invention, compound (IE) may be prepared according to SCHEME 5 from compounds (XVI).

Compound (XVII) may be prepared from Compound (XVI) by deoxyamination reaction mediated by reagents like PyBOP or similar in the presence of a suitable amine (Reag. 1).

Compounds (IE) were prepared from Compounds (XVII) by metal-catalyzed cross coupling reactions like Stille, Suzuki or similar ones with suitable organometallic reagents (Reag. 2) like, for example, organoboron compounds.

Some compounds (IE) may contain a protected hydroxyl or amino group which were then removed under well known procedures.

Scheme 6

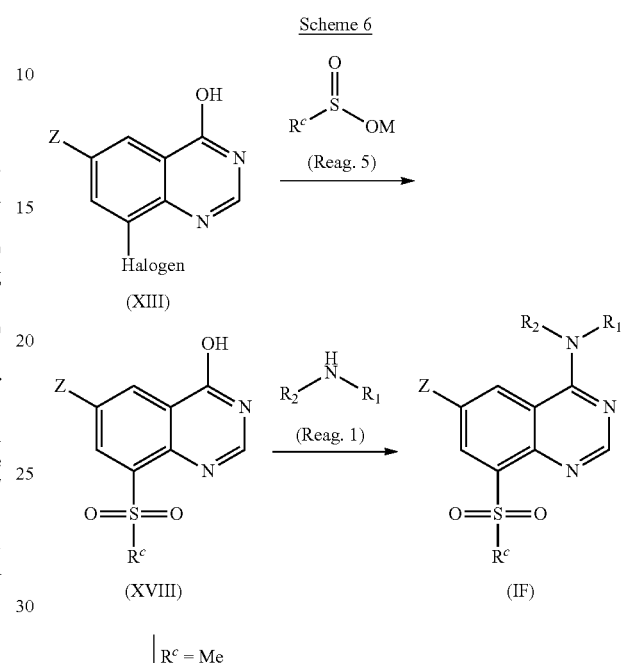

In another embodiment of the present invention, compound (IF) and (IG) may be prepared according to SCHEME 6 from compounds (XIII).

Compound (XVIII) may be prepared from Compound (XIII) by metal catalyzed sulfenylation reaction with a suitable sulfinate (Reag. 5) like, for example, sodium methanesulfinate.

Compound (IF) may be prepared from Compound (XVIII) by deoxyamination reaction mediated by reagents like PyBOP or similar in the presence of a suitable amine (Reag. 1). Some compounds (IF) may contain a protected hydroxyl or amino group which were then removed under well known procedures.

In another embodiment of the present invention Compound (XIX) may be prepared from Compound (XVIII) by amination with tributylborate and (aminooxy)sulfonic acid as described in *Tetr. Lett.* 1994, 39, 7201

Compound (IG) may be prepared from Compound (XIX) by deoxyamination reaction mediated by reagents like PyBOP or similar in the presence of a suitable amine (Reag. 1).

Some compounds (IG) may contain a protected hydroxyl or amino group which were then removed under well known procedures.

Scheme 7

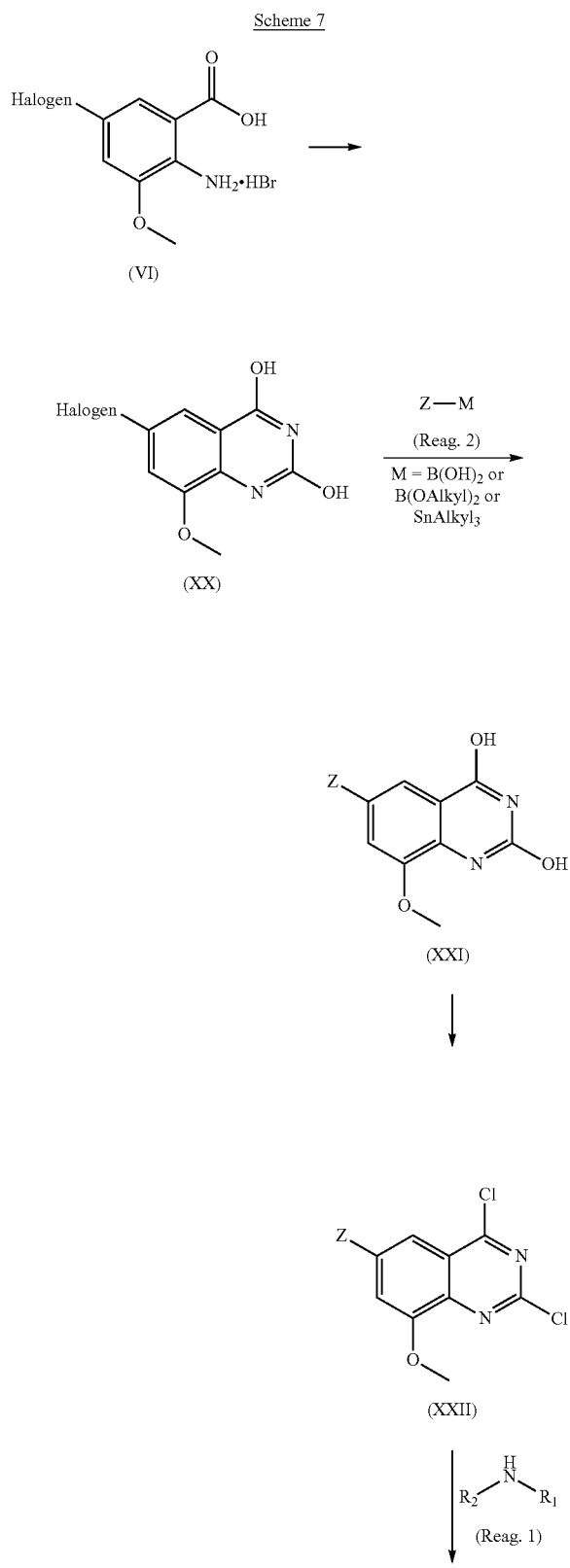

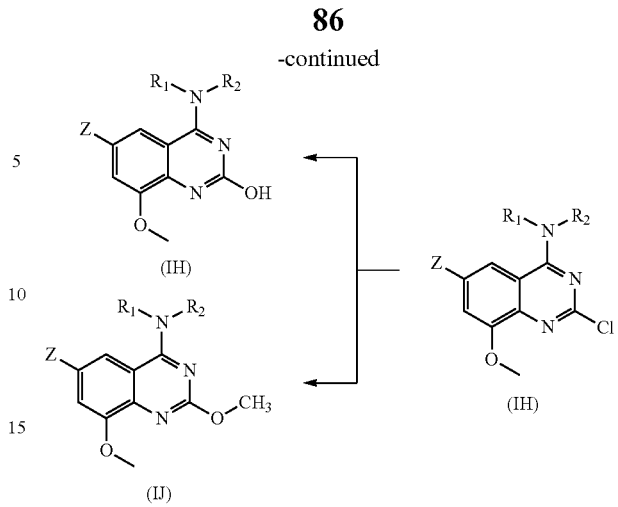

In another embodiment of the present invention, compound (IH) and (IJ) may be prepared according to SCHEME 7 from compounds (VI).

Compound (XX) may be prepared from Compound (VI) by quinazoline ring construction reaction with suitable reagents like Urea or similar.

Compound (XXI) may be prepared from Compound (XX) by metal-catalyzed cross coupling reactions like Stille, Suzuki or similar ones with suitable organometallic reagents (Reag. 2) like, for example, organoboron compounds.

Compound (XXII) may be prepared from Compound (XXI) by chlorination reaction with suitable reagents like phosphorous oxychloride or similar.

Compound (XXIII) may be prepared from Compound (XXII) by amination reaction in the presence of a suitable amine (Reag. 1).

Compound (IH) may be prepared from Compound (XXIII) by hydrolysis with a suitable reagent like, for example, acetic acid.

Some compounds (IH) may contain a protected hydroxyl or amino group which were then removed under well known procedures.

In another embodiment of the present invention Compound (IJ) may be prepared from Compound (XXIII) by reaction with alkoxides, like, for example, Sodium Methoxide.

Some compounds (IJ) may contain a protected hydroxyl or amino group which were then removed under well known procedures.

Scheme 8

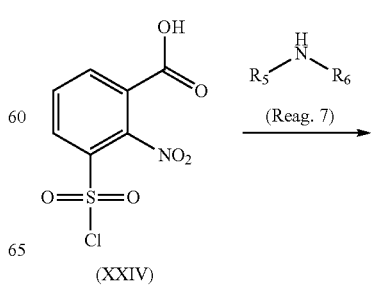

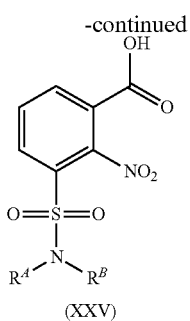

(XXV)

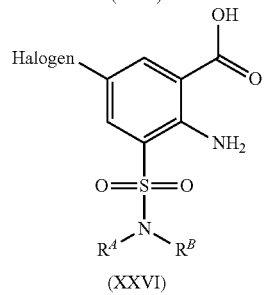

(XXVI)

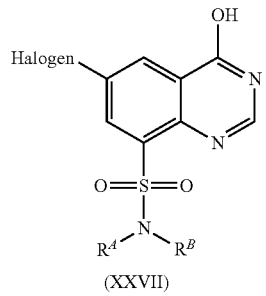

(XXVII)

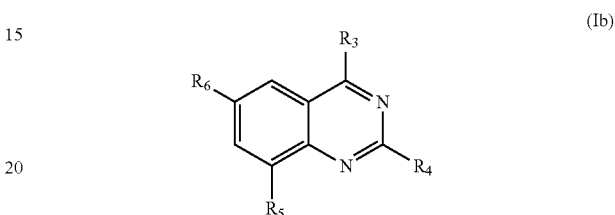

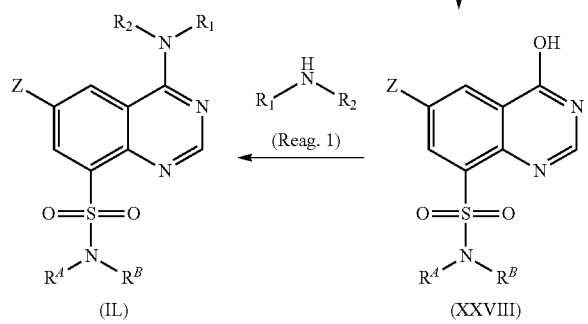

(IL)     (XXVIII)

In another embodiment of the present invention, compound (IK) may be prepared according to SCHEME 8 from compounds (XXIV).

Compound (XXV) may be prepared from Compound (XXIV) by amination reaction in the presence of a suitable amine (Reag. 6).

Compound (XXVI) may be prepared from Compound (XXV) by Halogenation with suitable reagents like Bromine, NBS, NIS, Iodine, iodonium salts or similar Compound (XXVII) may be prepared from Compound (XXVI) by quinazoline ring construction reaction with suitable reagents like formamide or similar.

Compound (XXVIII) may be prepared from Compound (XXVII) by metal-catalyzed cross coupling reactions like Stille, Suzuki or similar ones with suitable organometallic reagents (Reag. 2) like, for example, organoboron compounds.

Compound (XXIII) may be prepared from Compound (XXII) by amination reaction in the presence of a suitable amine (Reag. 1).

Some compounds (IL) may contain a protected hydroxyl or amino group which were then removed under well known procedures.

In a specific aspect the present invention relates to compounds of formula (Ib)

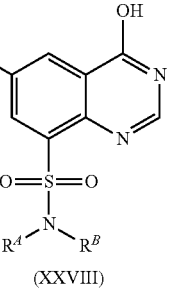

(Ib)

wherein
$R_3$ is OH or halo,
$R_4$ is H or OH;
$R_5$ is halo or —OMe;
$R_6$ is halo or Z;
Z is as defined above.

In a further aspect the present invention relates to the use of compounds of formula (Ib) as intermediate in the preparation of compounds of formula (I) as above described.

The compounds of the present invention have surprisingly been found to effectively inhibit $P2X_3$ receptor and said compounds are useful for the treatment of respiratory disease.

In one embodiment, representative compounds of formula (I) of the present invention have surprisingly been found to effectively and selectively inhibit $P2X_3$ receptor and said compounds are useful for the treatment of respiratory disease avoiding adverse effect, such as loss of taste response.

In a preferred embodiment, the compound of formula (I) are selective $P2X_3$ antagonist wherein the selective $P2X_3$ antagonist is at least 10-fold selective for $P2X_3$ homomeric receptor antagonism versus $P2X_{2/3}$ heteromeric receptor antagonism.

In a further preferred embodiment, the selective $P2X_3$ antagonist is at least 30-fold selective for $P2X_3$ homomeric receptor antagonism versus $P2X_{2/3}$ heteromeric receptor antagonism.

In a further preferred embodiment, the selective $P2X_3$ antagonist is at least 50-fold selective for $P2X_3$ homomeric receptor antagonism versus $P2X_{2/3}$ heteromeric receptor antagonism.

The present invention also provides a pharmaceutical composition comprising a compound of formula (I) or a pharmaceutically acceptable salt thereof in admixture with one or more pharmaceutically acceptable carrier or excipient, either alone or in combination with one or more further active ingredient.

In one aspect, the invention refers to a compound of formula (I) according to the invention for use as a medicament.

In a further aspect, the invention refers to the use of a compound of formula (I) of the invention, or a pharmaceutically acceptable salt thereof, in the manufacture of a medicament for the treatment of disorders associated with P2X$_3$ receptors mechanism, preferably for the treatment of respiratory diseases.

Preferably, the invention refers to a compound of formula (I) for use in the prevention and/or treatment of respiratory diseases, preferably cough, sub-acute or chronic cough, treatment-resistant cough, idiopathic chronic cough, post-viral cough, iatrogenic cough, asthma, idiopathic pulmonary fibrosis (IPF), chronic obstructive pulmonary disease (COPD) and cough associated with respiratory diseases such as COPD, asthma and bronchospasm.

More preferably, the invention refers to a compounds of formula (I) for use in the prevention and/or treatment of chronic cough and cough associated with respiratory diseases such as COPD, asthma and bronchospasm.

The invention also provides a method for the prevention and/or treatment of disorders associated with P2X$_3$ receptors mechanisms, said method comprising administering to a patient in need of such treatment a therapeutically effective amount of a compound of the invention.

In particular the invention refers to a method for the prevention and/or treatment wherein the disorder is cough, sub-acute or chronic cough, treatment-resistant cough, idiopathic chronic cough, post-viral cough, iatrogenic cough, asthma, idiopathic pulmonary fibrosis (IPF), chronic obstructive pulmonary disease (COPD) and cough associated with respiratory diseases such as COPD, asthma and bronchospasm, wherein said method comprises the administration of a proper amount of a compound of formula (I) to a patient in the need thereof.

In a further preferred embodiment, the disorder is chronic cough.

The methods of treatment of the invention comprise administering a safe and effective amount of a compound of formula (I) or a pharmaceutically acceptable salt thereof to a patient in need thereof. As used herein, "safe and effective amount" in reference to a compound of formula (I) or a pharmaceutically acceptable salt thereof or other pharmaceutically-active agent means an amount of the compound sufficient to treat the patient's condition but low enough to avoid serious side effects and it can nevertheless be routinely determined by the skilled artisan. The compounds of formula (I) or pharmaceutically acceptable salts thereof may be administered once or according to a dosing regimen wherein a number of doses are administered at varying intervals of time for a given period of time. Typical daily dosages may vary depending upon the particular route of administration chosen.

The invention also provides pharmaceutical compositions of compounds of formula (I) in admixture with one or more pharmaceutically acceptable carrier or excipient, for example those described in Remington's Pharmaceutical Sciences Handbook, XVII Ed., Mack Pub., N.Y., U.S.A.

Administration of the compounds of the invention and their pharmaceutical compositions may be accomplished according to patient needs, for example, orally, nasally, parenterally (subcutaneously, intravenously, intramuscularly, intrasternally and by infusion) and by inhalation.

Preferably the compounds of the present invention may be administered orally or by inhalation.

Various solid oral dosage forms can be used for administering compounds of the invention including such solid forms as tablets, gelcaps, capsules, caplets, granules, lozenges and bulk powders. The compounds of the invention can be administered alone or combined with various pharmaceutically acceptable carriers, diluents (such as sucrose, mannitol, lactose, starches) and known excipients, including suspending agents, solubilizers, buffering agents, binders, disintegrants, preservatives, colorants, flavorants, lubricants and the like. Time release capsules, tablets and gels are also advantageous in administering the compounds of the invention.

Preferably the compounds of the invention are administered in forms of tablets.

Various liquid oral dosage forms can also be used for administering compounds of the invention, including aqueous and non-aqueous solutions, emulsions, suspensions, syrups, and elixirs. Such dosage forms can also contain suitable known inert diluents such as water and suitable known excipients such as preservatives, wetting agents, sweeteners, flavorants, as well as agents for emulsifying and/or suspending the compounds of the invention. The compounds of the invention may be injected, for example, intravenously, in the form of an isotonic sterile solution.

For the treatment of the diseases of the respiratory tract, the compounds according to the invention are preferably administered by inhalation.

Inhalable preparations include inhalable powders, propellant-containing metering aerosols or propellant-free inhalable formulations.

For administration as a dry powder, single- or multi-dose inhalers known from the prior art may be utilized. In that case the powder may be filled in gelatine, plastic or other capsules, cartridges or blister packs or in a reservoir.

A diluent or carrier chemically inert to the compounds of the invention, e.g. lactose or any other additive suitable for improving the respirable fraction may be added to the powdered compounds of the invention.

Inhalation aerosols containing propellant gas such as hydrofluoroalkanes may contain the compounds of the invention either in solution or in dispersed form. The propellant-driven formulations may also contain other ingredients such as co-solvents, stabilizers and optionally other excipients.

The propellant-free inhalable formulations comprising the compounds of the invention may be in form of solutions or suspensions in an aqueous, alcoholic or hydroalcoholic medium and they may be delivered by jet or ultrasonic nebulizers known from the prior art or by soft-mist nebulizers.

Preferably, the compound of the present invention are administered orally.

The compounds of the invention can be administered as the sole active agent or in combination with other pharmaceutical active ingredients.

Preferably, the compound of the present invention can be combined with therapeutic agents or active ingredients useful for the treatment of disease which are related to or mediated by P2X$_3$ receptor.

The dosages of the compounds of the invention depend upon a variety of factors including among others the particular disease to be treated, the severity of the symptoms, the route of administration, and the like.

The invention is also directed to a device comprising a pharmaceutical composition comprising a compound of formula (I) according to the invention, in form of a single- or multi-dose dry powder inhaler or a metered dose inhaler.

The various aspects of the invention described in this application are illustrated buy the following examples which are not meant to limit the invention in any way. following examples illustrate the invention.

The example testing experiments described herein serve to illustrate the present invention and the invention is not limited to the examples given.

Preparations of Intermediates and Examples

Chemical names were generated using the Dotmatics software. In some cases generally accepted names of commercially available reagents were used in place of Dotmatics software generated names.

All reagents, for which the synthesis is not described in the experimental part, are either commercially available, or are known compounds or may be formed from known compounds by known methods by a person skilled in the art.

(R)-1-(2-(trifluoromethyl)pyrimidin-5-yl)ethanamine HCl, (R)-1-(6-methylpyridazin-3-yl)ethan-1-amine HCl were prepared accordingly to the procedure described in WO2016/091776.

Abbreviation—Meaning

Et$_2$O: diethyl ether;
Et$_3$N: triethyl amine;
TEA: triethyl amine;
DCC: N,N'-Dicyclohexylcarbodiimide;
PyBOP: (benzotriazol-1-yloxy)tripyrrolidinophosphonium hexafluorophosphate;
DMF: dimethylformamide;
EtOAc: Ethyl acetate;
RT: room temperature;
THF: tetrahydrofuran;
DCM: dichloromethane;
MeOH: methyl alcohol;
EtOH: ethylic alcohol;
TFA: Trifluoroacetic acid;
LC-MS: Liquid Chromatography/Mass Spectrometry;
HPLC: high pressure liquid chromatography;
MPLC: medium pressure liquid chromatography;
SFC: Supercritical Fluid Chromatography;
dppf: 1,1'-Bis(diphenylphosphino) ferrocene;
DIEA or DIPEA: N,N-Diisopropylethylamine;
MeCN: Acetonitrile;
MTBE: tert-Butyl methyl ether;
TBDMSCl: tert-Butyl(chloro)dimethylsilane;
DMSO: Dimethylsulfoxide;
Boc$_2$O: di-tert-butyl dicarbonate;
UPLC: Ultra Performance Liquid Chromatography.

General Experimental Details and Methods

Analytical Methods
Liquid Chromatography-Mass Spectrometry
Method 1

UPLC-MS was performed on a Waters Acquity I-Class with Waters Diode Array Detector coupled to a Waters SQD2 single quadrupole mass spectrometer using an Waters HSS C18 column (1.8 µm, 100×2.1 mm) being initially held at 5% acetonitrile/water (with 0.1% formic acid in each mobile phase) for 1.2 minutes, followed by a linear gradient of 5-100% within 3.5 minutes and then held at 100% for 1.5 minutes (F=0.5 mL/min).

Method 2

UPLC-MS was performed on a Waters Acquity I-Class with Waters Diode Array Detector coupled to a Waters SQD2 single quadrupole mass spectrometer using an Waters BEH Shield RP18 column (1.7 µm, 100×2.1 mm) being initially held at 5% acetonitrile/water (with 10 mM ammonium bicarbonate in each mobile phase) for 1.2 minutes, followed by a linear gradient of 5-100% within 3.5 minutes and then held at 100% for 1.5 minutes (F=0.5 mL/min).

Method 3

UPLC-MS was performed on a Waters DAD+Waters SQD2, single quadrupole UPLC-MS spectrometer using an Acquity UPLC BEH Shield RP18 1.7 um 100×2.1 mm (Plus guard cartridge), maintained at temp column being initially held at 5% acetonitrile/water (with 10 mM ammonium bicarbonate in each mobile phase) for 0.4 minutes, followed by a linear gradient of 5-95% within 6.4 minutes and then held at 95% for 1.2 minutes (F=0.4 mL/min).

Method 4

UPLC-MS was performed on a Waters DAD+Waters SQD2, single quadrupole UPLC-MS spectrometer using an Acquity UPLC BEH Shield RP18 1.7 um 100×2.1 mm (Plus guard cartridge), maintained at temp column being initially held at 5% Acetonitrile (Far UV grade) with 0.1% (V/V) formic acid/Water (High purity via PureLab Option unit) with 0.1% formic acid for 0.4 minutes, followed by a linear gradient of 5-95% within 6.4 minutes and then held at 95% for 1.2 minutes (F=0.4 mL/min).

Method 5

Acquity UPLC-QDa Mass Spectrometer with a C18-reverse-phase column (50×2.1 mm Acquity CSH with 1.7 µm particle size) maintained at 40° C., elution with A: 95/5 water/acetonitrile+0.05% formic acid; B: 95/5 acetonitrile/water+0.05% formic acid.

Gradient:

| Time [min] | Flow [ml/min] | Mobile phase A [%] | Mobile phase B [%] |
|---|---|---|---|
| 0.0 | 1 | 99.0 | 1.0 |
| 1.50 | 1 | 0.1 | 99.9 |
| 1.90 | 1 | 0.1 | 99.9 |
| 2.00 | 1 | 99.0 | 1.0 |

Detection-MS, UV PDA

MS Ionisation Method-Electrospray (Positive/Negative Ion).

Method 5A

Acquity UPLC-QDa Mass Spectrometer with a C18-reverse-phase column (50×2.1 mm Acquity CSH with 1.7 µm particle size) maintained at 40° C., elution with A: 95/5 water/acetonitrile+0.05% formic acid; B: 95/5 acetonitrile/water+0.05% formic acid.

Gradient:

| Time [min] | Flow [ml/min] | Mobile phase A [%] | Mobile phase B [%] |
|---|---|---|---|
| 0.0 | 1 | 99.0 | 1.0 |
| 3.50 | 1 | 0.1 | 99.9 |
| 3.90 | 1 | 0.1 | 99.9 |
| 4.00 | 1 | 99.0 | 1.0 |

Detection-MS, UV PDA

MS Ionisation Method-Electrospray (Positive/Negative Ion).

Method 6

Acquity UPLC-QDa Mass Spectrometer with a C18-reverse-phase column (50×2.1 mm Acquity BEH with 1.7 µm particle size) maintained at 40° C., elution with A: 95/5 water/acetonitrile+0.05% conc. ammonia; B: 95/5 acetonitrile/water+0.05% conc. ammonia.

Gradient:

| Time [min] | Flow [ml/min] | Mobile phase A [%] | Mobile phase B [%] |
|---|---|---|---|
| 0.0 | 1 | 99.0 | 1.0 |
| 1.50 | 1 | 0.1 | 99.9 |
| 1.90 | 1 | 0.1 | 99.9 |
| 2.00 | 1 | 99.0 | 1.0 |

Detection-MS, UV PDA
MS Ionisation Method-Electrospray (Positive/Negative Ion)
Method 7
Dionex UHPLC Ultimate 3000 with DAD detector/Thermo Scientific MSQ Pluse quipped with a Kinetex® 2.6 μm XB-C18 (4.6×50 mm), 110A maintained at 25° C., elution with A: 0.1% v/v water solution of formic acid, B: 0.1% v/v acetonitrile solution of formic acid
Gradient:

| Time [min] | Flow [ml/min] | Mobile phase A [%] | Mobile phase B [%] |
|---|---|---|---|
| 0.0 | 1.0 | 95 | 5 |
| 1.0 | 1.0 | 95 | 5 |
| 4.75 | 1.0 | 20 | 80 |
| 5.25 | 1.0 | 20 | 80 |
| 6.0 | 1.0 | 95 | 5 |
| 7.0 | 1.0 | 95 | 5 |

Detection-MS, UV PDA
MS Ionisation Method-Electrospray (Positive/Negative Ion)
NMR
$^1$H Nuclear magnetic resonance (NMR) spectroscopy was carried out using a Bruker or Varian instruments operating at 300 or 400 MHz using the stated solvent at around room temperature unless otherwise stated. In all cases, NMR data were consistent with the proposed structures. Characteristic chemical shifts (δ) are given in parts-per-million using conventional abbreviations for designation of major peaks: e.g. s, singlet; d, doublet; t, triplet; q, quartet; dd, doublet of doublets; dt, doublet of triplets; m, multiplet; br, broad.
Preparative Reverse-Phase HPLC Conditions
Preparative HPLC purification was performed by reverse phase HPLC using a Waters Fractionlynx preparative HPLC system (2525 pump, 2996/2998 UV/VIS detector, 2767 liquid handler) or an equivalent HPLC system such as a Gilson Trilution UV directed system. The Waters 2767 liquid handler acted as both auto-sampler and fraction collector. The columns used for the preparative purification of the compounds were a Waters Sunfire OBD Phenomenex Luna Phenyl Hexyl or Waters Xbridge Phenyl at 10 μm 19×150 mm or Waters CSH Phenyl Hexyl, 19×150, 5 μm column. Appropriate focused gradients were selected based on acetonitrile and methanol solvent systems under either acidic or basic conditions. The modifiers used under acidic/basic conditions were formic acid or trifluoroacetic acid (0.1% V/V) and ammonium bicarbonate (10 mM) respectively. The purification was controlled by Waters Fractionlynx software through monitoring at 210-400 nm, and triggered a threshold collection value at 260 nm and, when using the Fractionlynx, the presence of target molecular ion as observed under API conditions. Collected fractions were analysed by LCMS (Waters Acquity systems with Waters SQD).
Chiral Supercritical Fluid Chromatography (SFC) Separation Protocol
The diastereomeric separation of compounds was achieved by Supercritical Fluid Chromatography (SFC) using a Waters Thar Prep100 preparative SFC system (P200 $CO_2$ pump, 2545 modifier pump, 2998 UV/VIS detector, 2767 liquid handler with Stacked Injection Module). The Waters 2767 liquid handler acted as both auto-sampler and fraction collector. Appropriate isocratic methods were selected based on methanol, ethanol or isopropanol solvent systems under un-modified or basic conditions. The standard SFC method used was modifier, CO2, 100 mL/min, 120 Bar backpressure, 40° C. column temperature. The modifier used under basic conditions was diethylamine (0.1% V/V). The modifier used under acidic conditions was either formic acid (0.1% V/V) or trifluoroacetic acid (0.1% V/V). The SFC purification was controlled by Waters Fractionlynx software through monitoring at 210-400 nm and triggered at a threshold collection value, typically 260 nm. Collected fractions were analysed by SFC (Waters/Thar SFC systems with Waters SQD). The fractions that contained the desired product were concentrated by vacuum centrifugation.
Supercritical Fluid Chromatography—Mass Spectrometry Analytical Conditions
Method 8
SFC-MS was performed on a Waters/Thar SFC systems with Waters SQD using a Lux Cellulose-3 column with a 15% methyl alcohol/$CO_2$ (with 0.1% diethylamine) isocratic run at 5 mL/min, 120 Bar backpressure, 40° C. column temperature.
Method 9
SFC-MS was performed on a Waters/Thar SFC systems with Waters SQD using a Lux Cellulose-3 column with a 20% methyl alcohol/$CO_2$ (with 0.1% diethylamine) isocratic run at 5 mL/min, 120 Bar backpressure, 40° C. column temperature.
Method 10
SFC-MS was performed on a Waters/Thar SFC systems with Waters SQD using a Lux Cellulose-4 column with a 55% ethyl alcohol/$CO_2$ (with 0.1% diethylamine) isocratic run at 5 mL/min, 120 Bar backpressure, 40° C. column temperature.
Method 11
SFC-MS was performed on a Waters/Thar SFC systems with Waters SQD using a Lux Cellulose-4 column with a 20% iso-propyl alcohol/$CO_2$ (with 0.1% diethylamine) isocratic run at 5 mL/min, 120 Bar backpressure, 40° C. column temperature.
Method 12
SFC-MS was performed on a Waters/Thar SFC systems with Waters SQD using a Lux Cellulose-4 column with a 30% iso-propyl alcohol/$CO_2$ (with 0.1% diethylamine) isocratic run at 5 mL/min, 120 Bar backpressure, 40° C. column temperature.
Method 13
SFC-MS was performed on a Waters/Thar SFC systems with Waters SQD using a Lux Cellulose-4 column with a 50% iso-propyl alcohol/$CO_2$ (with 0.1% diethylamine) isocratic run at 5 mL/min, 120 Bar backpressure, 40° C. column temperature.
Method 14
SFC-MS was performed on a Waters/Thar SFC systems with Waters SQD using a Lux Cellulose-4 column with a 25% methyl alcohol/$CO_2$ (with 0.1% diethylamine) isocratic run at 5 mL/min, 120 Bar backpressure, 40° C. column temperature.
Method 15
SFC-MS was performed on a Waters/Thar SFC systems with Waters SQD using a YMC Amylose-C column with a 15% ethyl alcohol/$CO_2$ (with 0.1% diethylamine) isocratic run at 5 mL/min, 120 Bar backpressure, 40° C. column temperature.

Method 16

SFC-MS was performed on a Waters/Thar SFC systems with Waters SQD using a YMC Amylose-C column with a 25% iso-propyl alcohol/$CO_2$ (with 0.1% diethylamine) isocratic run at 5 mL/min, 120 Bar backpressure, 40° C. column temperature.

Method 17

SFC-MS was performed on a Waters/Thar SFC systems with Waters SQD using a YMC Amylose-C column with a 35% iso-propyl alcohol/$CO_2$ (with 0.1% diethylamine) isocratic run at 5 mL/min, 120 Bar backpressure, 40° C. column temperature.

Method 18

SFC-MS was performed on a Waters/Thar SFC systems with Waters SQD using a YMC Amylose-C column with a 55% iso-propyl alcohol/$CO_2$ (with 0.1% diethylamine) isocratic run at 5 mL/min, 120 Bar backpressure, 40° C. column temperature.

Method 19

SFC-MS was performed on a Waters/Thar SFC systems with Waters SQD using a YMC Amylose-C column with a 15% methyl alcohol/$CO_2$ (with 0.1% diethylamine) isocratic run at 5 mL/min, 120 Bar backpressure, 40° C. column temperature.

Method 20

SFC-MS was performed on a Waters/Thar SFC systems with Waters SQD using a YMC Amylose-C column with a 20% methyl alcohol/$CO_2$ (with 0.1% diethylamine) isocratic run at 5 mL/min, 120 Bar backpressure, 40° C. column temperature.

Method 21

SFC-MS was performed on a Waters/Thar SFC systems with Waters SQD using a YMC Cellulose-C column with a 15% iso-propyl alcohol/$CO_2$ (with 0.1% diethylamine) isocratic run at 5 mL/min, 120 Bar backpressure, 40° C. column temperature.

Method 22

SFC-MS was performed on a Waters/Thar SFC systems with Waters SQD using a YMC Cellulose-C column with a 15% methyl alcohol/$CO_2$ (with 0.1% diethylamine) isocratic run at 5 mL/min, 120 Bar backpressure, 40° C. column temperature.

Method 23

SFC-MS was performed on a Waters/Thar SFC systems with Waters SQD using a YMC Cellulose-C column with a 25% methyl alcohol/$CO_2$ (with 0.1% diethylamine) isocratic run at 5 mL/min, 120 Bar backpressure, 40° C. column temperature.

Method 24

SFC-MS was performed on a Waters/Thar SFC systems with Waters SQD using a YMC Cellulose-SC column with a 55% iso-propyl alcohol/$CO_2$ (with 0.1% diethylamine) isocratic run at 5 mL/min, 120 Bar backpressure, 40° C. column temperature.

Method 25

SFC-MS was performed on a Waters/Thar SFC systems with Waters SQD using a Lux Cellulose-3 column with a 10% methyl alcohol/$CO_2$ (with 0.1% diethylamine) isocratic run at 5 mL/min, 120 Bar backpressure, 40° C. column temperature.

Method 26

SFC-MS was performed on a Waters/Thar SFC systems with Waters SQD using a Lux Cellulose-3 column with a 25% methyl alcohol/$CO_2$ (with 0.1% diethylamine) isocratic run at 5 mL/min, 120 Bar backpressure, 40° C. column temperature.

Method 27

SFC-MS was performed on a Waters/Thar SFC systems with Waters SQD using a Lux Cellulose-3 column with a 30% methyl alcohol/$CO_2$ (with 0.1% diethylamine) isocratic run at 5 mL/min, 120 Bar backpressure, 40° C. column temperature.

Method 28

SFC-MS was performed on a Waters/Thar SFC systems with Waters SQD using a Lux Cellulose-4 column with a 40% iso-propyl alcohol/$CO_2$ (with 0.1% diethylamine) isocratic run at 5 mL/min, 120 Bar backpressure, 40° C. column temperature.

Method 29

SFC-MS was performed on a Waters/Thar SFC systems with Waters SQD using a Lux Cellulose-4 column with a 40% methyl alcohol/$CO_2$ (with 0.1% diethylamine) isocratic run at 5 mL/min, 120 Bar backpressure, 40° C. column temperature.

Method 30

SFC-MS was performed on a Waters/Thar SFC systems with Waters SQD using a Lux Cellulose-4 column with a 50% methyl alcohol/$CO_2$ (with 0.1% diethylamine) isocratic run at 5 mL/min, 120 Bar backpressure, 40° C. column temperature.

Method 31

SFC-MS was performed on a Waters/Thar SFC systems with Waters SQD using a Lux Cellulose-4 column with a 55% iso-propyl alcohol/$CO_2$ (with 0.1% diethylamine) isocratic run at 5 mL/min, 120 Bar backpressure, 40° C. column temperature.

Method 32

SFC-MS was performed on a Waters/Thar SFC systems with Waters SQD using a Lux Cellulose-4 column with a 55% methyl alcohol/$CO_2$ (with 0.1% diethylamine) isocratic run at 5 mL/min, 120 Bar backpressure, 40° C. column temperature.

Method 33

SFC-MS was performed on a Waters/Thar SFC systems with Waters SQD using a YMC Amylose-C column with a 20% ethyl alcohol/$CO_2$ (with 0.1% diethylamine) isocratic run at 5 mL/min, 120 Bar backpressure, 40° C. column temperature.

Method 34

SFC-MS was performed on a Waters/Thar SFC systems with Waters SQD using a YMC Amylose-C column with a 30% iso-propyl alcohol/$CO_2$ (with 0.1% diethylamine) isocratic run at 5 mL/min, 120 Bar backpressure, 40° C. column temperature.

Method 35

SFC-MS was performed on a Waters/Thar SFC systems with Waters SQD using a YMC Amylose-C column with a 30% methyl alcohol/$CO_2$ (with 0.1% diethylamine) isocratic run at 5 mL/min, 120 Bar backpressure, 40° C. column temperature.

Method 36

SFC-MS was performed on a Waters/Thar SFC systems with Waters SQD using a YMC Amylose-C column with a 40% methyl alcohol/$CO_2$ (with 0.1% diethylamine) isocratic run at 5 mL/min, 120 Bar backpressure, 40° C. column temperature.

Method 37

SFC-MS was performed on a Waters/Thar SFC systems with Waters SQD using a YMC Amylose-C column with a 55% methyl alcohol/$CO_2$ (with 0.1% diethylamine) isocratic run at 5 mL/min, 120 Bar backpressure, 40° C. column temperature.

Method 38

SFC-MS was performed on a Waters/Thar SFC systems with Waters SQD using a YMC Cellulose-C column with a 20% methyl alcohol/$CO_2$ (with 0.1% diethylamine) isocratic run at 5 mL/min, 120 Bar backpressure, 40° C. column temperature.

Method 39

SFC-MS was performed on a Waters/Thar SFC systems with Waters SQD using a YMC Cellulose-SC column with a 35% iso-propyl alcohol/$CO_2$ (with 0.1% diethylamine) isocratic run at 5 mL/min, 120 Bar backpressure, 40° C. column temperature.

Method 40

SFC-MS was performed on a Waters/Thar SFC systems with Waters SQD using a YMC Cellulose-SC column with a 45% iso-propyl alcohol/$CO_2$ (with 0.1% diethylamine) isocratic run at 5 mL/min, 120 Bar backpressure, 40° C. column temperature.

PREPARATION OF INTERMEDIATES AND EXAMPLES

Example 1

6-(1-((6-(4-Fluorophenyl)-8-methoxyquinazolin-4-yl)amino)ethyl)pyridin-2(1H)-one

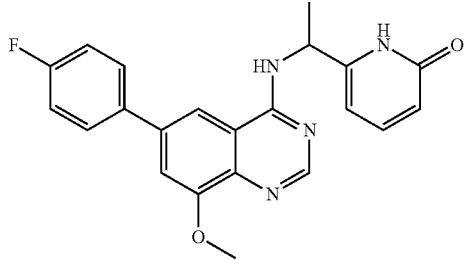 [SMILES: COc1cc(-c2ccc(F)cc2)cc2c(NC(C)c3cccc(=O)[nH]3)ncnc12]

Step 1: Preparation of 6-(1-Aminoethyl)pyridin-2(1H)-one Hydrobromide

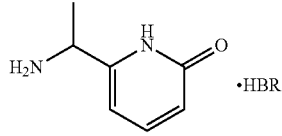

1-(6-Methoxypyridin-2-yl)ethan-1-amine (250 mg, 1.64 mmol) in hydrogen bromide (48 wt % in water, 3.7 mL) was heated at 80° C. for 24 hours. After this time the mixture was cooled to room temperature and concentrated in vacuo to give the title compound (360 mg, quantitative yield) as brown solid which was used in the next step without further purification.

$^1$H NMR (400 MHz, DMSO): δ 8.39 (br s, 3H), 7.64 (dd, J=8.9, 7.1 Hz, 1H), 6.64 (d, J=6.9 Hz, 1H), 6.54 (d, J=8.8 Hz, 1H), 4.38-4.30 (m, 1H), 1.52 (d, J=6.8 Hz, 3H). 1 NH/OH not observed.

Step 2: Preparation of 6-(1-((6-(4-fluorophenyl)-8-methoxyquinazolin-4-yl)amino)ethyl)pyridin-2(1H)-one

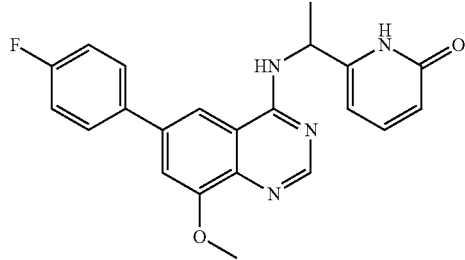 [SMILES: COc1cc(-c2ccc(F)cc2)cc2c(NC(C)c3cccc(=O)[nH]3)ncnc12]

6-(4-Fluorophenyl)-8-methoxyquinazolin-4-ol (150 mg, 0.56 mmol), (benzotriazol-1-yloxy)tripyrrolidinophosphonium hexafluorophosphate (318 mg, 0.61 mmol) and N,N-diisopropylethylamine (0.48 mL, 2.78 mmol) were stirred in N,N-dimethylformamide (4 mL) at 40° C. for 1 h. 6-(1-Aminoethyl)pyridin-2(1H)-one hydrobromide (146 mg, 0.67 mmol) was added and the reaction mixture stirred at 40° C. for 24 hours. The reaction mixture was cooled to room temperature and ethyl acetate (10 mL) and water (10 mL) were added. The layers were separated and the aqueous layer extracted with ethyl acetate (2×10 mL). The combined organics were washed with water (2×10 mL), dried on $MgSO_4$, filtered and concentrated in vacuo. The residue was purified by preparative HPLC to give the title compound (35 mg, 16%) as an off-white solid.

$^1$H NMR (400 MHz, DMSO): δ 11.73 (s, 1H), 8.47 (s, 1H), 8.43 (d, J=7.6 Hz, 1H), 8.26 (d, J=1.8 Hz, 1H), 8.02-7.97 (m, 2H), 7.58 (d, J=1.5 Hz, 1H), 7.47-7.38 (m, 3H), 6.22 (d, J=9.1 Hz, 2H), 5.43-5.35 (m, 1H), 4.06 (s, 3H), 1.64 (d, J=7.1 Hz, 3H). LCMS (Method 4): [MH+]=391 at 3.01 min.

Example 2

6-(5-fluoropyridin-2-yl)-8-methoxy-N-(1-(3-methyl-1,2,4-oxadiazol-5-yl)ethyl)quinazolin-4-amine

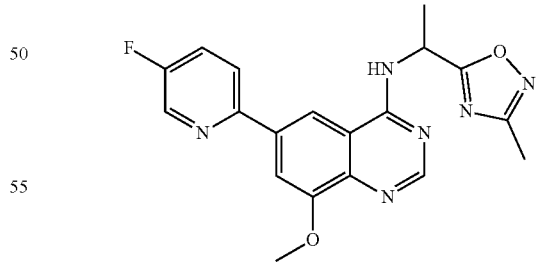

6-(5-Fluoropyridin-2-yl)-8-methoxyquinazolin-4-ol (140 mg, 0.42 mmol), benzotriazol-1-yl-oxytripyrrolidinophosphonium hexafluorophosphate (294 mmol, 0.56 mmol) and N,N-diisopropylethylamine (332 mg, 0.45 mL, 2.57 mmol) were dissolved in N,N-dimethylformamide (4 mL). The reaction mixture was heated to 40° C. for 2 hours, after which time (1-(3-methyl-1,2,4-oxadiazol-5-yl)ethan-1-amine (101 mg, 0.62 mmol) was added. The reaction mixture was stirred for a further 24 hours before being concentrated in vacuo. The residue was purified by preparative HPLC to give the title compound (12.1 mg, 6%) a colourless solid.

$^1$H NMR (400 MHz, CDCl3): δ 8.53 (dd, J=2.8, 6.5 Hz, 1H) 8.42 (s, 1H), 7.89 (d, J=4.4 Hz, 1H), 7.79 (m, 1H), 7.61 (d, J=10.1 Hz, 1H), 7.52 (m, 1H), 7.16 (br s, 1H), 5.86 (m, 1H), 4.14 (s, 3H), 2.45 (s, 3H), 1.81 (d, J=6.6 Hz, 1H). LCMS (Method 4): [MH+]=381 at 3.76 min.

The following examples reported in the table below were synthesised following the same procedure described for the preparation of 6-(5-fluoropyridin-2-yl)-8-methoxy-N-(1-(3-methyl-1,2,4-oxadiazol-5-yl)ethyl)quinazolin-4-amine (Example 2):

| Example No. | Chemical Name Structure | Analytical Data $^1$H NMR LC-MS |
|---|---|---|
| Example 3 | 6-(5-fluoropyrimidin-2-yl)-8-methoxy-N-(1-(3-methyl-1,2,4-oxadiazol-5-yl)ethyl)quinazolin-4-amine | $^1$H-NMR (400 MHz, CDCl$_3$): δ 8.66 (s, 2 H), 8.34 (m, 2 H), 8.13 (s, 1 H), 7.05 (br s, 1H), 5.86 (m, 1H, 4.13 (s, 3 H), 2.44 (s, 3 H), 1.83 (d, J = 7.3 Hz, 3 H). LCMS (Method 3): [MH+] = 382 at 2.81 min. |
| Example 4 | ((R)-6-(5-fluoropyrimidin-2-yl)-8-methoxy-N-(1-(6-methylpyradazin-3-yl)ethyl)quinazolin-4-amine | $^1$H NMR (400 MHz,CDCl$_3$): δ 8.72 (s, 1 H) 8.71(s, 2 H), 8.59 (d, J = 1.6 Hz, 1H, 8.19 (d, J = 1.6 Hz, 1 H), 7.66 (s, 1 H), 7.45 (d, J = 8.6 Hz, 1 H), 7.35 (d, J = 8.6 Hz, 1 H), 5.79 (quin, J = 6.9 Hz, 1 H, 4.15 (s, 3 H), 2.75 (s, 3 H), 1.76 (d, J = 7.0 Hz, 3 H). LCMS (Method 3): [MH$^+$] = 392 at 2.51 min. |
| Example 5 | (R)-8-methoxy-N-(1-(6-methylpyridazin-3-yl)ethyl)-6-(5-methylthiazol-2-yl)quinazolin-4-amine | $^1$H NMR (400 MHz, DMSO): δ 8.91 (d, J = 737 Hz, 1H), 8.37 (m, 2H), 7.71 (d, J = 18.1 Hz, 2H), 7.62 (d, J = 9.8 Hz, 1H), 7.5 (d, J = 9.8 Hz, 1H), 5.76 (m, J = 7.4 Hz, 1H), 3.98 (s, 3H), 2.59 (s, 3H), 2.57(s, 3H) 1.71 (d, J = 7.4 Hz, 3H). LCMS (Method 3): [MH+] = 393 at 3.8 min. |

| Example No. | Chemical Name Structure | Analytical Data ¹H NMR LC-MS |
|---|---|---|
| Example 6 | 8-methoxy-6-(5-methylpyrimidin-2-yl)-N-(1-(3-(pyridin-4-yl)-1,2,4-oxadiazol-5-yl)ethyl)quinazolin-4-amine | ¹H NMR (400 MHz, DMSO): δ 9.31 (d, J = 7.3 Hz, 1 H), 9.04 (d, J = 1.3 Hz, 1 H), 8.90 (s, 2 H), 8.85-8.83 (m, 2 H), 8.53 (s, 1 H), 8.29 (d, J = 1.5 Hz, 1 H), 7.99-7.97 (m, 2 H), 6.03-5.95 (m, 1 H), 4.07 (s, 3 H), 2.42 (s, 3 H), 1.89 (d, J = 7.1 Hz, 3 H). LCMS (Method 4): [MH+] = 441 at 2.82 min. |
| Example 7 | 8-Methoxy-N-[(1R)-1-(5-methyl-1,2,4-oxadiazol-3-yl)ethyl]-6-(5-methylpyrimidin-2-yl)quinazolin-4-amine | ¹H NMR (400 MHz, DMSO): δ 10.5 (brs, 1 H), 9.17 (d, J = 1.2 Hz, 1 H), 8.89 (d, J = 0.8 Hz, 2 H), 8.76 (s, 1 H), 8.42 (d, J = 1.2 Hz, 1 H), 5.94 (m, 1 H), 4.14 (s, 3 H), 2.58 (s, 3 H), 2.38 (s, 3 H), 1.74 (d, J = 6.8 Hz, 3 H). LCMS (Method 3): [MH+] = 378 at 3.46 min. |

Intermediate 29

Preparation of 2-amino-3-(morpholinosulfonyl)benzoic Acid

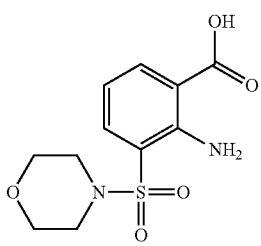 [SMILES: Nc1c(C(=O)O)cccc1S(=O)(=O)N1CCOCC1]

To a solution of morpholine (0.741 ml, 8.47 mmol) in water (50 ml), 3-(chlorosulfonyl)-2-nitrobenzoic acid (0.75 g, 2.82 mmol) was added in 10 min and stirred for 30 min, then, Pd/C 10% (50% wet) (2.82 mmol) and aqueous hydrogen chloride 2 N aq (0.103 g, 2.82 mmol) were added and the reaction was stirred overnight under hydrogen atmosphere (balloon). The catalyst was filtered off and the solvent removed under reduced pressure. The crude was purified by C18 flash chromatography ((H2O/ACN)) 95:5+ 0.1% HCOOH}:{(ACN/H2O) 95:5+HCOOH 0.1%} from 100:0 to 0:100 affording 2-amino-3-(morpholinosulfonyl) benzoic acid (0.80 g, 2.79 mmol, 99% yield) as a brown solid.

LCMS (Method 5): 0.75 min, [M+H]+ 287.75

The following compound reported in the table below was prepared via adaptation of the above procedure.

| Intermediate No. | Chemical Name Structure | Analytical data LC-MS | Reagents |
|---|---|---|---|
| Intermediate 30 | 2-amino-5-bromo-3-(N,N-dimethylsulfamoyl)benzoic acid | LCMS(Method5): 0.98 min, [M + H]+ 322.76 | dimethylamine 2 M in THF |
| Intermediate 31 | 2-amino-3-((3,3-difluoropyrrolidin-1-yl)sulfonyl)benzoic acid | LCMS(Method5A): 1.55 min, [M + H]+ 306.75 | 3,3-difluoropyrrolidine hydrochloride |
| Intermediate 32 | 2-amino-3-((4-hydroxypiperidin-1-yl)sulfonyl)benzoic acid | LCMS(Method5): 0.67 min, 300.99 [M + H]+ | piperidin-4-ol |
| Intermediate 33 | 2-amino-3-((N-methylsulfamoyl)benzoic acid | LCMS(Method5): 0.63 min, [M + H]+ 230.9 | methyl amine solution 2 M in THF |

| Intermediate No. | Chemical Name Structure | Analytical data LC-MS | Reagents |
|---|---|---|---|
| Intermediate 34 | 2-amino-3-((4-((benzyloxy)carbonyl)piperazin-1-yl)sulfonyl)benzoic acid 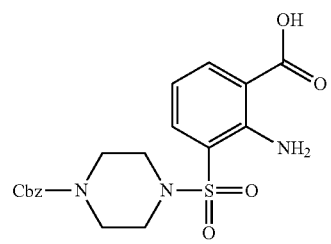 | LCMS(Method5): 1.07 min, [M + H]+ 419.72 | benzyl piperazine-1-carboxylate |

Intermediate 35

2-amino-5-bromo-3-(morpholinosulfonyl) Benzoic Acid

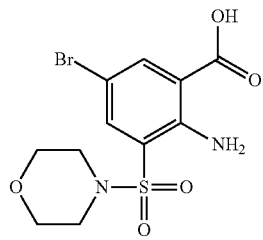 [SMILES: Nc1c(C(=O)O)cc(Br)cc1S(=O)(=O)N1CCOCC1]

To a solution of 2-amino-3-(morpholinosulfonyl)benzoic acid (0.8 g, 2.79 mmol) (Intermediate 29) in DMF, NBS (0.567 ml, 2.79 mmol) was added and the solution stirred for 30 min. Then, solvent was removed and the crude was purified by C18 flash chromatography ((H$_2$O/ACN)) 95:5+ 0.1% o HCOOH}:{(ACN/H$_2$O) 95:5+HCOOH 0.1%} from 100:0 to 0:100 affording 2-amino-5-bromo-3-(morpholinosulfonyl)benzoic acid (0.85 g, 2.328 mmol, 83 0% yield) as a white off solid.

LCMS (Method 5): 0.98 min, 366.56 [M+H]+

The following compound reported in the table below was prepared via adaptation of the above procedure.

| Intermediate No. | Chemical Name Structure | Analytical data LC-MS | Reagents |
|---|---|---|---|
| Intermediate 36 | 2-amino-5-bromo-3-(N,N-dimethylsulfamoyl)benzoic acid 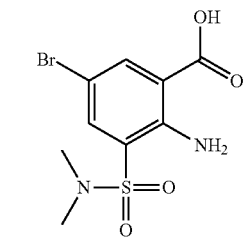 | LCMS(Method5): 0.98 min, [M + H]+ 322.76 | Intermediate 30 |
| Intermediate 37 | 2-amino-5-bromo-3-((3,3-difluoropyrrolidin-1-yl)sulfonyl)benzoic acid 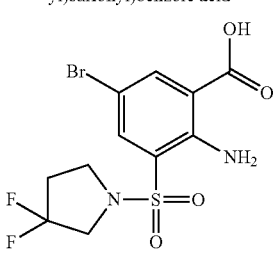 | LCMS(Method5): 1.11 min, [M + H]+ 384.56 | Intermediate 31 |

-continued

| Intermediate No. | Chemical Name Structure | Analytical data LC-MS | Reagents |
|---|---|---|---|
| Intermediate 38 | 6-bromo-8-((4-hydroxypiperidin-1-yl)sulfonyl)quinazolin-4-ol | LCMS(Method5): 0.86 min, 378.96 [M + H]+ | Intermediate 32 |
| Intermediate 39 | 2-amino-5-bromo-3-(N-methylsulfamoyl)benzoic acid | LCMS(Method5): 0.84 min, [M + H]+ 308.61 | Intermediate 32 |
| Intermediate 40 | | LCMS(Method5): 1.07 min, [M + H]+ 497.77 | Intermediate 34 |

Intermediate 41

6-bromo-8-(morpholinosulfonyl)quinazolin-4-ol

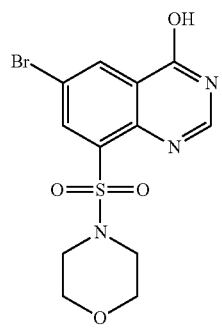 [SMILES: O=S(=O)(c1cc(Br)cc2c(O)ncnc12)N1CCOCC1]

To a solution 2-amino-5-bromo-3-(morpholinosulfonyl) benzoic acid (600 mg, 1.643 mmol) (Intermediate 35) in Formamide (6 ml), ethanesulfonic acid (0.6 ml, 1.643 mmol) was added and the mixture heated to 120 C for 48h. The reaction was directly loaded on C18 cartridge by reverse chromatography ((H₂O/ACN)) 95:5+0.1% HCOOH}:{ (ACN/H₂O) 95:5+HCCOH 0.1%} from 100:0 to 0:100 affording 6-bromo-8-(morpholinosulfonyl)quinazolin-4-ol (0.230 g, 0.615 mmol, 37.4% yield) as a brown solid.

LCMS (Method 5): 0.72 min [M+H]+ 375.56

The following compound reported in the table below was prepared via adaptation of the above procedure.

| Intermediate No. | Chemical Name Structure | Analytical data LC-MS | Reagents |
|---|---|---|---|
| Intermediate 42 | 6-bromo-4-hydroxy-N,N-dimethylquinazoline-8-sulfonamide 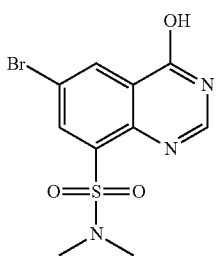 | LCMS(Method5): 0.74 min, [M + H]+ 331.71 | Intermediate 36 |
| Intermediate 43 | 6-bromo-8-((3,3-difluoropyrrolidin-1-yl)sulfonyl)quinazolin-4-ol 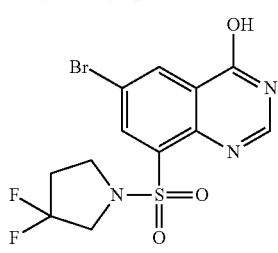 | LCMS(Method5): 0.88 min, [M + H]+ 393.66 | Intermediate 37 |
| Intermediate 44 | 6-bromo-8-((4-hydroxypiperidin-1-yl)sulfonyl)quinazolin-4-ol 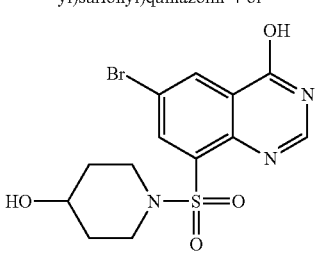 | LCMS(Method5): 0.66 min, 387.95 [M + H]+ | Intermediate 38 |
| Intermediate 45 | 6-bromo-4-hydroxy-N-methylquinazoline-8-sulfonamide 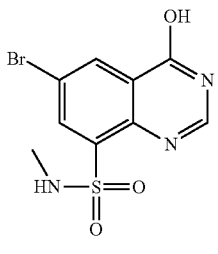 | LCMS(Method5): 0.69 min, [M + H]+ 317.81 | Intermediate 39 |

-continued

| Intermediate No. | Chemical Name Structure | Analytical data LC-MS | Reagents |
|---|---|---|---|
| Intermediate 46 | benzyl 4-((6-bromo-4-hydroxyquinazolin-8-yl)sulfonyl)piperazine-1-carboxylate<br>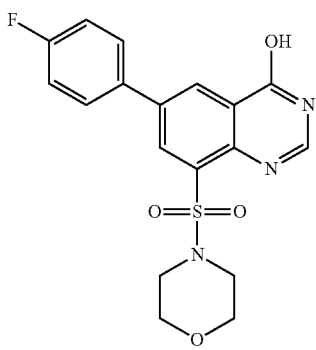 [SMILES: O=S(=O)(c1cc(-c2ccc(F)cc2)cc2c(O)ncnc12)N1CCOCC1] | LCMS(Method5A): 1.05 min, 506.67 [M + H]+ | Intermediate 40 |

Intermediate 47

6-(4-fluorophenyl)-8-(morpholinosulfonyl)quinazolin-4-ol

To a suspension of 6-bromo-8-(morpholinosulfonyl)quinazolin-4-ol (250 mg, 0.668 mmol) in Dioxane (10 ml), Water (3 ml), 4-fluorophenylboronic acid (187 mg, 1.336 mmol), K2CO3 (277 mg, 2.004 mmol) PdCl2(dppf) (56 mg, 0.07 mmol) were added and the reaction was stirred overnight. Then, solvent was removed and the crude was purified by C18 flash chromatography ((H2O/ACN)) 95:5+0.1% HCOOH}:{(ACN/H2O) 95:5+HCOOH 0.1%} from 100:0 to 0:100 affording 6-(4-fluorophenyl)-8-(morpholinosulfonyl)quinazolin-4-ol (204 mg, 0.524 mmol, 78% yield) as a brown solid.

LCMS (Method 5): 0.87 min, [M+H]+ 389.81

The following compounds reported in the table below was prepared via adaptation of the above procedure.

| Intermediate No. | Chemical Name Structure | Analytical data LC-MS | Reagents |
|---|---|---|---|
| Intermediate 48 | 6-(4-fluorophenyl)-4-hydroxy-N,N-dimethylquinazoline-8-sulfonamide<br>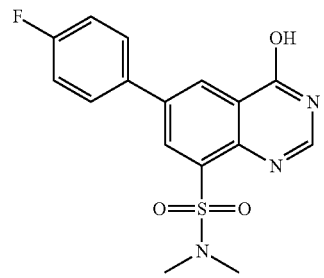 | LCMS(Method5): 0.91 min, [M + H]+ 347.81 | Intermediate 42 |

| Intermediate No. | Chemical Name Structure | Analytical data LC-MS | Reagents |
|---|---|---|---|
| Intermediate 49 | 8-((3,3-difluoropyrrolidin-1-yl)sulfonyl)-6-(4-fluorophenyl)quinazolin-4-ol 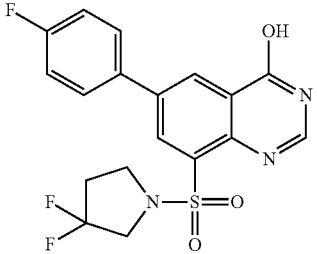 | LCMS(Method5): 1.01 min, 410.02 [M + H]+ | Intermediate 43 |
| Intermediate 50 | 6-(4-fluorophenyl)-8-((4-hydroxypiperidin-1-yl)sulfonyl)quinazolin-4-ol 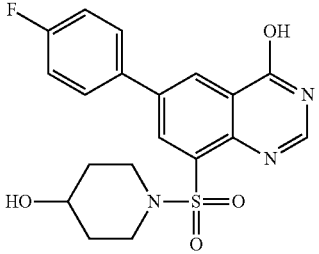 | LCMS(Method5): 0.80 min, 404.32 [M + H]+ | Intermediate 44 |
| Intermediate 51 | 6-(4-fluorophenyl)-4-hydroxy-N-methylquinazoline-8-sulfonamide 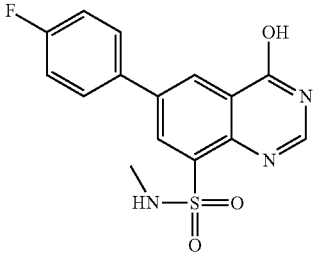 | LCMS(Method5): 0.85 min, [M + H]+ 333.81 | Intermediate 45 |
| Intermediate 52 | benzyl 4-((6-(4-fluorophenyl)-4-hydroxyquinazolin-8-yl)sulfonyl)piperazine-1-carboxylate 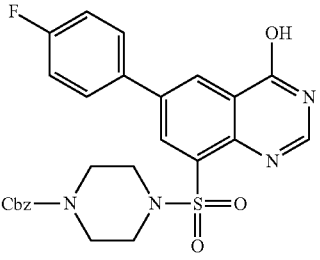 | LCMS(Method5A): 1.13 min, 522.52 [M + H]+ | Intermediate 46 |

Example 8

(R)-6-(4-fluorophenyl)-N-(1-(6-methylpyridazin-3-yl)ethyl)-8-(morpholinosulfonyl)quinazolin-4-amine

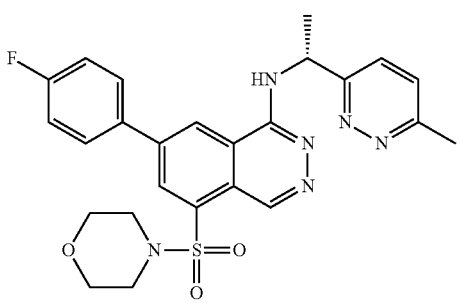 [SMILES: Cc1ccc([C@@H](C)Nc2nncc3c(S(=O)(=O)N4CCOCC4)cc(-c4ccc(F)cc4)cc23)nn1]

To a solution of 6-(4-fluorophenyl)-8-(morpholinosulfonyl)quinazolin-4-ol (60 mg, 0.154 mmol) in dry DMF (4 ml), PyBOP (96 mg, 0.185 mmol) and DIPEA (0.059 ml, 0.339 mmol) were added and the reaction was stirred for 30 min. Then, ((R)-1-(6-methylpyridazin-3-yl)ethan-1-amine dihydrochloride (32.4 mg, 0.154 mmol) was added and the reaction was further stirred for 30 min. Then, solvent was removed and the crude purified by C18 flash chromatography ((H2O/ACN)) 95:5+0.1% HCOOH}:{(ACN/H2O) 95:5+HCOOH 0.1%} from 100:0 to 0:100 affording (R)-6-(4-fluorophenyl)-N-(1-(6-methylpyridazin-3-yl)ethyl)-8-(morpholinosulfonyl)quinazolin-4-amine (10 mg, 0.020 mmol, 12.76% yield) as a yellowish solid.

$^1$H NMR (400 MHz, DMSO-$d_6$) δ ppm 9.20 (s, 2H), 9.01 (br d, J=6.58 Hz, 1H), 8.95 (s, 1H), 8.56 (s, 1H), 8.54 (s, 1H), 7.92 (br dd, J=8.22, 5.59 Hz, 2H), 7.43 (br t, J=8.66 Hz, 2H), 5.71 (br quin, J=6.80 Hz, 1H), 4.33 (br t, J=4.82 Hz, 2H), 3.52-3.61 (m, 4H), 3.39-3.50 (m, 2H), 1.75 (br d, J=7.02 Hz, 3H)

LCMS (Method 5): 1.58 min, 509.13 [M+H]+

The following compounds reported in the table below was prepared via adaptation of the above procedure.

| Example No. | Chemical name Structure | Analytical data $^1$H NMR/LC-MS |
|---|---|---|
| Example 9 | ((R)-6-(4-fluorophenyl)-8-(morpholinosulfonyl)-N-(1-(2-(trifluoromethyl)pyrimidin-5-yl)ethyl)quinazolin-4-amine | $^1$H NMR (400 MHz, DMSO-$d_6$) δ ppm 9.20 (s, 2 H), 9.01 (br d, J = 6.58 Hz, 1 H), 8.95 (s, 1 H), 8.56 (s, 1 H), 8.54 (s, 1 H), 7.92 (br dd, J = 8.22, 5.59 Hz, 2 H), 7.43 (br t, J = 8.66 Hz, 2 H), 5.71 (br quin, J = 6.80 Hz, 1 H), 4.33 (br t, J = 4.82 Hz, 2 H), 3.52-3.61 (m, 4 H), 3.39-3.50 (m, 2 H), 1.75 (br d, J = 7.02 Hz, 3 H) LCMS (Method5): [MH+] = 509.13 at 1.58 min. |
| Example 10 | (Rac)-6-(4-fluorophenyl)-N-(1-(5-methyl-1,3,4-thiadiazol-2-yl)ethyl)-8-(morpholinosulfonyl)quinazolin-4-amine | $^1$H NMR (600 MHz, DMSO-d6) δ ppm 9.22 (d, J = 7.42 Hz, 1 H) 8.95 (d, J = 2.06 Hz, 1 H) 8.66 (s, 1 H) 8.57 (d, J = 1.92 Hz, 1 H) 7.92 (dd, J = 8.80, 5.36 Hz, 2 H) 7.43 (t, J = 8.35 Hz, 2 H) 6.01 (quin, J = 7.11 Hz, 1 H) 3.57-3.60 (m, 4 H) 2.66 (s, 3 H) 2.52-2.55 (m, 4 H) 1.82 (d, J = 7.01 Hz, 3 H) LCMS (Method5): [MH+] = 515.01 at 0.98 min |

-continued

| Example No. | Chemical name Structure | Analytical data ¹H NMR/LC-MS |
|---|---|---|
| Example 11 | (R)-6-(4-fluorophenyl)-N,N-dimethyl-4-((1-(6-methylpyridazin-3-yl)ethyl)-amino)quinazoline-8-sulfonamide | ¹H NMR (400 MHz, DMSO-d6) δ ppm 9.06 (d, J = 7.23 Hz, 1 H) 9.02 (d, J = 1.97 Hz, 1 H) 8.54 (d, J = 1.97 Hz, 1 H) 8.51 (s, 1 H) 7.93 (dd, J = 8.77, 5.26 Hz, 2 H) 7.65 (d, J = 8.77 Hz, 1 H) 7.50 (d, J = 8.55 Hz, 1 H) 7.43 (t, J = 8.77 Hz, 2 H) 5.78 (quin, J = 7.07 Hz, 1 H) 2.86 (s, 6 H) 2.58 (s, 3 H) 1.73 (s, 3 H). LCMS (Method5): [MH+] = 466.62 at 0.92 min |
| Example 12 | 6-(4-fluorophenyl)-N,N-dimethyl-4-((1-(5-methyl-1,3,4-thiadiazol-2-yl)ethyl)amino)quinazoline-8-sulfonamide | ¹H NMR (400 MHz, DMSO-d6) δ ppm 9.16 (br d, J = 7.45 Hz, 1H) 8.89 (s, 1 H) 8.62 (s, 1 H) 8.52 (s, 1 H) 7.87 (dd, J = 8.44, 5.59 Hz, 2 H) 7.39 (t, J = 8.77 Hz, 2 H) 5.96 (quin, J = 7.02 Hz, 1 H) 2.84 (s, 6 H) 2.62 (s, 3H) 1.78 (d, J = 7.02 Hz, 3 H) LCMS (Method5): [MH+] = 472.7 at 1.0 min |
| Example 13 | 6-(4-fluorophenyl)-N,N-dimethyl-4-((1-(5-methyl-1,2,4-oxadiazol-3-yl)ethyl)amino)quinazoline-8-sulfonamide | ¹H NMR (400 MHz, DMSO-d6) δ ppm 9.03 (d, J = 7.13 Hz, 1 H) 8.95 (d, J = 1.75 Hz, 1 H) 8.60 (s, 1 H) 8.55 (d, J = 1.75 Hz, 1 H) 7.91 (dd, J = 8.66, 5.37 Hz, 2 H) 7.42 (t, J = 8.77 Hz, 2 H) 5.77 (quin, J = 7.18 Hz, 1 H) 2.87 (s, 6 H) 2.57 (s, 3 H) 1.69 (d, J = 7.02 Hz, 3 H). LCMS (Method5): [MH+] = 457.6 at 1.02 min |

| Example No. | Chemical name Structure | Analytical data ¹H NMR/LC-MS |
|---|---|---|
| Example 19 | (R)-6-(4-fluorophenyl)-N-methyl-4-((1-(6-methylpyridazin-3-yl)ethyl)amino)quinazoline-8-sulfonamide 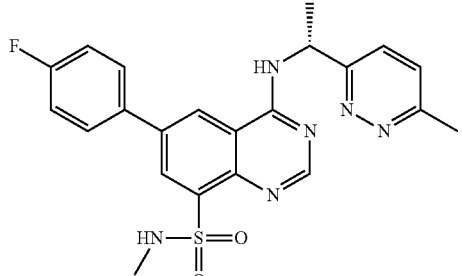 | ¹H NMR (600 MHz. DMSO-d6) δ ppm 9.13 (d, J = 7.18 Hz, 1 H) 9.04 (d, J = 2.05 Hz, 1 H) 8.52 (s, 1 H) 8.48 (d, J = 2.05 Hz, 1 H) 7.94 (dd, J = 8.78, 5.32 Hz. 2 H) 7.65 (d, J = 8.72 Hz, 1 H) 7.50 (d, J = 8.72 Hz, 1 H) 7.43 (t, J = 8.85 Hz, 2 H) 6.98 (q, J = 5.21 Hz, 1 H) 5.78 (quin, J = 7.12 Hz. 1 H) 2.58 (s, 3 H) 2.42 (d, J = 5.15 Hz, 3 H) 1.73 (d, J = 7.06 Hz, 3 H) LCMS (Method5A): [MH+] = 452.92 at 1.61 min |
| Example 20 | (R)-6-(4-fluorophenyl)-N-methyl-4-((1-(5-methyl-1,2,4-oxadiazol-3-yl)ethyl)amino)quinazoline-8-sulfonamide 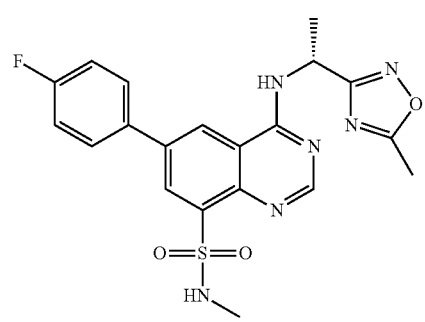 | ¹H NMR (600 MHz. DMSO-d6) δ ppm 9.11 (d, J = 7.63 Hz, 1 H), 8.97 (d, J = 2.05 Hz, 1H), 8.60 (s, 1H), 8.49 (d, J = 2.05 Hz, 1 H), 7.92 (t, J = 6.71 Hz, 2 H), 7.42 (t, J = 8.41 Hz, 2 H), 7.01 (q, J = 5.18 Hz, 1 H), 5.78 (quin, J = 7.19 Hz, 1 H), 2.57 (s, 3 H), 2.44 (d, J = 4.99 Hz, 3 H), 1.69 (d, J = 7.04 Hz, 3 H) LCMS (Method5A): [MH+] = 442.81 at 1.81 min |
| Example 21 | 6-(4-fluorophenyl)-N-methyl-4-((1-(5-methyl-1,3,4-thiadiazol-2-yl)ethyl)amino)quinazoline-8-sulfonamide 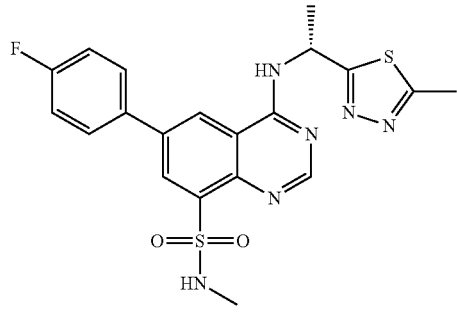 | ¹H NMR (400 MHz, DMSO-d6) δ ppm 9.22 (d, J = 7.23 Hz, 1 H), 8.90 (d, J = 1.75 Hz, 1H), 8.62 (s, 1H), 8.47 (d, J = 1.75 Hz, 1 H), 7.88 (dd, J = 8.66, 5.37 Hz, 2 H), 7.39 (t, J = 8.88 Hz, 2 H), 6.99 (q, J = 5.04 Hz, 1 H), 5.96 (t, J = 7.13 Hz, 1 H), 2.62 (s, 3 H), 2.39-2.43 (m, 3 H), 1.79 (d, J = 7.02 Hz, 3 H) LCMS (Method): [MH+] = 458.02 at 1.02 min |

Example 22

(R)-6-(4-fluorophenyl)-N-(1-(6-methylpyridazin-3-yl)ethyl)-8-(piperazin-1-ylsulfonyl)quinazolin-4-amine

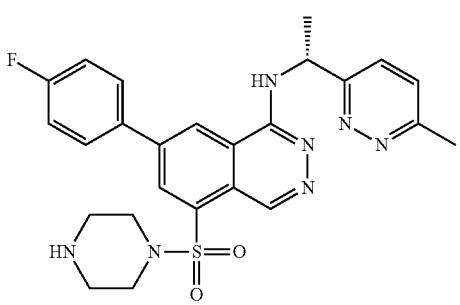 [SMILES: Cc1ccc([C@@H](C)Nc2nncc3c(S(=O)(=O)N4CCNCC4)cc(-c4ccc(F)cc4)cc23)nn1]

To a solution of benzyl 4-((6-(4-fluorophenyl)-4-hydroxyquinazolin-8-yl)sulfonyl)piperazine-1-carboxylate (100 mg, 0.191 mmol) (Intermediate 52) in dry DMF (5 ml), PyBOP (129 mg, 0.249 mmol) and DIPEA (0.100 ml, 0.574 mmol) were added and the reaction was stirred for 30 min. Then, (R)-1-(6-methylpyridazin-3-yl)ethan-1-amine dihydrochloride (40.2 mg, 0.191 mmol) was added and the reaction was further stirred for 30 min. The solvent was removed and the crude redissolved in dry DCM (5.00 ml) and borontribromide 1 M in DCM (1.914 ml, 1.914 mmol) was added and the reaction was stirred for 1 hr. EtOH (2 mL) was added then volatiles were removed and the crude purified by C18 flash chromatography ((H2O/ACN)) 95:5+0.1% HCOOH}:{(ACN/H2O) 95:5+HCOOH 0.1%} from 100:0 to 0:100 affording (R)-6-(4-fluorophenyl)-N-(1-(6-methylpyridazin-3-yl)ethyl)-8-(piperazin-1-ylsulfonyl)quinazolin-4-amine (7 mg, 0.014 mmol, 7.21% yield) as a white solid.

1H NMR (400 MHz, DMSO-d6) δ ppm 9.25 (br d, J=6.58 Hz, 1H), 9.08 (d, J=1.75 Hz, 1H), 8.64 (br s, 2H), 8.54 (d, J=1.75 Hz, 1H), 8.50 (s, 1H), 7.88-7.98 (m, 3H), 7.76 (d, J=8.77 Hz, 1H), 7.41 (t, J=8.77 Hz, 2H), 5.76 (quin, J=6.96 Hz, 1H), 3.46-3.58 (m, 4H), 3.09 (br s, 4H), 2.62 (s, 3H), 1.71 (d, J=7.02 Hz, 3H)

UPLC PRECLI-WI-0183 minuti rt 4.29 min 508.18 m/z

The following compounds reported in the table below was prepared via adaptation of the above procedure.

| Example No. | Chemical name Structure | Analytical data ¹H NMR/LC-MS |
|---|---|---|
| Example 23 | (R)-6-(4-fluorophenyl)-N-(1-(5-methyl-1,2,4-oxadiazol-3-yl)ethyl)-8-(piperazin-1-ylsulfonyl)quinazolin-4-amine 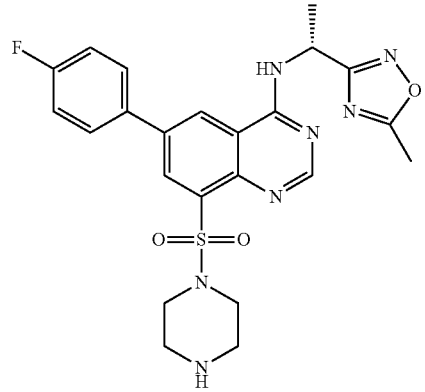 | ¹H NMR (600 MHz, DMSO-d6) δ ppm 9.11 (d, J = 7.56 Hz, 1 H), 9.00 (d, J = 2.30 Hz, 1 H), 8.62 (s, 1 H), 8.58 (d, J = 1.97 Hz, 1 H), 7.93 (t, J = 6.62 Hz, 2 H), 7.44 (t, J = 8.71 Hz, 1 H), 5.78-5.82 (m, 1 H), 3.36-3.50 (m, 4 H), 2.97-3.06 (m, 4 H), 2.59 (s, 3 H), 1.70 (d, J = 6.91 Hz, 3 H) LCMS (Method5): [MH+] = 458.02 at 1.02 min |

Intermediate 20

(R)-6-(4-Fluorophenyl)-8-iodo-N-(1-(2-(trifluoromethyl)pyrimidin-5-yl)ethyl)quinazolin-4-amine

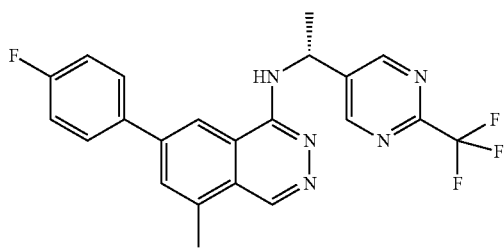 [SMILES: Cc1cc(-c2ccc(F)cc2)cc2c(N[C@H](C)c3cnc(C(F)(F)F)nc3)nncc12]

Step 1: Preparation of methyl 4-amino-4'-fluoro-[1,1'-biphenyl]-3-carboxylate

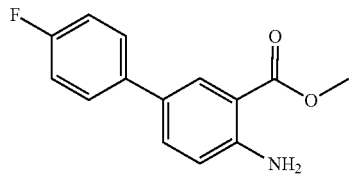 [SMILES: COC(=O)c1cc(-c2ccc(F)cc2)ccc1N]

Nitrogen was bubbled for 5 min through a mixture of methyl 2-amino-5-bromobenzoate (2.00 g, 8.69 mmol), 4-fluorophenylboronic acid, pinacol ester (2.90 g, 12.04 mmol), potassium phosphate tribasic (3.69 g, 17.39 mmol), water (3.5 mL) in N,N-dimethylformamide (10.5 mL), then [1,1'-bis(diphenylphosphino)ferrocene]-dichloropalladium (II) complex with dichloromethane (710 mg, 0.87 mmol) was added. The resulting mixture was heated to 100° C. for 1.25 hours. After return to room temperature, the reaction was diluted with water (100 mL) and diethyl ether (100 mL) and the organic phase was separated. The aqueous phase was extracted further with diethyl ether (100 mL) and then Ethyl acetate (100 mL). The organic phases were combined, washed with water (100 mL), dried over MgSO$_4$ and the solvent was removed in vacuo. The residue was purified by chromatography on silica gel eluting with 5-35% Ethyl acetate in cyclohexane to give the title compound as an off-white solid (2.08 g, 97%).

$^1$H NMR (400 MHz, CDCl3): δ 8.06 (d, J=2.3 Hz, 1H), 7.50-7.44 (m, 3H), 7.08 (dd, J=8.7, 8.7 Hz, 2H), 6.74 (d, J=8.6 Hz, 1H), 5.78 (s, 2H), 3.90 (s, 3H).

Step 2: Preparation of methyl 4-amino-4'-fluoro-5-iodo-[1,1'-biphenyl]-3-carboxylate

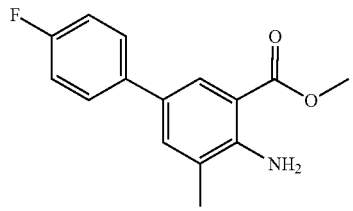 [SMILES: COC(=O)c1cc(-c2ccc(F)cc2)cc(C)c1N]

To a solution of methyl 4-amino-4'-fluoro-[1,1'-biphenyl]-3-carboxylate (2.08 g, 8.48 mmol) in dichloromethane (25 mL) was added bis(pyridine)iodonium tetrafluoroborate (4.73 g, 12.72 mmol) and TFA (2.1 mL, 27.42 mmol). The resulting mixture was stirred at room temperature for 2 days. HPLC analysis showed 70% conversion and further bis(pyridine)iodonium tetrafluoroborate (1.25 g, 3.36 mmol) was added and the stirring was maintained for a further 2.5 hours. The reaction was diluted with dichloromethane (25 mL) and cautiously treated with a solution of NaHCO$_3$ (7 g, 83 mmol) in water (100 mL). The aqueous layer was collected and further extracted with dichloromethane (2×25 mL). The organic phases were combined, washed with an 8% sodium thio sulphate aqueous solution (100 mL), filtered through a hydrophobic frit and the solvent was removed in vacuo. The residue was purified by chromatography on silica gel eluting with 0-25% Ethyl acetate in cyclohexane to give the title compound as an off-white solid (2.71 g, 86%).

$^1$H NMR (400 MHz, CDCl$_3$): δ 8.10-8.07 (m, 1H), 8.04-8.00 (m, 1H), 7.46-7.41 (m, 2H), 7.09 (dd, J=8.6, 8.6 Hz, 2H), 6.48-6.37 (m, 2H), 3.91 (s, 3H).

Step 3: Preparation of 4-amino-4'-fluoro-5-iodo-[1,1'-biphenyl]-3-carboxylic acid

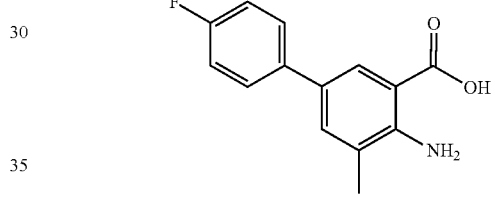

To a solution of methyl 4-amino-4'-fluoro-5-iodo-[1,1'-biphenyl]-3-carboxylate (2.59 g, 6.98 mmol) in 1,4-dioxane (25 mL) and water (5 mL) was added lithium hydroxide monohydrate (1.75 g, 41.87 mmol). The mixture was stirred at room temperature for 18 hours. The reaction was diluted with water (100 mL) and diethyl ether (100 mL) and separated. The aqueous phase was acidified with 1N HCl (45 mL) to pH=1 and extracted with dichloromethane (3×50 mL). The organic phases were combined, filtered through a hydrophobic frit and the solvent was removed in vacuo to give the title compound as an off-white solid (2.39 g, 96%).

$^1$H NMR (400 MHz, DMSO): δ 13.17 (s, 1H), 8.18 (d, J=2.0 Hz, 1H), 8.09 (d, J=2.3 Hz, 1H), 7.65 (dd, J=5.4, 8.5 Hz, 2H), 7.27 (dd, J=8.8, 8.8 Hz, 2H), 6.84 (s, 2H).

Step 4: Preparation of 6-(4-fluorophenyl)-8-iodoquinazolin-4(3H)-one

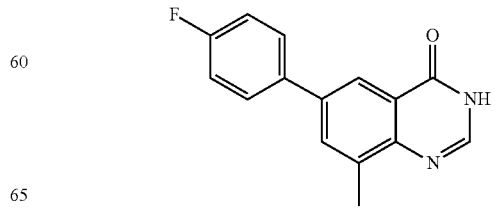

A solution of 4-amino-4'-fluoro-5-iodo-[1,1'-biphenyl]-3-carboxylic acid (2.39 g, 6.69 mmol) in formamide (4 mL) was heated to 130° C. for 16 hours. After return to room temperature, the reaction was diluted with water (20 mL) and stirred for 20 minutes before filtering. The solid was washed with water (3×5 mL) then 10% MeOH in diethyl ether (3×5 mL) to give the title compound as an off-white solid (2.14 g, 87%).

$^1$H NMR (400 MHz, DMSO): δ 12.57 (s, 1H), 8.66 (s, 1H), 8.36 (s, 1H), 8.28 (s, 1H), 7.89 (dd, J=5.6, 7.8 Hz, 2H), 7.38 (dd, J=8.6, 8.6 Hz, 2H).

Step 5: Preparation of (R)-6-(4-fluorophenyl)-8-iodo-N-(1-(2-(trifluoromethyl)pyrimidin-5-yl)ethyl)quinazolin-4-amine

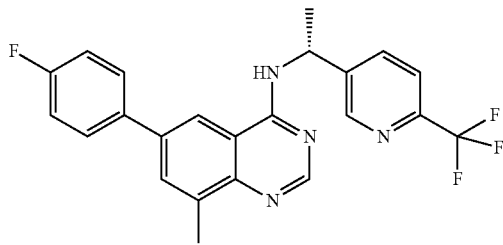 [SMILES: Cc1cc(-c2ccc(F)cc2)cc2c(N[C@H](C)c3ccc(C(F)(F)F)nc3)ncnc12]

To a solution of 6-(4-fluorophenyl)-8-iodoquinazolin-4-(3H)-one (1.14 g, 3.11 mmol) in N,N-dimethylformamide (10 mL) was successively added (benzotriazol-1-yloxy)tripyrrolidinophosphonium hexafluorophosphate (2.03 g, 1.25 mmol) and di-isopropylethylamine (2.7 mL, 15.57 mmol). The resulting mixture was heated to 45° C. for one hour then (R)-1-(2-(trifluoromethyl)pyrimidin-5-yl)ethan-1-amine hydrochloride (0.96 g, 4.2 mmol) was added and the heating was maintained at 45° C. for 2 hours. After return to room temperature, the mixture was diluted with ethyl acetate (75 mL) and water (175 mL). The organic phase was washed with brine (2×20 mL), passed through a hydrophobic frit and the solvent was removed in vacuo. The residue was purified by chromatography on silica gel eluting with 0-15% ethyl acetate in dichloromethane to give the title compound as an off-white solid (1.27 g, 75%).

$^1$H NMR (400 MHz, DMSO): δ 9.18 (s, 2H), 8.88 (d, J=6.9 Hz, 1H), 8.71 (d, J=1.8 Hz, 1H), 8.67 (d, J=1.8 Hz, 1H), 8.51 (s, 1H), 7.95-7.90 (m, 2H), 7.40 (dd, J=8.9, 8.9 Hz, 2H), 5.73-5.67 (m, 1H), 1.75 (d, J=7.2 Hz, 3H).

The following compound reported in the table below was prepared via adaptation of the above procedure using the appropriate amine.

Example 24

(R)-6-(4-fluorophenyl)-8-(pyridazin-4-yl)-N-(1-(2-(trifluoromethyl)pyrimidin-5-yl)ethyl)quinazolin-4-amine

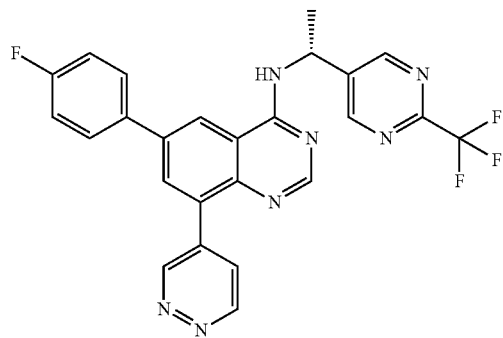 [SMILES: C[C@@H](Nc1ncnc2c(-c3ccnnc3)cc(-c3ccc(F)cc3)cc12)c1cnc(C(F)(F)F)nc1]

Nitrogen was bubbled for 10 minutes through a suspension of (R)-6-(4-fluorophenyl)-8-iodo-N-(1-(2-(trifluoromethyl)pyrimidin-5-yl)ethyl)quinazolin-4-amine (50 mg, 0.093 mmol), 4-(tributylstannyl)pyridazine (44 mg, 0.12 mmol, 1.3 eq.), tetrakis(triphenylphosphine)palladium(O) (16 mg, 0.014 mmol, 0.15 eq.) in 1,4-dioxane (1 mL). The degassed mixture is subsequently transferred to a pre-heated 90° C. stirrer. The mixture then was stirred at 90° C. for 17 hours. The resulting solution was cooled to room temperature. The resulting residue was stirred with saturated aqueous potassium fluoride solution (10 mL) for 1 hour and extracted with ethyl acetate (3×15 mL). The combined organic layers were passed through a hydrophobic frit and concentrated in vacuo. The residue was purified by SCX cartridge, washing with methanol (10 mL) then eluting in 10% v/v 7 N ammonia in methanol. The resulting residue was purified by preparative HPLC to give the title compound (6.0 mg, 13%) as an off-white solid.

$^1$H NMR (400 MHz, DMSO): δ 9.65-9.63 (m, 1H), 9.35 (dd, J=1.1, 5.3 Hz, 1H), 9.21 (s, 2H), 8.93 (d, J=6.9 Hz, 1H), 8.84 (d, J=1.9 Hz, 1H), 8.50 (s, 1H), 8.36 (d, J=1.9 Hz, 1H), 8.10 (dd, J=2.3, 5.3 Hz, 1H), 8.07-8.02 (m, 2H), 7.44 (dd, J=8.8, 8.8 Hz, 2H), 5.72 (dd, J=7.0, 7.0 Hz, 1H), 1.78 (d, J=7.0 Hz, 3H). LCMS (Method 4): [MH+]=492 at 4.49 min.

Example 25

(R)-6-(4-fluorophenyl)-8-(pyrimidin-5-yl)-N-(1-(2-(trifluoromethyl)pyrimidin-5-yl)ethyl)quinazolin-4-amine

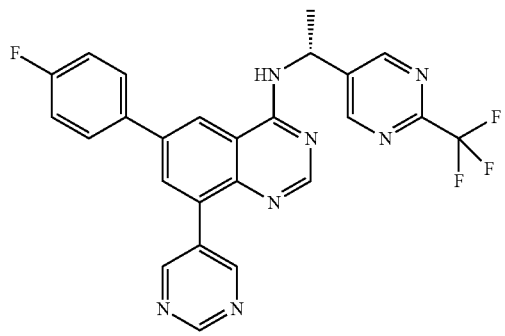 [SMILES: C[C@@H](Nc1ncnc2c(-c3cncnc3)cc(-c3ccc(F)cc3)cc12)c1cnc(C(F)(F)F)nc1]

Nitrogen was bubbled for 10 minutes through a suspension of (R)-6-(4-fluorophenyl)-8-iodo-N-(1-(2-(trifluoromethyl)pyrimidin-5-yl)ethyl)quinazolin-4-amine (100 mg, 0.18 mmol), pyrimidin-5-ylboronic acid (31 mg, 0.25 mmol), cesium fluoride (85 mg, 0.556 mmol) in water (0.5 mL) and N,N-dimethylformamide (2.0 mL), then Tetrakis(triphenylphosphine)palladium(O) (21 mg, 0.018 mmol) was added. The resulting mixture was heated at 95° C. for 18 hours. After this time the reaction mixture was cooled to room temperature and filtered through Celite, washing with ethyl acetate (2×10 mL). The combined organics were partitioned with water (15 mL), dried via phase separator cartridge and concentrated in vacuo. The resulting residue was purified by preparative HPLC to give the title compound (49 mg, 55%) as an off-white solid.

$^1$H NMR (400 MHz, DMSO): δ 9.22-9.18 (m, 5H), 8.90 (d, J=6.9 Hz, 1H), 8.80 (d, J=1.9 Hz, 1H), 8.49 (s, 1H), 8.34 (d, J=1.9 Hz, 1H), 8.07-8.03 (m, 2H), 7.43 (dd, J=8.9, 8.9 Hz, 2H), 5.75-5.70 (m, 1H), 1.78 (d, J=7.2 Hz, 3H). LCMS (Method 3): [MH+]=492 at 4.88 min.

The following intermediates reported in the table below were prepared according to the same procedure described for the preparation of (R)-6-(4-fluorophenyl)-8-(pyrimidin-5-yl)-N-(1-(2-(trifluoromethyl)pyrimidin-5-yl)ethyl)quinazolin-4-amine

| Intermediates No. | Chemical name Structure | Analytical data ¹H NMR LC-MS |
|---|---|---|
| Intermediate 53 | (R)-8-(3,6-dihydro-2H-pyran-4-yl)-6-(4-fluorophenyl)-N-(1-(2-(trifluoro-methyl)pyrimidin-5-yl)ethyl)quinazolin-4-amine 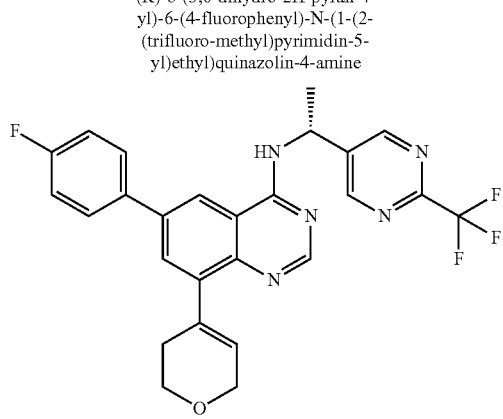 | LCMS (Method 4): [MH+] = 496.2 at 3.95 min. |
| Intermediate 54 | tert-butyl (R)-4-(6-(4-fluorophenyl)-4-((1-(2-(trifluoromethyl)pyrimidin-5-yl)ethyl)amino)quinazolin-8-yl)-3,6-dihydropyridine-1(2H)-carboxylate 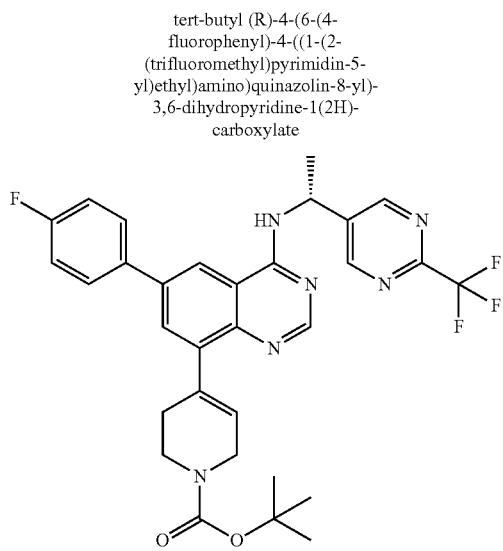 [SMILES: C[C@@H](Nc1ncnc2c(C3=CCN(C(=O)OC(C)(C)C)CC3)cc(-c3ccc(F)cc3)cc12)c1cnc(C(F)(F)F)nc1] | LCMS (Method 3): [MH+] = 594.6 at 1.98 min. |

Example 26

(R)-6-(4-fluorophenyl)-8-(tetrahydro-2H-pyran-4-yl)-N-(1-(2-(trifluoromethyl) pyrimidin-5-yl)ethyl)quinazolin-4-amine

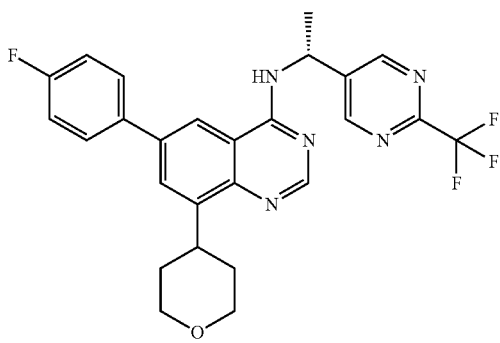 [SMILES: C[C@@H](Nc1ncnc2c(C3CCOCC3)cc(-c3ccc(F)cc3)cc12)c1cnc(C(F)(F)F)nc1]

A mixture of (R)-8-(3,6-dihydro-2H-pyran-4-yl)-6-(4-fluorophenyl)-N-(1-(2-(trifluoromethyl)pyrimidin-5-yl)ethyl)quinazolin-4-amine (46 mg, 0.093 mmol) and 10% Pd/C (10 mg) in ethanol (15 mL) was subjected to an atmosphere of hydrogen for 36 hours. After this time the mixture was passed through Celite and concentrated in vacuo. The residue was purified by preparative HPLC to give the title compound (14.2 mg, 30%) as an off-white solid.

$^1$H NMR (400 MHz, DMSO): δ 9.18 (s, 2H), 8.71 (d, J=6.9 Hz, 1H), 8.54 (d, J=1.9 Hz, 1H), 8.51 (s, 1H), 7.97-7.92 (m, 3H), 7.40 (dd, J=8.9, 8.9 Hz, 2H), 5.72-5.66 (m, 1H), 4.03-3.97 (m, 3H), 3.60-3.52 (m, 2H), 1.98-1.83 (m, 2H), 1.78-1.71 (m, 4H), 1.52-1.42 (m, 1H). LCMS (Method 4): [MH+]=498 at 4.33 min.

Example 27

(R)-6-(4-fluorophenyl)-8-(1,2,3,6-tetrahydropyridin-4-yl)-N-(1-(2-(trifluoro-methyl)pyrimidin-5-yl)ethyl)quinazolin-4-amine

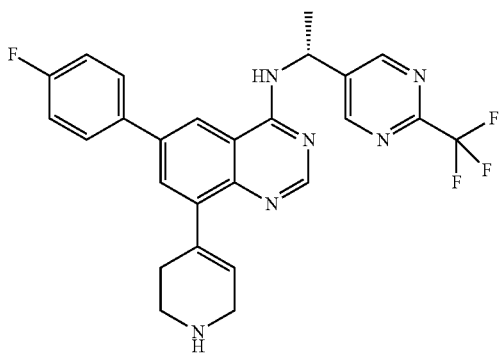 [SMILES: C[C@@H](Nc1ncnc2c(C3=CCNCC3)cc(-c3ccc(F)cc3)cc12)c1cnc(C(F)(F)F)nc1]

To a solution of tert-butyl (R)-4-(6-(4-fluorophenyl)-4-((1-(2-(trifluoromethyl)pyrimidin-5-yl)ethyl)amino)quinazolin-8-yl)-3,6-dihydropyridine-1(2H)-carboxylate (Intermediate 54) (120 mg, 0.20 mmol) in methanol (10.0 mL) was added a 4N HCl solution in 1,4-dioxane (1 mL, 4.04 mmol). The mixture was stirred at room temperature for 18 hours. The reaction was directly loaded onto an SCX cartridge. The cartridge was washed with methanol and the filtrate was collected when eluting with a 7M solution of ammonia in methanol. The solvent was removed in vacuo to give the title compound (12.5 mg, 13%) as an off-white solid.

$^1$H NMR (400 MHz, DMSO): δ 9.18 (s, 2H), 8.70 (d, J=6.9 Hz, 1H), 8.58 (d, J=1.9 Hz, 1H), 8.45 (s, 1H), 7.92 (dd, J=5.4, 8.8 Hz, 2H), 7.85 (d, J=1.9 Hz, 1H), 7.39 (dd, J=8.9, 8.9 Hz, 2H), 5.95 (s, 1H), 5.71-5.66 (m, 1H), 3.42 (d, J=2.5 Hz, 2H), 2.96 (dd, J=5.5, 5.5 Hz, 2H), 2.59-2.59 (m, 2H), 1.75 (d, J=7.2 Hz, 3H). one NH not observed. LCMS (Method 4): [MH+]=495 at 3.1 min.

Intermediate 11

2-Amino-5-bromo-3-methoxybenzoic Acid Hydrobromide

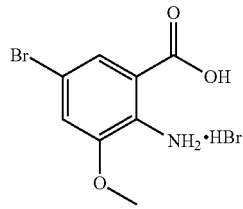

A solution of bromine (6.0 g, 1.9 mL, 37.70 mmol) in chloroform (15 mL) was added dropwise over a period of one hour to a suspension of 2-amino-3-methoxybenzoic acid (6.0 g, 35.90 mmol) in chloroform (180 mL) at 0° C. The reaction was stirred for a further five hours and slowly allowed to warm to room temperature. The solvent was removed in vacuo and the residue was triturated with diethyl ether. The reaction was filtered to give the title compound as a beige solid (11.3 g, 96%).

LCMS (Method 4): [MH+]=247 at 4.07 min.

Intermediate 10

6-Bromo-8-methoxyquinazolin-4-ol

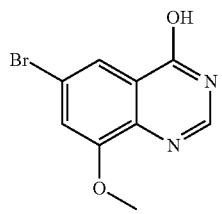

A solution 2-amino-5-bromo-3-methoxybenzoic acid hydrobromide (Intermediate 11) (10.0 g, 30.60 mmol) in formamide (40 mL) was heated to 165° C. for 18 hours. After return to room temperature, the reaction was diluted with water (100 mL) and poured into ice water (400 mL) and filtered. The solid was washed with water (200 mL) and diethyl ether (200 mL) to give the title compound as a light brown solid (5.9 g, 76%).

LCMS (Method 4): [MH+]=255 at 3.07 min.

Intermediate 16

6-(4-Fluorophenyl)-8-methoxyquinazolin-4-ol

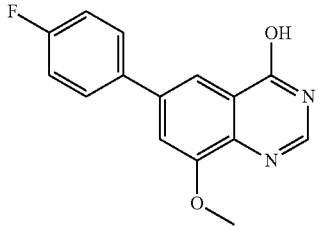 [SMILES: COc1cc(-c2ccc(F)cc2)cc2c(O)ncnc12]

Nitrogen was bubbled for 5 min through a mixture of 6-bromo-8-methoxyquinazolin-4-ol (Intermediate 10) (1.18 g, 4.63 mmol), 4-fluorophenylboronic acid (710 mg, 5.09 mmol) and cesium carbonate (5.73 g, 17.58 mmol) in 1,4-dioxane (30 mL) and water (7.5 mL), then [1,1'-bis(diphenylphosphino)ferrocene]dichloropalladium(II) complex with dichloromethane (190 mg, 0.23 mmol) was added and the reaction was heated to 110° C. for 5 hours. After return to room temperature, the reaction was diluted with water (20 mL), filtered and the solid was washed with 10% methanol in diethyl ether then with diethyl ether to give the title compound (1.0 g, 80%) as a beige solid.

LCMS (Method 5): [MH+]=271.1 at 0.81 min.

Intermediate 17

6-(4-Fluorophenyl)-8-methoxy-N-(1-(3-methyl-1,2,4-oxadiazol-5-yl)ethyl)quinazolin-4-amine

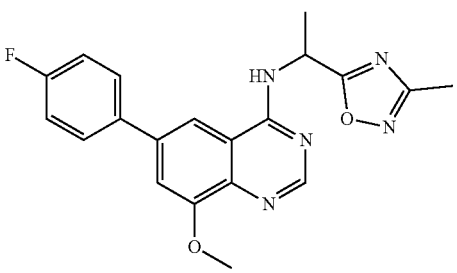 [SMILES: COc1cc(-c2ccc(F)cc2)cc2c(NC(C)c3nc(C)no3)ncnc12]

To a solution of 6-(4-fluorophenyl)-8-methoxyquinazolin-4-ol (Intermediate 16) (100 mg, 0.37 mmol) in N,N-dimethylformamide (2 mL) was successively added (benzotriazol-1-yloxy)tripyrrolidinophosphonium hexafluorophosphate (212 mg, 0.41 mmol) and di-isopropylethylamine (0.32 mL, 1.85 mmol). The resulting mixture was heated to 40° C. and stirred for 20 min, 1-(3-methyl-1,2,4-oxadiazol-5-yl)ethan-1-amine (67 mg, 0.41 mmol) was then added and the heating was maintained at 40° C. for 18 hours. After return to room temperature, the mixture was diluted with ethyl acetate (50 mL) and water (20 mL). The organic phase was washed with brine (2×20 mL), passed through a hydrophobic frit and the solvent was removed in vacuo. The residue was purified by preparative HPLC to give the title compound (43 mg, 31%) as a white solid.

$^1$H NMR (400 MHz, DMSO): δ 8.85 (d, J=6.8 Hz, 1H), 8.49 (s, 1H), 8.24 (s, 1H), 7.99 (dd, J=5.6, 8.6 Hz, 2H), 7.61 (s, 1H), 7.44 (dd, J=8.8, 8.8 Hz, 2H), 5.88-5.82 (m, 1H), 4.08 (s, 3H), 2.37 (s, 3H), 1.78 (d, J=7.1 Hz, 3H). LCMS (Method 4): [MH+]=375 at 3.29 min.

The compounds reported in the table below were synthesised following the same procedure described for the preparation of 6-(4-Fluorophenyl)-8-methoxy-N-(1-(3-methyl-1,2,4-oxadiazol-5-yl)ethyl)quinazolin-4-amine.

| Example No. | Chemical Name Structure | Analytical Data $^1$H NMR LC-MS |
|---|---|---|
| Intermediate 18 | 6-(4-Fluorophenyl)-8-methoxy-N-[(1-methyl-4-piperidyl)methyl]quinazolin-4-amine 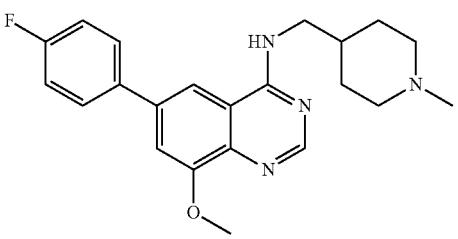 | $^1$H NMR (400 MHz, DMSO): δ 8.43 (s, 1 H), 8.34 (dd, J = 5.5, 5.5 Hz, 1 H), 8.10 (d, J = 1.6 Hz, 1 H), 7.94-7.89 (m, 2 H), 7.50 (d, J = 1.6 Hz, 1 H), 7.39 (dd, J = 8.8, 8.8 Hz, 2 H), 4.01 (s, 3 H), 3.46 (s, 2 H), 2.89 (d, J = 11.4 Hz, 2 H), 2.27 (s, 3 H), 2.09-2.03 (m, 2 H), 1.76 (dd, J = 10.2, 10.2 Hz, 3 H), 1.34-1.24 (m, 2 H). LCMS (Method 4): [MH+] = 381 at 2.27 min. |

Intermediate 8

(R)-6-Bromo-8-methoxy-N-(1-(6-methylpyridazin-3-yl)ethyl)quinazolin-4-amine

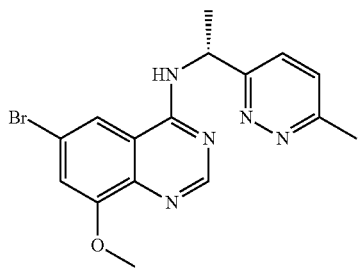 [SMILES: COc1cc(Br)cc2c(N[C@H](C)c3ccc(C)nn3)ncnc12]

To a solution of 6-bromo-8-methoxyquinazolin-4-ol (Intermediate 10) (65 mg, 0.27 mmol) in N,N-dimethylformamide (1.5 mL) was successively added (benzotriazol-1-yloxy)tripyrrolidinophosphonium hexafluorophosphate (139 mg, 0.27 mmol) and di-isopropylethylamine (0.2 mL, 0.81 mmol). The resulting mixture was heated to 60° C. for one hour then (R)-1-(6-methylpyridazin-3-yl)ethan-1-amine (65 mg, 0.27 mmol) was added and the heating was maintained at 60° C. for 18 hours. After return to room temperature, the reaction mixture was directly concentrated onto silica gel and purified by chromatography on silica gel eluting with 0-100% (10% MeOH in ethyl acetate) in ethyl acetate to give the title compound as a beige solid (100 mg, quantitative yield).

LCMS (Method 4): [MH+]=374 at 2.42 min.

The following intermediates reported in the table below were synthesised following the same procedure described for the preparation of (R)-6-Bromo-8-methoxy-N-(1-(6-methylpyridazin-3-yl)ethyl)quinazolin-4-amine (Intermediate 8):

| Intermediate No. | Chemical name Structure | Analytical data LC-MS |
|---|---|---|
| Intermediate 9 | 6-Bromo-8-methoxy-N-((6-methylpyridazin-3-yl)methyl)quinazolin-4-amine | LCMS (Method 3): [MH+] = 360 at 3.06 min. |
| Intermediate 9a | 6-Bromo-8-methoxy-N-[(1R)-1-[2-(trifluoromethyl)pyrimidin-5-yl]ethyl]quinazolin-4-amine | LCMS (Method 4): [MH+] = 428 at 3.19 min. |

Intermediate 5

6-(4-Fluoro-3-methylphenyl)-8-methoxy-N-((6-methylpyridazin-3-yl)methyl)quinazolin-4-amine

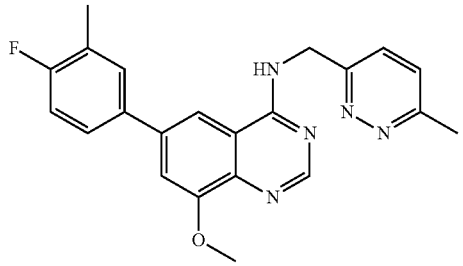 [SMILES: COc1cc(-c2ccc(F)c(C)c2)cc2c(NCc3ccc(C)nn3)ncnc12]

To a solution of 6-bromo-8-methoxy-N-((6-methylpyridazin-3-yl)methyl)quinazolin-4-amine (Intermediate 9) (70 mg, 0.19 mmol) in 1,4-dioxane (4.0 mL) was added 4-fluoro-3-methylphenylboronic acid (33 mg, 0.21 mmol), tetrakis(triphenylphosphine)palladium(0) (20 mg, 0.02 mmol), potassium carbonate (36 mg, 0.26 mmol) and water (0.5 mL). The resulting mixture was heated to 95° C. for 18 h. After return to room temperature, the reaction was filtered through Celite®. The Celite® cake was rinsed with ethyl acetate (2×20 mL). Combined organic phases were washed with brine (2×20 mL), filtered through a hydrophobic frit and the solvent was removed in vacuo. The residue was purified by preparative HPLC to give the title compound as an off-white solid (18 mg, 24%).

$^1$H NMR (400 MHz, DMSO) δ 9.03 (dd, J=5.8, 5.8 Hz, 1H), 8.41 (s, 1H), 8.15 (d, J=1.8 Hz, 1H), 7.82 (dd, J=2.0, 7.4 Hz, 1H), 7.77-7.72 (m, 1H), 7.57-7.49 (m, 3H), 7.31 (dd, J=9.1, 9.1 Hz, 1H), 5.03 (d, J=5.8 Hz, 2H), 4.03 (s, 3H), 2.60 (s, 3H), 2.37 (d, J=1.8 Hz, 3H).

LCMS (Method 4): [MH+]=390 at 3.12 min.

The following compounds reported in the table below were prepared according to the same procedure described for the preparation of 6-(4-Fluoro-3-methylphenyl)-8-methoxy-N-((6-methylpyridazin-3-yl)methyl)quinazolin-4-amine (intermediate 5):

| Intermediate No. | Chemical name Structure | Analytical data LC-MS |
|---|---|---|
| Intermediate 7 | 6-(3,4-Difluorophenyl)-8-methoxy-N-((6-methylpyridazin-3-yl)methyl)quinazolin-4-amine | $^1$H NMR (400 MHz, DMSO): δ 9.04 (dd, J = 5.9, 5.9 Hz, 1 H), 8.41 (s, 1 H), 8.20 (d, J = 1.6 Hz, 1 H), 8.00 (ddd, J = 2.3, 7.8, 12.5 Hz, 1 H), 7.79-7.75 (m, 1 H), 7.65-7.59 (m, 1 H), 7.55 (d, J = 8.8 Hz, 2 H), 7.49 (d, J = 8.7 Hz, 1 H), 5.02 (d, J = 5.8 Hz, 2 H), 4.02 (s, 3 H), 2.59 (s, 3 H). LCMS (Method 3): [MH+] = 394 at 3.79 min. |
| Intermediate 7a PdCl$_2$dppf was used as catalyst | (R)-6-(4-fluorophenyl)-8-methoxy-N-(1-(2-(trifluoromethyl)pyrimidin-5-yl)ethyl)quinazolin-4-amine | LCMS (Method 5): 0.79 min, m/z 443.8 [M + 2]+, $^1$H NMR (400 MHz, DMSO-d6) δ ppm 9.12 (s, 2 H), 8.55 (d, J = 7.0 Hz, 1 H), 8.37 (s, 1 H), 8.14 (d, J = 1.3 Hz, 1 H), 7.83-7.96 (m, 2 H), 7.48 (d, J = 1.3 Hz, 1 H), 7.35 (t, J = 8.8 Hz, 2 H), 5.50-5.60 (m, 1 H), 3.97 (s, 3H), 1.69 (d, J = 7.0 Hz, 3 H). |

| Intermediate No. | Chemical name Structure | Analytical data LC-MS |
|---|---|---|
| Intermediate 7b PdCl$_2$dppf was used as catalyst | 6-(4-fluorophenyl)-8-methoxy-N-((6-methylpyridazin-3-yl)methyl)quinazolin-4-amine 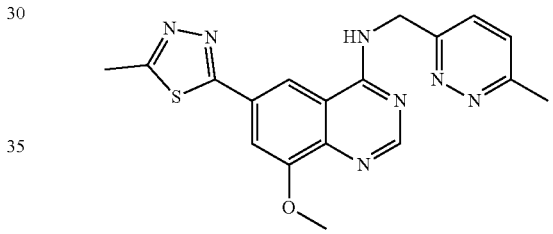 | LCMS (Method 6): 0.88 min, 375.9 m/z [M + H]+, $^1$H NMR (400 MHz, ACETONITRILE-d3) δ □ ppm 8.43 (s, 1 H), 7.66-7.84 (m, 3 H), 7.53 (d, J = 8.8 Hz, 1 H), 7.44 (d, J = 1.3 Hz, 1H), 7.39 (d, J = 8.8 Hz, 1 H), 7.20-7.30 (m, 2 H), 7.00-7.15 (m, 1 H), 5.06 (s, 2H), 4.04 (s, 3 H), 2.62 (s, 3 H). |

Intermediate 14

8-Methoxy-6-(5-methyl-1,3,4-thiadiazol-2-yl)-N-((6-methylpyridazin-3-yl)methyl)quinazolin-4-amine

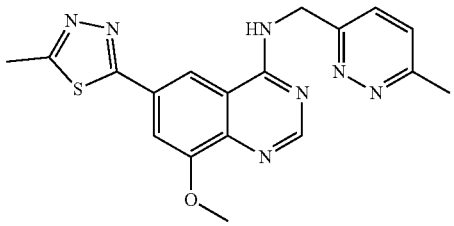

Step 1: Preparation of 8-methoxy-N-((6-methylpyridazin-3-yl)methyl)-6-(4,4,5,5-tetramethyl-1,3,2-dioxaborolan-2-yl)quinazolin-4-amine

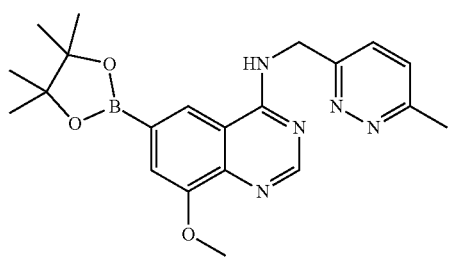

Nitrogen was bubbled for 5 min through a mixture of 6-bromo-8-methoxy-N-((6-methylpyridazin-3-yl)methyl)quinazolin-4-amine (Intermediate 9) (250 mg, 0.69 mmol), bis-(pinacolato)diboron (194 mg, 0.76 mmol), [1,1'-bis-(diphenylphosphino)-ferrocene]dichloropalladium(II) (25 mg, 0.03 mmol) and potassium acetate (204 mg, 2.08 mmol) in 1,4-dioxane (15.0 mL). The mixture was heated at 90° C. for 18 hours. After return to room temperature, the reaction was filtered through Celite® and the solvent was removed in vacuo. The residue was taken on to the next step without further purification.

Step 2: Preparation of 8-methoxy-6-(5-methyl-1,3,4-thiadiazol-2-yl)-N-((6-methylpyridazin-3-yl)methyl)quinazolin-4-amine Nitrogen was bubbled for 5 min through a mixture of 2-bromo-5-methyl-1,3,4-thiadiazole (34 mg, 0.19 mmol), 8-methoxy-N-((6-methylpyridazin-3-yl)methyl)-6-(4,4,5,5-tetramethyl-1,3,2-dioxaborolan-2-yl)quinazolin-4-amine (70 mg, 0.17 mmol), potassium carbonate (36 mg, 0.26 mmol) and water (0.5 mL) in 1,4-dioxane (4.0 mL), then tetrakis(triphenylphosphine)palladium(O) (20 mg, 0.02 mmol) was added. The resulting mixture was heated to 95° C. for 16 hours. After return to room temperature, the reaction was filtered through Celite®, rinsed with ethyl acetate (20 mL). The organic phases were combined, passed through a hydrophobic frit and the solvent was removed in vacuo. The residue was purified by preparative HPLC to give the title compound as an off-white solid (21.0 mg, 32%).

$^1$H NMR (400 MHz, DMSO): δ 9.31 (dd, J=5.8, 5.8 Hz, 1H), 8.47 (s, 1H), 8.44 (d, J=1.7 Hz, 1H), 7.80 (d, J=1.4 Hz, 1H), 7.58 (d, J=8.7 Hz, 1H), 7.51 (d, J=8.7 Hz, 1H), 5.03 (d, J=5.8 Hz, 2H), 4.03 (s, 3H), 2.84 (s, 3H), 2.60 (s, 3H). LCMS (Method 3): [MH+]=380 at 2.13 min.

The following compounds reported in the table below were prepared according to the same procedure described for the preparation of 8-methoxy-6-(5-methyl-1,3,4-thiadiazol-2-yl)-N-((6-methylpyridazin-3-yl)methyl)quinazolin-4-amine:

| Intermediate No. | Chemical Name Structure | Analytical data ¹H NMR LC-MS |
|---|---|---|
| Intermediate 15 | 8-Methoxy-N-[(6-methylpyridazin-3-yl)methyl]-6-(5-methylpyrimidin-2-yl)quinazolin-4-amine | ¹H NMR (400 MHz, DMSO): δ 9.29 (dd, J = 5.7, 5.7 Hz, 1 H), 8.93 (d, J = 1.5 Hz, 1 H), 8.84 (s, 2 H), 8.44 (s, 1 H), 8.22 (d, J = 1.5 Hz, 1 H), 7.54 (d, J = 8.7 Hz, 1 H), 7.49 (d, J = 8.7 Hz, 1 H), 5.01 (d, J = 5.8 Hz, 2 H), 4.02 (s, 3 H), 2.60 (s, 3 H), 2.38 (s, 3 H). LCMS (Method 3): [MH+] = 374 at 3.25 min. |

Intermediate 15a

8-Methoxy-N-((6-methylpyridazin-3-yl)methyl)-6-(5-methylthiazol-2-yl)quinazolin-4-amine

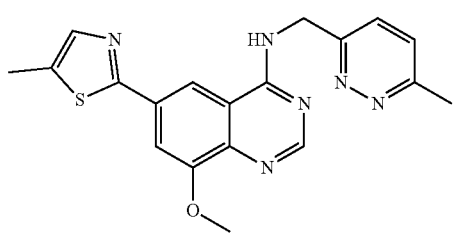

Step 1: Preparation of 6-(5,5-dimethyl-1,3,2-dioxaborinan-2-yl)-8-methoxy-N-((6-methylpyridazin-3-yl)methyl)quinazolin-4-amine

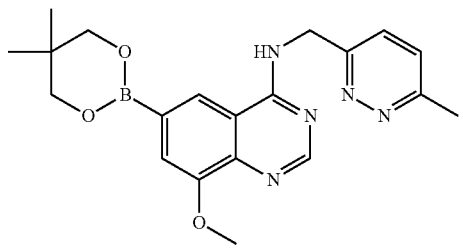

Nitrogen was bubbled for 5 min through a mixture of 6-bromo-8-methoxy-N-((6-methylpyridazin-3-yl)methyl)quinazolin-4-amine (Intermediate 6) (100 mg, 0.28 mmol), bis(neopentyl glycolato)diboron (66 mg, 0.29 mmol), [1,1'-bis(diphenylphosphino)ferrocene]-dichloropalladium (II) complex with dichloromethane (10 mg, 0.02 mmol) and potassium acetate (54 mg, 0.55 mmol) in 1,4-dioxane (3.0 mL). The mixture was heated to 100° C. for 3 hours. After return to room temperature, the mixture was taken on to the next step as a 1,4-dioxane solution without further purification.

Step 2: Preparation of 8-methoxy-N-((6-methylpyridazin-3-yl)methyl)-6-(5-methylthiazol-2-yl)quinazolin-4-amine

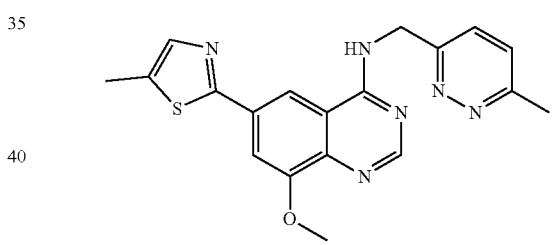

To the above solution of 6-(5,5-dimethyl-1,3,2-dioxaborinan-2-yl)-8-methoxy-N-((6-methylpyridazin-3-yl)methyl)quinazolin-4-amine (100 mg, 0.28 mmol) was added aqueous caesium carbonate (181 mg, 0.56 mmol, 0.4 mL), 2-bromo-5-methylthiazole (64 mg, 0.28 mmol) and tetrakis(triphenylphosphine)palladium(O) (20 mg, 0.02 mmol). The resulting mixture was heated to 95° C. for 16 hours. After return to room temperature, the mixture was filtered through Celite® and the filter cake rinsed with ethyl acetate (2×10 mL). The organic phases were washed with saturated aqueous ammonium chloride (10 mL), passed through a hydrophobic frit and the solvent was removed in vacuo. The residue was purified by preparative HPLC to give the title compound as an off-white solid (25 mg, 24%).

¹H NMR (400 MHz, DMSO): δ 9.24 (dd, J=5.7, 5.7 Hz, 1H), 8.43 (s, 1H), 8.37 (d, J=1.5 Hz, 1H), 7.75 (d, J=1.5 Hz, 1H), 7.68 (d, J=1.1 Hz, 1H), 7.57 (d, J=8.7 Hz, 1H), 7.50 (d, J=8.7 Hz, 1H), 5.02 (d, J=5.8 Hz, 2H), 4.00 (s, 3H), 2.60 (s, 3H), 2.50 (s, 3H). LCMS (Method 3): [MH+]=379 at 3.20 min.

Intermediate 1

(R)-6-(4-fluorophenyl)-4-((1-(2-(trifluoromethyl)pyrimidin-5-yl)ethyl)amino)-quinazolin-8-ol

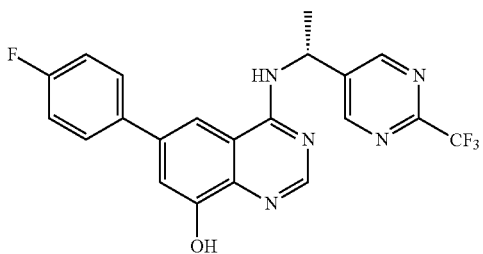 [SMILES: C[C@@H](Nc1ncnc2c(O)cc(-c3ccc(F)cc3)cc12)c1cnc(C(F)(F)F)nc1]

To a solution of 6-(4-fluorophenyl)-8-methoxy-N-[(1R)-1-[2-(trifluoromethyl)-pyrimidin-5-yl]ethyl]quinazolin-4-amine (intermediate 7a) (490 mg, 1.11 mmol) in chloroform (8 mL) at 0° C. was added dropwise boron tribromide (0.32 mL, 3.32 mmol). The reaction was then allowed to warm to room temperature and was heated to 65° C. for 18 hours. After return to room temperature, the reaction was cooled down in an ice-bath and quenched with methanol (2 mL). The solvent was removed in vacuo. The residue was diluted with ethyl acetate (50 mL) and washed with saturated aqueous $NaHCO_3$ solution (50 mL). The aqueous layer was then extracted with ethyl acetate (2×20 mL). The organic phases were combined, passed through a hydrophobic frit and the solvent was removed in vacuo to give the title compound as a grey solid (416 mg, 88%).

$^1$H NMR (400 MHz, DMSO): δ 9.18 (s, 2H), 8.65 (d, J=7.0 Hz, 1H), 8.46 (s, 1H), 8.09 (s, 1H), 7.86 (dd, J=5.5, 8.7 Hz, 2H), 7.45 (d, J=1.3 Hz, 1H), 7.37 (dd, J=8.8, 8.8 Hz, 2H), 5.71-5.67 (m, 1H), 1.75 (d, J=7.0 Hz, 3H). OH not observed.

The following intermediates were prepared via adaptations of the above procedure starting from substrate reported in table.

| Intermediate No. | Structure | | Analytical data LC-MS | Substrate |
|---|---|---|---|---|
| Intermediate 4 | 6-(4-fluorophenyl)-4-(((6-methylpyridazin-3-yl)methyl)amino)quinazolin-8-ol | | LCMS: 0.51 min, 362.1 [M + H]+, Method 5method 2 min | Intermediate 7b |
| Intermediate 56 | (((6-methylpyridazin-3-yl)methyl)amino)-6-(5-methylthiazol-2-yl)quinazolin-8-ol | | LCMS (Method 4): [MH+] = 365 at 2.39 min. | Intermediate 15a |
| Intermediate 57 | 4-(((6-methylpyridazin-3-yl)methyl)amino)-6-(5-methylpyrimidin-2-yl)quinazolin-8-ol | | LCMS (Method5): [MH+] = 360.4 at 0.92 | Intermediate 15 |

| Intermediate No. | Structure | Analytical data LC-MS | Substrate |
|---|---|---|---|
| Intermediate 58 | 6-(4-fluorophenyl)-4-(((1-methylpiperidin-4-yl)methyl)amino)quinazolin-8-ol 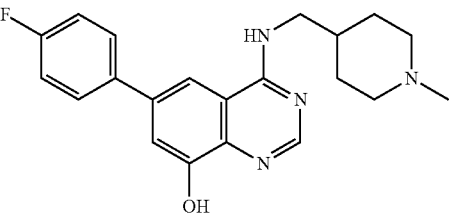 | LCMS (Method5): [MH+] = 367.3 at 0.44 | Intermediate 18 |

Intermediate 59

6-bromo-N-((6-methylpyridazin-3-yl)methyl)-8-((tetrahydro-2H-pyran-4-yl)oxy)quinazolin-4-amine

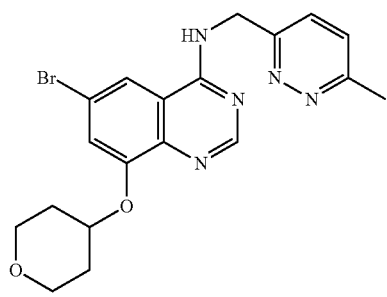 [SMILES: Cc1ccc(CNc2ncnc3c(OC4CCOCC4)cc(Br)cc23)nn1]

Step 1: Preparation of 6-bromo-4-(((6-methylpyridazin-3-yl)methyl)amino)quinazolin-8-ol

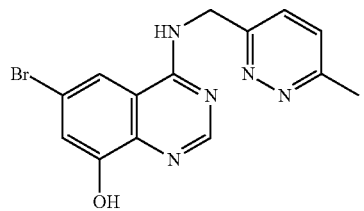 [SMILES: Cc1ccc(CNc2ncnc3c(O)cc(Br)cc23)nn1]

6-Bromo-8-methoxy-N-((6-methylpyridazin-3-yl)methyl)quinazolin-4-amine (500 mg, 1.39 mmol) was suspended in chloroform (10 mL) and cooled to 0° C. Boron tribromide (0.40 mL, 4.16 mmol) was added slowly. The reaction mixture was stirred at 0° C. for 5 minutes and then heated to 70° C. for 16 hours. The mixture was then cooled to room temperature and quenched with methanol. The solvents were then removed in vacuo. The residue was triturated with water and the precipitate was dried under reduced pressure for 16 hours to give the title compound (480 mg, quantitative yield) as an off-white solid.

LCMS (Method 4): [MH+]=346 at 2.07 min.

Step 2: Preparation of 6-bromo-N-((6-methylpyridazin-3-yl)methyl)-8-((tetrahydro-2H-pyran-4-yl)oxy)quinazolin-4-amine

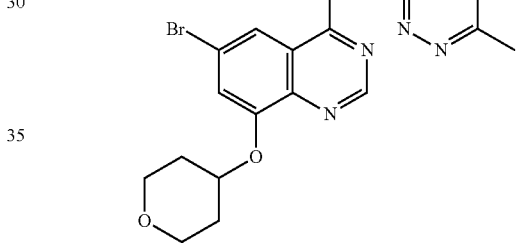

A mixture of 6-bromo-4-(((6-methylpyridazin-3-yl)methyl)amino)quinazolin-8-ol (400 mg, 1.16 mmol), tetrahydro-2H-pyran-4-yl methanesulfonate (458 mg, 2.54 mmol) and cesium carbonate (1129 mg, 3.47 mmol) in N,N-dimethylformamide (12 mL) was heated at 50° C. under nitrogen for 16 hours. An additional aliquot of tetrahydro-2H-pyran-4-yl methanesulfonate (458 mg, 2.54 mmol) was added and the reaction mixture was heated at 50° C. under nitrogen for a further 5 hours. The reaction was cooled to room temperature and then partitioned between water and ethyl acetate. The two phases were separated and the aqueous phase was further extracted with ethyl acetate (4×10 mL). The combined organic layers were dried over magnesium sulfate, filtered and the solvent was removed in vacuo. The residue was purified by reverse phase column chromatography on C18 column eluting with 0-95% acetonitrile (+0.1% ammonium hydroxide) in water (+0.1% ammonium hydroxide) to give the title compound (110 mg, 22%) as a brown solid.

LCMS (Method 4): [MH+]=430 at 2.46 min.

The following intermediate reported in the table below was prepared according to the same procedure described for the preparation of 6-bromo-N-((6-methylpyridazin-3-yl)methyl)-8-((tetrahydro-2H-pyran-4-yl)oxy)quinazolin-4-amine:

| Intermediate No. | Chemical name Structure | Analytical data $^1$H NMR LC-MS |
|---|---|---|
| Intermediate 60 | (R)-6-bromo-N-(1-(6-methylpyridazin-3-yl)methyl)-8-((tetrahydro-2H-pyran-4-yl)oxy)quinazolin-4-amine | $^1$H NMR (400 MHz, CDCl$_3$) δ 8.73 (s, 1 H), 7.64 (d, J = 1.6 Hz, 1 H), 7.43 (d, J = 8.2 Hz, 1 H), 7.37 (d, J = 9.9 Hz, 1 H), 7.24 (d, J = 1.6 Hz, 1 H), 5.70-5.63 (m, 1 H), 4.72-4.65 (m, 1 H), 4.13-4.07 (m, 2 H), 3.62-3.56 (m, 2 H), 2.75 (s, 3 H), 2.17-2.12 (m, 2 H), 2.03-1.99 (m, 2 H), 1.71 (d, J = 6.9 Hz, 2 H). LCMS (Method 4): [MH$^+$] = 444 at 2.61 min. |

Example 28

Single enantiomer 1 of N-[1-(6-methylpyridazin-3-yl)ethyl]-6-(5-methylpyrimidin-2-yl)-8-tetrahydro-pyran-4-yloxy-quinazolin-4-amine Example 29

Single enantiomer 2 of N-[1-(6-methylpyridazin-3-yl)ethyl]-6-(5-methylpyrimidin-2-yl)-8-tetrahydro-pyran-4-yloxy-quinazolin-4-amine

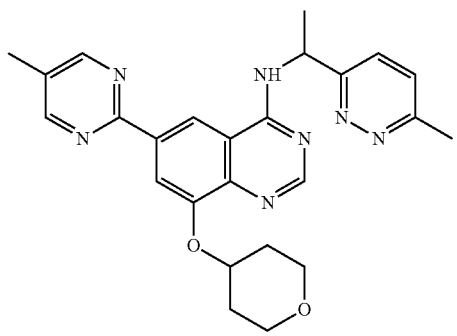

4-((1-(6-Methylpyridazin-3-yl)ethyl)amino)-6-(5-methylpyrimidin-2-yl)quinazolin-8-ol (150 mg, 0.40 mmol), tetrahydro-2H-pyran-4-yl methanesulfonate (159 mg, 0.88 mmol) and caesium carbonate (393 mg, 1.21 mmol) were dissolved in N,N-dimethylformamide (5 mL). The reaction mixture was then heated to 50° C. for 16 hours. After this time, the mixture was then cooled to room temperature and diluted with water (40 mL) and partitioned with ethyl acetate (50 mL). The phases were separated, and the aqueous layer extracted twice with ethyl acetate (2×40 mL). The combined organic layers were dried over a hydrophobic frit and concentrated in vacuo. The residue was purified by preparative HPLC to give the title compound (50.6 mg, 27%) as a colourless solid, as a mixture of two enantiomers. The single isomers were obtained by chiral preparative SFC purification of the racemic mixture hereinabove described.

Example 28

Single enantiomer 1 of N-[1-(6-methylpyridazin-3-yl)ethyl]-6-(5-methylpyrimidin-2-yl)-8-tetrahydro-pyran-4-yloxy-quinazolin-4-amine (16.9 mg, 66%)

$^1$H NMR (400 MHz, CDCl$_3$) δ 8.75 (s, 1H), 8.68 (s, 2H), 8.62 (d, J=2.9 Hz, 1H), 8.28 (d, J=0.8 Hz, 1H), 7.57 (d, J=5.4 Hz, 1H), 7.45 (d, J=8.3 Hz, 1H), 7.35 (d, J=8.3 Hz, 1H), 5.84-5.76 (m, 1H), 4.94-4.86 (m, 1H), 4.15-4.08 (m, 2H), 3.68-3.60 (m, 2H), 2.75 (s, 3H), 2.40 (s, 3H), 2.25-2.16 (m, 2H), 2.11-2.02 (m, 2H), 1.76 (d, J=8.3 Hz, 3H). LCMS (Method 4): [MH+]=394 at 2.81 min. Chiral analysis (Method 30) at 2.93 min.

Example 29

Single enantiomer 2 of N-[1-(6-methylpyridazin-3-yl)ethyl]-6-(5-methylpyrimidin-2-yl)-8-tetrahydro-pyran-4-yloxy-quinazolin-4-amine (8.7 mg, 34%)

$^1$H NMR (400 MHz, CDCl$_3$) δ 8.75 (s, 1H), 8.68 (s, 2H), 8.60 (d, J=2.9 Hz, 1H), 8.28 (d, J=0.8 Hz, 1H), 7.57 (d, J=5.4 Hz, 1H), 7.45 (d, J=8.3 Hz, 1H), 7.35 (d, J=8.3 Hz, 1H), 5.84-5.76 (m, 1H), 4.94-4.86 (m, 1H), 4.15-4.08 (m, 2H), 3.68-3.60 (m, 2H), 2.75 (s, 3H), 2.40 (s, 3H), 2.25-2.16 (m, 2H), 2.11-2.02 (m, 2H), 1.76 (d, J=8.3 Hz, 3H). LCMS (Method 3): [MH+]=394 at 3.68 min. Chiral analysis (Method 30) at 3.7 min.

Example 30

6-(5-fluoro-2-pyridyl)-N-[(6-methylpyridazin-3-yl)methyl]-8-tetrahydropyran-4-yloxy-quinazolin-4-amine

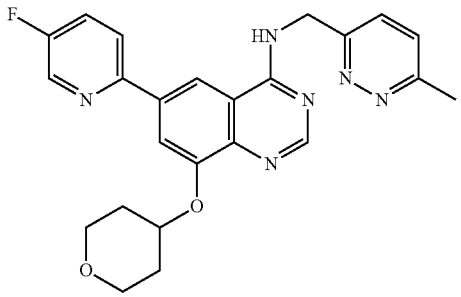 [SMILES: Cc1ccc(CNc2ncnc3c(OC4CCOCC4)cc(-c4ccc(F)cn4)cc23)nn1]

Nitrogen was bubbled for 5 minutes through a suspension of 6-bromo-N-((6-methylpyridazin-3-yl)methyl)-8-((tetrahydro-2H-pyran-4-yl)oxy)quinazolin-4-amine (110 mg, 0.26 mmol) and bis(triphenylphosphine)palladium(II) dichloride (18 mg, 0.026 mmol) in 1,4-dioxane (6 mL). 5-Fluoro-2-(tributylstannyl)pyridine (118 mg, 0.31 mmol) was subsequently added and the microwave vial was sealed. The reaction mixture was heated to 150° C. for 15 minutes. After this time, the reaction was diluted with ethyl acetate and filtered through a pad of Celite®. The solvent was removed in vacuo and the resulting residue was purified by preparative HPLC to give the title compound (11.7 mg, 10%) as a colourless solid.

$^1$H NMR (400 MHz, DMSO): δ 9.14 (t, J=5.9 Hz, 1H), 8.73 (d, J=2.9 Hz, 1H), 8.60 (d, J=1.6 Hz, 1H), 8.47 (s, 1H), 8.25 (dd, J=4.3, 8.9 Hz, 1H), 8.06 (d, J=1.5 Hz, 1H), 7.96 (dt, J=3.0, 8.7 Hz, 1H), 7.57 (d, J=8.7 Hz, 1H), 7.50 (d, J=8.8 Hz, 1H), 5.05 (d, J=5.7 Hz, 2H), 4.98-4.90 (m, 1H), 3.93 (td, J=4.6, 11.4 Hz, 2H), 3.53 (ddd, J=2.7, 9.1, 11.6 Hz, 2H), 2.60 (s, 3H), 2.09-2.01 (m, 2H), 1.78-1.68 (m, 2H). LCMS (Method 4): [MH+]=447 at 2.69 min.

Example 31

N-[(6-methylpyridazin-3-yl)methyl]-6-(5-methylpyrimidin-2-yl)-8-tetrahydropyran-4-yloxy-quinazolin-4-amine

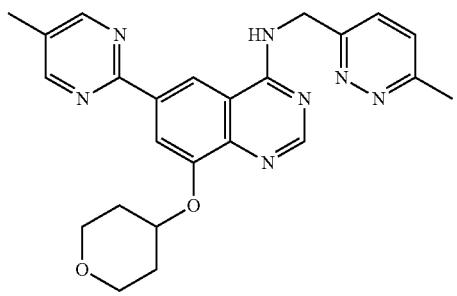

Nitrogen was bubbled for 5 minutes through a suspension of 6-bromo-N-((6-methylpyridazin-3-yl)methyl)-8-((tetrahydro-2H-pyran-4-yl)oxy)quinazolin-4-amine (100 mg, 0.23 mmol), bis(pinacolato)diboron (71 mg, 0.28 mmol), [1,1'-bis(diphenylphosphino)ferrocene]dichloropalladium (II) complex with dichloromethane (9.5 mg, 0.012 mmol), potassium acetate (46 mg, 0.47 mmol) in 1,4-dioxane (3 mL). The reaction mixture was heated to 100° C. for 4 hours. The reaction was cooled to room temperature and the solvent was removed in vacuo. The residue was suspended in dioxane (3 mL) and water (0.6 mL). 2-Bromo-5-methylpyrimidine (39 mg, 0.22 mmol), cesium carbonate (139 mg, 0.43 mmol) and [1,1'-bis(diphenylphosphino)ferrocene]-dichloropalladium(II) complex with dichloromethane (8.7 mg, 0.011 mmol) were added and nitrogen was bubbled through the suspension for 5 minutes. The reaction was then heated to 100° C. for 16 hours. The reaction was cooled to room temperature, diluted with methanol and the solvent was removed in vacuo. The resulting residue was purified by preparative HPLC to give the title compound (15.8 mg, 15%) as an off-white solid.

$^1$H NMR (400 MHz, DMSO): δ 9.31 (t, J=5.9 Hz, 1H), 8.96 (d, J=1.5 Hz, 1H), 8.84 (d, J=0.7 Hz, 2H), 8.47 (s, 1H), 8.28 (d, J=1.5 Hz, 1H), 7.54 (d, J=8.6 Hz, 1H), 7.49 (d, J=8.7 Hz, 1H), 5.01 (d, J=5.7 Hz, 2H), 4.95-4.88 (m, 1H), 3.94 (td, J=4.6, 11.3 Hz, 2H), 3.54 (ddd, J=2.7, 9.0, 11.6 Hz, 2H), 2.60 (s, 3H), 2.37 (s, 3H), 2.09-2.02 (m, 2H), 1.79-1.69 (m, 2H). LCMS (Method 4): [MH+]=444 at 2.59 min.

Example 32

(R)-6-(1-methyl-1H-pyrazol-3-yl)-N-(1-(6-methylpyridazin-3-yl)ethyl)-8-((tetrahydro-2H-pyran-4-yl)oxy)quinazolin-4-amine

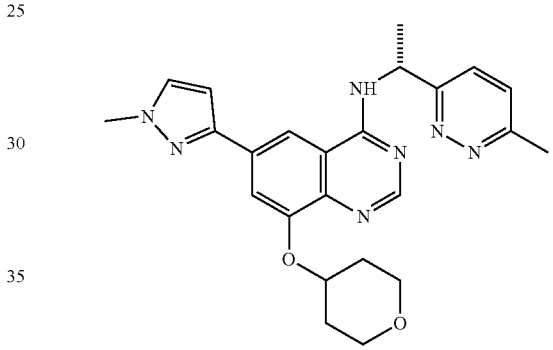

Nitrogen was bubbled for 10 minutes through a mixture (R)-6-bromo-N-(1-(6-methylpyridazin-3-yl)ethyl)-8-((tetrahydro-2H-pyran-4-yl)oxy)quinazolin-4-amine (120 mg, 0.270 mmol), 1-methyl-3-(4,4,5,5-tetramethyl-1,3,2-dioxaborolan-2-yl)-1H-pyrazole (73 mg, 0.351 mmol) and caesium carbonate (176 mg, 0.54 mmol) in 1,4-dioxane (5 mL) and water (0.75 mL). Then [1,1'-bis(diphenylphosphino)ferrocene]dichloropalladium(II) (20 mg, 0.027 mmol) was added and reaction mixture heated at 95° C. for 3 hours. After this time the reaction was cooled to room temperature and filtered through Celite®. The mixture was diluted with Water (10 mL) and partitioned with ethyl acetate (15 mL). The phases were separated and the aqueous layer extracted with ethyl acetate (2×10 mL). The combined organic layers were dried over a hydrophobic frit and concentrated in vacuo. The residue was purified by preparative HPLC to yield the title compound (48 mg, 39%).

$^1$H NMR (400 MHz, DMSO): δ 8.64 (d, J=8.4 Hz, 1H), 8.41 (d, J=2.0 Hz, 1H), 8.36 (s, 1H), 7.83 (d, J=2.7 Hz, 1H), 7.77 (d, J=1.4 Hz, 1H), 7.62 (d, J=8.2 Hz, 1H), 7.50 (d, J=7.5 Hz, 1H), 6.91 (d, J=2.7 Hz, 1H), 5.79-5.72 (m, 1H), 4.92-4.84 (m, 1H), 3.96 (s, 3H), 3.92-3.88 (m, 2H), 3.56-3.47 (m, 3H), 2.60 (s, 3H), 2.05-1.97 (m, 2H), 1.73 (d, J=7.5 Hz, 3H), 1.69-1.65 (m, 2H). LCMS (Method 4): [MH+]=446 at 2.59 min.

Example 33

(R)-6-(5-methylthiazol-2-yl)-N-(1-(pyridazin-3-yl)ethyl)-8-((tetrahydro-2H-pyran-4-yl)oxy)quinazolin-4-amine

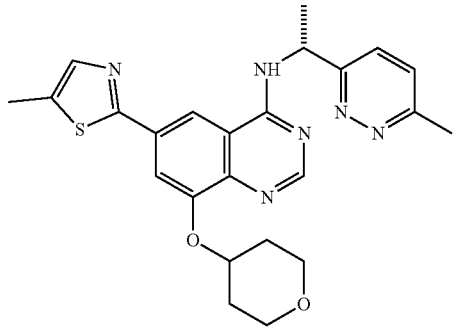

Step 1: Preparation of (R)—N-(1-(6-methylpyridazin-3-yl)ethyl)-8-((tetrahydro-2H-pyran-4-yl)oxy)-6-(4,4,5,5-tetramethyl-1,3,2-dioxaborolan-2-yl)quinazolin-4-amine

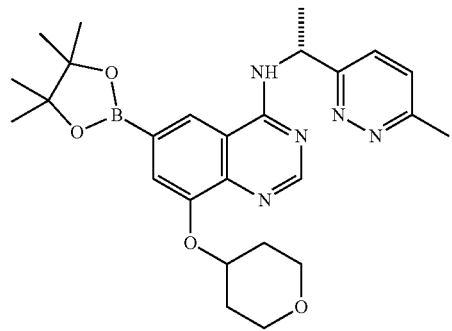

Nitrogen was bubbled for 10 minutes through a mixture (R)-6-bromo-N-(1-(6-methylpyridazin-3-yl)ethyl)-8-((tetrahydro-2H-pyran-4-yl)oxy)quinazolin-4-amine (200 mg, 0.45 mmol), bis(pinacolato) diboron (137 mg, 0.54 mmol) and potassium acetate (88 mg, 0.90 mmol) in 1,4-dioxane (6 mL). [1,1'-bis(diphenylphosphino)ferrocene]dichloropalladium(II) (33 mg, 0.05 mmol) was then added and the reaction mixture heated at 90° C. for 2 hours. After this time the reaction was cooled to room temperature and filtered through Celite®. The title compound was used directly as a solution in 1,4-dioxane, assuming a quantitative yield.

Step 2: Preparation of (R)—N-(1-(6-methylpyridazin-3-yl)ethyl)-6-(5-methylthiazol-2-yl)-8-((tetrahydro-2H-pyran-4-yl)oxy)quinazolin-4-amine

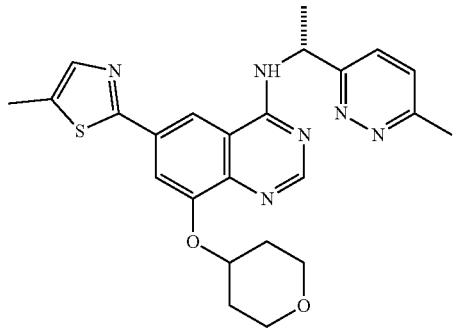

To (R)—N-(1-(6-methylpyridazin-3-yl)ethyl)-8-((tetrahydro-2H-pyran-4-yl)oxy)-6-(4,4,5,5-tetramethyl-1,3,2-dioxaborolan-2-yl)quinazolin-4-amine (6 mL solution in dioxane, 0.45 mmol) was added 2-bromo-5-methylthiazole (120 mg, 0.68 mmol), caesium carbonate (291 mg, 0.90 mmol) and water (0.5 mL). Nitrogen was bubbled through the reaction mixture for 10 minutes before tetrakis(triphenylphosphine) palladium(0) (52 mg, 0.05 mmol) was added. The reaction was then heated at 90° C. for 16 hours. After this time the reaction mixture was cooled to room temperature, filtered through Celite® and concentrated in vacuo. The residue was purified by column chromatography on silica gel eluting with 0-60% ethyl acetate in cyclohexane to give the title compound (52 mg, 25%) as an off white solid.

$^1$H NMR (400 MHz, DMSO): δ 8.91 (d, J=7.4 Hz, 1H), 8.53 (d, J=1.6 Hz, 1H), 8.41 (s, 1H), 7.81 (d, J=1.6 Hz, 1H), 7.69 (d, J=1.1 Hz, 1H), 7.63 (d, J=8.7 Hz, 1H), 7.51 (d, J=8.8 Hz, 1H), 5.80-5.71 (m, 1H), 4.94-4.87 (m, 1H), 3.96-3.88 (m, 2H), 3.56-3.50 (m, 2H), 2.59 (s, 3H), 2.07-1.99 (m, 4H), 1.72 (d, J=7.2 Hz, 6H). LCMS (Method 4): [MH+]=463 at 2.86 min.

Example 34

4-[[4-[1-(6-methylpyridazin-3-yl)ethylamino]-6-(5-methylpyrimidin-2-yl)quinazolin-8-yl]oxymethyl]tetrahydropyran-4-ol

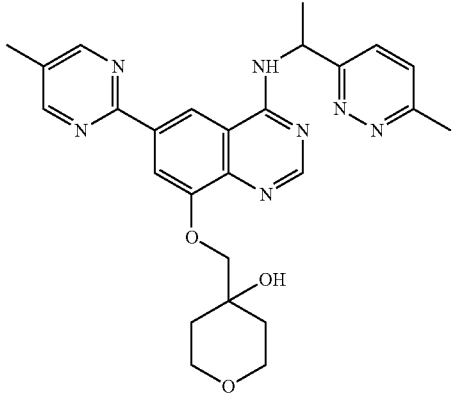

(R)-4-((1-(6-methylpyridazin-3-yl)ethyl)amino)-6-(5-methylpyrimidin-2-yl)quinazolin-8-ol (35 mg, 0.094 mmol), 1,6-Dioxaspiro(2,5)octane (23.0 mg, 0.20 mmol) and cesium carbonate (31.0 mg, 0.94 mmol) were suspended in N,N-dimethylformamide (0.6 mL). The reaction mixture was then heated to 120° C. for 2 hours. The mixture was then cooled to room temperature and filtered. The resulting filtrate was purified by preparative HPLC to give the title compound (6 mg, 16%) as a brown solid.

$^1$H NMR (400 MHz, DMSO): δ 9.08-9.00 (m, 2H), 8.86 (s, 2H), 8.45 (s, 1H), 8.25 (s, 1H), 7.63 (d, J=8.8 Hz, 1H), 7.50 (d, J=8.7 Hz, 1H), 5.82-5.76 (m, 1H), 4.91 (s, 1H), 4.01 (s, 2H), 3.72 (d, J=7.0 Hz, 4H), 2.60 (s, 3H), 2.38 (s, 3H), 1.97-1.87 (m, 2 H), 1.73 (d, J=7.0 Hz, 3H), 1.57-1.50 (m, 2H). LCMS (Method 4): [MH+]=488 at 2.70 min.

Example 35

8-(2-methoxyethoxy)-N-((6-methylpyridazin-3-yl)methyl)-6-(5-methylthiazol-2-yl)quinazolin-4-amine

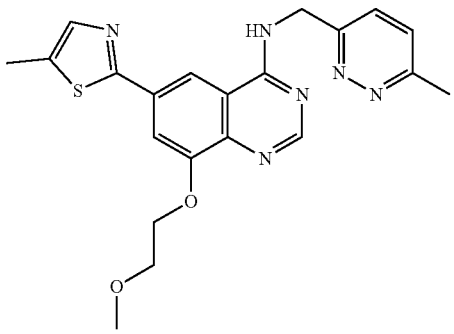

To a solution of 4-(((6-methylpyridazin-3-yl)methyl)amino)-6-(5-methylthiazol-2-yl)quinazolin-8-ol (100 mg, 0.27 mmol) in N,N-dimethylformamide (2 mL) was added cesium carbonate (178 mg, 0.55 mmol), followed by 1-bromo-2-methoxyethane (55 mg, 0.39 mmol). The reaction mixture was stirred at 100° C. for 16 hours. The mixture was cooled to room temperature, concentrated in vacuo and the residue was purified by preparative HPLC to give the title compound (28.0 mg, 24%) as a colourless solid.

$^1$H NMR (400 MHz, DMSO): δ 9.24 (dd, J=5.9, 5.9 Hz, 1H), 8.45 (s, 1H), 8.38 (d, J=1.6 Hz, 1H), 7.76 (d, J=1.5 Hz, 1H), 7.67 (d, J=1.3 Hz, 1H), 7.57 (d, J=8.6 Hz, 1H), 7.51 (d, J=8.7 Hz, 1H), 5.02 (d, J=5.7 Hz, 2H), 4.35-4.32 (m, 2H), 3.81-3.77 (m, 2H), 3.38 (s, 3H), 2.60 (s, 3H), 2.55 (d, J=1.6 Hz, 3H). LCMS (Method 4): [MH+]=423 at 2.66 min.

The following compounds reported in the table below were prepared according to the same procedure described for the preparation of 8-(2-methoxyethoxy)-N-((6-methylpyridazin-3-yl)methyl)-6-(5-methylthiazol-2-yl)quinazolin-4-amine:

| Example No. | Chemical name Structure | Analytical data $^1$H NMR LC-MS | Reagents |
|---|---|---|---|
| Example 36 | 2-((4-(((6-methylpyridazin-3-yl)methyl)amino)-6-(5-methylthiazol-2-yl)quinazolin-8-yl)oxy)ethan-1-ol | $^1$H-NMR (400 MHz, DMSO): δ 9.26 (dd, J = 5.8, 5.8 Hz, 1 H), 8.44 (s, 1 H), 8.38 (d, J = 1.6 Hz, 1 H), 7.78 (d, J = 1.5 Hz, 1 H), 7.67 (d, J = 1.3 Hz, 1 H), 7.57 (d, J = 8.7 Hz, 1 H), 7.50 (d, J = 8.7 Hz, 1 H), 5.02 (d, J = 5.8 Hz, 3 H), 4.23 (dd, J = 5.0, 5.0 Hz, 2 H), 3.84 (dd, J = 5.0, 5.0 Hz, 2 H), 2.60 (s, 3 H), 2.55 (d, J = 1.3 Hz, 3 H). LCMS (Method 4): [MH$^+$] = 409 at 2.41 min. | Intermediate 56, 2-bromoethan-1-ol, Cs$_2$CO$_3$ |
| Example 37 | N-((6-methylpyridazin-3-yl)methyl)-6-(5-methylthiazol-2-yl)-8-(oxetan-3-ylmethoxy)quinazolin-4-amine | $^1$H NMR (400 MHz, DMSO): δ 9.26 (dd, J = 5.8, 5.8 Hz, 1 H), 8.45 (s, 1 H), 8.39 (d, J = 1.5 Hz, 1 H), 7.81 (d, J = 1.6 Hz, 1 H), 7.68 (d, J = 1.1 Hz, 1 H), 7.56 (d, J = 8.5 Hz, 1 H), 7.50 (d, J = 8.7 Hz, 1H), 5.02 (d, J = 5.8 Hz, 2 H), 4.77 (dd, J = 6.1, 7.8 Hz, 2 H), 4.55-4.44 (m, 4 H), 3.57-3.47 (m, 1 H), 2.60 (s, 3 H), 2.55 (s, 3 H). LCMS (Method 4): [MH$^+$] = 435 at 2.59 min. | Intermediate 56, oxetane-3-ylmethyl-4-methylbenzenesulfonate, K$_2$CO$_3$ |

| Example No. | Chemical name Structure | Analytical data $^1$H NMR LC-MS | Reagents |
|---|---|---|---|
| Example 38 | N-[(6-methylpyridazin-3-yl)methyl]-6-(5-methylthiazol-2-yl)-8-tetrahydropyran-4-yloxy-quinazolin-4-amine | $^1$H NMR (400 MHz, DMSO): δ 9.28-9.26 (m, 1 H), 8.47 (s, 1 H), 8.45-8.39 (m, 1H), 7.82 (d, J = 1.6 Hz, 1 H), 7.67 (d, J = 1.2 Hz, 1 H), 7.57-7.55 (m, 1 H), 7.51-7.49 (m, 1 H), 5.02-5.01 (m, 2 H), 4.94-4.88 (m, 1 H), 3.93-3.89 (m, 2 H), 3.56-3.51 (m, 2 H), 2.55 (s, 3 H), 2.44 (s, 3 H), 2.06-2.01 (m, 2 H), 1.76-1.71 (m, 2 H). LCMS (Method 4): [MH+] = 449 at 3.68 min. | Intermediate 56, Tetrahydro-2H-pyran-4-yl 4-methylbenzenesulfonate, $Cs_2CO_3$ |

Example 39

8-(5-azaspiro[3.5]nonan-8-yloxy)-6-(4-fluorophenyl)-N-[(1R)-1-[2-(trifluoromethyl)pyrimidin-5-yl]ethyl]quinazolin-4-amine

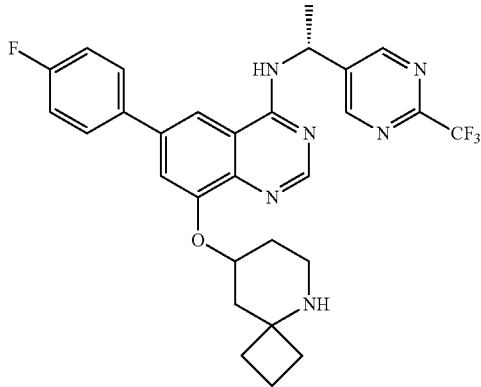 [SMILES: C[C@@H](Nc1ncnc2c(OC3CCNC4(CCC4)C3)cc(-c3ccc(F)cc3)cc12)c1cnc(C(F)(F)F)nc1]

Step 1: Preparation of tert-butyl 8-((6-(4-fluorophenyl)-4-(((R)-1-(2-(trifluoromethyl)pyrimidin-5-yl)ethyl)amino)quinazolin-8-yl)oxy)-5-azaspiro[3.5]nonane-5-carboxylate

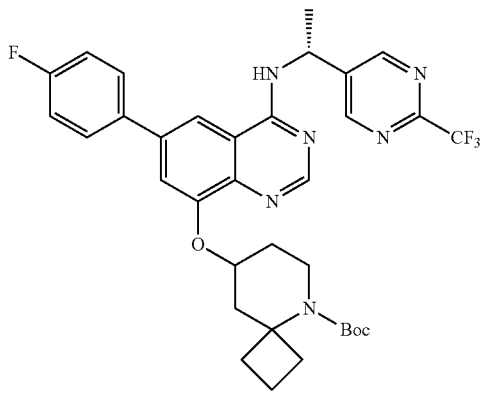 [SMILES: C[C@@H](Nc1ncnc2c(OC3CCN(C(=O)OC(C)(C)C)C4(CCC4)C3)cc(-c3ccc(F)cc3)cc12)c1cnc(C(F)(F)F)nc1]

Nitrogen was bubbled for 5 min through a mixture of (R)-6-(4-fluorophenyl)-4-((1-(2-(trifluoromethyl)pyrimidin-5-yl)ethyl)amino)quinazolin-8-ol (100 mg, 0.233 mmol), tert-butyl 8-hydroxy-5-azaspiro[3.5]nonane-5-carboxylate (62 mg, 0.256 mmol) and cyanomethyl-tributylphosphorane (84 mg, 0.349 mmol) in toluene (3.0 mL). The mixture was heated to 100° C. for 72 hours. After return to room temperature, the solvent was removed in vacuo. The residue was purified by preparative HPLC to give the title compound (41 mg, 27%) as an off white solid.

LCMS (Method 3): [MH+]=653 at 6.17 min.

Step 2: Preparation of 8-(5-azaspiro[3.5]nonan-8-yloxy)-6-(4-fluorophenyl)-N-[(1R)-1-[2-(trifluoromethyl)pyrimidin-5-yl]ethyl]quinazolin-4-amine

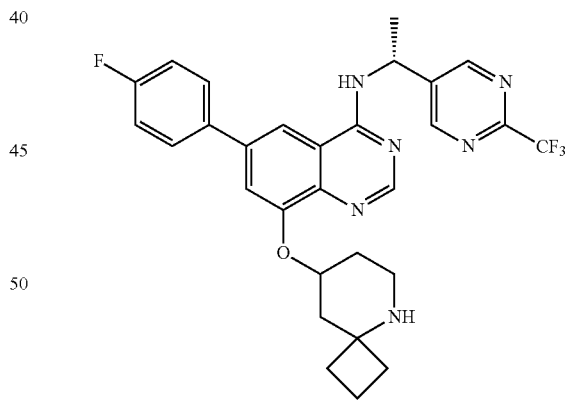

To a solution of tert-butyl 8-((6-(4-fluorophenyl)-4-(((R)-1-(2-(trifluoromethyl)pyrimidin-5-yl)ethyl)amino)quinazolin-8-yl)oxy)-5-azaspiro[3.5]nonane-5-carboxylate (41 mg, 0.063 mmol) in methanol (1 mL) was added a solution of 4 N HCl in 1,4-dioxane (1 mL). The resulting mixture was stirred at room temperature for 18 hours.

The reaction was directly loaded onto an SCX cartridge. The cartridge was washed with methanol and the filtrate was collected when eluting with a 7M solution of ammonia in methanol. The solvent was removed in vacuo and the residue was purified by preparative HPLC to give the title compound (11.0 mg, 31%) as a beige solid.

¹H NMR (400 MHz, DMSO): δ 9.18 (s, 2H), 8.68 (d, J=6.8 Hz, 1H), 8.43 (s, 1H), 8.25 (s, 1H), 7.94-7.90 (m, 2H), 7.63-7.61 (m, 1H), 7.43-7.40 (m, 2H), 5.71-5.64 (m, 1H), 4.88-4.85 (m, 1H), 3.05-3.03 (m, 1H), 2.84-2.79 (m, 1H), 2.34-2.31 (m, 1H), 2.10-2.02 (m, 2H), 1.80-1.73 (m, 2H), 1.66-1.61 (m, 2H), 1.47-1.41 (m, 4H), 1.89 (d, J=7.2 Hz, 3H). LCMS (Method 4): [MH+]=553 at 3.09 min.

The following compounds reported in the table below were prepared according to the same procedure described for the preparation of 8-(5-azaspiro[3.5]nonan-8-yloxy)-6-(4-fluorophenyl)-N-[(1R)-1-[2-(trifluoromethyl)pyrimidin-5-yl]ethyl]quinazolin-4-amine:

| Example No. | Chemical Name Structure | Analytical data ¹H NMR LC-MS |
|---|---|---|
| Example 41 | 8-((2-azabicyclo[2.2.1]heptan-5-yl)oxy)-6-(4-fluorophenyl)-N-((R)-1-(2-(trifluoromethyl)pyrimidin-5-yl)ethyl)quinazolin-4-amine | ¹H NMR (400 MHz, DMSO): δ 9.20 (s, 2 H), 8.67 (d, J = 7.1 Hz, 1 H), 8.48 (s, 1 H), 8.25 (s, 1 H), 7.94-7.97 (m, 2 H), 7.53 (s, 1 H), 7.42 (dd, J = 8.1, 8.1 Hz, 2 H), 5.70 (dd, J = 5.8, 11.1 Hz, 1 H), 5.20 (s, 1 H), 3.95-4.05 (m, 1 H), 3.77-3.79 (m, 2 H), 2.89-2.99 (m, 2 H), 2.33-2.37 (m, 1 H), 1.76 (m, 4H), 1.69-1.70 (m, 4H); LCMS (Method 4): [MH+] = 525 at 3.02 min. |

Example 44

(R)-2-((6-(4-fluorophenyl)-4-((1-(2-(trifluoromethyl) pyrimidin-5-yl)ethyl)amino)quinazolin-8-yl)oxy) acetic Acid

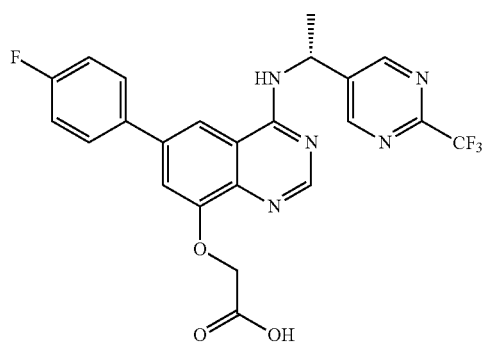 [SMILES: C[C@@H](Nc1ncnc2c(OCC(=O)O)cc(-c3ccc(F)cc3)cc12)c1cnc(C(F)(F)F)nc1]

Step 1: Tert-butyl (R)-2-((6-(4-fluorophenyl)-4-((1-(2-(trifluoromethyl)pyrimidin-5-yl)ethyl)amino)quinazolin-8-yl)oxy)acetate

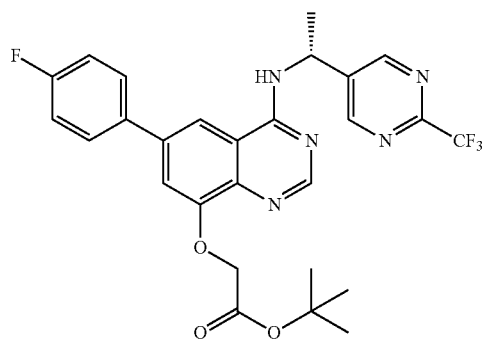 [SMILES: C[C@@H](Nc1ncnc2c(OCC(=O)OC(C)(C)C)cc(-c3ccc(F)cc3)cc12)c1cnc(C(F)(F)F)nc1]

Tert-butyl 2-bromoacetate (0.057 ml, 0.384 mmol) was added to a stirred mixture of (R)-6-(4-fluorophenyl)-4-((1-(2-(trifluoromethyl)pyrimidin-5-yl)ethyl)amino) quinazolin-8-ol (150 mg, 0.349 mmol) (Intermediate 1) and potassium carbonate (155 mg, 1.122 mmol) in DMF (3 ml). Stirring went on at rt for 1 h, then the reaction mixture was diluted with EtOAC and washed with brine (2 X). The organic layer was dried over sodium sulfate, filtered and concentrated under reduced pressure. Purification by chromatography (Biotage Isolera, 10 g KP-Sil cartridge, gradient elution from 0 to 50% EtOAc in dichloromethane in 15 CV) yielded tert-butyl (R)-2-((6-(4-fluorophenyl)-4-((1-(2-(trifluoromethyl)pyrimidin-5-yl)ethyl)amino)quinazolin-8-yl)oxy)acetate (149 mg, 0.274 mmol, 78% yield) a white powder.

LCMS (Method 5): 0.97 min, m/z 544.2 [M+H]+.

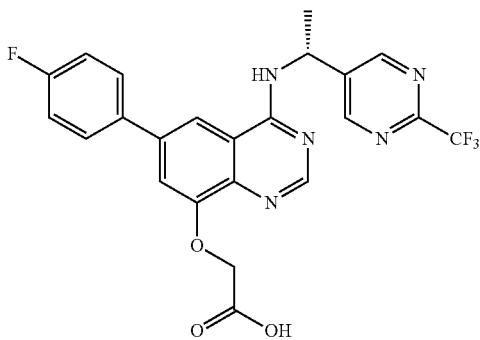 [SMILES: C[C@@H](Nc1ncnc2c(OCC(=O)O)cc(-c3ccc(F)cc3)cc12)c1cnc(C(F)(F)F)nc1]

Tert-butyl (R)-2-((6-(4-fluorophenyl)-4-((1-(2-(trifluoromethyl)pyrimidin-5-yl)ethyl)amino)quinazolin-8-yl)oxy)acetate (149 mg, 0.274 mmol) was dissolved in TFA (2 mL). Stirring went on at rt for 16 h, then volatiles were removed under reduced pressure. Trituration in diethyl ether yielded (R)-2-((6-(4-fluorophenyl)-4-((1-(2-(trifluoromethyl)pyrimidin-5-yl)ethyl)amino)quinazolin-8-yl)oxy)acetic acid (134 mg, 0.275 mmol, 100% yield) as a pale pink powder.

LCMS (Method 5): 0.81 min, m/z 488.1 [M+H]+, 1H NMR (400 MHz, DMSO-d6) δ ppm 9.22 (bs, 1H), 9.16 (s, 2H), 8.55 (s, 1H), 8.29 (s, 1H), 7.87 (dd, J=8.66, 5.37 Hz, 2H), 7.65 (br s, 1H), 7.38 (t, J=8.77 Hz, 2H), 5.75 (quin, J=6.63 Hz, 1H), 5.07 (s, 2H), 1.73 (d, J=7.02 Hz, 3H).

Example 55

2-((4-(((6-methylpyridazin-3-yl)methyl)amino)-6-(5-methylpyrimidin-2-yl)quinazolin-8-yl)oxy)acetic acid dihydrochloride

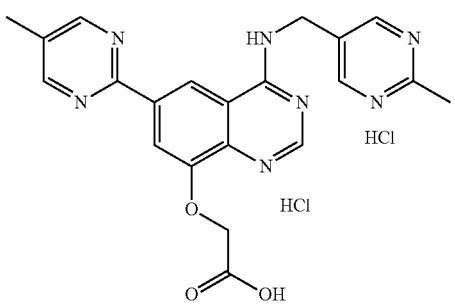

Step 1: tert-butyl 2-((4-(((6-methylpyridazin-3-yl)methyl)amino)-6-(5-methylpyrimidin-2-yl)quinazolin-8-yl)oxy)acetate

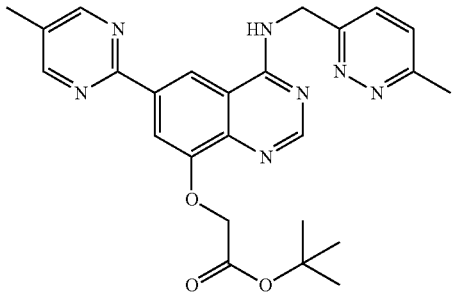

Tert-butyl 2-bromoacetate (247 μL, 1.669 mmol) was added to a stirred mixture of 4-(((6-methylpyridazin-3-yl)methyl)amino)-6-(5-methylpyrimidin-2-yl)quinazolin-8-ol (500 mg, 1.391 mmol) (intermediate 57) and potassium carbonate (456 mg, 3.30 mmol) in DMF/THF 2:1 (9 mL). Stirring went on at rt for 16 h. The reaction was quenched by the addition of formic acid (300 μL, 7.95 mmol) and volatiles were removed under reduced pressure. Purification by RP chromatography (Biotage Isolera, 60 g C18 cartridge, gradient elution from 0 to 30% B in A; A: water/acetonitrile 95:5+0.1% HCOOH, B: acetonitrile/water 95:5+0.1% HCOOH) yielded tert-butyl 2-((4-(((6-methylpyridazin-3-yl)methyl)amino)-6-(5-methylpyrimidin-2-yl)quinazolin-8-yl)oxy)acetate (451 mg, 0.952 mmol, 68.5% yield) as an orange wax.

LCMS (Method 5): 0.66 min, 473.8 [M+H]+

Step 2: 2-((4-(((6-methylpyridazin-3-yl)methyl)amino)-6-(5-methylpyrimidin-2-yl)quinazolin-8-yl)oxy)acetic Acid Dihydrochloride

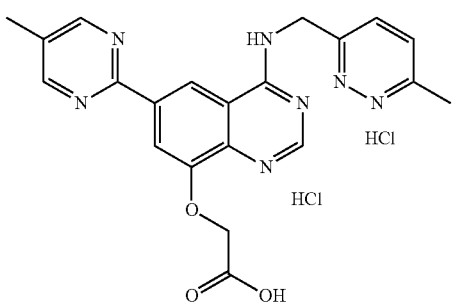

Tert-butyl 2-((4-(((6-methylpyridazin-3-yl)methyl)amino)-6-(5-methylpyrimidin-2-yl)quinazolin-8-yl)oxy)acetate was stirred in 4N HCl in 1,4-dioxane (20 ml, 80 mmol) for 16 h at rt. Volatiles were removed under reduced pressure to yield 2-((4-(((6-methylpyridazin-3-yl)methyl)amino)-6-(5-methylpyrimidin-2-yl)quinazolin-8-yl)oxy)acetic acid dihydrochloride (552 mg, 1.126 mmol, 81% yield) as a pale yellow powder.

LCMS (Method 5): 0.45 min, 418.0 [M+H]+,

1H NMR (400 MHz, DMSO-d6) δ ppm 11.20 (br t, J=5.48 Hz, 1H), 9.18 (s, 1H), 8.88 (s, 2H), 8.80 (s, 1H), 8.41 (s, 1H), 7.77 (d, J=8.55 Hz, 1H), 7.65 (d, J=8.55 Hz, 1H), 5.16-5.28 (m, 4H), 2.63 (s, 3H), 2.38 (s, 3H)

Example 57

2-((6-(4-fluorophenyl)-4-(((1-methylpiperidin-4-yl)methyl)amino)quinazolin-8-yl)oxy)acetic Acid Hydrochloride

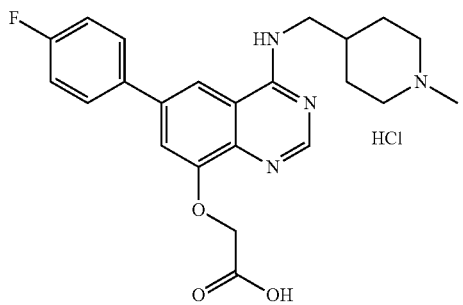 [SMILES: CN1CCC(CNc2ncnc3c(OCC(=O)O)cc(-c4ccc(F)cc4)cc23)CC1 ; Cl]

Step 1: tert-butyl (6-(4-fluorophenyl)-8-hydroxyquinazolin-4-yl)((1-methylpiperidin-4-yl)methyl)carbamate

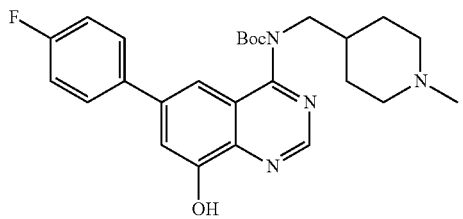 [SMILES: CN1CCC(CN(C(=O)OC(C)(C)C)c2ncnc3c(O)cc(-c4ccc(F)cc4)cc23)CC1]

A solution of di-tert-butyl dicarbonate (1.641 mL, 7.14 mmol) in THF (10 mL) was added to a stirred solution of 6-(4-fluorophenyl)-4-(((1-methylpiperidin-4-yl)methyl)amino)quinazolin-8-ol (1.19 g, 3.25 mmol) (Intermediate 59) and DIPEA (1.244 mL, 7.14 mmol) in THF (20 mL). 4-dimethylamino pyridine (0.079 g, 0.649 mmol) was then added and stirring went on for 16 h at rt. LCMS showed complete conversion to tert-butyl (8-((tert-butoxycarbonyl)oxy)-6-(4-fluorophenyl)quinazolin-4-yl)((1-methylpiperidin-4-yl)methyl)carbamate. Volatiles were removed under reduced pressure and the residue was partitioned between EtOAc/THF 1:1 and saturated aqueous ammonium chloride. The layers were separated and the organic layer was washed with brine, dried over sodium sulfate, filtered and concentrated under reduced pressure. The crude material was redissolved in dichloromethane (20 mL) and treated with 2.0 M dimethylamine in THF (4 mL). Stirring went on at rt for 4 h, then volatiles were removed under reduced pressure. Purification by column chromatography (Biotage Isolera, 55 g NH cartridge, gradient elution from 0 to 30% EtOH in dichloromethane) yielded tert-butyl (6-(4-fluorophenyl)-8-hydroxyquinazolin-4-yl)((1-methylpiperidin-4-yl)methyl)carbamate (398 mg, 0.853 mmol, 26.3% yield) as an orange powder.

LCMS (Method 5): 1.32 min, 467.4 [M+H]+.

Step 2: 2-((6-(4-fluorophenyl)-4-(((1-methylpiperidin-4-yl)methyl)amino)quinazolin-8-yl)oxy)acetic Acid Hydrochloride

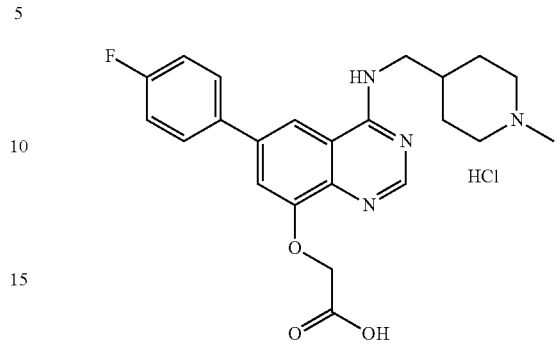

Tert-butyl 2-bromoacetate (0.075 mL, 0.509 mmol) was added to a stirred suspension of potassium carbonate (147 mg, 1.061 mmol) and tert-butyl (6-(4-fluorophenyl)-8-hydroxyquinazolin-4-yl)((1-methylpiperidin-4-yl)methyl)carbamate (198 mg, 0.424 mmol) in DMF (2 mL). Stirring went of for 16 h at rt. The reaction mixture was diluted with EtOAc and washed with brine (3 x). The organic layer was dried over sodium sulfate, filtered and concentrated under reduced pressure. Purification by column chromatography (Biotage Isolera, 28 g NH cartridge, gradient elution from 0 to 20% AcOEt in dichloromethane) yielded the intermediate tert-butyl 2-((4-((tert-butoxycarbonyl)((1-methylpiperidin-4-yl)methyl)amino)-6-(4-fluorophenyl)quinazolin-8-yl)oxy)acetate. This material was dissolved rt in 1,4-dioxane (3 mL) then treated with 4N HCl for 18h at rt. Removal of volatiles under reduced pressure yielded 2-((6-(4-fluorophenyl)-4-(((1-methylpiperidin-4-yl)methyl)amino)quinazolin-8-yl)oxy)acetic acid hydrochloride (88.1 mg, 0.191 mmol, 45.0% yield) as a pale yellow powder.

LCMS (Method 5): 0.33 min, 425.2 [M+H]+

1H NMR (400 MHz, DMSO-d6) δ ppm 13.95-14.23 (bs, 1H), 10.65-10.55 (bs, 1H), 10.11-10.18 (m, 1H), 8.72 (s, 1H), 8.53 (s, 1H), 7.95 (br dd, J=8.33, 5.48 Hz, 2H), 7.87 (s, 1H), 7.38 (t, J=8.77 Hz, 2H), 5.19 (s, 2H), 3.60-3.50 (m, 2H), 3.17-3.34 (br s, 3H), 2.74-2.90 (m, 2H), 2.67 (s, 3H), 2.50-2.53 (m, 1H), 1.97-2.05 (m, 1H), 1.90 (br d, J=13.37 Hz, 2H), 1.40-1.61 (m, 2H)

Intermediate 2

6-(4-fluorophenyl)-8-[(3-methyl-1,2,4-oxadiazol-5-yl)methoxy]-N-[(6-methylpyridazin-3-yl)methyl]quinazolin-4-amine

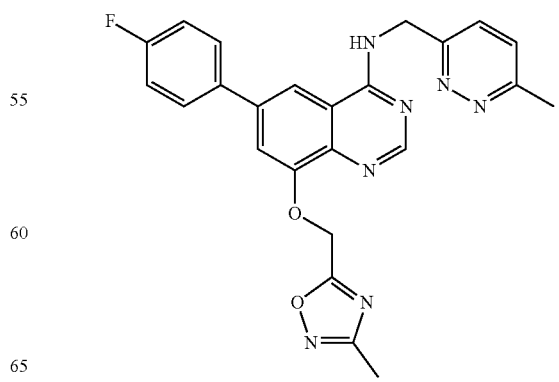

Step 1: Preparation of (3-Methyl-1,2,4-oxadiazol-5-yl)methyl methanesulfonate

Step 2: Preparation of 6-(4-Fluorophenyl)-8-[(3-methyl-1,2,4-oxadiazol-5-yl)methoxy]-N-[(6-methylpyridazin-3-yl)methyl]quinazolin-4-amine

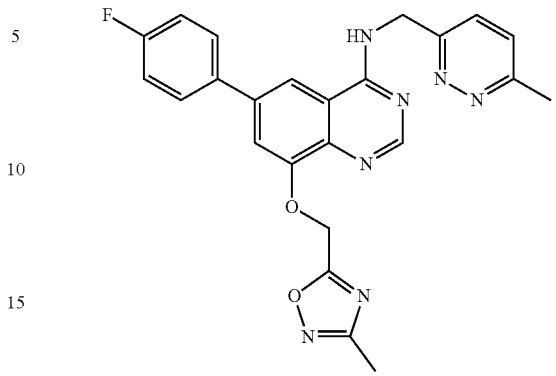

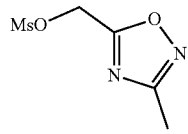

A solution of (3-methyl-1,2,4-oxadiazol-5-yl)methanol (300 mg, 2.63 mmol) and triethylamine (1.1 mL, 7.89 mmol) in DCM (6 mL) was stirred at 0° C. for 5 minutes. Methanesulfonyl chloride (0.41 mL, 5.26 mmol) was added and the reaction mixture was stirred at 0° C. for 15 minutes. The reaction was then warmed to room temperature and stirred for 16 hours. The reaction was partitioned between DCM and water and the two phases were separated. The aqueous phase was extracted with DCM and the combined organic phases were passed through phase separating paper. The solvent was removed in vacuo to afford the title compound as an orange oil (290 mg, 57% yield).

$^1$H NMR (400 MHz, CDCl$_3$): δ 4.66 (s, 2H), 3.49 (s, 3H), 2.43 (s, 3H).

(3-Methyl-1,2,4-oxadiazol-5-yl)methyl methanesulfonate (176 mg, 0.46 mmol), 6-(4-fluorophenyl)-4-(((6-methylpyridazin-3-yl)methyl)amino)quinazolin-8-ol (150 mg, 0.23 mmol) and cesium carbonate (223 mg, 0.69 mmol) were dissolved in DMF (4 mL). The reaction mixture was heated at 55° C. for 16 hours. The reaction was cooled to room temperature and then it was partitioned between DCM and water. The two phases were separated and the aqueous phase was extracted with DCM (×2). The combined organic phases were passed through phase separating paper and concentrated in vacuo. Purification by preparative HPLC afforded the title compound (78.1 mg, 75%) as an off-white solid.

$^1$H NMR (400 MHz, DMSO): δ 9.13 (t, J=5.9 Hz, 1H), 8.45 (s, 1H), 8.30 (d, J=1.5 Hz, 1H), 7.95-7.90 (m, 2H), 7.75 (d, J=1.6 Hz, 1H), 7.59-7.49 (m, 2H), 7.43-7.38 (m, 2H), 5.80 (s, 2H), 5.04 (d, J=5.9 Hz, 2H), 2.61-2.60 (m, 3H), 2.39 (s, 3H). LCMS (Method 3): [MH]=458 at 4.29 min.

The following compounds were prepared via adaptations of the above procedures for Intermediate 2 starting from substrate reported in table.

| Example No. | Structure | Analytical data $^1$H NMR LC-MS | Reagents |
|---|---|---|---|
| Example 61 | 6-(4-fluorophenyl)-8-[(3-methyloxetan-3-yl)methoxy]-N-[(6-methylpyridazin-3-yl)methyl]quinazolin-4-amine 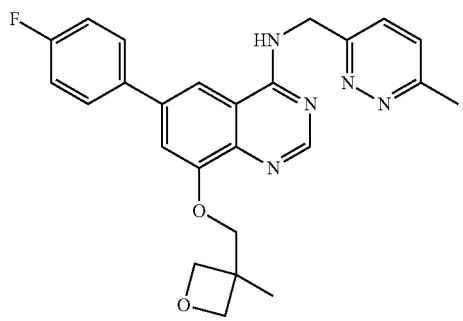 [SMILES: Cc1ccc(CNc2ncnc3c(OCC4(C)COC4)cc(-c4ccc(F)cc4)cc23)nn1] | $^1$H NMR (400 MHz, DMSO): δ 9.05 (dd, J = 5.9, 5.9 Hz, 1 H), 8.46 (s, 1 H), 8.22 (d, J = 1.6 Hz, 1 H), 7.98-7.93 (m, 2 H), 7.65 (d, J = 1.5 Hz, 1 H), 7.55 (d, J = 8.7 Hz, 1 H), 7.50 (d, J = 8.7 Hz, 1 H), 7.39 (dd, J = 8.8, 8.8 Hz, 2 H), 5.04 (d, J = 5.8 Hz, 2 H), 4.60 (d, J = 5.8 Hz, 2 H), 4.39-4.35 (m, 4 H), 2.60 (s, 3 H), 1.47 (s, 3 H). LCMS (Method 3): [MH$^+$] = 446 at 3.9 min. | Intermediate 4, 3-methyl-3-(p-toluenesulfonyloxymethyl) oxetane, Cs$_2$CO$_3$ |

-continued

| Example No. | Structure | Analytical data ¹H NMR LC-MS | Reagents |
|---|---|---|---|
| Example 67 | 3-[6-(4-fluorophenyl)-4-[(6-methylpyridazin-3-yl)methylamino]quinazolin-8-yl]oxy-1-methyl-pyrrolidin-2-one | ¹H NMR (400 MHz, DMSO): δ 9.07 (dd, J = 5.9, 5.9 Hz, 1 H), 8.42 (s, 1 H), 8.24 (d, J = 1.5 Hz, 1 H), 7.93-7.88 (m, 2 H), 7.82 (d, J = 1.5 Hz, 1 H), 7.56 (d, J = 8.7 Hz, 1 H), 7.50 (d, J = 8.7 Hz, 1 H), 7.40 (dd, J = 8.9, 8.9 Hz, 2 H), 5.44 (dd, J = 7.3, 7.3 Hz, 1 H), 5.04 (d, J = 5.8 Hz, 2 H), 3.52-3.37 (m, 2 H), 2.84 (s, 3 H), 2.61-2.60 (m, 3 H), 2.15-2.06 (m, 2 H). LCMS (Method 4): [MH⁺] = 459 at 2.93 min. | Intermediate 4, 3-bromo-1-methylpyrrolidin-2-one, Cs₂CO₃ |
| Example 72 | 2-[6-(4-fluorophenyl)-4-[(6-methylpyridazin-3-yl)methylamino]quinazolin-8-yl]oxy-N-(2,2,2-trifluoroethyl)acetamide | ¹H NMR (400 MHz, DMSO): δ 9.28-9.15 (m, 2 H), 8.47 (s, 1 H), 8.32 (d, J = 1.6 Hz, 1 H), 7.93-7.88 (m, 2 H), 7.72 (d, J = 1.6 Hz, 1 H), 7.57 (d, J = 8.7 Hz, 1 H), 7.51 (d, J = 8.7 Hz, 1 H), 7.39 (dd, J = 8.9, 8.9 Hz, 2 H), 5.05 (d, J = 5.8 Hz, 2 H), 4.95 (s, 2 H), 4.09-3.98 (m, 2 H), 2.60 (s, 3 H). LCMS (Method 4): [MH⁺] = 501 at 3.22 min. | Intermediate 4, 2-chloro-N-(2,2,2-trifluoroethyl)acetamide, Cs₂CO₃ |
| Example 74 | 6-(4-fluorophenyl)-N-((6-methylpyridazin-3-yl)methyl)-8-(oxetan-3-yloxy)quinazolin-4-amine | ¹H NMR (400 MHz, DMSO): δ 8.29 (s, 1 H), 8.17 (s, 1 H), 8.03 (d, J = 1.6 Hz, 1 H), 7.80-7.75 (m, 2 H), 7.68 (d, J = 8.5 Hz, 1 H), 7.55-7.51 (m, 2 H), 7.32 (dd, J = 8.9, 8.9 Hz, 2 H), 5.07 (s, 2 H), 4.43-4.37 (m, 2 H), 4.02-3.95 (m, 1 H), 3.83-3.72 (m, 2 H), 2.61 (s, 3 H). LCMS (Method 4): [MH+] = 418 at 2.69 min. | Intermediate 4, 3-iodooxetane, Cs₂CO₃ |

Example 81

N-[1-(5-methyl-1,3,4-thiadiazol-2-yl)ethyl]-6-(5-methylthiazol-2-yl)-8-tetrahydropyran-4-yloxy-quinazolin-4-amine

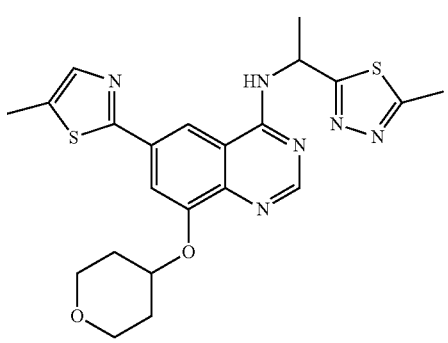

Step 1: Preparation of Methyl 2-nitro-3-((tetrahydro-2H-pyran-4-yl)oxy)benzoate

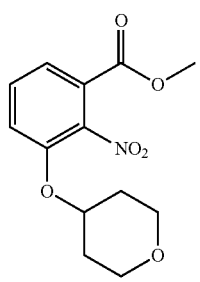 [SMILES: COC(=O)c1cccc(OC2CCOCC2)c1[N+](=O)[O-]]

Methyl 3-hydroxy-2-nitrobenzoate (2000 mg, 10.14 mmol), tetrahydropyran-4-yl methanesulfonate (3600 mg, 19.97 mmol) and potassium carbonate (6900 mg, 49.92 mmol) were suspended in acetonitrile (40 mL) and the reaction mixture was heated at 82° C. for 16 hours under nitrogen. The reaction mixture was cooled to room temperature and filtered. The filtrate was concentrated under reduced pressure, dissolved in acetonitrile and filtered. The filtrate was concentrated under reduced pressure and purified by flash column chromatography on silica gel eluting with 45% ethyl acetate in cyclohexane to give the title compound as a clear colourless oil (1500 mg, 52% yield).

LCMS (Method 3): $[M+NH_4]^+$=299 at 4.04 min.

Step 2: Preparation of Methyl 2-amino-3-((tetrahydro-2H-pyran-4-yl)oxy)benzoate

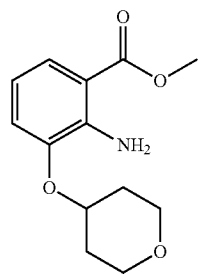 [SMILES: COC(=O)c1cccc(OC2CCOCC2)c1N]

To a solution of methyl 2-nitro-3-((tetrahydro-2H-pyran-4-yl)oxy)benzoate (2200 mg, 7.82 mmol) in ethanol (22 mL) and methanol (5 mL) was added 1-methyl-1,4-cyclohexadiene (4.4 mL, 39.11 mmol). The reaction mixture was degassed with nitrogen for 20 minutes. Palladium on carbon (10%, 832 mg, 0.782 mmol) was added and reaction mixture was heated at 80° C. under nitrogen for 16 hours. The reaction mixture was cooled to room temperature and filtered. The filtrate was concentrated in vacuo and the residue was purified by flash column chromatography on silica gel eluting with 25% ethyl acetate in cyclohexane to give the title compound (822 mg, 42%) as an off white solid.

LCMS (Method 4): [MH+]=252 at 4.27 min.

Step 3: Preparation of Methyl 2-amino-5-bromo-3-((tetrahydro-2H-pyran-4-yl)oxy)benzoate

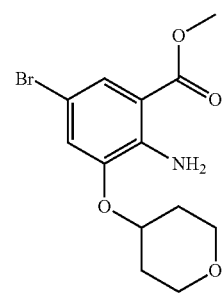 [SMILES: COC(=O)c1cc(Br)cc(OC2CCOCC2)c1N]

Methyl 2-amino-3-((tetrahydro-2H-pyran-4-yl)oxy)benzoate (886 mg, 3.53 mmol) was dissolved in chloroform (10 mL) and stirred at 5° C. for 5 minutes. Bromine (0.19 mL, 3.70 mmol) in chloroform (6 mL) was added dropwise, allowing the colour to dissipate between drops. The reaction was stirred at 5° C. for 1 hour. The reaction mixture was quenched with sodium thiosulfate (3 mL) and the mixture was stirred for 10 minutes. A saturated sodium hydrogen carbonate solution was added and the reaction was stirred for 5 minutes. The two phases were separated and the aqueous phase was extracted with DCM (×2). The combined organic phases were dried and concentrated in vacuo to give the title compound (1106 mg, 95%).

$^1$H NMR (400 MHz, CDCl$_3$): δ 7.62 (d, J=2.3 Hz, 1H), 6.94 (d, J=2.3 Hz, 1H), 6.03-5.99 (m, 2H), 4.51-4.43 (m, 1H), 4.01-3.95 (m, 2H), 3.87 (s, 3H), 3.63-3.56 (m, 2H), 2.10-2.02 (m, 2H), 1.86-1.77 (m, 2H).

Step 4: Preparation of 6-Bromo-8-((tetrahydro-2H-pyran-4-yl)oxy)quinazolin-4-ol

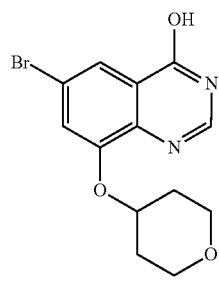 [SMILES: Oc1ncnc2c(OC3CCOCC3)cc(Br)cc12]

Methyl 2-amino-5-bromo-3-((tetrahydro-2H-pyran-4-yl)oxy)benzoate (1106 mg, 3.35 mmol) was dissolved in THF (5 mL), methanol (5 mL) and water (5 mL). Lithium hydroxide (176 mg, 4.19 mmol) was added and the reaction was stirred at room temperature for 18 hours. The reaction mixture was concentrated in vacuo. The residue was stirred in formamide (4 mL) at 140° C. for 16 hours. The reaction mixture was cooled to room temperature and then it was diluted with water and filtered. The solid was then washed with water (×2) followed by 9:1 diethyl ether/methanol (×2) and finally ether to give the title compound (1045 mg, 96%).
LCMS (Method 4): [MH+]=326 at 3.12 min.

Step 5: Preparation of 6-(5-methylthiazol-2-yl)-8-((tetrahydro-2H-pyran-4-yl)oxy)quinazolin-4-ol

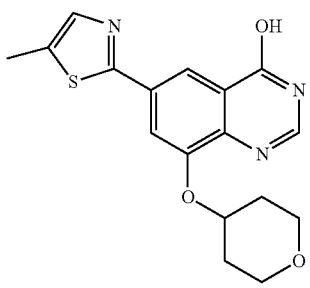 [SMILES: Cc1cnc(-c2cc(OC3CCOCC3)c3ncnc(O)c3c2)s1]

6-Bromo-8-((tetrahydro-2H-pyran-4-yl)oxy)quinazolin-4-ol quinazoline (348 mg, 1.07 mmol), potassium acetate (210 mg, 2.14 mmol) and bis(pinacolato)diboron (326 mg, 1.29 mmol) were degassed in dioxane (13 mL). [1,1'-Bis(diphenylphosphino)ferrocene]dichloropalladium(II), complex with dichloromethane (44 mg, 0.054 mmol) was added and the reaction mixture was heated at 100° C. for 20 hours. The reaction mixture was allowed to cool to room temperature and 2-bromo-5-methylthiazole (258 mg, 1.45 mmol), cesium carbonate (698 mg, 2.14 mmol) and water (4 mL) were added. The reaction mixture was degassed with nitrogen and then tetrakis(triphenylphosphine)palladium(O) (37 mg, 0.032 mmol) was added. The reaction mixture was heated at 100° C. for 23 hours. The reaction mixture was then cooled to room temperature and then partitioned between EtOAc and water. The two phases were separated, and the aqueous phase was extracted with EtOAc (×1) and DCM (×1). The organic phases were dried over MgSO4, combined and concentrated in vacuo. The residue was purified by flash column chromatography on silica gel eluting with 0-100% ethyl acetate/EtOH (ratio 3:1) in cyclohexane to give the title compound (176 mg, 20%).
LCMS (Method 4): [MH+]=344 at 3.21 min.

Step 6: Preparation of N-[1-(5-methyl-1,3,4-thiadiazol-2-yl)ethyl]-6-(5-methylthiazol-2-yl)-8-tetrahydropyran-4-yloxy-quinazolin-4-amine

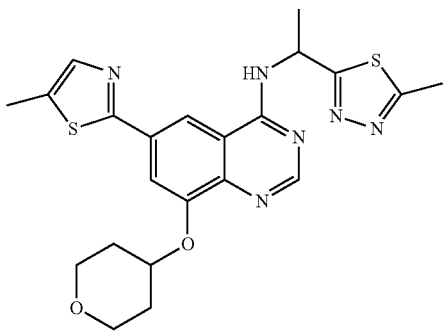

A mixture of 6-(5-methylthiazol-2-yl)-8-((tetrahydro-2H-pyran-4-yl)oxy)quinazolin-4-ol (176 mg, 0.513 mmol, 40% pure), phosphorus(V) oxychloride (0.062 mL, 0.67 mmol), DIPEA (0.45 mL, 2.56 mmol) in toluene (5 mL) was heated at 90° C. under nitrogen for 2 hours. The reaction was cooled to room temperature and concentrated in vacuo. The residue was partitioned between water and dichloromethane. The combined organic layers were washed with saturated sodium hydrogen carbonate solution, passed through a hydrophobic frit and concentrated in vacuo. The residue (80 mg) was dissolved in chloroform (0.5 mL) and 1-(5-methyl-1,3,4-thiadiazol-2-yl)ethan-1-amine (37 mg, 0.26 mmol) was added. The reaction mixture was heated in a sealed tube under nitrogen for 18 hours at 70° C. After this time the resulting mixture was cooled to room temperature. The reaction was diluted with cold water and stirred for 10 minutes. The mixture was then partitioned between ethyl acetate and water. The two phases were separated and the aqueous phase was extracted further with ethyl acetate (×2). The combined organic phases were passed through phase separating paper and the solvent was removed in vacuo. The residue was purified by preparative HPLC to give the title compound (27.5 mg, 29%) as an off white solid.
$^1$H NMR (400 MHz, DMSO): δ 9.09-9.08 (m, 1H), 8.55 (s, 1H), 8.44 (d, J=1.3 Hz, 1H), 7.84 (s, 1H), 7.69 (d, J=1.1 Hz, 1H), 6.01-5.96 (m, 1H), 4.97-4.90 (m, 1H), 3.95-3.91 (m, 2H), 3.58-3.51 (m, 2H), 2.67 (s, 3H), 2.55 (s, 3H), 2.09-2.02 (m, 2H), 1.81 (d, J=7.0 Hz, 3H), 1.78-1.67 (m, 2H). LCMS (Method 4): [MH+]=469 at 2.94 min.

The following compounds reported in the table below were prepared according to the same procedure described for the preparation of N-[1-(5-methyl-1,3,4-thiadiazol-2-yl)ethyl]-6-(5-methylthiazol-2-yl)-8-tetrahydropyran-4-yloxy-quinazolin-4-amine:

| Example No. | Chemical Name Structure | Analytical data<br>¹H NMR<br>LC-MS |
|---|---|---|
| Example 82 | 6-(5-fluoro-2-pyridyl)-N-[(1R)-1-(5-methyl-1,2,4-oxadiazol-3-yl)ethyl]-8-tetrahydropyran-4-yloxy-quinazolin-4-amine | ¹H NMR (400 MHz, DMSO): δ 8.78-8.73 (m, 2 H), 8.63 (d, J = 1.6 Hz, 1 H), 8.50 (s, 1 H), 8.29 (dd, J = 4.3, 9.0 Hz, 1 H), 8.07 (d, J = 1.5 Hz, 1 H), 8.00-7.94 (m, 1 H), 5.80-5.75 (m, 1 H), 4.97-4.91 (m, 1 H), 3.97-3.90 (m, 2 H), 3.57-3.50 (m, 2 H), 2.58 (s, 3 H), 2.10-2.00 (m, 2 H), 1.70 (d, J = 7.2 Hz, 5 H). LCMS (Method 3): [MH+] = 451 at 3.79 min. |

The following compounds reported in the table below were obtained as single isomers by chiral preparative SFC purification of the corresponding racemic mixture, which was prepared according to the same procedure described for the preparation of N-[1-(5-methyl-1,3,4-thiadiazol-2-yl)ethyl]-6-(5-methylthiazol-2-yl)-8-tetrahydropyran-4-yloxy-quinazolin-4-amine:

| Example No. | Chemical Name Structure | Analytical data<br>¹H NMR<br>LC-MS |
|---|---|---|
| Example 83 | Single enantiomer 1 of 6-(5-methyl-2-pyridyl)-N-[1-(5-methyl-1,3,4-thiadiazol-2-yl)ethyl]-8-tetrahydropyran-4-yloxy-quinazolin-4-amine | ¹H NMR (400 MHz, DMSO): δ 8.94 (d, J = 7.4 Hz, 1 H), 8.61 (s, 1 H), 8.58-8.57 (m, 1 H), 8.53 (s, 1 H), 8.10 (d, J = 5.3 Hz, 2 H), 7.82-7.79 (m, 1 H), 5.99 (dd, J = 7.2, 7.2 Hz, 1 H), 4.98-4.92 (m, 1 H), 3.95-3.92 (m, 2 H), 3.57-3.51 (m, 2 H), 2.65 (d, J = 4.1 Hz, 3 H), 2.38 (s, 3 H), 2.05 (d, J = 12.8 Hz, 2 H), 1.82 (d, J = 7.8 Hz, 3 H), 1.78-1.67 (m, 2 H), 1.25 (s, 1 H).<br>LCMS (Method 4): [MH⁺] = [MH+] = 463 at 2.9 min. Chiral analysis (Method 8) at 2.20 min. |
| Example 84 | Single enantiomer 2 of 6-(5-methyl-2-pyridyl)-N-[1-(5-methyl-1,3,4-thiadiazol-2-yl)ethyl]-8-tetrahydropyran-4-yloxy-quinazolin-4-amine | ¹H NMR (400 MHz, DMSO): δ 8.94 (d, J = 7.4 Hz, 1 H), 8.61 (d, J = 1.6 Hz, 1 H), 8.58 (d, J = 1.9 Hz, 1 H), 8.53 (s, 1 H), 8.12-8.09 (m, 2 H), 7.81 (dd, J = 1.9, 8.2 Hz, 1 H), 6.01-5.96 (m, 1 H), 4.98-4.91 (m, 1 H), 3.96- |

-continued

| Example No. | Chemical Name Structure | Analytical data ¹H NMR LC-MS |
|---|---|---|
| | (structure with methylpyridyl, quinazoline, tetrahydropyran, methylthiadiazole) | 3.91 (m, 2 H), 3.58-3.50 (m, 2 H), 2.66 (s, 3 H), 2.39 (s, 3 H), 2.08-2.01 (m, 2 H), 1.82 (d, J = 7.2 Hz, 3 H), 1.79-1.68 (m, 2 H). LCMS (Method 4): [MH⁺] = 463 at 2.9 min. Chiral analysis (Method 8) at 3.98 min. |
| Example 85 | Single enantiomer 1 of 6-(5-fluoro-2-pyridyl)-N-[1-(3-methyl-1,2,4-oxadiazol-5-yl)ethyl]-8-tetrahydropyran-4-yloxy-quinazolin-4-amine | ¹H NMR (400 MHz, DMSO): δ 8.92 (d, J = 7.3 Hz, 1 H), 8.75 (d, J = 3.0 Hz, 1 H), 8.62 (d, J = 1.6 Hz, 1 H), 8.50 (s, 1 H), 8.28 (dd, J = 4.3, 8.9 Hz, 1 H), 8.08 (d, J = 1.5 Hz, 1 H), 8.00-7.95 (m, 1 H), 5.84-5.79 (m, 1 H), 4.99-4.92 (m, 1 H), 3.97-3.90 (m, 2 H), 3.57-3.50 (m, 2 H), 2.33 (s, 3 H), 2.09-2.02 (m, 2 H), 1.77-1.73 (m, 5 H). LCMS (Method 3): [MH⁺] = 451 at 4.39 min. Chiral analysis (Method 40) at 3.49 min. |

Example 94

6-(4-fluorophenyl)-8-(2-methylpyrazol-3-yl)-N-[(6-methylpyridazin-3-yl)methyl]quinazolin-4-amine

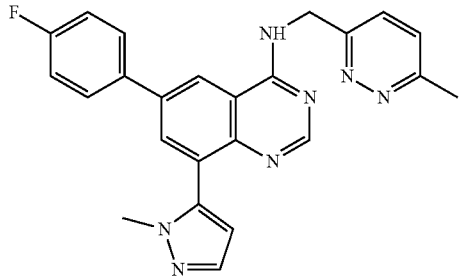 [SMILES: Cc1ccc(CNc2ncnc3c(-c4ccnn4C)cc(-c4ccc(F)cc4)cc23)nn1]

Step 1: Preparation of 6-(4-Fluorophenyl)-8-iodo-4-((2-(trimethylsilyl)ethoxy)methoxy)-quinazoline

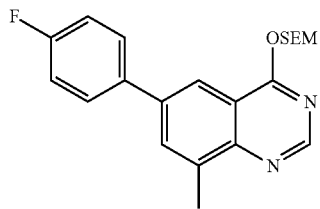

6-(4-Fluorophenyl)-8-iodoquinazolin-4-ol (2.0 g, 5.46 mmol) was suspended in DMF (50 ml) and cooled to 0° C. Sodium hydride (60% in mineral oil, 262 mg, 6.55 mmol) was added portionwise and the reaction mixture was stirred at 0° C. for 30 minutes. 2-(Trimethylsilyl)ethoxymethyl chloride (1.5 mL, 8.19 mmol) was added at 0° C. and the reaction mixture was allowed to warm to room temperature over 16 hours. The reaction was quenched with water and extracted with EtOAc (×3). The combined organic phases were passed through phase separating paper and the solvent was removed under in vacuo. The residue was purified by column chromatography on silica gel eluting with 0-100% DCM in cyclohexane, followed by 0-100% ethyl acetate in DCM to give the title compound (1.2 g, 44%) as a white solid.

LCMS (Method 3): [MH+]=497 at 6.43 min.

Step 2: Preparation of 6-(4-fluorophenyl)-8-(1-methyl-1H-pyrazol-5-yl)-4-((2-trimethylsilyl)ethoxy)methoxy)-quinazoline

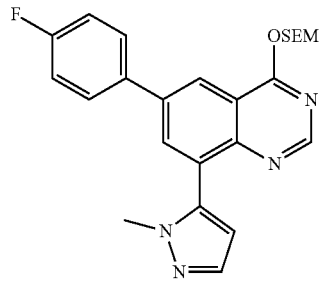

To 6-(4-fluorophenyl)-8-iodo-4-((2-(trimethylsilyl) ethoxy)methoxy)quinazoline (500 mg, 1.01 mmol) was added 1-(methyl-1H-pyrazole-5-boronic acid pinacol ester (210 mg, 1.01 mmol), cesium carbonate (1313 mg, 4.03 mmol), tetrakis(triphenylphosphine)palladium(O) (175 mg, 0.15 mmol), dioxane (4 mL) and water (2 mL). The reaction mixture was heated at 105° C. for 20 hours. Further aliquots of 1-(methyl-1H-pyrazole-5-boronic acid pinacol ester (210 mg, 1.01 mmol) and tetrakis(triphenylphosphine)palladium (O) (175 mg, 0.15 mmol) were added and the reaction mixture was heated at 105° C. for 24 hours. The reaction was cooled to room temperature and partitioned between DCM and water. The two phases were separated and the aqueous phase was extracted with DCM. The combined organic phases were passed through phase separating paper and the solvent was removed in vacuo. Purification by column chromatography on silica gel eluting with 0-50% ethyl acetate in cyclohexane afforded the title compound (388 mg, 85%) as a yellow oil.

$^1$H NMR (400 MHz, CDCl$_3$): δ 8.60 (d, J=2.0 Hz, 1H), 8.16 (s, 1H), 7.96 (d, J=2.0 Hz, 1H), 7.70-7.61 (m, 3H), 7.18 (t, J=8.5 Hz, 2H), 6.41 (d, J=1.8 Hz, 1H), 5.46 (s, 2H), 3.78 (s, 3H), 3.70 (t, J=8.2 Hz, 2H), 0.97 (t, J=8.3 Hz, 2H), 0.00 (s, 9H).

Step 3: Preparation of 6-(4-fluorophenyl)-8-(1-methyl-1H-pyrazol-5-yl)quinazolin-4-ol

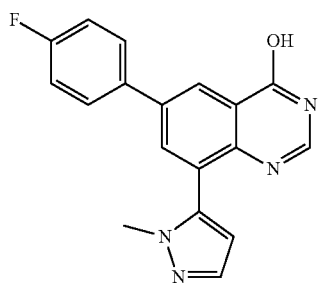 [SMILES: Cn1nccc1-c1cc(-c2ccc(F)cc2)cc2c(O)ncnc12]

A solution of 6-(4-fluorophenyl)-8-(1-methyl-IH-pyrazol-5-yl)-4-((2-trimethylsilyl)ethoxy)methoxy)-quinazoline (388 mg, 0.86 mmol) in DCM (7.5 mL) was treated with trifluoroacetic acid (2.5 mL) and the reaction mixture was stirred at room temperature for 3 hours. The solvents were removed under reduced pressure and the residue was quenched with a saturated solution of NaHCO$_3$ and water. The resulting solid was filtered and dried in vacuo to give the title compound (185 mg, 67%) as a pink solid.

LCMS (Method 4): [MH+]=321 at 3.80 min.

Step 4: Preparation of 6-(4-fluorophenyl)-8-(2-methylpyrazol-3-yl)-N-[(6-methylpyridazin-3-yl) methyl]quinazolin-4-amine

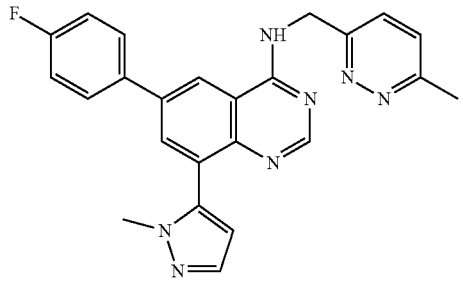 [SMILES: Cc1ccc(CNc2ncnc3c(-c4ccnn4C)cc(-c4ccc(F)cc4)cc23)nn1]

6-(4-Fluorophenyl)-8-(1-methyl-1H-pyrazol-5-yl)quinazolin-4-ol (100 mg, 0.31 mmol) was suspended in thionyl chloride (0.46 mL, 6.24 mmol) and DMF (0.0002 mL, 0.003 mmol). The reaction mixture was heated at 95° C. for 30 minutes and cooled to room temperature. The solvent was removed in vacuo. The resulting residue was suspended in dioxane (3.0 mL) and then DIPEA (272 µL, 1.56 mmol) and (6-methylpyridazin-3-yl)methanamine dihydrochloride (92 mg, 0.47 mmol) were added. The reaction mixture was heated at 95° C. for 20 hours and then cooled to room temperature. The reaction was partitioned between water and DCM. The two phases were separated and the aqueous phase was extracted with DCM. The combined organic phases were passed through phase separating paper and the solvent was removed in vacuo. The residue was purified by preparative HPLC to give the title compound (12 mg, 9%) as a brown solid.

$^1$H NMR (400 MHz, DMSO): δ 9.34 (t, J=5.7 Hz, 1H), 8.80 (d, J=2.0 Hz, 1H), 8.47-8.46 (m, 1H), 8.12 (d, J=2.0 Hz, 1H), 8.00-7.95 (m, 2H), 7.63-7.60 (m, 1H), 7.52 (dd, J=3.4, 5.3 Hz, 2H), 7.45-7.37 (m, 2H), 6.46-6.45 (m, 1H), 5.09-5.05 (m, 2H), 3.66 (s, 3H), 2.61 (s, 3H). LCMS (Method 3): [MH+]=426.5 at 4.3 min.

Example 95

6-(3-Chloro-1H-pyrazol-1-yl)-8-methoxy-N-(1-(2-(trifluoromethyl)pyrimidin-5-yl)ethyl)quinazolin-4-amine

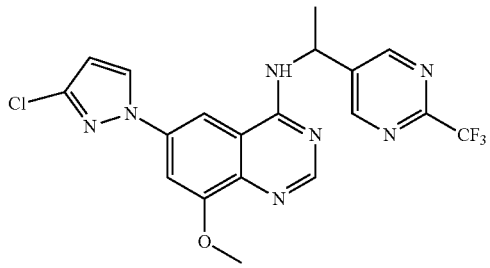 [SMILES: COc1cc(-n2ccc(Cl)n2)cc2c(NC(C)c3cnc(C(F)(F)F)nc3)ncnc12]

Nitrogen gas was bubbled through a mixture of 6-Bromo-8-methoxy-N-[(1R)-1-[2-(trifluoromethyl)pyrimidin-5-yl] ethyl]quinazolin-4 amine (200 mg, 0.47 mmol), copper (I) bromide (3.3 mg, 0.02 mmol), 3-chloro-1H-pyrazole (57 mg, 0.56 mmol) and cesium carbonate (304 mg, 0.93 mmol). 1-(pyridin-2-yl)propan-2-one (6.3 mg, 0.05 mmol) in N,N-dimethylformamide (1.0 mL) were added and the reaction mixture transferred to a pre-heated stirrer. The mixture was heated at 120° C. for 16 hours. The reaction was cooled, filtered through Celite® and the filter cake rinsed with ethyl acetate (2×5 mL). The residue was purified by column chromatography on silica gel eluting with 0-70 methanol in dichloromethane, followed by preparative HPLC to give the title compound (30.0 mg, 14-yl) as an off-white solid.

$^1$H NMR (400 MHz, DMSO): δ 9.17 (s, 2H), 8.93 (s, 1H), 8.63 (d, J=7.0 Hz, 1H), 8.42 (s, 1H), 8.33 (d, J=2.0 Hz, 1H), 8.01 (s, 1H), 7.70 (d, J=2.1 Hz, 1H), 5.70-5.64 (m, 1H), 4.02 (s, 3H), 1.74 (d, J=7.2 Hz, 3H). LCMS (Method 4): [MH+]=450.2 at 3.60 min.

The following compounds reported in the table below were prepared according to the same procedure described for the preparation of 6-(3-Chloro-H-pyrazol-O-yl)-8-methoxy-N-(1-(2-(trifluoromethyl)pyrimidin-5-yl)ethyl)quinazolin-4-amine:

| Example No. | Chemical Name Structure | Analytical data $^1$H NMR LC-MS |
|---|---|---|
| Example 96 | 6-(3-chloro-1H-pyrazol-1-yl)-8-methoxy-N-(1-(6-methylpyridazin-3-yl)ethyl)quinazolin-4-amine 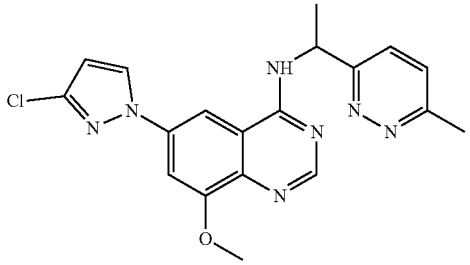 [SMILES: COc1cc(-n2ccc(Cl)n2)cc2c(NC(C)c3ccc(C)nn3)ncnc12] | $^1$H NMR (400 MHz, DMSO): δ 8.91 (s, 1 H), 8.61 (d, J = 7.4 Hz, 1 H), 8.41-8.37 (m, 2 H), 8.00 (s, 1 H), 7.71 (d, J = 2.0 Hz, 1 H), 7.62 (d, J = 8.7 Hz, 1 H), 7.50 (d, J = 8.7 Hz, 1 H), 5.77-5.72 (m, 1 H), 4.01 (s, 3 H), 2.59 (s, 3 H), 1.71 (d, J = 7.2 Hz, 3 H). LCMS (Method 4): [MH+] = 397 at 2.92 min. |
| Example 97 | (R)-6-(4-fluoro-1H-pyrazol-1-yl)-8-methoxy-N-(1-(2-(trifluoromethyl)pyrimidin-5-yl)ethyl)quinazolin-4-amine 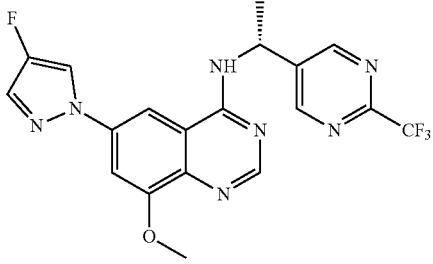 [SMILES: COc1cc(-n2cc(F)cn2)cc2c(N[C@H](C)c3cnc(C(F)(F)F)nc3)ncnc12] | $^1$H NMR (400 MHz, DMSO): δ 9.17 (s, 2 H), 8.81 (d, J = 4.5 Hz, 1 H), 8.61 (d, J = 6.9 Hz, 1 H), 8.42 (s, 1 H), 8.29 (d, J = 2.1 Hz, 1 H), 7.97 (d, J = 4.1 Hz, 1 H), 7.67 (d, J = 2.1 Hz, 1 H), 5.69-5.64 (m, 1 H), 4.02 (s, 3 H), 1.74 (d, J = 7.2 Hz, 3 H). LCMS (Method 4): [MH+] = 434 at 3.38 min. |
| Example 98 | (R)-6-(4-fluoro-1H-pyrazol-1-yl)-8-methoxy-N-(1-(6-methylpyridazin-3-yl)ethyl)quinazolin-4-amine 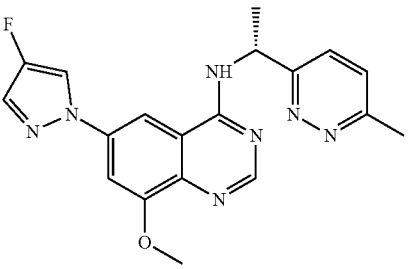 [SMILES: COc1cc(-n2cc(F)cn2)cc2c(N[C@H](C)c3ccc(C)nn3)ncnc12] | $^1$H NMR (400 MHz, DMSO): δ 8.80 (d, J = 4.5 Hz, 1 H), 8.60 (d, J = 7.4 Hz, 1 H), 8.37-8.35 (m, 2 H), 7.96 (d, J = 3.9 Hz, 1 H), 7.69 (d, J = 2.1 Hz, 1 H), 7.62 (d, J = 8.7 Hz, 1 H), 7.50 (d, J = 8.7 Hz, 1 H), 5.77-5.72 (m, 1 H), 4.01 (s, 3 H), 2.60 (s, 3 H), 1.71 (d, J = 7.2 Hz, 3 H). LCMS (Method 3): [MH+] = 380 at 3.70 min. |

-continued

| Example No. | Chemical Name Structure | Analytical data ¹H NMR LC-MS |
|---|---|---|
| Example 99 | (R)-8-methoxy-6-(4-methyl-1H-pyrazol-1-yl)-N-(1-(6-methylpyridazin-3-yl)ethyl)quinazolin-4-amine | ¹H NMR (400 MHz, DMSO): δ 8.59 (d, J = 7.4 Hz, 1 H), 8.43 (s, 1 H), 8.35-8.31 (m, 2 H), 7.73 (d, J = 2.1 Hz, 1 H), 7.67 (s, 1 H), 7.62 (d, J = 8.7 Hz, 1 H), 7.50 (d, J = 8.7 Hz, 1 H), 5.79-5.71 (m, 1 H), 4.00 (s, 3 H), 2.60 (s, 3 H), 2.18 (s, 3 H), 1.72 (d, J = 7.2 Hz, 3 H). LCMS (Method 3): [MH+] = 376 at 3.73 min. |
| Example 100 | (R)-6-(4-chloro-1H-pyrazol-1-yl)-8-methoxy-N-(1-(6-methylpyridazin-3-yl)ethyl)quinazolin-4-amine | ¹H NMR (400 MHz, DMSO): δ 8.91 (s, 1 H), 8.62 (d, J = 7.4 Hz, 1 H), 8.40 (d, J = 2.1 Hz, 1 H), 8.37 (s, 1 H), 8.00 (s, 1 H), 7.71 (d, J = 2.0 Hz, 1 H), 7.62 (d, J = 8.7 Hz, 1 H), 7.50 (d, J = 8.7 Hz, 1 H), 5.79-5.70 (m, 1 H), 4.01 (s, 3H), 2.60 (s, 3 H), 1.71 (d, J = 7.2 Hz, 3 H). LCMS (Method 3): [MH+] = 396 at 4.00 min. |
| Example 101 | (R)-6-(3-fluoro-1H-pyrazol-1-yl)-8-methoxy-N-(1-(6-methylpyridazin-3-yl)ethyl)quinazolin-4-amine | ¹H NMR (400 MHz, DMSO): δ 8.66 (d, J = 7.4 Hz, 1 H), 8.61 (dd, J = 2.7, 2.7 Hz, 1 H), 8.36-8.33 (m, 2 H), 7.64-7.60 (m, 2 H), 7.50 (d, J = 8.7 Hz, 1 H), 6.48 (dd, J = 2.7, 5.8 Hz, 1 H), 5.77-5.72 (m, 1 H), 4.01 (s, 3 H), 2.59 (s, 3 H), 1.71 (d, J = 7.2 Hz, 3 H). LCMS (Method 3): [MH+] = 379 at 3.73 min. |
| Example 102 | (R)-8-methoxy-6-(5-methyl-1H-pyrazol-1-yl)-N-(1-(6-methylpyridazin-3-yl)ethyl)quinazolin-4-amine | ¹H NMR (400 MHz, DMSO): δ 8.66 (d, J = 7.3 Hz, 1 H), 8.41 (s, 1 H), 8.17 (d, J = 1.8 Hz, 1 H), 7.65 (d, J = 1.5 Hz, 1 H), 7.60 (d, J = 8.7 Hz, 1 H), 7.49 (d, J = 8.7 Hz, 1 H), 7.38 (d, J = 1.7 Hz, 1 H), 6.37 (s, 1 H), 5.78-5.69 (m, 1 H), 3.96 (s, 3 H), 2.59 (s, 3 H), 2.44 (s, 3 H), 1.68 (d, J = 7.1 Hz, 3 H). LCMS (Method 3): [MH+] = 376 at 2.41 min. |

| Example No. | Chemical Name Structure | Analytical data $^1$H NMR LC-MS |
|---|---|---|
| Example 103 | (R)-8-methoxy-6-(3-methyl-1H-pyrazol-1-yl)-N-(1-(6-methylpyridazin-3-yl)ethyl)quinazolin-4-amine | $^1$H NMR (400 MHz, DMSO): δ 8.59 (d, J = 7.3 Hz, 1 H), 8.52 (d, J = 2.4 Hz, 1 H), 8.34 (s, 1 H), 8.31 (d, J = 2.0 Hz, 1 H), 7.70 (d, J = 1.8 Hz, 1 H), 7.62 (d, J = 8.7 Hz, 1 H), 7.50 (d, J = 8.7 Hz, 1 H), 6.46 (d, J = 2.4 Hz, 1 H), 5.79-5.71 (m, 1 H), 4.01 (s, 3 H), 2.59 (s, 3 H), 2.35 (s, 3 H), 1.72 (d, J = 7.2 Hz, 3 H). LCMS (Method 3): [MH+] = 376 at 2.60 min. |
| Example 104 | (R)-6-(4-chloro-1H-pyrazol-1-yl)-8-methoxy-N-(1-(2-(trifluoromethyl)pyrimidin-5-yl)ethyl)quinazolin-4-amine | $^1$H NMR (400 MHz, DMSO): δ 9.17 (s, 2 H), 8.92 (s, 1 H), 8.61 (d, J = 7.0 Hz, 1 H), 8.42 (s, 1 H), 8.33 (d, J = 2.1 Hz, 1 H), 8.01 (s, 1 H), 7.70 (d, J = 2.1 Hz, 1 H), 5.69-5.64 (m, 1 H), 4.02 (s, 3 H), 3.18 (d, J = 5.1 Hz, 1 H), 1.74 (d, J = 7.2 Hz, 3 H). LCMS (Method 4): [MH+] = 450 at 4.55 min. |

Intermediate 23

6-bromo-8-methoxy-4-((2-(trimethylsilyl)ethoxy)methoxy)quinazoline

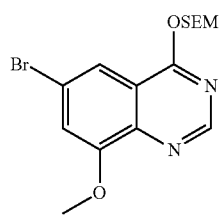

6-Bromo-8-methoxyquinazolin-4-ol (200 mg, 0.78 mmol) was dissolved in N,N-dimethylformamide (10 mL) and the reaction mixture cooled to 0° C. Sodium hydride (60% dispersion in mineral oil, 38 mg, 0.94 mmol) was added portion-wise and the reaction mixture stirred for 30 min. (2-Chloromethoxyethyl)trimethylsilane (0.21 ml, 1.18 mmol) was then added dropwise. The reaction was then stirred at 0° C. for 1 hour and then allowed to warm to room temperature. The reaction mixture was quenched with water (5 mL) and partitioned with ethyl acetate (15 mL). The phases were separated and the aqueous layer washed with ethyl acetate (2×10 mL). The combined organic phases were dried (MgSO$_4$), filtered and concentrated in vacuo. The crude product was purified by column chromatography on silica gel, eluting with 0-40% ethyl acetate in cyclohexane to give the title compound (181 mg, 60%) as a colourless solid.

$^1$H NMR (400 MHz, CDCl$_3$): δ 8.17 (s, 1H), 8.04 (d, J=2.0 Hz, 1H), 7.3 (d, J=2.0 Hz, 1H), 5.43 (s, 2H), 4.02 (s. 3H), 3.66 (m, J=4.1 Hz, 2H), 0.95 (m, J=4.1 Hz, 2H)), 0.02 (s, 9H). LCMS (Method 3): [MH+]=385 at 5.24 min.

Intermediate 24

8-methoxy-6-(4,4,5,5-tetramethyl-1,3,2-dioxaborolan-2-yl)-4-((2-(trimethylsilyl)ethoxy)methoxy)quinazoline

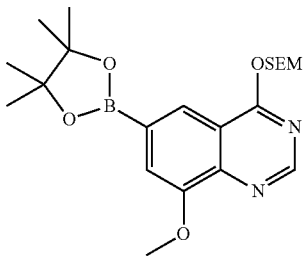

Nitrogen was bubbled for 10 minutes through a mixture of 6-bromo-8-methoxy-4-((2-(trimethylsilyl)ethoxy)methoxy) quinazoline (190 mg, 0.49 mmol), bis(pinacolato)diboron (150 mg, 0.59 mmol) and potassium acetate (97 mg, 0.99 mmol) in 1,4-dioxane (5 mL), then [1,1'-bis(diphenylphosphino)ferrocene]dichloropalladium(II) (36 mg, 0.05 mmol) was added. The reaction mixture was then heated at 95° C. for 2 hours. After this time the reaction was cooled to room temperature and filtered through Celite®. The title compound was used directly as a solution in 1,4-dioxane, assuming a quantitative yield.

Intermediate 25

6-(5-Fluoropyridin-2-yl)-8-methoxy-4-((2-(trimethylsilyl)ethoxy)-methoxy)-quinazoline To 8-methoxy-6-(4,4,5,5-tetramethyl-1,3,2-dioxaborolan-2-yl)-4-((2-(trimethylsilyl) ethoxy)methoxy) quinazoline (330 mg, 0.78 mmol) was added 2-bromo-5-fluoropyridine (137 mg, 0.78 mmol), cesium carbonate (508 mg, 1.56 mmol), 1,4-dioxane (8 mL) and water (1 mL). Nitrogen was bubbled through the reaction mixture for 10 minutes before tetrakis(triphenylphosphine)palladium(O) (90 mg, 0.078 mmol) was added. The reaction was then heated at 90° C. for 16 hours. After this time the reaction mixture was cooled to room temperature, filtered through Celite® and concentrated in vacuo. The residue was purified by column chromatography on silica gel eluting with 0-60% ethyl acetate in cyclohexane to give the title compound (226 mg, 72%) as a pale yellow solid.

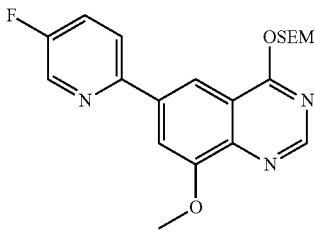

$^1$H NMR (400 MHz, DMSO): δ 8.76 (d, J=2.4 Hz, 1H), 8.46 (s, 1H), 8.42 (d, J=1.7 Hz, 1H), 8.30 (dd, J=9.1 Hz, 4.4 Hz, 1H), 8.06 (d, J=1.7 Hz, 1H), 7.91 (dt, J=2.4, 9.1 Hz, 1H), 5.44 (s, 2H), 4.06 (s, 3H), 3.64 (t, J=8.1 Hz, 2H), 0.97 (t, J=8.1 Hz, 2H), 0.01 (s, 9H). LCMS (Method 3): [MH+]=402 at 5.43 min.

The following intermediates reported in the table below were synthesised following the same procedure described for the preparation of 6-(5-Fluoropyridin-2-yl)-8-methoxy-4-((2-(trimethylsilyl)ethoxy)-methoxy)-quinazoline:

| Intermediate No. | Chemical Name Structure | Analytical Data $^1$H NMR LC-MS |
|---|---|---|
| Intermediate 22 | 6-(3-fluoro-5-methylpyridin-2-yl)-8-methoxy-4-((2-(trimethylsilyl)ethoxy)methoxy) quinazoline 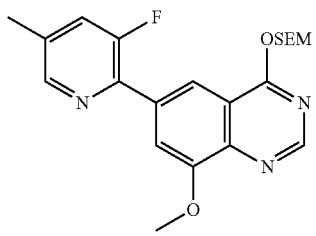 | $^1$H NMR (400 MHz, CDCl$_3$): δ 8.52 (dd, J = 1.8, 1.8 Hz, 1 H), 8.38 (s, 1 H), 8.22 (s, 1 H), 7.97 (d, J = 1.8 Hz, 1 H), 7.37 (qd, J = 4.1, 1.8 Hz, 1 H), 5.48 (s, 2 H), 4.13 (s, 3 H), 3.72-3.67 (m, 2 H), 2.44 (s, 3 H), 1.00-0.95 (m, 2 H), 0.01 (s, 9 H). |

Intermediate 26

6-(5-fluoropyridin-2-yl)-8-methoxyquinazolin-4-ol

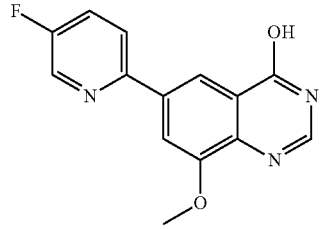 [SMILES: COc1cc(-c2ccc(F)cn2)cc2c(O)ncnc12]

6-(5-Fluoropyridin-2-yl)-8-methoxy-4-((2-(trimethylsilyl)ethoxy)methoxy)quinazoline (225 mg, 0.56 mmol) was dissolved in dichloromethane (5 mL) and trifluoroacetic acid (0.21 mL, 2.81 mmol). The reaction mixture was stirred for 16 hours. The reaction mixture was concentrated in vacuo to yield the title compound (142 mg, 93%) as a pale orange solid.

$^1$H NMR (400 MHz, DMSO): δ 8.76 (d, J=2.4 Hz, 1H), 8.39 (d, J=1.7 Hz, 1H), 8.29 (dd, J=9.0 Hz, 4.6 Hz, 1H), 8.13 (s, 1H) 8.05 (d, J=1.7 Hz, 1H), 7.92 (dt, J=2.4, 9.1 Hz, 1H), 5.69 (br s, 1H), 4.06 (s, 3H). LCMS (Method 3): [MH+]=272 at 3.08 min.

The following intermediates reported in the table below were synthesised following the same procedure described for the preparation of 6-(5-fluoropyridin-2-yl)-8-methoxy-quinazolin-4-ol (Intermediate 26):

| Intermediate No. | Chemical Name Structure | Analytical Data $^1$H NMR LC-MS |
|---|---|---|
| Intermediate 27 | 6-(5-methylpyrimidin-2-yl)-8-methoxyquinazolin-4-ol 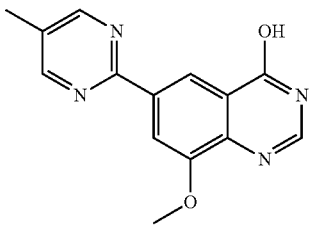 [SMILES: COc1cc(-c2ncc(C)cn2)cc2c(O)ncnc12] | LCMS (Method 4): [MH+] = 269 at 2.89 min. |

Intermediate 61

4-Chloro-8-methoxy-6-(5-methylpyrimidin-2-yl)quinazoline

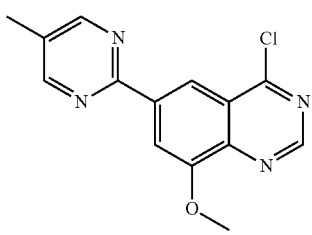 [SMILES: COc1cc(-c2ncc(C)cn2)cc2c(Cl)ncnc12]

8-methoxy-6-(5-methylpyrimidin-2-yl)quinazolin-4-ol (526 mg, 2.00 mmol) (Intermediate 27) and N,N-diisopropylethylamine (760 mg, 5.9 mmol) were dissolved in toluene (12 mL) and heated to 120° C. for 20 min. Phosphorus oxychloride (331 mg, 2.2 mmol) was then added and the reaction mixture stirred for 2 h. The reaction was cooled to room temperature and the reaction mixture concentrated in vacuo. The resulting residue was triturated from acetonitrile to give the title compound (284 mg, 50%) as an off-white solid.

$^1$H NMR (400 MHz, CDCl$_3$): δ 9.08 (s, 1H), 8.96 (s, 1H), 8.73 (s, 2H), 8.44 (s, 1H), 4.24 (s, 3H), 2.42 (s, 3H).

Intermediate 28

8-methoxy-6-(1-methyl-1H-pyrazol-3-yl)quinazolin-4-ol

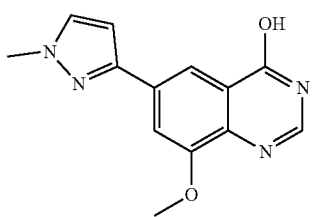 [SMILES: COc1cc(-c2ccn(C)n2)cc2c(O)ncnc12]

Nitrogen was bubbled for 10 minutes through a mixture of 6-bromo-8-methoxyquinazolin-4-ol (613 mg, 2.4 mmol), 1-methyl-3-(4,4,5,5-tetramethyl-1,3,2-dioxaborolan-2-yl)-1H-pyrazole (500 mg, 2.4 mmol) and cesium carbonate (1570 mg, 4.8 mmol) in 1,4-dioxane (25 mL) and water (4 mL). Then [1,1'-bis(diphenylphosphino)ferrocene]dichloropalladium(II) (36 mg, 0.05 mmol) was added and the reaction mixture heated at 95° C. for 3 hours. After this time the reaction was cooled to room temperature and concentrated in vacuo to one third volume. Water (40 mL) was then added and the precipitated formed was filtered to yield title compound as a colourless solid (449 mg, 73%)

$^1$H NMR (400 MHz, DMSO) δ 12.28 (s, 1H), 8.06 (s, 1H), 8.02 (s, 1H), 7.80 (s, 1H), 7.73 (s, 1H), 6.86 (s, 1H), 3.99 (s, 3H), 3.92 (s, 3H). LCMS (Method 3): [MH+]=257 at 2.77 min.

Example 105

(8-methoxy-N-(1-(5-methyl-1,3,4-oxadiazol-2-yl)ethyl)-6-(1-methyl-1H-pyrazol-3-yl)quinazolin-4-amine

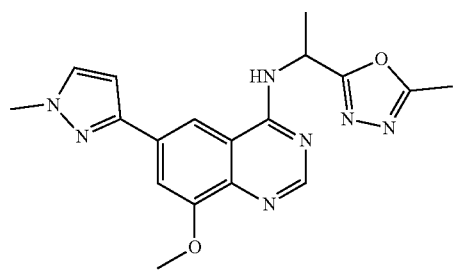

Step 1: Preparation of 4-chloro-8-methoxy-6-(1-methyl-1H-pyrazol-3-yl)quinazoline

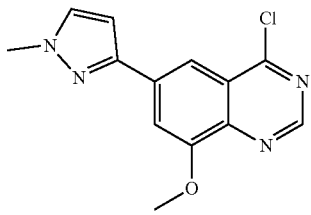 [SMILES: COc1cc(-c2ccn(C)n2)cc2c(Cl)ncnc12]

8-methoxy-6-(1-methyl-1H-pyrazol-3-yl)quinazolin-4-ol (250 mg, 0.976 mmol) and N,N-diisopropylethylamine (151.0 mg, 1.17 mmol) were dissolved in toluene (10 mL) and heated to 120° C. for 20 mins. Phosphorus oxychloride (179 mg, 0.11 mL, 1.17 mmol) was then added and the reaction mixture stirred for 4 h. The reaction was cooled and the mixture concentrated in vacuo to give a pale red solid (256 mg). The crude residue was taken on directly to the next step without further purification.

Step 2: Preparation of (8-methoxy-N-(1-(5-methyl-1,3,4-oxadiazol-2-yl)ethyl)-6-(1-methyl-1H-pyrazol-3-yl)quinazolin-4-amine

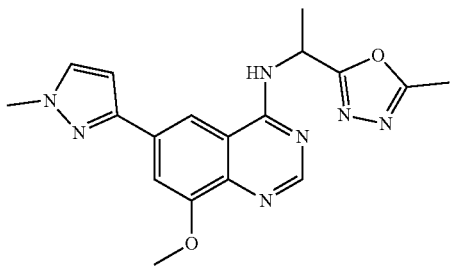

4-Chloro-8-methoxy-6-(1-methyl-1H-pyrazol-3-yl)quinazoline (150 mg, 0.546 mmol) and N,N-diisopropylethylamine (352 mg, 2.73 mmol) were dissolved in 1,4-dioxane (5 mL). 1-(5-methyl-1,3,4-oxadiazol-2-yl)ethan-1-amine (139 mg, 1.09 mmol) was added and the reaction stirred at 50° C. for 5 days. The reaction mixture was cooled and concentrated in vacuo. The residue was purified by preparative HPLC to yield the title compound as an off white solid (11 mg, 6.3%).

$^1$H NMR (400 MHz, DMSO): δ 8.59 (d, J=7.8 Hz, 1H), 8.41 (s, 1H), 8.29 (d, J=1.3 Hz, 1H), 7.83 (d, J=2.3 Hz, 1H), 7.69 (d, J=1.0 Hz, 1H), 6.89 (d, J=2.3 Hz, 1H), 5.78-5.73 (m, 1H), 3.98 (s, 3H), 3.95 (s, 3H), 2.58 (s, 3H), 1.68 (d, J=7.2 Hz, 3H). LCMS (Method 4): [MH+]=366 at 2.64 min.

The following compounds reported in the table below were prepared according to the same procedure described for the preparation of 8-methoxy-N-(1-(5-methyl-1,3,4-oxadiazol-2-yl)ethyl)-6-(1-methyl-1H-pyrazol-3-yl)quinazolin-4-amine:

| Example No. | Chemical name Structure | Analytical data $^1$H NMR LC-MS |
|---|---|---|
| Example 106 | 8-methoxy-N-(1-(5-methyl-1,3,4-thiadiazol-2-yl)ethyl)-6-(5-methylthiazol-2-yl)quinazolin-4-amine 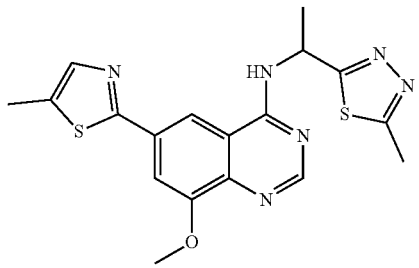 [SMILES: COc1cc(-c2ncc(C)s2)cc2c(NC(C)c3nnc(C)s3)ncnc12] | $^1$H NMR (400 MHz, DMSO): δ 9.05 (d, J = 7.5 Hz, 1 H), 8.52 (s, 1 H), 8.41 (d, J = 1.6 Hz, 1 H), 7.75 (d, J = 1.3 Hz, 1 H), 7.69 (d, J = 1.2 Hz, 1 H), 6.01-5.93 (m, 1 H), 4.01 (s, 3 H), 2.66 (s, 3 H), 1.81 (d, J = 7.0 Hz, 3 H). LCMS (Method 4): [MH$^+$] = 399 at 2.80 min. |
| Example 107 | 8-methoxy-N-(1-(5-methyl-1,2,4-oxadiazol-3-yl)ethyl)-6-(5-methylthiazol-2-yl)quinazolin-4-amine 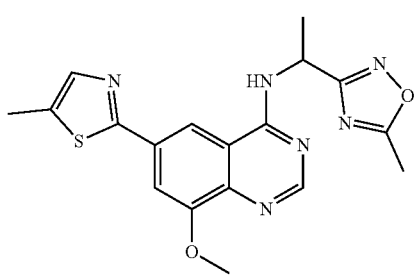 [SMILES: COc1cc(-c2ncc(C)s2)cc2c(NC(C)c3noc(C)n3)ncnc12] | $^1$H NMR (400 MHz, DMSO): δ 8.88 (d, J = 7.6 Hz, 1 H), 8.47-8.41 (m, 2 H), 7.75 (d, J = 1.5 Hz, 1 H), 7.69 (d, J = 1.2 Hz, 1 H), 5.80-5.71 (m, 1 H), 4.00 (s, 3 H), 1.69 (d, J = 7.1 Hz, 3 H). LCMS (Method 4): [MH$^+$] = 383 at 3.37 min. |

-continued

| Example No. | Chemical name Structure | Analytical data ¹H NMR LC-MS |
|---|---|---|
| Example 108 | 6-(5-fluoropyrimidin-2-yl)-8-methoxy-N-(1-(5-methyl-1,2,4-oxadiazol-3-yl)ethyl)quinazolin-4-amine 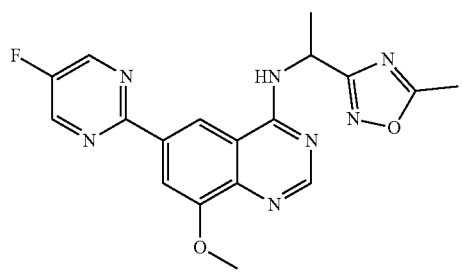 [SMILES: COc1cc(-c2ncc(F)cn2)cc2c(NC(C)c3noc(C)n3)ncnc12] | ¹H NMR (400 MHz, CDCl₃) δ 8.56 (d, J = 3.3 Hz, 1 H), 7.86 (dd, J = 4.1, 8.7 Hz, 1 H), 7.78 (d, J = 2.5 Hz, 1 H), 7.52 (ddd, J = 8.6, 8.6, 2.8 Hz, 1 H), 6.09-6.00 (m, 1 H), 1.89 (d, J = 7.5 Hz, 3 H). 8.33 (d, J = 1.6 Hz, 1 H), 8.12 (d, J = 1.6 Hz, 1 H), 5.95-5.87 (m, 1 H), 1.80 (d, J = 7.3 Hz, 3 H). LCMS (Method 3): [MH⁺] = 382 at 2.76 min. |
| Example 109 | 6-(5-fluoropyrimidin-2-yl)-8-methoxy-N-(1-(5-methyl-1,3,4-thiadiazol-2-yl)ethyl)quinazolin-4-amine 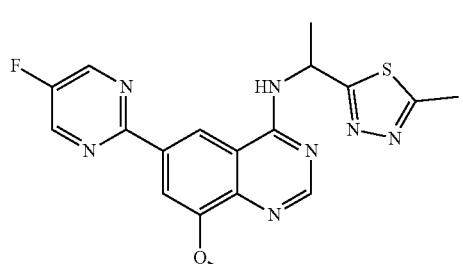 | ¹H NMR (400 MHz, CDCl₃) δ 8.76 (s, 1 H), 8.71 (s, 2 H), 8.48 (d, J = 1.1 Hz, 1 H), 8.22 (d, J = 1.4 Hz, 1 H), 6.67 (d, J = 7.2 Hz, 1 H), 6.09-6.01 (m, 1 H), 4.17 (s, 3 H), 2.76 (s, 3 H), 1.91 (d, J = 7.2 Hz, 3 H). LCMS (Method 3): [MH⁺] = 398 at 2.64 min. |
| Example 110 | 6-(5-fluoropyrimidin-2-yl)-8-methoxy-N-(1-(5-methyl-1,3,4-oxadiazol-2-yl)ethyl)quinazolin-4-amine 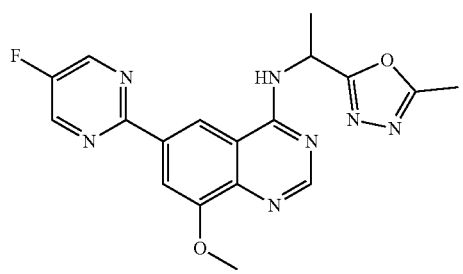 [SMILES: COc1cc(-c2ncc(F)cn2)cc2c(NC(C)c3nnc(C)o3)ncnc12] | ¹H NMR (400 MHz, CDCl₃) δ 8.69 (s, 3 H), 8.48 (d, J = 1.4 Hz, 1 H), 8.21 (d, J = 1.7 Hz, 1 H), 6.64 (s, 1 H), 6.02-5.94 (m, 1 H), 4.17 (s, 3H), 2.56 (s, 3H), 1.83 (d, J = 7.8 Hz, 3 H). LCMS (Method 4): [MH⁺] = 381 at 3.37 min. |
| Example 111 | 8-methoxy-N-[(3-methylisoxazol-5-yl)methyl]-6-(5-methylthiazol-2-yl)quinazolin-4-amine 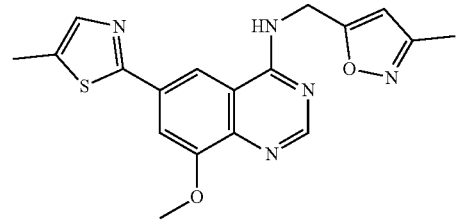 | ¹H NMR (400 MHz, DMSO): δ 9.16-9.11 (m, 1 H), 8.50-8.50 (m, 1 H), 8.32 (d, J = 1.6 Hz, 1 H), 7.75 (d, J = 1.5 Hz, 1 H), 7.69-7.67 (m, 1 H), 6.26 (s, 1 H), 4.87 (d, J = 5.5 Hz, 2 H), 4.01-4.00 (m, 3 H), 2.56 (s, 3 H), 2.19 (s, 3 H). LCMS (Method 4): [MH⁺] = 368 at 2.95 min. |

-continued

| Example No. | Chemical name Structure | Analytical data<br>¹H NMR<br>LC-MS |
|---|---|---|
| Example 112 | 8-methoxy-6-(5-methylthiazol-2-yl)-N-[[3-(trifluoromethyl)-1,2,4-oxadiazol-5-yl]methyl]quinazolin-4-amine<br>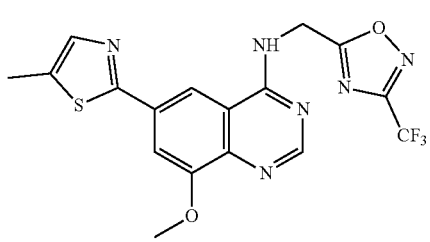 [SMILES: COc1cc(-c2ncc(C)s2)cc2c(NCc3nc(C(F)(F)F)no3)ncnc12] | ¹H NMR (400 MHz, DMSO): δ 9.50-9.45 (m, 1 H), 8.50-8.49 (m, 1 H), 8.40 (d, J = 1.5 Hz, 1 H), 7.82 (d, J = 1.5 Hz, 1 H), 7.74 (d, J = 1.3 Hz, 1 H), 5.20 (d, J = 5.3 Hz, 2 H), 4.06-4.05 (m, 3 H), 2.61 (d, J = 1.1 Hz, 3 H). LCMS (Method 4): [MH⁺] = 424 at 3.48 min. |
| Example 113 | 8-methoxy-N-[(3-methyl-1,2,4-oxadiazol-5-yl)methyl]-6-(5-methylthiazol-2-yl)quinazolin-4-amine<br>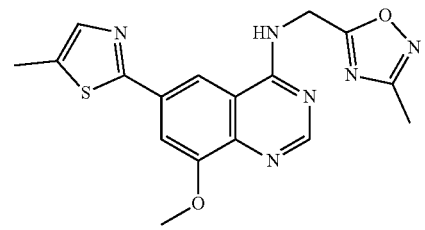 [SMILES: COc1cc(-c2ncc(C)s2)cc2c(NCc3nc(C)no3)ncnc12] | ¹H NMR (400 MHz, DMSO): δ 9.32 (t, J = 5.6 Hz, 1 H), 8.46 (s, 1 H), 8.34 (d, J = 1.6 Hz, 1 H), 7.77 (d, J = 1.6 Hz, 1 H), 7.70-7.68 (m, 1 H), 5.00 (d, J = 5.6 Hz, 2 H), 4.01 (s, 3 H), 2.56 (d, J = 1.1 Hz, 3 H), 2.32 (s, 3 H). LCMS (Method 4): [MH⁺] = 369 at 2.70 min. |
| Example 114 | 8-methoxy-N-((5-methyl-1,3,4-thiadiazol-2-yl)methyl)-6-(5-methylthiazol-2-yl)quinazolin-4-amine<br>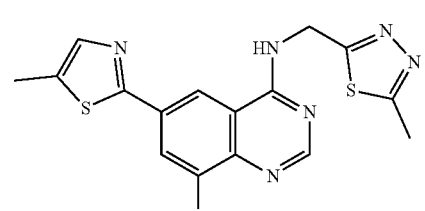 | ¹H NMR (400 MHz, DMSO): δ 9.41 (dd, J = 5.8, 5.8 Hz, 1 H), 8.55 (s, 1 H), 8.30 (d, J = 1.6 Hz, 1 H), 7.76 (d, J = 1.6 Hz, 1 H), 7.68 (d, J = 1.3 Hz, 1 H), 5.09 (d, J = 5.8 Hz, 2 H), 4.01 (s, 3 H), 2.66 (s, 3 H). LCMS (Method 3): [MH⁺] = 385 at 3.66 min. |
| Example 115 | 4-(((8-methoxy-6-(5-methylthiazol-2-yl)quinazolin-4-yl)amino)methyl)-1-methylpyridin-2(1H)-one<br>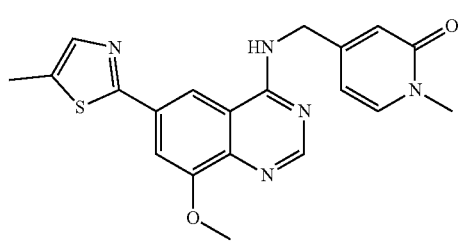 [SMILES: COc1cc(-c2ncc(C)s2)cc2c(NCc3ccn(C)c(=O)c3)ncnc12] | ¹H NMR (400 MHz, DMSO): δ 9.04 (dd, J = 5.9, 5.9 Hz, 1 H), 8.45 (s, 1 H), 8.35 (d, J = 1.5 Hz, 1 H), 7.74 (d, J = 1.5 Hz, 1 H), 7.68 (d, J = 1.3 Hz, 1 H), 7.63 (d, J = 6.9 Hz, 1 H), 6.26-6.21 (m, 2 H), 4.61 (d, J = 5.6 Hz, 2 H), 4.00 (s, 3 H), 3.38 (s, 3 H), 2.55 (d, J = 1.3 Hz, 3 H). LCMS (Method 4): [MH⁺] = 394 at 4.49 min. |

| Example No. | Chemical name Structure | Analytical data ¹H NMR LC-MS |
|---|---|---|
| Example 116 | 8-methoxy-6-(5-methylthiazol-2-yl)-N-((5-(trifluoromethyl)pyridin-2-yl)methyl)quinazolin-4-amine | ¹H NMR (400 MHz, DMSO): δ 9.27 (dd, J = 5.8, 5.8 Hz, 1 H), 8.94 (s, 1 H), 8.42-8.39 (m, 2 H), 8.15 (dd, J = 2.1, 8.3 Hz, 1 H), 7.76 (d, J = 1.5 Hz, 1 H), 7.69 (d, J = 1.3 Hz, 1H), 7.59 (d, J = 8.3 Hz, 1 H), 4.97 (d, J = 5.8 Hz, 2 H), 4.01 (s, 3 H), 2.56 (s, 3 H). LCMS (Method 4): [MH⁺] = 432 at 3.40 min. |
| Example 117 | N-((5-chloropyridin-2-yl)methyl)-8-methoxy-6-(5-methylthiazol-2-yl)quinazolin-4-amine | ¹H NMR (400 MHz, DMSO): δ 9.20 (dd, J = 5.8, 5.8 Hz, 1 H), 8.59 (d, J = 2.3 Hz, 1 H), 8.42 (s, 1 H), 8.37 (d, J = 1.6 Hz, 1 H), 7.87 (dd, J = 2.6, 8.5 Hz, 1 H), 7.75 (d, J = 1.6 Hz, 1 H), 7.68 (d, J = 1.3 Hz, 1 H), 7.41 (d, J = 8.4 Hz, 1 H), 4.87 (d, J = 5.9 Hz, 2 H), 4.00 (s, 3 H), 2.55 (s, 3 H). LCMS (Method 4): [MH+] = 398 at 3.20 min. |
| Example 118 | N-((3,5-difluoropyridin-2-yl)methyl)-8-methoxy-6-(5-methylthiazol-2-yl)quinazolin-4-amine | ¹H NMR (400 MHz, DMSO): δ 9.09 (dd, J = 5.6, 5.6 Hz, 1 H), 8.45 (d, J = 2.4 Hz, 1 H), 8.41 (s, 1 H), 8.36 (d, J = 1.5 Hz, 1 H), 7.99-7.92 (m, 1 H), 7.74 (d, J = 1.5 Hz, 1 H), 7.67 (d, J = 1.1 Hz, 1 H), 4.93 (d, J = 5.3 Hz, 2 H), 3.99 (s, 3 H), 2.55 (d, J = 1.2 Hz, 3 H). LCMS (Method 4): [MH+] = 400 at 3.11 min. |
| Example 119 | N-((5-fluoropyridin-2-yl)methyl)-8-methoxy-6-(5-methylthiazol-2-yl)quinazolin-4-amine | ¹H NMR (400 MHz, DMSO): δ 9.19 (dd, J = 5.8, 5.8 Hz, 1 H), 8.53 (d, J = 3.0 Hz, 1 H), 8.43 (s, 1 H), 8.37 (d, J = 1.6 Hz, 1 H), 7.75 (d, J = 1.5 Hz, 1 H), 7.70-7.64 (m, 2 H), 7.45 (dd, J = 4.5, 8.7 Hz, 1 H), 4.88 (d, J = 5.8 Hz, 2 H), 4.00 (s, 3 H), 2.55 (d, J = 1.1 Hz, 3 H). LCMS (Method 4): [MH+] = 382 at 2.99 min. |

| Example No. | Chemical name Structure | Analytical data $^1$H NMR LC-MS |
|---|---|---|
| Example 185 | 6-(4-fluorophenyl)-8-methoxy-N-[(1S)-1-[2-(trifluoromethyl)pyrimidin-5-yl]ethyl]quinazolin-4-amine formate | $^1$H NMR (400 MHz, DMSO): δ 8.89 (d, J = 1.6 Hz, 1 H), 8.74-8.76 (m, 1 H), 8.42 (s, 1 H), 8.26 (d, J = 2.0 Hz, 1 H), 8.13-8.15 (m, 1 H), 7.92-7.97 (m, 3 H), 7.55 (d, J = 1.6 Hz, 1 H), 7.73-7.40 (m, 2 H), 5.71 (m, 1 H, 4.01 (s, 3 H), 1.70 (d, J = 7.2 Hz, 3 H). LCMS (Method 3): [MH+] = 444 at 5.04 min. |

Example 120

Single enantiomer 1 of 8-methoxy-6-(5-methylpyrimidin-2-yl)-N-[1-[6-(trifluoromethyl)pyridazin-3-yl]ethyl]quinazolin-4-amine

Example 121

Single enantiomer 2 of 8-methoxy-6-(5-methylpyrimidin-2-yl)-N-[1-[6-(trifluoromethyl)pyridazin-3-yl]ethyl]quinazolin-4-amine

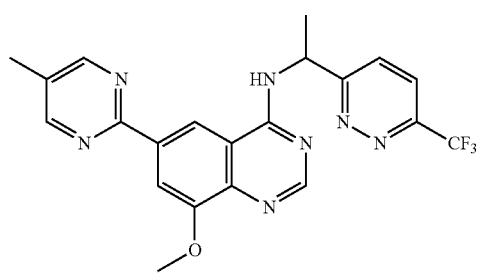 [SMILES: COc1cc(-c2ncc(C)cn2)cc2c(NC(C)c3ccc(C(F)(F)F)nn3)ncnc12]

A mixture of 6-(5-Methylpyrimidin-2-yl)-8-methoxyquinazolin-4-ol (Intermediate 27) (74 mg, 0.276 mmol), phosphorus(V) oxychloride (0.034 mL, 0.36 mmol) and DIPEA (0.24 mL, 1.38 mmol) in toluene (4 mL) was heated at 90° C. under nitrogen for 2 hours. The reaction was cooled to room temperature and concentrated in vacuo. The residue was partitioned between water and dichloromethane. The combined organic layers were washed with saturated sodium hydrogen carbonate solution, passed through a hydrophobic frit and concentrated in vacuo. The residue (88 mg, 0.275 mmol) was dissolved in chloroform (0.5 mL) and 1-(2-(trifluoromethyl)pyrimidin-5-yl)ethan-1-amine (105 mg, 0.55 mmol) was added. The reaction mixture was heated in a sealed tube under nitrogen for 18 hours at 70° C. After this time the resulting mixture was cooled to room temperature. The reaction was diluted with cold water and stirred for 10 minutes, then ethyl acetate and water were added. The two phases were separated and the aqueous phase was extracted further with ethyl acetate (2×50 mL). The combined organic phases were passed through phase separating paper and the solvent was removed in vacuo to give an off white solid (69.2 mg, 57%). The residue was purified by preparative chiral SFC to give the title compounds as an off-white solid.

Example 120

Single enantiomer 1 of 8-methoxy-6-(5-methylpyrimidin-2-yl)-N-[1-[6-(trifluoromethyl)pyridazin-3-yl]ethyl]quinazolin-4-amine: 43.8 mg, 63%

$^1$H NMR (400 MHz, DMSO): δ 9.13-9.07 (m, 2H), 8.86 (s, 2H), 8.40 (s, 1H), 8.24-8.19 (m, 2H), 8.07 (d, J=8.9 Hz, 1H), 5.93-5.88 (m, 1H), 4.02 (s, 3H), 2.39 (s, 3H), 1.80 (d, J=7.2 Hz, 3H). LCMS (Method 4): [MH+]=442 at 3.95 min. Chiral analysis (Method 36) at 0.73 min.

Example 121

Single enantiomer 2 of 8-methoxy-6-(5-methylpyrimidin-2-yl)-N-[1-[6-(trifluoromethyl)pyridazin-3-yl]ethyl]quinazolin-4-amine: 8.0 mg, 11%

$^1$H NMR (400 MHz, DMSO): δ 9.13-9.07 (m, 2H), 8.87 (s, 2H), 8.40 (s, 1H), 8.24-8.19 (m, 2H), 8.07 (d, J=8.8 Hz, 1H), 5.93-5.88 (m, 1H), 4.02 (s, 3H), 2.39 (s, 3H), 1.80 (d, J=7.2 Hz, 3H). LCMS (Method 4): [MH+]=442 at 3.95 min. Chiral analysis (Method 36) at 1.54 min.

The following compounds reported in the table below were obtained as single isomers according to the same procedure described for the preparation of 8-methoxy-6-(5-methylpyrimidin-2-yl)-N-[1-[6-(trifluoromethyl)pyridazin-3-yl]ethyl]quinazolin-4-amine:

| Example No. | Chemical name Structure | Analytical data ¹H NMR LC-MS |
|---|---|---|
| Example 122 | Single enantiomer 1 of 8-Methoxy-N-[1-(3-methyl-1,2,4-oxadiazol-5-yl)ethyl]-6-(5-methylpyrimidin-2-yl)quinazolin-4-amine | ¹H NMR (400 MHz, DMSO): δ 9.18 (d, J = 7.5 Hz, 1 H), 8.97 (d, J = 1.5 Hz, 1 H), 8.85 (s, 2 H), 8.48 (s, 1 H), 8.23 (d, J = 1.4 Hz, 1 H), 5.85-5.80 (m, 1 H), 4.03 (s, 3 H), 2.38 (s, 3 H), 2.34 (s, 3 H), 1.75 (d, J = 7.3 Hz, 3 H). LCMS (Method 3): [MH+] = 378 at 3.93 min. Chiral analysis (Method 12) at 2.72 min. |
| Example 123 | Single enantiomer 2 of 8-Methoxy-N-[1-(3-methyl-1,2,4-oxadiazol-5-yl)ethyl]-6-(5-methylpyrimidin-2-yl)quinazolin-4-amine | ¹H NMR (400 MHz, DMSO): δ 9.18 (d, J = 7.3 Hz, 1 H), 8.98 (d, J = 1.4 Hz, 1 H), 8.85 (s, 2 H), 8.48 (s, 1 H), 8.24 (d, J = 1.4 Hz, 1 H), 5.85-5.80 (m, 1 H), 4.03 (s, 3 H), 2.38 (s, 3 H), 2.33 (s, 3 H), 1.75 (d, J = 7.2 Hz, 3 H). LCMS (Method 4): [MH+] = 378 at 2.8 min. Chiral analysis (Method 12) at 3.73 min. |
| Example 124 | Single enantiomer 1 of 8-Methoxy-6-(5-methylpyrimidin-2-yl)-N-[1-(5-methyl-1,3,4-thiadiazol-2-yl)ethyl]quinazolin-4-amine | ¹H NMR (400 MHz, DMSO): δ 9.22 (d, J = 7.5 Hz, 1 H), 8.98 (d, J = 1.5 Hz, 1 H), 8.85 (s, 2 H), 8.52 (s, 1 H), 8.23 (d, J = 1.4 Hz, 1 H), 6.02-5.94 (m, 1 H), 4.02 (s, 3 H), 2.66 (s, 3 H), 2.38 (s, 3 H), 1.81 (d, J = 7.0 Hz, 3 H). LCMS (Method 3): [MH+] = 394 at 3.32 min. Chiral analysis (Method 39) at 1.56 min. |
| Example 125 | Single enantiomer 2 of 8-Methoxy-6-(5-methylpyrimidin-2-yl)-N-[1-(5-methyl-1,3,4-thiadiazol-2-yl)ethyl]quinazolin-4-amine | ¹H NMR (400 MHz, DMSO): δ 9.21 (d, J = 7.7 Hz, 1 H), 8.98 (d, J = 1.5 Hz, 1 H), 8.85 (s, 2 H), 8.52 (s, 1H), 8.23 (d, J = 1.4 Hz, 1 H), 6.00-5.95 (m, 1 H), 4.02 (s, 3 H), 2.66 (s, 3 H), 2.38 (s, 3 H), 1.81 (d, J = 7.0 Hz, 3 H). LCMS (Method 3): [MH+] = 394 at 3.32 min. Chiral analysis (Method 39) at 2.50 min. |

-continued

| Example No. | Chemical name Structure | Analytical data ¹H NMR LC-MS |
|---|---|---|
| Example 126 | Single enantiomer 1 of 8-methoxy-6-(5-methyl-2-pyridyl)-N-[1-(5-methyl-1,3,4-thiadiazol-2-yl)ethyl]quinazolin-4-amine 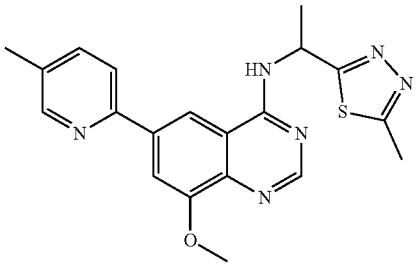 [SMILES: COc1cc(-c2ccc(C)cn2)cc2c(NC(C)c3nnc(C)s3)ncnc12] | ¹H NMR (400 MHz, DMSO): δ 8.91 (d, J = 7.6 Hz, 1 H), 8.57-8.59 (m, 2 H), 8.50 (s, 1 H), 8.13 (d, J = 8.0 Hz, 1 H), 8.04 (s, 1 H), 7.80-7.83 (m, 1 H), 5.97-6.00 (m, 1 H), 4.02 (s, 3 H), 2.69 (s, 3 H), 2.39 (s, 3 H), 1.82 (d, J = 7.2 Hz, 3 H). LCMS (Method 4): [MH+] = 393 at 2.76 min. Chiral analysis (Method 9) at 1.43 min. |
| Example 127 | Single enantiomer 2 of 8-methoxy-6-(5-methyl-2-pyridyl)-N-[1-(5-methyl-1,3,4-thiadiazol-2-yl)ethyl]quinazolin-4-amine 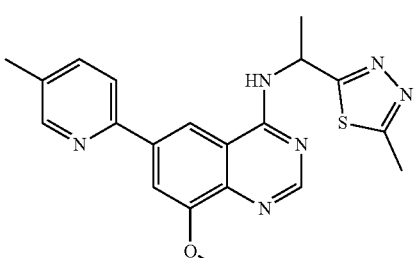 | ¹H NMR (400 MHz, DMSO): δ 8.91 (d, J = 7.6 Hz, 1 H), 8.57-8.59 (m, 2 H), 8.50 (s, 1 H), 8.12 (d, J = 8.0 Hz, 1 H), 8.04 (s, 1 H), 7.80-7.83 (m, 1 H), 5.97-6.00 (m, 1 H), 4.02 (s, 3 H), 2.68 (s, 3 H), 2.39 (s, 3 H), 1.83 (d, J = 7.2 Hz, 3 H). LCMS (Method 4): [MH+] = 393 at 2.76 min. Chiral analysis (Method 12 at 2.66 min. |
| Example 128 | Single enantiomer 1 of 8-methoxy-N-[(1R)-1-(5-methyl-1,3,4-oxadiazol-2-yl)ethyl]-6-(5-methylpyrimidin-2-yl)quinazolin-4-amine 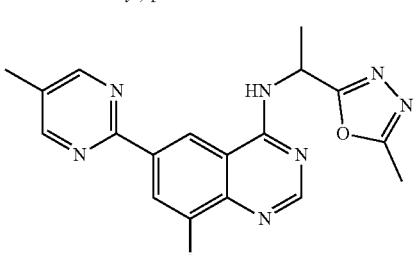 | ¹H NMR (400 MHz, DMSO): δ 9.11 (d, J = 7.7 Hz, 1 H), 8.94 (d, J = 1.4 Hz, 1 H), 8.84 (s, 2 H), 8.51 (s, 1 H), 8.23 (d, J = 1.5 Hz, 1 H), 5.90-5.86 (m, 1 H), 4.05 (s, 3 H), 2.38 (s, 3 H), 1.72 (d, J = 7.0 Hz, 3 H). LCMS (Method 4): [MH⁺] = 378 at 2.53 min. Chiral analysis (Method 13) at 1.49 min. |
| Example 129 | Single enantiomer 2 of 8-methoxy-N-[(1R)-1-(5-methyl-1,3,4-oxadiazol-2-yl)ethyl]-6-(5-methylpyrimidin-2-yl)quinazolin-4-amine 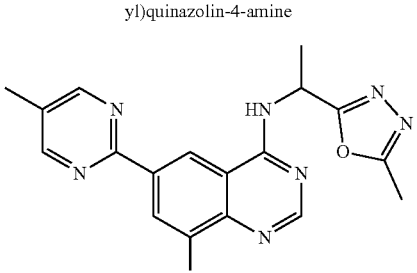 | ¹H NMR (400 MHz, DMSO): δ 9.11 (d, J = 7.7 Hz, 1 H), 8.95 (d, J = 1.4 Hz, 1 H), 8.85 (s, 2 H), 8.51 (s, 1 H), 8.23 (d, J = 1.5 Hz, 1 H), 5.91-5.86 (m, 1 H), 4.03 (s, 3 H), 2.38 (s, 3 H), 1.73 (d, J = 7.0 Hz, 3 H). LCMS (Method 4): [MH⁺] = 378 at 2.53 min. Chiral analysis (Method 13) at 1.83 min. |

Intermediate 21

Preparation of 4-Chloro-6-(5-fluoropyridin-2-yl)-8-methoxyquinazoline

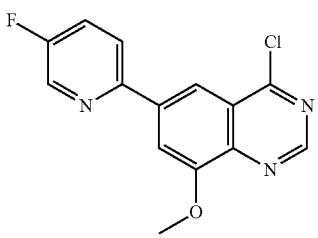 [SMILES: COc1cc(-c2ccc(F)cn2)cc2c(Cl)ncnc12]

8-Methoxy-6-(5-fluoropyridin-2-yl)quinazolin-4-ol (750 mg, 2.81 mmol) was suspended in thionyl chloride (4.1 mL, 56.12 mmol) and DMF (0.0005 mL, 0.006 mmol) was added. The reaction mixture was heated at 95° C. for 4 hours. The reaction was cooled to room temperature and the solvent was removed in vacuo to give 4-chloro-6-(5-fluoropyridin-2-yl)-8-methoxyquinazoline (800 mg, 98%). The crude residue was taken on directly to the next step without further purification.

Example 132

6-(5-Fluoropyridin-2-yl)-8-methoxy-N-((5-methyl-1,2,4-oxadiazol-3-yl)methyl)quinazolin-4-amine

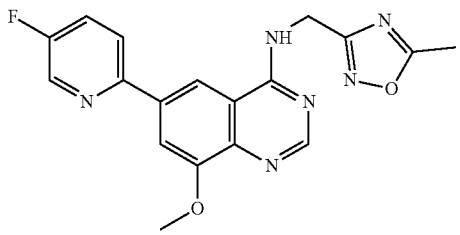 [SMILES: COc1cc(-c2ccc(F)cn2)cc2c(NCc3noc(C)n3)ncnc12]

To a suspension of 4-chloro-6-(5-fluoropyridin-2-yl)-8-methoxyquinazoline (150 mg, 0.51 mmol) in dioxane (5 ml) was added DIPEA (0.45 ml, 2.59 mmol) followed by (1,3,4-oxadiazole-2-yl)methanamine hydrochloride (105 mg, 0.77 mmol). The reaction mixture was heated at 100° C. for 20 hours and then allowed to cool to room temperature and the solvent was removed in vacuo. The residue was taken up into DCM (25 ml), stirred for 30 min, filtered through a phase separator cartridge and the solvent was removed in vacuo. The residue was purified by preparative HPLC to give the title compound (17.9 mg, 9%) as an off-white solid.
$^1$H NMR (400 MHz, DMSO): δ 9.08 (t, J=5.6 Hz, 1H), 8.59 (d, J=2.1 Hz, 1H), 8.52 (d, J=1.5 Hz, 1H), 8.49 (s, 1H), 8.10 (d, J=8.1 Hz, 1H), 8.04 (d, J=1.5 Hz, 1H), 7.82 (dd, J=1.5, 8.2 Hz, 1H), 4.99 (d, J=5.5 Hz, 2H), 4.03-4.02 (m, 3H), 2.48 (s, 3H). LCMS (Method 4): [MH+]=367 at 2.67 min.

The following compounds reported in the table below were prepared according to the same procedure described for the preparation of 6-(5-fluoropyridin-2-yl)-8-methoxy-N-((5-methyl-1,2,4-oxadiazol-3-yl)methyl)quinazolin-4-amine:

| Example No. | Chemical name Structure | Analytical data $^1$H NMR LC-MS |
|---|---|---|
| Example 133 | 6-(5-fluoropyridin-2-yl)-8-methoxy-N-((3-methyl-1,2,4-oxadiazol-5-yl)methyl)quinazolin-4-amine | $^1$H NMR (400 MHz, DMSO): δ 9.20 (t, J = 5.7 Hz, 1 H), 8.75 (d, J = 2.9 Hz, 1 H), 8.55 (d, J = 1.5 Hz, 1 H), 8.47-8.46 (m, 1 H), 8.30-8.24 (m, 1 H), 8.02-7.96 (m, 2 H), 5.02 (d, J = 5.6 Hz, 2 H), 4.04-4.03 (m, 3 H), 2.32 (s, 3 H). LCMS (Method 4): [MH+] = 367 at 2.71 min. |
| Example 134 | 6-(5-fluoropyridin-2-yl)-8-methoxy-N-((5-methyl-1,3,4-oxadiazol-2-yl)methyl)quinazolin-4-amine | $^1$H NMR (400 MHz, DMSO): δ 9.08 (t, J = 5.6 Hz, 1 H), 8.75 (d, J = 3.0 Hz, 1 H), 8.53-8.50 (m, 2 H), 8.26 (dd, J = 4.3, 8.9 Hz, 1 H), 8.01-7.95 (m, 2 H), |

| Example No. | Chemical name Structure | Analytical data ¹H NMR LC-MS |
|---|---|---|
| | (structure: 5-fluoropyridin-2-yl / quinazoline / oxadiazole) | 5.00 (d, J = 5.6 Hz, 2 H), 4.03 (s, 3 H), 2.48 (s, 3 H). LCMS (Method 4): [MH⁺] = 367 at 2.49 min. |
| Example 135 | 6-(5-fluoropyridin-2-yl)-8-methoxy-N-((3-methylisoxazol-5-yl)methyl)quinazolin-4-amine | ¹H NMR (400 MHz, DMSO): δ 9.01 (t, J = 5.8 Hz, 1 H), 8.74 (d, J = 3.0 Hz, 1 H), 8.52-8.50 (m, 2 H), 8.32-8.24 (m, 1 H), 8.01-7.95 (m, 2 H), 6.27-6.26 (m, 1 H), 4.91-4.88 (m, 2 H), 4.02 (s, 3 H), 2.19 (s, 3 H). LCMS (Method 4): [MH⁺] = 366 at 2.85 min. |
| Example 136 | 8-methoxy-N-((5-methyl-1,2,4-oxadiazol-3-yl)methyl)-6-(5-methylpyridin-2-yl)quinazolin-4-amine | ¹H NMR (400 MHz, DMSO): δ 9.01 (t, J = 5.8 Hz, 1 H), 8.56 (dd, J = 1.9, 21.5 Hz, 2 H), 8.46-8.46 (m, 1 H), 8.13-8.10 (m, 1 H), 8.03 (d, J = 1.5 Hz, 1 H), 7.82 (dd, J = 1.5, 8.2 Hz, 1 H), 4.90-4.87 (m, 2 H), 4.03-4.02 (m, 3 H), 2.58 (s, 3 H), 2.40-2.39 (m, 3 H). LCMS (Method 3): [MH⁺] = 363 at 3.36 min. |
| Example 137 | 8-methoxy-N-((3-methylisoxazol-5-yl)methyl)-6-(5-methylpyridin-2-yl)quinazolin-4-amine | ¹H NMR (400 MHz, DMSO): δ 9.00 (t, J = 5.8 Hz, 1 H), 8.58 (d, J = 2.3 Hz, 1 H), 8.52-8.49 (m, 2 H), 8.12-8.09 (m, 1 H), 8.03 (d, J = 1.4 Hz, 1 H), 7.82 (dd, J = 1.5, 8.2 Hz, 1 H), 6.26 (s, 1 H), 4.91-4.87 (m, 2 H), 4.02 (s, 3 H), 2.39 (s, 3 H), 2.20-2.19 (m, 3 H). LCMS (Method 3): [MH⁺] = 362.4 at 3.59 min. |
| Example 138 | 6-(5-fluoro-2-pyridyl)-8-methoxy-N-[(5-methylisoxazol-3-yl)methyl]quinazolin-4-amine | ¹H NMR (400 MHz, DMSO): δ 8.97-8.92 (m, 1 H), 8.74-8.73 (m, 1 H), 8.51-8.49 (m, 2 H), 8.26 (dd, J = 4.3, 8.9 Hz, 1 H), 8.00-7.94 (m, 2 H), 6.21 (d, J = 0.9 Hz, 1 H), 4.81 (d, J = 5.8 Hz, 2 H), 4.02 (s, 3 H), 2.36 (d, J = 0.8 Hz, 3 H). LCMS (Method 3): [MH⁺] = 366 at 4.12 min. |

-continued

| Example No. | Chemical name Structure | Analytical data ¹H NMR LC-MS |
|---|---|---|
| Example 139 | 8-methoxy-N-[(5-methylisoxazol-3-yl)methyl]-6-(5-methyl-2-pyridyl)quinazolin-4-amine | ¹H NMR (400 MHz, DMSO): δ 8.94 (t, J = 5.8 Hz, 1 H), 8.58 (d, J = 2.3 Hz, 1 H), 8.51-8.49 (m, 2 H), 8.10 (d, J = 8.2 Hz, 1 H), 8.03 (d, J = 1.5 Hz, 1 H), 7.81 (dd, J = 1.6, 8.2 Hz, 1 H), 6.21 (d, J = 0.9 Hz, 1 H), 4.82-4.79 (m, 2 H), 4.02 (s, 3 H), 2.39 (s, 3 H), 2.36 (d, J = 0.8 Hz, 3 H). LCMS (Method 4): [MH⁺] = 362 at 2.94 min. |
| Example 140 | 6-(5-fluoro-2-pyridyl)-8-methoxy-N-[(1-methylpyrazol-3-yl)methyl]quinazolin-4-amine | ¹H NMR (400 MHz, DMSO): δ 8.86-8.75 (m, 2 H), 8.57-8.52 (m, 2 H), 8.31 (dd, J = 4.3, 8.8 Hz, 1 H), 8.03-7.97 (m, 2 H), 7.64 (d, J = 1.8 Hz, 1 H), 6.23 (d, J = 2.0 Hz, 1 H), 4.79 (d, J = 5.6 Hz, 2 H), 4.05 (s, 3 H), 3.85 (s, 3 H). LCMS (Method 3): [MH⁺] = 365 at 3.33 min. |
| Example 141 | 8-methoxy-N-[(1-methylpyrazol-3-yl)methyl]-6-(5-methyl-2-pyridyl)quinazolin-4-amine | ¹H NMR (400 MHz, DMSO): δ 8.80 (t, J = 5.8 Hz, 1 H), 8.58-8.47 (m, 3 H), 8.13-8.10 (m, 1 H), 8.03 (d, J = 1.5 Hz, 1 H), 7.79 (dd, J = 1.6, 8.2 Hz, 1 H), 7.60 (d, J = 2.1 Hz, 1 H), 6.19 (d, J = 2.1 Hz, 1 H), 4.74 (d, J = 5.8 Hz, 2 H), 4.01 (s, 3 H), 3.81-3.81 (m, 3 H), 2.39-2.37 (m, 3 H). LCMS (Method 3): [MH+] = 361 at 3.9 min. |
| Example 142 | 8-methoxy-N-[(3-methyl-1,2,4-oxadiazol-5-yl)methyl]-6-(5-methyl-2-pyridyl)quinazolin-4-amine | ¹H NMR (400 MHz, DMSO): δ 9.19 (t, J = 5.7 Hz, 1 H), 8.60-8.58 (m, 1 H), 8.55 (d, J = 1.5 Hz, 1 H), 8.45 (s, 1 H), 8.13-8.10 (m, 1 H), 8.04 (d, J = 1.4 Hz, 1 H), 7.83 (dd, J = 1.6, 8.2 Hz, 1 H), 5.02 (d, J = 5.6 Hz, 2 H), 4.03-4.02 (m, 3 H), 2.40 (s, 3 H), 2.32 (s, 3 H). LCMS (Method 4): [MH⁺] = 363 at 2.7 min. |

-continued

| Example No. | Chemical name Structure | Analytical data ¹H NMR LC-MS |
|---|---|---|
| Example 143 | 8-methoxy-N-[(5-methyl-1,3,4-oxadiazol-2-yl)methyl]-6-(5-methyl-2-pyridyl)quinazolin-4-amine | ¹H NMR (400 MHz, DMSO): δ 9.08 (t, J = 5.6 Hz, 1 H), 8.59 (d, J = 2.1 Hz, 1 H), 8.52 (d, J = 1.5 Hz, 1 H), 8.49 (s, 1 H), 8.10 (d, J = 8.1 Hz, 1 H), 8.04 (d, J = 1.5 Hz, 1 H), 7.82 (dd, J = 1.5, 8.2 Hz, 1 H), 4.99 (d, J = 5.5 Hz, 2 H), 4.03-4.02 (m, 3 H), 2.48 (s, 3 H), 2.40-2.39 (m, 3 H). LCMS (Method 4): [MH⁺] = 363 at 2.47 min. |
| Example 144 | 8-methoxy-6-(5-methylpyrimidin-2-yl)-N-[[3-(trifluoromethyl)-1,2,4-oxadiazol-5-yl]methyl]quinazolin-4-amine | ¹H NMR (400 MHz, DMSO): δ 9.48 (t, J = 5.5 Hz, 1 H), 8.90 (d, J = 1.6 Hz, 1 H), 8.86 (d, J = 1.4 Hz, 2 H), 8.48-8.47 (m, 1 H), 8.25 (d, J = 1.4 Hz, 1 H), 5.15 (d, J = 5.4 Hz, 2 H), 4.04 (s, 3 H), 2.39-2.38 (m, 3 H). LCMS (Method 4): [MH⁺] = 418 at 3.19 min. |
| Example 145 | 8-methoxy-6-(5-methylpyrimidin-2-yl)-N-[[2-(trifluoromethyl)pyrimidin-5-yl]methyl]quinazolin-4-amine | ¹H NMR (400 MHz, DMSO): δ 9.19 (t, J = 6.2 Hz, 1 H), 9.13-9.12 (m, 2 H), 8.86-8.84 (m, 3 H), 8.51 (s, 1 H), 8.22 (d, J = 1.5 Hz, 1 H), 4.90 (d, J = 5.5 Hz, 2 H), 4.02 (s, 3 H), 2.38-2.37 (m, 3 H). LCMS (Method 4): [MH⁺] = 429 at 3.09 min. |
| Example 146 | 6-(5-fluoropyridin-2-yl)-8-methoxy-N-((2-(trifluoromethyl)pyrimidin-5-yl)methyl)quinazolin-4-amine | ¹H NMR (400 MHz, DMSO): δ 9.13 (s, 2 H), 9.05 (s, 1 H), 8.74 (d, J = 2.9 Hz, 1 H), 8.49 (s, 2 H), 8.26 (dd, J = 4.3, 8.9 Hz, 1 H), 8.01-7.95 (m, 2 H), 4.93 (s, 2 H), 4.03-4.02 (m, 3 H). LCMS (Method 3): [MH⁺] = 431 at 4.42 min. |

-continued

| Example No. | Chemical name Structure | Analytical data ¹H NMR LC-MS |
|---|---|---|
| Example 147 | 4-(((6-(5-fluoropyridin-2-yl)-8-methoxyquinazolin-4-yl)amino)methyl)-1-methylpyridin-2(1H)-one | ¹H NMR (400 MHz, DMSO): δ 8.92 (dd, J = 6.0, 6.0 Hz, 1 H), 8.74 (d, J = 3.0 Hz, 1 H), 8.54 (d, J = 1.4 Hz, 1 H), 8.46 (s, 1 H), 8.28 (dd, J = 4.3, 8.8 Hz, 1 H), 8.00-7.94 (m, 2 H), 7.63 (d, J = 6.9 Hz, 1 H), 6.27 (s, 1 H), 6.23 (dd, J = 1.9, 7.0 Hz, 1 H), 4.64 (d, J = 5.8 Hz, 2 H), 4.02 (s, 3 H), 3.39 (s, 3H). LCMS (Method 4): [MH⁺] = 392 at 2.49 min. |
| Example 148 | 4-(((6-(5-fluoropyridin-2-yl)-8-methoxyquinazolin-4-yl)amino)methyl)pyridin-2(1H)-one | ¹H NMR (400 MHz, DMSO): δ 8.92 (t, J = 6.0 Hz, 1 H), 8.74 (d, J = 3.0 Hz, 1 H), 8.54 (d, J = 1.5 Hz, 1 H), 8.46 (s, 1 H), 8.28 (dd, J = 4.3, 8.8 Hz, 1 H), 8.00-7.94 (m, 2 H), 7.63 (d, J = 6.9 Hz, 1 H), 6.28-6.22 (m, 2 H), 4.64 (d, J = 5.8 Hz, 2 H), 4.03-4.02 (m, 3 H). NH not observed. LCMS (Method 4): [MH+] = 378 at 2.47 min. |
| Example 149 | 6-(5-fluoropyridin-2-yl)-8-methoxy-N-((6-methylpyridin-3-yl)methyl)quinazolin-4-amine | ¹H NMR (400 MHz, DMSO): δ 8.93 (t, J = 5.8 Hz, 1 H), 8.73 (d, J = 3.0 Hz, 1 H), 8.52-8.47 (m, 3 H), 8.25 (dd, J = 4.1, 9.0 Hz, 1 H), 7.99-7.93 (m, 2 H), 7.69 (dd, J = 2.3, 8.0 Hz, 1 H), 7.23-7.20 (m, 1 H), 4.79 (d, J = 5.6 Hz, 2 H), 4.02-4.01 (m, 3 H), 2.44 (s, 3 H). LCMS (Method 3): [MH⁺] = 376 at 3.56 min. |
| Example 150 | 6-(5-fluoropyridin-2-yl)-8-methoxy-N-((6-(trifluoromethyl)pyridin-3-yl)methyl)quinazolin-4-amineamine | ¹H NMR (400 MHz, DMSO): δ 9.07 (t, J = 5.6 Hz, 1 H), 8.85 (d, J = 1.5 Hz, 1 H), 8.74 (d, J = 2.9 Hz, 1 H), 8.53-8.47 (m, 2 H), 8.26 (dd, J = 4.3, 8.9 Hz, 1 H), 8.08 (dd, J = 1.5, 8.2 Hz, 1 H), 8.00-7.87 (m, 3 H), 4.95-4.92 (m, 2 H), 4.03-4.02 (m, 3 H). LCMS (Method 4): [MH⁺] = 430 at 3.36 min. |

-continued

| Example No. | Chemical name Structure | Analytical data ¹H NMR LC-MS |
|---|---|---|
| Example 151 | 4-(((8-methoxy-6-(5-methylpyrimidin-2-yl)quinazolin-4-yl)amino)methyl)-1-methylpyridin-2(1H)-one | ¹H NMR (400 MHz, DMSO): δ 9.12 (dd, J = 5.6, 5.6 Hz, 1 H), 8.90 (s, 1 H), 8.84 (s, 2 H), 8.46 (s, 1 H), 8.23 (s, 1 H), 7.62 (d, J = 6.9 Hz, 1 H), 6.24 (d, J = 9.4 Hz, 2 H), 4.60 (d, J = 5.5 Hz, 2 H), 4.02 (s, 3 H), 3.38 (s, 3 H), 3.34 (s, 3 H), 2.38 (s, 3 H). LCMS (Method 3): [MH⁺] = 389 at 3.21 min. |
| Example 152 | 6-(((8-methoxy-6-(5-methylpyrimidin-2-yl)quinazolin-4-yl)amino)methyl)pyridin-2(1H)-one | ¹H NMR (400 MHz, DMSO): δ 11.68-11.68 (m, 1 H), 8.99 (dd, J = 5.1, 5.1 Hz, 1 H), 8.87 (s, 1 H), 8.85 (s, 2 H), 8.49 (s, 1 H), 8.23 (s, 1 H), 7.34 (dd, J = 7.8, 7.8 Hz, 1 H), 6.21 (d, J = 9.2 Hz, 1 H), 6.07 (s, 1 H), 4.61 (d, J = 5.5 Hz, 2 H), 4.03 (s, 3 H), 2.38 (s, 3 H). LCMS (Method 3): [MH⁺] = 375 at 3.22 min. |
| Example 153 | 8-methoxy-N-((5-methyl-1,3,4-thiadiazol-2-yl)methyl)-6-(5-methylpyrimidin-2-yl)quinazolin-4-amine | ¹H NMR (400 MHz, DMSO): δ 9.47 (dd, J = 5.8, 5.8 Hz, 1 H), 8.86-8.84 (m, 3 H), 8.56 (s, 1 H), 8.23 (d, J = 1.4 Hz, 1 H), 5.08 (d, J = 5.8 Hz, 2 H), 4.03 (s, 3 H), 2.66 (s, 3 H), 2.38 (s, 3 H). LCMS (Method 4): [MH⁺] = 380 at 2.49 min. |
| Example 154 | 8-methoxy-N-((6-methylpyridin-3-yl)methyl)-6-(5-methylpyrimidin-2-yl)quinazolin-4-amine | ¹H NMR (400 MHz, DMSO): δ 9.47 (dd, J = 5.8, 5.8 Hz, 1 H), 8.86-8.84 (m, 3 H), 8.56 (s, 1 H), 8.23 (d, J = 1.4 Hz, 1 H), 5.08 (d, J = 5.8 Hz, 2 H), 4.03 (s, 3 H), 2.66 (s, 3 H), 2.38 (s, 3 H). LCMS (Method 4): [MH⁺] = 373 at 1.99 min. |

| Example No. | Chemical name Structure | Analytical data ¹H NMR LC-MS |
|---|---|---|
| Example 155 | 6-(5-fluoropyridin-2-yl)-8-methoxy-N-((6-(trifluoromethyl)pyridin-3-yl)methyl)quinazolin-4-amineamine | ¹H NMR (400 MHz, DMSO): δ 9.24 (dd, J = 5.8, 5.8 Hz, 1 H), 8.88 (d, J = 1.5 Hz, 1 H), 8.84 (s, 3 H), 8.48 (s, 1 H), 8.22 (d, J = 1.5 Hz, 1 H), 8.07 (dd, J = 1.5, 8.0 Hz, 1 H), 7.87 (d, J = 8.2 Hz, 1 H), 4.90 (d, J = 5.6 Hz, 2 H), 4.02 (s, 3 H), 2.37 (s, 3 H). LCMS (Method 4): [MH⁺] = 427 at 3.19 min. |

Example 160

2-((8-methoxy-6-(5-methylpyrimidin-2-yl)quinazolin-4-yl)amino)-1-morpholinoethan-1-one

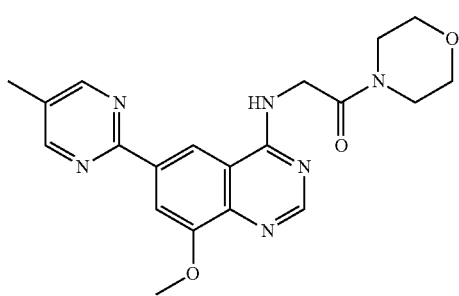 [SMILES: COc1cc(-c2ncc(C)cn2)cc2c(NCC(=O)N3CCOCC3)ncnc12]

Step 1: Preparation of Methyl (8-methoxy-6-(5-methylpyrimidin-2-yl)quinazolin-4-yl)glycinate

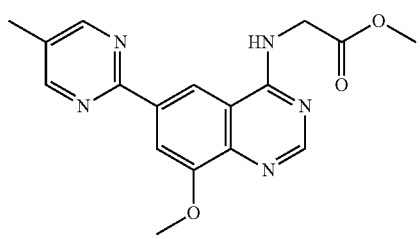

To a suspension of crude 4-chloro-8-methoxy-6-(5-methylpyrimidin-2-yl)quinazoline (500 mg, 1.86 mmol) in dioxane (5 mL) was added DIPEA (1.6 mL, 9.32 mmol) and glycine methyl ester (382 mg, 4.29 mmol). The mixture was heated to 95° C. for 18 h. The reaction mixture was cooled to room temperature and concentrated in vacuo. The resulting residue was purified by flash column chromatography on silica gel eluting with 20% ethyl acetate in methanol to give the title compound (552 mg, 87%) as a pale yellow solid.

LCMS (Method 3): [MH+]=340 at 2.47 min

Step 2: Preparation of Methyl N-(tert-butoxycarbonyl)-N-(8-methoxy-6-(5-methylpyrimidin-2-yl)quinazolin-4-yl)glycinate

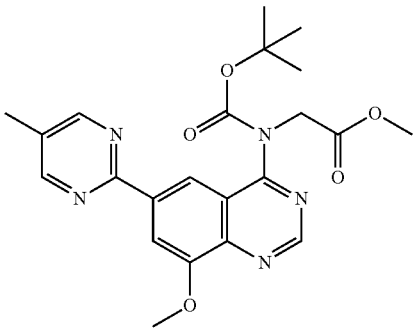

To a solution of methyl-(8-methoxy-6-(5-methylpyrimidin-2-yl)quinazolin-4-yl)glycinate (550 mg, 1.62 mmol) in dichloromethane (25 mL) was added DMAP (20 mg, 0.16 mmol), triethylamine (0.56 mL, 4.05 mmol) and di-tert-butyl dicarbonate (707 mg, 3.24 mmol). The mixture was stirred at room temperature for 3 h. After this time, the mixture was concentrated in vacuo and the residue was purified by column chromatography on silica gel eluting with 10% methanol/ethyl acetate to give the title compound (689 mg, 96%) as a yellow solid.

LCMS (Method 3): [MH+]=440 at 4.71 min.

Step 3: Preparation of N-(tert-butoxycarbonyl)-N-(8-methoxy-6-(5-methylpyrimidin-2-yl)quinazolin-4-yl)glycine

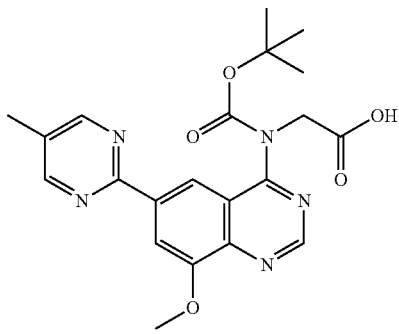 [SMILES: COc1cc(-c2ncc(C)cn2)cc2c(N(CC(=O)O)C(=O)OC(C)(C)C)ncnc12]

To a suspension of methyl N-(tert-butoxycarbonyl)-N-(8-methoxy-6-(5-methylpyrimidin-2-yl)quinazolin-4-yl)glycinate (680 mg, 1.55 mmol) in a mixture of THF (20 mL) and methanol (20 mL) was added a 1 M aqueous solution of lithium hydroxide (3.9 mL, 2.5 mmol). The mixture was stirred at room temperature for 5 h. After this time, the reaction mixture was diluted with water (20 mL). The mixture was then acidified to pH 7 using 1 M aqueous hydrochloric acid solution. The aqueous mixture was concentrated in vacuo and the residue was purified using reverse phase chromatography, eluting with 0-100% ACN/water (NH4HCO3 modifier) to give the title compound as an off-white solid (498 mg, 75%).

LCMS (Method 4): [MH+]=426 at 3.98 min.

Step 4: Preparation of tert-butyl (8-methoxy-6-(5-methylpyrimidin-2-yl)quinazolin-4-yl)(2-morpholino-2-oxoethyl)carbamate

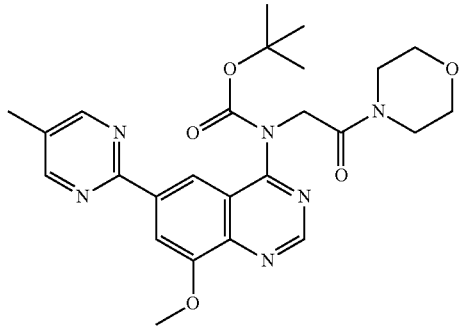 [SMILES: COc1cc(-c2ncc(C)cn2)cc2c(N(CC(=O)N3CCOCC3)C(=O)OC(C)(C)C)ncnc12]

To a solution of N-(tert-butoxycarbonyl)-N-(8-methoxy-6-(5-methylpyrimidin-2-yl)quinazolin-4-yl)glycine (50 mg, 0.12 mmol) in DMF (2 mL) was added triethylamine (0.033 mL, 0.24 mmol), HATU (58 mg, 0.15 mmol) and morpholine (0.015 mL, 0.18 mmol). The mixture was then stirred at room temperature for 18 hours. After this time, the mixture was concentrated in vacuo and the residue purified using reverse phase chromatography, eluting with 0-100% ACN/water (NH4HCO3 modifier) to give the title compound as an off-white solid (38 mg, 65%).

LCMS (Method 4): [MH+]=495 at 3.97 min.

Step 5: Preparation of 2-((8-methoxy-6-(5-methylpyrimidin-2-yl)quinazolin-4-yl)amino)-1-morpholinoethan-1-one

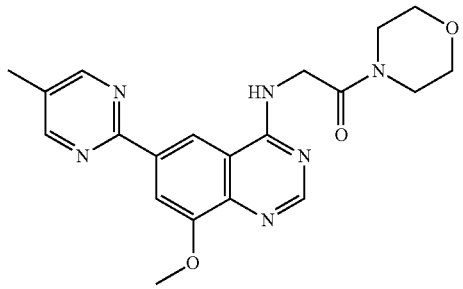 [SMILES: COc1cc(-c2ncc(C)cn2)cc2c(NCC(=O)N3CCOCC3)ncnc12]

To a solution of tert-butyl (8-methoxy-6-(5-methylpyrimidin-2-yl)quinazolin-4-yl)(2-morpholino-2-oxoethyl) carbamate (28 mg, 0.057 mmol) in dioxane (2 mL) was added a 4 M solution of hydrogen chloride in dioxane (2 mL). The mixture was subsequently stirred at room temperature for 2 h. After this time the mixture was concentrated in vacuo. The residue was purified using preparative reverse phase HPLC to give the title compound as a colourless solid (13 mg, 58%).

¹H NMR (400 MHz, DMSO): δ 8.85 (s, 3H), 8.69 (dd, J=5.6, 5.6 Hz, 1H), 8.46 (s, 1H), 8.21 (d, J=1.4 Hz, 1H), 4.41 (d, J=5.6 Hz, 2H), 4.02 (s, 3H), 3.69-3.64 (m, 2H), 3.63-3.57 (m, 4H), 3.49 (dd, J=4.6, 4.6 Hz, 2H), 2.38 (s, 3H). LCMS (Method 4): [MH+]=395 at 2.33 min.

Example 156

8-Methoxy-N-((3-methyl-1,2,4-oxadiazol-5-yl)methyl)-6-(5-methylpyrimidin-2-yl)quinazolin-4-amine

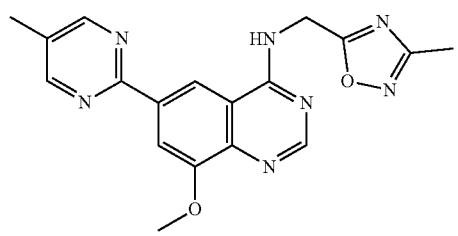

To a solution of N-(tert-butoxycarbonyl)-N-(8-methoxy-6-(5-methylpyrimidin-2-yl)quinazolin-4-yl) glycine (100 mg, 0.24 mmol) in DMF (3 mL) was added 1-ethyl-3-(3-dimethylaminopropyl)carbodiimide (59 mg, 0.31 mmol) and the mixture was stirred at room temperature for 10 minutes. N-hydroxyacetimidamide (26 mg, 0.35 mmol) was added and the mixture was heated to 120° C. for 45 minutes. After this time, the mixture was concentrated in vacuo. The resulting residue was solubilised in 1,4-dioxane (2 mL) and treated with 4 M HCl in 1,4-dioxane (5 mL). The resulting mixture was stirred at room temperature for an additional 1 hour and then concentrated in vacuo. The residue was purified by preparative HPLC to give the title compound (18.5 mg, 12% over two steps) as a light brown solid.

¹H NMR (400 MHz, DMSO): δ 9.36 (t, J=5.6 Hz, 1H), 8.90-8.85 (m, 3H), 8.48-8.47 (m, 1H), 8.24 (d, J=1.4 Hz, 1H), 4.98 (d, J=5.6 Hz, 2H), 4.04-4.03 (m, 3H), 2.38 (s, 3H), 2.31 (s, 3H). LCMS (Method 4): [MH+]=364 at 2.63 min.

Example 157

6-(3-fluoro-5-methyl-2-pyridyl)-8-methoxy-N-[(1R)-1-(5-methyl-1,2,4-oxadiazol-3-yl)ethyl]quinazolin-4-amine

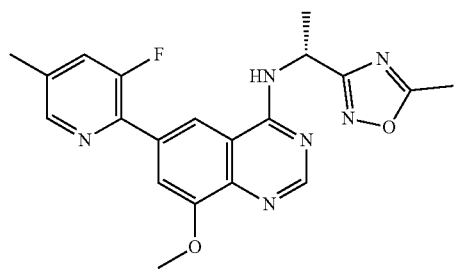

A solution of 6-(3-fluoro-5-methylpyridin-2-yl)-8-methoxy-4-((2-(trimethylsilyl)ethoxy)methoxy)quinazoline (700 mg, 1.68 mmol) in DCM (20 mL) was treated with trifluoroacetic acid (2.6 mL) and the reaction mixture was stirred at room temperature for 19 hours. The solvents were removed under reduced pressure and the residue was quenched with a saturated solution of NaHCO$_3$ and water. The resulting solid was filtered and dried in vacuo to give 6-(3-fluoro-5-methylpyridin-2-yl)-8-methoxyquinazolin-4-ol (470 mg) as an off-white solid. A partial amount of the residue (100 mg, 0.35 mmol) was suspended in thionyl chloride (0.51 mL, 7.01 mmol) and DMF (0.005 mL). The reaction mixture was heated at 90° C. for 3 hours and cooled to room temperature. The solvent was removed in vacuo. The residue was dissolved in DCM and washed with saturated NaHCO$_3$ solution, water then dried, and the solvent removed in vacuo. The residue was then suspended in dioxane (2.0 mL) and DIPEA (0.30 mL, 1.75 mmol) and [(R)-1-(5-methyl-1,2,4-oxadiazol-3-yl)ethan-1-amine hydrochloride (79 mg, 0.525 mmol) were added. The reaction mixture was heated at 55° C. for 4 days and then cooled to room temperature. The reaction mixture was partitioned between ethyl acetate and water. The two phases were separated, and the aqueous phase was extracted with ethyl acetate. The combined organic phases were concentrated in vacuo and the residue was purified by preparative HPLC to give the title compound (38.1 mg, 27%) as a white solid.

$^1$H NMR (400 MHz, DMSO): δ 8.80 (d, J=7.5 Hz, 1H), 8.48 (d, J=3.4 Hz, 2H), 8.43 (s, 1H), 7.79 (qd, J=2.5, 7.0 Hz, 1H), 7.70 (s, 1H), 5.77-5.73 (m, 1H), 3.98 (s, 3 H), 2.57 (s, 3H), 2.44 (s, 3H), 1.66 (d, J=7.2 Hz, 3H); LCMS (Method 4): [MH+]=395 at 3.03 min. Chiral analysis (Method 35) at 1.75 min.

Example 158

6-(5-fluoro-2-pyridyl)-8-methoxy-N-[(1R)-1-(1-methylpyrazol-3-yl)ethyl]quinazolin-4-amine

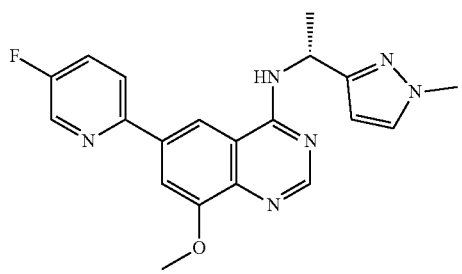 [SMILES: COc1cc(-c2ccc(F)cn2)cc2c(N[C@H](C)c3ccn(C)n3)ncnc12]

Step 1: Preparation of (R)-2-methyl-N-((1-methyl-1H-pyrazol-3-yl)methylene)propane-2-sulfinamide

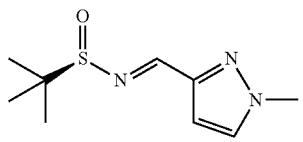

To a solution of 1-methyl-1H-pyrazole-3-carbaldehyde (500 mg, 4.54 mmol) in DCM (5.0 mL) were added copper sulfate (1667 mg, 10.4 mmol) and (R)-(+)-2-methyl-2-propanesulfinamide (605 mg, 4.99 mmol). The reaction mixture was stirred at room temperature for 72 hours under nitrogen. The reaction was filtered through a pad of Celite© and the solid was washed with DCM. The filtrate was concentrated under reduced pressure, dissolved in acetonitrile and filtered. The filtrate was concentrated under reduced pressure and purified by flash column chromatography on silica gel eluting with 0-50% ethyl acetate in cyclohexane to give the title compound (955 mg, 99%) as a white solid.

$^1$H NMR (400 MHz, CDCl$_3$): δ 8.63 (s, 1H), 7.40 (d, J=2.3 Hz, 1H), 6.77 (d, J=2.5 Hz, 1H), 3.99 (s, 3H), 1.25-1.25 (m, 9H).

Step 2: Preparation of (R)-2-Methyl-N—((R)-1-(1-methyl-1H-pyrazol-3-yl)ethyl)propane-2-sulfinamide

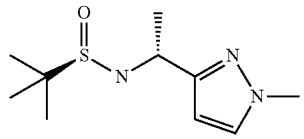

A solution of (R)-2-methyl-N-((1-methyl-1H-pyrazol-3-yl)methylene)propane-2-sulfinamide (500 mg, 2.34 mmol) in DCM (10.0 mL) was cooled to −60° C. Methylmagnesium bromide in diethyl ether (3.0M, 1.0 mL, 2.93 mmol) was slowly added. The reaction mixture was stirred at −60° C. for 1 hour and then slowly warmed to room temperature. The reaction mixture was then cooled at −60° C. and another aliquot of methylmagnesium bromide in diethyl ether (3.0M, 0.5 mL, 1.47 mmol) was slowly added. The reaction mixture was warmed to room temperature overnight. The reaction was quenched with a saturated aqueous NH$_4$Cl solution and the two phases were separated. The aqueous phase was extracted with DCM (2×50 mL) and the combined organic phases were passed through a phase separator filter paper. The solvent was removed in vacuo. The residue was purified by flash column chromatography on silica gel eluting with 0-10% methanol in DCM to give the title compound (206 mg, 38%) as a colourless oil.

LCMS (Method 3): [MH+]=230 at 3.41 min.

Step 3: Preparation of (R)-1-(1-Methyl-1H-pyrazol-3-yl)ethan-1-amine Hydrochloride

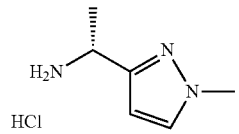

To a solution of (R)-2-methyl-N—((R)-1-(1-methyl-1H-pyrazol-3-yl)ethyl)propane-2-sulfinamide (206 mg, 0.90 mmol) in dioxane (2.2 mL) was added a solution of hydrogen chloride in dioxane (4.0M, 2.2 mL, 8.98 mmol). The reaction mixture was stirred at room temperature for 18 hours. The solvent was removed in vacuo. The residue was triturated with ethyl acetate to give the title compound (160 mg, quantitative) as a white solid.

LCMS (Method 3): [MH+]=126 at 1.88 min.

Step 4: Preparation of 6-(5-fluoro-2-pyridyl)-8-methoxy-N-[(1R)-1-(1-methylpyrazol-3-yl)ethyl]quinazolin-4-amine

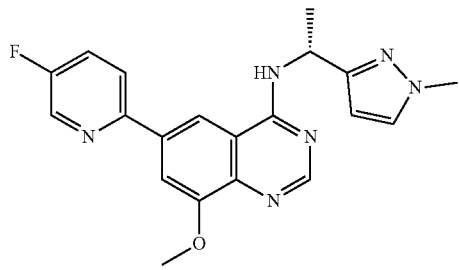 [SMILES: COc1cc(-c2ccc(F)cn2)cc2c(N[C@H](C)c3ccn(C)n3)ncnc12]

To a suspension of 4-chloro-6-(5-fluoropyridin-2-yl)-8-methoxyquinazoline (106 mg, 0.37 mmol) in dioxane (3.0 mL) was added DIPEA (0.32 mL, 1.84 mmol) followed by (R)-1-(1-Methyl-1H-pyrazol-3-yl)ethan-1-amine hydrochloride (89 mg, 0.55 mmol). The reaction mixture was heated at 95° C. for 20 hours and then allowed to cool to room temperature. The reaction was partitioned between DCM and water and the two phases were separated. The aqueous phase was washed with DCM (2×50 mL) and then the water was removed in vacuo. The residue was purified by preparative HPLC to give the title compound (5.25 mg, 4%) as an off-white solid.

$^1$H NMR (400 MHz, DMSO): δ 8.72 (d, J=3.0 Hz, 1H), 8.56 (d, J=1.6 Hz, 1H), 8.51 (d, J=8.3 Hz, 1H), 8.46 (s, 1H), 8.31 (dd, J=4.3, 9.2 Hz, 1H), 7.99 (d, J=1.5 Hz, 1H), 7.98-7.92 (m, 1H), 7.60 (d, J=2.1 Hz, 1H), 6.20 (d, J=2.1 Hz, 1H), 5.79-5.71 (m, 1H), 4.00 (s, 3H), 3.81-3.81 (m, 3H), 1.62 (d, J=6.9 Hz, 3H). LCMS (Method 4): [MH+]=379 at 3.00 min. Chiral analysis (Method 29) at 2.4 min.

The following compound reported in the table below was prepared according to the same procedure described for the preparation of 6-(5-fluoro-2-pyridyl)-8-methoxy-N-[(1R)-1-(1-methylpyrazol-3-yl)ethyl]quinazolin-4-amine:

Example 161

6-(4-Fluorophenyl)-N-[(5-fluoro-2-pyridyl)methyl]-8-methoxy-quinazolin-4-amine

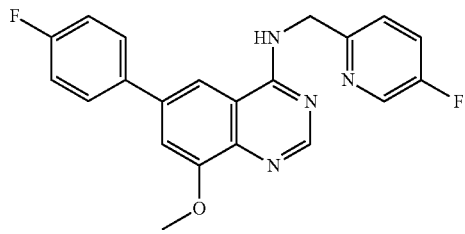 [SMILES: COc1cc(-c2ccc(F)cc2)cc2c(NCc3ccc(F)cn3)ncnc12]

Step 1: Preparation of 6-(4-fluorophenyl)-8-methoxyquinazolin-4-amine Hydrochloride

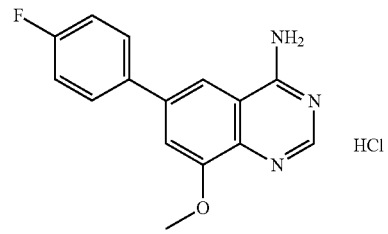 [SMILES: COc1cc(-c2ccc(F)cc2)cc2c(N)ncnc12 ; Cl]

A solution of 4-chloro-6-(4-fluorophenyl)-8-methoxyquinazoline (100 mg, 0.346 mmol) in 7M solution of ammonia in methanol (5 mL, 35.0 mmol) was stirred at room temperature for 18 hours in a sealed tube. The reaction was concentrated to dryness to give the title compound (105 mg, quantitative yield) as a beige solid, which was taken on to the next step without further purification.

| Example No. | Chemical name Structure | Analytical data $^1$H NMR LC-MS |
|---|---|---|
| Example 159 | 8-methoxy-N-[(1R)-1-(1-methylpyrazol-3-yl)ethyl]-6-(5-methyl-2-pyridyl)quinazolin-4-amine | $^1$H NMR (400 MHz, DMSO): δ 8.58-8.55 (m, 2 H), 8.51 (d, J = 8.2 Hz, 1 H), 8.45 (s, 1 H), 8.16 (d, J = 8.4 Hz, 1 H), 8.03 (d, J = 1.5 Hz, 1 H), 7.79 (dd, J = 1.6, 8.2 Hz, 1 H), 7.60-7.59 (m, 1 H), 6.20 (d, J = 2.1 Hz, 1 H), 5.80-5.72 (m, 1 H), 4.00 (s, 3 H), 3.81-3.81 (m, 3 H), 2.39-2.38 (m, 3 H), 1.62 (d, J = 6.9 Hz, 3 H). LCMS (Method 4): [MH⁺] = 375 at 2.84 min. Chiral analysis (Method 29) at 3.1 min. |

Step 2: Preparation of 6-(4-Fluorophenyl)-N-[(5-fluoro-2-pyridyl)methyl]-8-methoxy-quinazolin-4-amine

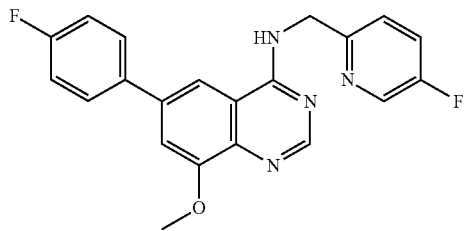 [SMILES: COc1cc(-c2ccc(F)cc2)cc2c(NCc3ccc(F)cn3)ncnc12]

A microwave tube was charged with 6-(4-fluorophenyl)-8-methoxyquinazolin-4-amine hydrochloride (40 mg, 0.132 mmol), 5-fluoropicolinaldehyde (19.0 mg, 0.149 mmol), ethanol (1 mL), acetic acid (0.05 mL) and sodium triacetoxyborohydride (47 mg, 0.223 mmol). The resulting mixture was heated under microwave irradiations for 30 minutes at 170° C. After return to room temperature, the reaction was concentrated in vacuo. The residue was purified by preparative HPLC to give the title compound (1.5 mg, 3%) as an off-white solid.

$^1$H NMR (400 MHz, DMSO): δ 9.04-9.01 (m, 1H), 8.57 (d, J=3.2 Hz, 1H), 8.45 (s, 1H), 8.22 (d, J=1.6 hz, 1H), 8.01-7.95 (m, 2H), 7.72-7.68 (m, 1H), 7.58 (d, J=1.6 Hz, 1H), 7.49-7.47 (m, 1H), 7.45-7.39 (m, 2H), 4.92 (d, J=5.6 Hz, 2H), 4.06 (s, 3H).

LCMS (Method 3): [MH+]=379 at 4.5 min.

Example 188

6-(3,6-Dihydro-2H-pyran-4-yl)-8-methoxy-N-((6-methylpyridazin-3-yl)methyl)quinazolin-4-amine

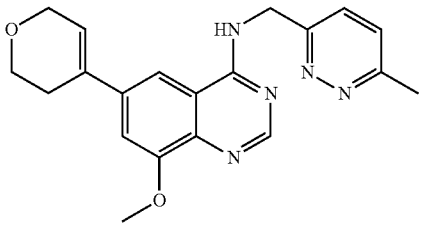 [SMILES: COc1cc(C2=CCOCC2)cc2c(NCc3ccc(C)nn3)ncnc12]

To a mixture of 6-Bromo-8-methoxy-N-((6-methylpyridazin-3-yl)methyl)quinazolin-4-amine (intermediate 9) (150 mg, 0.41 mmol), 3,6-dihydro-2H-pyran-4-boronic acid pinacol ester (175 mg, 0.834 mmol) and bis(triphenylphosphine)palladium(II) dichloride (15 mg, 0.02 mmol) in 1,2-dimethoxyethane (5 mL), was added caesium carbonate (271 mg, 0.83 mmol) in water (0.5 mL). The reaction mixture was stirred under a nitrogen atmosphere at 100° C. for 16 hours. After this time the reaction mixture was filtered through a Celite® pad and rinsed with ethyl acetate (10 mL). The solvent was removed in vacuo and the resulting residue was purified by preparative HPLC to give the title compound (38 mg, 220) as a colourless solid.

$^1$H NMR (400 MHz, DMSO): δ 8.96 (dd, J=5.8, 5.8 Hz, 1H), 8.38 (s, 1H), 7.86 (d, J=1.3 Hz, 1H), 7.55-7.48 (i, 2H), 7.39 (d, J=1.4 Hz, 1H), 6.51 (s, 1H), 5.01 (d, J=5.9 Hz, 2H), 4.32-4.30 (N, 2H), 3.96 (s, 3H), 3.90 (dd, J=5.5, 5.5 Hz, 2H), 2.65-2.59 (m, 5H). LCMS (Method 3): [MH+]=364 at 3.27 min.

The following compounds reported in the table below were obtained as single isomers by chiral preparative SFC purification of the appropriate racemic mixture hereinabove described.

| Example No. | Chemical Name Structure | Analytical data $^1$H NMR LC-MS |
|---|---|---|
| Example 162 | Single enantiomer 1 of 8-Methoxy-N-[1-(3-methyl-1,2,4-oxadiazol-5-yl)ethyl]-6-(5-methyl-2-pyridyl)quinazolin-4-amine<br>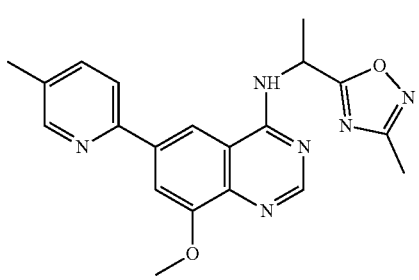 [SMILES: COc1cc(-c2ccc(C)cn2)cc2c(NC(C)c3nc(C)no3)ncnc12] | $^1$H NMR (400 MHz, DMSO): δ 8.89 (d, J = 7.3 Hz, 1 H), 8.60-8.58 (m, 2 H), 8.46-8.45 (m, 1 H), 8.14 (d, J = 8.2 Hz, 1 H), 8.05 (d, J = 1.5 Hz, 1 H), 7.82 (dd, J = 1.6, 8.2 Hz, 1 H), 5.87-5.78 (m, 1 H), 4.03 (s, 3 H), 2.40 (s, 3 H), 2.33 (s, 3 H), 1.76 (d, J = 7.1 Hz, 3 H). LCMS (Method 3): [MH+] = 377 at 4.17 min. Chiral analysis (Method 28) at 2.01 min. |

-continued

| Example No. | Chemical Name Structure | Analytical data ¹H NMR LC-MS |
|---|---|---|
| Example 163 | Single enantiomer 2 of 8-Methoxy-N-[1-(3-methyl-1,2,4-oxadiazol-5-yl)ethyl]-6-(5-methyl-2-pyridyl)quinazolin-4-amine | ¹H NMR (400 MHz, DMSO): δ 8.89 (d, J = 7.3 Hz, 1 H), 8.60-8.58 (m, 2 H), 8.46 (s, 1 H), 8.14 (d, J = 8.1 Hz, 1 H), 8.05 (d, J = 1.4 Hz, 1 H), 7.82 (dd, J = 1.5, 8.2 Hz, 1 H), 5.87-5.78 (m, 1 H), 4.03 (s, 3 H), 2.40 (s, 3 H), 2.33 (s, 3 H), 1.76 (d, J = 7.2 Hz, 3 H). LCMS (Method 3): [MH+] = 377 at 4.2 min. Chiral analysis (Method 28) at 2.83 min. |
| Example 164 | Single enantiomer 1 of 8-methoxy-N-(1-(5-methyl-1,3,4-thiadiazol-2-yl)ethyl)-6-(5-methylthiazol-2-yl)quinazolin-4-amine | ¹H NMR (400 MHz, DMSO): δ 9.04 (s, 1 H), 8.51 (s, 1 H), 8.41-8.39 (m, 1 H), 7.75 (d, J = 1.3 Hz, 1 H), 7.69-7.68 (m, 1 H), 5.99-5.94 (m, 1 H), 4.01-4.00 (m, 3 H), 2.66 (s, 3 H), 2.57-2.55 (m, 3 H), 1.83-1.79 (m, 3 H). LCMS (Method 4): [MH+] = 399 at 2.80 min. Chiral analysis (Method 20) at 1.10 min. |
| Example 165 | Single enantiomer 2 of 8-methoxy-N-(1-(5-methyl-1,3,4-thiadiazol-2-yl)ethyl)-6-(5-methylthiazol-2-yl)quinazolin-4-amine | ¹H NMR (400 MHz, DMSO): δ 9.05 (d, J = 7.5 Hz, 1 H), 8.52-8.51 (m, 1 H), 8.41 (d, J = 1.6 Hz, 1 H), 7.75 (d, J = 1.4 Hz, 1 H), 7.69 (d, J = 1.3 Hz, 1 H), 6.01-5.93 (m, 1 H), 4.02-4.00 (m, 3 H), 2.66 (s, 3 H), 2.57-2.55 (m, 3 H), 1.81 (d, J = 7.0 Hz, 3 H). LCMS (Method 4): [MH+] = 399 at 2.80 min. Chiral analysis (Method 20) at 3.16 min. |

| Example No. | Chemical Name Structure | Analytical data ¹H NMR LC-MS |
|---|---|---|
| Example 166 | Single enantiomer 2 of 2-((8-methoxy-6-(5-methylpyrimidin-2-yl)quinazolin-4-yl)amino)-2-(3-methyl-1,3,4-oxadiazol-5-yl)ethan-1-ol | ¹H NMR (400 MHz, DMSO): δ 9.02-8.97 (m, 2 H), 8.86 (s, 2 H), 8.48 (s, 1 H), 8.24 (d, J = 1.1 Hz, 1 H), 5.75 (q, J = 6.6 Hz, 1 H), 5.40 (dd, J = 6.1, 6.1 Hz, 1 H), 4.13-4.06 (m, 2 H), 4.03 (s, 3 H), 2.38 (s, 3 H), 2.33 (s, 3 H). LCMS (Method 4): [MH+] = 394 at 2.61 min. Chiral analysis (Method 28) at 4.13 min. |
| Example 167 | Single enantiomer 1 of 8-methoxy-6-(5-methylpyrimidin-2-yl)-N-(1-(3-(pyridin-4-yl)-1,2,4-oxadiazol-5-yl)ethyl)quinazolin-4-amine | ¹H NMR (400 MHz, DMSO): δ 9.28 (d, J = 7.2 Hz, 1 H), 8.99 (d, J = 1.4 Hz, 1 H), 8.85 (s, 2 H), 8.81-8.79 (m, 2 H), 8.49 (s, 1 H), 8.25 (d, J = 1.4 Hz, 1 H), 7.95-7.93 (m, 2 H), 5.97-5.92 (m, 1 H), 4.03 (s, 3 H), 2.38 (s, 3 H), 1.85 (d, J = 7.2 Hz, 3 H). LCMS (Method 4): [MH⁺] = 441 at 2.78 min. Chiral analysis (Method 13) at 2.23 min. |
| Example 168 | Single enantiomer 2 of 8-methoxy-6-(5-methylpyrimidin-2-yl)-N-(1-(3-(pyridin-4-yl)-1,2,4-oxadiazol-5-yl)ethyl)quinazolin-4-amine | ¹H NMR (400 MHz, DMSO): δ 9.28 (d, J = 7.2 Hz, 1 H), 8.99 (d, J = 1.4 Hz, 1 H), 8.85 (s, 2 H), 8.81-8.79 (m, 2 H), 8.49 (s, 1 H), 8.25 (d, J = 1.4 Hz, 1 H), 7.95-7.93 (m, 2 H), 5.97-5.92 (m, 1 H), 4.03 (s, 3 H), 2.38 (s, 3 H), 1.85 (d, J = 7.2 Hz, 3 H). LCMS (Method 4): [MH⁺] = 441 at 2.81 min. Chiral analysis (Method 13) at 2.84 min. |

| Example No. | Chemical Name Structure | Analytical data ¹H NMR LC-MS |
|---|---|---|
| Example 190 | Single enantiomer 1 of 6-(1-((6-(4-Fluorophenyl)-8-methoxyquinazolin-4-yl)amino)ethyl)pyridin-2(1H)-one | ¹H NMR (400 MHz, DMSO): δ 11.73-11.72 (m, 1 H), 8.47 (s, 1 H), 8.27 (d, J = 1.5 Hz, 1 H), 8.00 (ddd, J = 3.2, 5.4, 12.1 Hz, 2 H), 7.58 (d, J = 1.5 Hz, 1 H), 7.48-7.36 (m, 3 H), 6.22 (d, J = 8.8 Hz, 2 H), 5.40 (dd, J = 6.8, 6.8 Hz, 1 H), 4.07 (s, 3 H), 1.65 (d, J = 7.1 Hz, 3 H). LCMS (Method 4): [MH+] = 391 at 2.95 min. Chiral analysis (Method 34) at 2.99 min. |
| Example 191 | Single enantiomer 2 of 6-(1-((6-(4-Fluorophenyl)-8-methoxyquinazolin-4-yl)amino)ethyl)pyridin-2(1H)-one | ¹H NMR (400 MHz, DMSO): δ 11.73-77.72 (m, 1 H), 8.47 (s, 1 H), 8.27 (d, J = 1.5 Hz, 1 H), 8.00 (ddd, J = 3.2, 5.4, 12.1 Hz, 2 H), 7.58 (d, J = 1.5 Hz, 1 H), 7.48-7.36 (m, 3 H), 6.22 (d, J = 8.8 Hz, 2 H), 5.40 (dd, J = 6.8, 6.8 Hz, 1 H), 4.07 (s, 3 H), 1.65 (d, J = 7.1 Hz, 3 H). LCMS (Method 4): [MH⁺] = 391 at 2.94 min. Chiral analysis (Method 34) at 4.43 min. |
| Example 192 | Single enantiomer 1 of 6-(4-fluorophenyl)-8-methoxy-N-(1-(3-(pyridin-4-yl)-1,2,4-oxadiazol-5-yl)ethyl)quinazolin-4-amine | ¹H NMR (400 MHz, DMSO): δ 8.91 (d, J = 7.0 Hz, 1 H), 8.81-8.79 (m, 2 H), 8.45 (s, 1 H), 8.23 (d, J = 1.8 Hz, 1 H), 7.98-7.92 (m, 4 H), 7.58 (d, J = 1.6 Hz, 1 H), 7.40 (dd, J = 8.9, 8.9 Hz, 2 H), 5.94-5.89 (m, 1 H), 4.04 (s, 3 H), 1.84 (d, J = 7.2 Hz, 3 H). LCMS (Method 4): [MH⁺] = 443 at 3.29 min. Chiral analysis (Method 17) at 2.24 min. |

-continued

| Example No. | Chemical Name Structure | Analytical data ¹H NMR LC-MS |
|---|---|---|
| Example 193 | Single enantiomer 2 of 6-(4-fluorophenyl)-8-methoxy-N-(1-(3-(pyridin-4-yl)-1,2,4-oxadiazol-5-yl)ethyl)quinazolin-4-amine | ¹H NMR (400 MHz, DMSO): δ 8.91 (d, J = 7.0 Hz, 1 H), 8.81-8.79 (m, 2 H), 8.45 (s, 1 H), 8.23 (d, J = 1.8 Hz, 1 H), 7.98-7.92 (m, 4 H), 7.58 (d, J = 1.6 Hz, 1 H), 7.40 (dd, J = 8.9, 8.9 Hz, 2 H), 5.94-5.89 (m, 1 H), 4.04 (s, 3 H), 1.84 (d, J = 7.2 Hz, 3 H). LCMS (Method 4): [MH⁺] = 443 at 3.29 min. Chiral analysis (Method 17) at 3.41 min. |
| Example 169 | Single enantiomer 1 of 6-(5-fluoro-2-pyridyl)-8-methoxy-N-[1-[6-(trifluoromethyl)pyridazin-3-yl]ethyl]quinazolin-4-amine | ¹H NMR (400 MHz, DMSO): δ 8.87 (d, J = 6.9 Hz, 1 H), 8.76 (d, J = 3.0 Hz, 1 H), 8.68 (d, J = 1.5 Hz, 1 H), 8.38 (s, 1 H), 8.34 (dd, J = 4.3, 8.9 Hz, 1 H), 8.21 (d, J = 8.8 Hz, 1 H), 8.07 (d, J = 8.8 Hz, 1 H), 8.03-7.97 (m, 2 H), 5.91-5.86 (m, 1 H), 4.01 (s, 3 H), 1.80 (d, J = 7.2 Hz, 3 H). LCMS (Method 4): [MH⁺] = 445 at 3.42 min. Chiral analysis (Method 35) at 1.35 min. |
| Example 170 | Single enantiomer 2 of 6-(5-fluoro-2-pyridyl)-8-methoxy-N-[1-[6-(trifluoromethyl)pyridazin-3-yl]ethyl]quinazolin-4-amine | ¹H NMR (400 MHz, DMSO): δ 8.87 (d, J = 7.0 Hz, 1 H), 8.76 (d, J = 2.9 Hz, 1 H), 8.68 (d, J = 1.6 Hz, 1 H), 8.38 (s, 1 H), 8.34 (dd, J = 4.4, 8.9 Hz, 1 H), 8.21 (d, J = 8.9 Hz, 1 H), 8.07 (d, J = 8.8 Hz, 1 H), 8.03-7.98 (m, 2 H), 5.91-5.86 (m, 1 H), 4.01 (s, 3 H), 1.80 (d, J = 7.2 Hz, 3 H). LCMS (Method 4): [MH⁺] = 445 at 3.43 min. Chiral analysis (Method 35) at 2.10 min. |

| Example No. | Chemical Name Structure | Analytical data ¹H NMR LC-MS |
|---|---|---|
| Example 171 | Single enantiomer 1 of N-[1-(5-methyl-1,3,4-thiadiazol-2-yl)ethyl]-6-(5-methylthiazol-2-yl)-8-tetrahydropyran-4-yloxy-quinazolin-4-amine | ¹H NMR (400 MHz, DMSO): δ 9.07 (d, J = 7.4 Hz, 1 H), 8.54 (s, 1 H), 8.43 (d, J = 1.6 Hz, 1 H), 7.83 (d, J = 1.6 Hz, 1 H), 7.69 (d, J = 1.1 Hz, 1 H), 5.96 (d, J = 6.0 Hz, 1 H), 4.96-4.89 (m, 1 H), 3.96-3.91 (m, 2 H), 3.58-3.50 (m, 2 H), 2.66 (s, 3 H), 2.55 (s, 3 H), 2.09-2.01 (m, 2 H), 1.81 (d, J = 6.8 Hz, 3 H), 1.78-1.68 (m, 2 H). LCMS (Method 3): [MH+] = 469 at 3.69 min. Chiral analysis (Method 9 at 1.51 min. |
| Example 172 | Single enantiomer 2 of N-[1-(5-methyl-1,3,4-thiadiazol-2-yl)ethyl]-6-(5-methylthiazol-2-yl)-8-tetrahydropyran-4-yloxy-quinazolin-4-amine | ¹H NMR (400 MHz, DMSO): δ 9.07 (d, J = 7.4 Hz, 1 H), 8.54 (s, 1 H), 8.44 (d, J = 1.6 Hz, 1 H), 7.83 (d, J = 1.6 Hz, 1 H), 7.69 (d, J = 1.1 Hz, 1 H), 5.96 (d, J = 6.0 Hz, 1 H), 4.96-4.89 (m, 1 H), 3.95-3.91 (m, 2 H), 3.57-3.50 (m, 2 H), 2.66 (s, 3 H), 2.55 (s, 3 H), 2.08-2.02 (m, 2 H), 1.81 (d, J = 7.2 Hz, 3 H), 1.78-1.67 (m, 2 H). LCMS (Method 3): [MH+] = 469 at 3.7 min. Chiral analysis (Method 9) at 3.52 min. |
| Example 173 | Single enantiomer 1 of 6-(5-fluoropyridin-2-yl)-8-methoxy-N-(1-(5-methyl-1,3,4-thiadiazol-2-yl)ethyl)quinazolin-4-amine | ¹H NMR (400 MHz, DMSO): δ 8.92 (d, J = 7.5 Hz, 1 H), 8.74 (d, J = 2.9 Hz, 1 H), 8.58-8.52 (m, 2 H), 8.29 (dd, J = 4.3, 8.9 Hz, 1 H), 8.01-7.95 (m, 2 H), 6.03-5.94 (m, 1 H), 4.03-4.02 (m, 3 H), 2.66 (s, 3 H), 1.82 (d, J = 7.0 Hz, 3 H). LCMS (Method 4): [MH+] = 397 at 2.75 min. Chiral analysis (Method 32) at 1.36 min. |

-continued

| Example No. | Chemical Name Structure | Analytical data ¹H NMR LC-MS |
|---|---|---|
| Example 174 | Single enantiomer 2 of 6-(5-fluoropyridin-2-yl)-8-methoxy-N-(1-(5-methyl-1,3,4-thiadiazol-2-yl)ethyl)quinazolin-4-amine | ¹H NMR (400 MHz, DMSO): δ 8.92 (d, J = 7.5 Hz, 1 H), 8.74 (d, J = 2.9 Hz, 1 H), 8.58-8.52 (m, 2 H), 8.29 (dd, J = 4.3, 8.9 Hz, 1 H), 8.01-7.95 (m, 2 H), 6.03-5.94 (m, 1 H), 4.03-4.02 (m, 3 H), 2.66 (s, 3 H), 1.82 (d, J = 7.0 Hz, 3 H). LCMS (Method 4): [MH+] = 397 at 2.75 min. Chiral analysis (Method 32) at 2 min. |
| Example 175 | Single enantiomer 1 of 6-(5-fluoropyridin-2-yl)-8-methoxy-N-(1-(3-methyl-1,2,4-oxadiazol-5-yl)ethyl)quinazolin-4-amine | ¹H NMR (400 MHz, DMSO): δ 8.93 (d, J = 7.1 Hz, 1 H), 8.80-8.78 (m, 1 H), 8.62 (d, J = 1.5 Hz, 1 H), 8.51-8.51 (m, 1 H), 8.33 (dd, J = 4.2, 9.0 Hz, 1 H), 8.05-7.99 (m, 2 H), 5.91-5.82 (m, 1 H), 4.07 (s, 3 H), 2.38-2.37 (m, 3 H), 1.80 (d, J = 7.3 Hz, 3 H). LCMS (Method 4): [MH+] = 382 at 2.86 min. Chiral analysis (Method 28) at 1.51 min. |
| Example 176 | Single enantiomer 2 of 6-(5-fluoropyridin-2-yl)-8-methoxy-N-(1-(3-methyl-1,2,4-oxadiazol-5-yl)ethyl)quinazolin-4-amine | ¹H NMR (400 MHz, DMSO): δ 8.90 (d, J = 7.3 Hz, 1 H), 8.75 (d, J = 2.9 Hz, 1 H), 8.58 (d, J = 1.6 Hz, 1 H), 8.47 (s, 1 H), 8.29 (dd, J = 4.3, 8.9 Hz, 1 H), 8.01-7.95 (m, 2 H), 5.86-5.78 (m, 1 H), 4.03 (s, 3 H), 2.33 (s, 3 H), 1.76 (d, J = 7.2 Hz, 3 H). LCMS (Method 3): [MH+] = 381 at 2.90 min. Chiral analysis (Method 28) at 2.07 min. |

Pharmacological Activity of the Compounds of the Invention

In Vitro Electrophysiology Assay for P2X$_3$

Cells expressing P2X$_3$ receptors were grown according to standard practice and maintained at 37° C. in a 5% humidified CO2 atmosphere. The cells were seeded into T175 flask 2 days prior to the day of the assay and dissociated from the flasks using TrypLE when grown to confluence of 80-90%. The dissociated cells were resuspended in serum free media at a cell density of 3×10$^6$ cells/ml and loaded onto the Sophion Qube automated patch-clamp system. The extracellular assay buffer contained 145 mM NaCl, 4 mM KCl, 2 mM CaCl$_2$), 1 mM MgCl$_2$, 10 mM HEPES, and 10 mM glucose at pH 7.4. The intracellular assay solution contained 140 mM CsF, 10 mM NaCl, 10 mM EGTA, 10 mM HEPES at pH 7.2. Agonist stock solutions were prepared in H$_2$O and diluted in bath solution prior to use. All antagonists were prepared as 10 mM stock solutions in DMSO and diluted in bath solution prior to use. All experiments were performed under the whole-cell patch clamp configuration at room temperature with 384 individual cells being voltage clamped at −60 mV simultaneously on the Sophion Qube instrument. Two baseline responses were established with the application of α,β-MeATP (800 nM), with the subsequent agonist applications being washed out using extracellular assay buffer containing 0.5 U/ml apyrase. Following the second agonist application, antagonist was incubated in the absence of α,β-MeATP for 10 minutes. After antagonist preincubation, 800 nM α,β-MeATP and antagonist were co-administered to determine the inhibitory effect of the antagonist. One concentration of an antagonist was assessed against a single cell, with different concentrations of the antagonist applied to other cells on the 384 recording substrate. The control P2X$_3$ current amplitude was taken from the peak current amplitude from the second agonist response prior to preincubation with antagonist. The peak P2X$_3$ current amplitude in the presence of antagonist was used to calculate the inhibitory effect at each concentration of the antagonist according to the following equation:

Percentage inhibition of $P2X_3$ =

($P2X_3$ control peak amplitude − $P2X_3$ antagonist peak amplitude)/

$P2X_3$ control peak amplitude) * 100

Concentration-response curves were constructed from ten different concentrations with each concentration of antagonist tested on at least two individual cells. The concentration of the antagonist to inhibit P2X$_3$ current by 50% (IC$_{50}$) was determined by fitting the data with the following equation:

$$Y = a + [(b-a)/(1 + 10^{\wedge}((\log c - x)d)]$$

Where 'a' is minimum response, 'b' is maximum response, 'c' is IC$_{50}$ and 'd' is Hill slope.

The results for individual compounds are provided below in Table 6 and are expressed as range of activity.

TABLE 6

| Example No. | h P2X$_3$ |
| --- | --- |
| 1 | +++ |
| 2 | +++ |
| 3 | ++ |
| 4 | ++ |
| 5 | +++ |
| 6 | ++ |
| 7 | ++ |
| 8 | ++ |
| 9 | ++ |
| 10 | +++ |
| 11 | +++ |
| 12 | +++ |
| 13 | +++ |
| 19 | +++ |
| 20 | +++ |
| 21 | ++ |
| 22 | ++ |
| 23 | ++ |
| 24 | +++ |
| 25 | +++ |
| 26 | ++ |
| 27 | +++ |
| 28 | +++ |
| 29 | ++ |
| 30 | ++ |
| 31 | ++ |
| 32 | ++ |
| 33 | +++ |
| 34 | ++ |
| 35 | +++ |
| 36 | +++ |
| 37 | +++ |
| 38 | ++ |
| 39 | +++ |
| 40 | ++ |
| 41 | +++ |
| 44 | +++ |
| 55 | +++ |
| 57 | ++ |
| 61 | +++ |
| 67 | ++ |

TABLE 6-continued

| Example No. | h P2X$_3$ |
| --- | --- |
| 72 | ++ |
| 74 | + |
| 81 | ++ |
| 82 | +++ |
| 83 | ++ |
| 84 | +++ |
| 85 | +++ |
| 94 | ++ |
| 95 | +++ |
| 96 | ++ |
| 97 | ++ |
| 98 | ++ |
| 99 | +++ |
| 100 | +++ |
| 101 | ++ |
| 102 | + |
| 103 | ++ |
| 104 | +++ |
| 105 | ++ |
| 106 | +++ |
| 107 | +++ |
| 108 | ++ |
| 109 | ++ |
| 110 | ++ |
| 111 | +++ |
| 112 | +++ |
| 113 | +++ |
| 114 | +++ |
| 115 | +++ |
| 116 | +++ |
| 117 | +++ |
| 118 | +++ |
| 119 | +++ |
| 120 | +++ |
| 121 | ++ |
| 122 | + |
| 123 | +++ |
| 124 | ++ |
| 125 | +++ |
| 126 | + |
| 127 | +++ |
| 128 | + |
| 129 | +++ |
| 132 | ++ |
| 133 | ++ |
| 134 | ++ |
| 135 | ++ |
| 136 | ++ |
| 137 | +++ |
| 138 | ++ |
| 139 | +++ |
| 140 | ++ |
| 141 | ++ |
| 142 | +++ |
| 143 | +++ |
| 144 | +++ |
| 145 | +++ |
| 146 | +++ |
| 147 | ++ |
| 148 | ++ |
| 149 | +++ |
| 150 | +++ |
| 151 | +++ |
| 152 | +++ |
| 153 | +++ |
| 154 | +++ |
| 155 | +++ |
| 160 | + |
| 156 | ++ |
| 157 | +++ |
| 158 | ++ |
| 159 | +++ |
| 161 | ++ |
| 162 | ++ |
| 163 | +++ |
| 164 | ++ |
| 165 | +++ |
| 166 | +++ |

TABLE 6-continued

| Example No. | h P2X$_3$ |
|---|---|
| 167 | ++ |
| 168 | ++ |
| 169 | +++ |
| 170 | ++ |
| 171 | ++ |
| 172 | +++ |
| 173 | ++ |
| 174 | +++ |
| 175 | ++ |
| 176 | +++ |
| 185 | +++ |
| 188 | + |
| 190 | ++ |
| 191 | +++ |
| 192 | + |
| 193 | +++ | wherein the compounds are classified in term of potency with respect to their inhibitory activity on P2X$_3$ according to the following classification criterion:

+++: pIC$_{50}$ h P2X$_3$>6.5
++: 6.5<pIC$_{50}$ h P2X$_3$>5.5
+: 5.5<pIC$_{50}$ h P2X$_3$>4.5

In Vitro Electrophysiology Assay for P2X$_{2/3}$

Representative compound of the present invention have been also tested for P2X$_{2/3}$ receptor.

The same assay protocol was used for the P2X$_{2/3}$ assay as the P2X$_3$ assay with two modifications: 1) 10 µM ATP was used as the agonist; and 2) the mean current amplitude was measured seven seconds after the application of agonist.

The results of Table 7 indicate that representative compounds of the present invention are selective P2X$_3$ antagonist.

TABLE 7

| Example No. | h P2X$_3$ | h P2X$_{2/3}$ |
|---|---|---|
| 2 | +++ | + |
| 5 | +++ | ++ |
| 7 | ++ | + |
| 13 | +++ | ++ |
| 19 | +++ | ++ |
| 20 | +++ | ++ |
| 24 | +++ | + |
| 28 | +++ | ++ |
| 30 | ++ | + |
| 99 | +++ | ++ |
| 107 | +++ | ++ |
| 108 | ++ | + |
| 109 | ++ | + |
| 111 | +++ | ++ |
| 112 | +++ | ++ |
| 113 | +++ | ++ |
| 116 | +++ | ++ |
| 117 | +++ | ++ |
| 121 | +++ | ++ |
| 123 | +++ | + |
| 127 | +++ | + |
| 129 | +++ | + |
| 136 | ++ | + |
| 137 | +++ | + |
| 142 | +++ | + |
| 143 | +++ | + |
| 144 | +++ | + |
| 145 | +++ | ++ |
| 146 | +++ | + |
| 149 | +++ | + |
| 150 | +++ | + |
| 151 | +++ | ++ |
| 152 | +++ | + |
| 153 | +++ | + |

TABLE 7-continued

| Example No. | h P2X$_3$ | h P2X$_{2/3}$ |
|---|---|---|
| 154 | +++ | ++ |
| 155 | +++ | ++ |
| 157 | +++ | + |
| 159 | +++ | + |
| 163 | +++ | + |
| 166 | +++ | + |
| 190 | ++ | + |
| 191 | +++ | ++ |
| 193 | +++ | ++ |
| 169 | +++ | + |
| 173 | ++ | + |
| 174 | +++ | + |
| 176 | +++ | + | wherein the compounds are classified in term of potency with respect to their inhibitory activity on P2X$_3$ or P2X$_{2/3}$ isoforms according to the following classification criterion:

+++: pIC$_{50}$ h P2X$_3$ or h P2X$_{2/3}$>6.5
++: 6.5<pIC$_{50}$ h P2X$_3$ or h P2X$_{2/3}$>5.5
+: 5.5<pIC$_{50}$ h P2X$_3$ or h P2X$_{2/3}$>4.5

Comparative Example A 6-(4-fluorophenyl)-4-[(6-methyl-3-pyridyl)methoxy]pyrido[2,3-d]pyrimidine

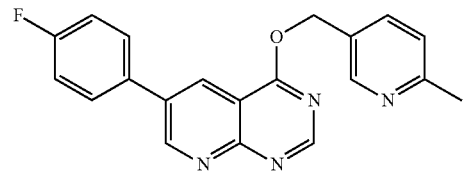

Step 1: Synthesis of 6-bromo-4-((6-methylpyridin-3-yl)methoxy)pyrido[2,3-d]pyrimidine

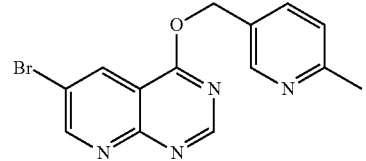 [SMILES: Cc1ccc(COc2ncnc3ncc(Br)cc23)cn1]

6-Bromopyrido[2,3-d]pyrimidin-4(3H)-one (202 mg, 0.89 mmol) (Intermediate 1), 5-hydroxymethyl-2-methylpyridine (110 mg, 0.89 mmol) and triphenylphosphine (328 mg, 1.25 mmol) were stirred in dry THF (7 mL) and a solution of diisopropyl azodicarboxylate (229 µL, 1.16 mmol) in dry THF (3 mL) was added dropwise and stirred at room temperature for 6 hours. The reaction was filtered and the precipitate was washed with (2:1) DCM/MeOH (20 mL). The filtrates were combined and the solvent was removed in vacuo. The residue was purified by chromatography on silica gel eluting with 0-100% EtOAc in DCM to give 6-bromo-4-((6-methylpyridin-3-yl)methoxy)pyrido[2,3-d]pyrimidine (164 mg, 55%).

¹H NMR (400 MHz, DMSO): δ 9.08 (d, J=2.6 Hz, 1H), 8.89 (s, 1H), 8.67 (d, J=2.6 Hz, 1H), 8.55 (d, J=2.1 Hz, 1H), 7.72 (dd, J=2.4, 8.0 Hz, 1H), 7.24 (d, J=8.0 Hz, 1H), 5.20 (s, 2H), 2.44 (s, 3H).

Step 2: Synthesis of 6-(4-fluorophenyl)-4-[(6-methyl-3-pyridyl)methoxy]pyrido[2,3-d]pyrimidine

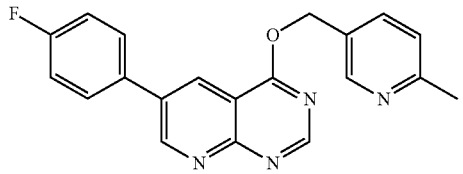 [SMILES: Cc1ccc(COc2ncnc3ncc(-c4ccc(F)cc4)cc23)cn1]

Nitrogen gas was bubbled through a mixture of 6-bromo-4-((6-methylpyridin-3-yl)methoxy)pyrido[2,3-d]pyrimidine (84 mg, 0.254 mmol), 4-fluorophenylboronic acid, pinacol ester (76 mg, 0.342 mmol) and cesium fluoride (116 mg, 0.761 mmol) in DMF (1 mL) and water (0.3 mL). After 5 min, tetrakis(triphenylphosphine)palladium(O) (29 mg, 0.025 mmol) was added and the resulting mixture was heated at 95° C. for 16 hours. The reaction was diluted with water (6 mL) and EtOAc (3 mL). The aqueous phase was extracted EtOAc (2×10 mL). The combined organic phases were passed through a hydrophobic frit, combined and the solvent was removed in vacuo. Purification by reverse phase preparative HPLC afforded 6-(4-fluorophenyl)-4-[(6-methyl-3-pyridyl)methoxy]pyrido[2,3-d]pyrimidine (52 mg, 59%) as a 0.5 eq formate salt.

¹H NMR (400 MHz, DMSO): δ 9.35 (d, J=2.8 Hz, 1H), 8.92 (s, 1H), 8.73 (d, J=2.5 Hz, 1H), 8.61 (d, J=1.5 Hz, 1H), 8.32 (s, 0.5H), 7.97 (dd, J=5.3, 8.6 Hz, 2H), 7.77 (dd, J=2.1, 8.0 Hz, 1H), 7.42 (dd, J=8.8, 8.8 Hz, 2H), 7.29 (d, J=8.1 Hz, 1H), 5.27 (s, 2H), 2.49 (s, 3H).

LCMS (Method 4): [MH+]=347 at 2.82 min.

The following compound reported in the table below was prepared according to the same procedure described for the preparation of 6-(4-fluorophenyl)-4-[(6-methyl-3-pyridyl)methoxy]pyrido[2,3-d]pyrimidine.

| Comparative Example No. | Chemical name Structure | Analytical data ¹H NMR LC-MS |
|---|---|---|
| Comparative Example B | 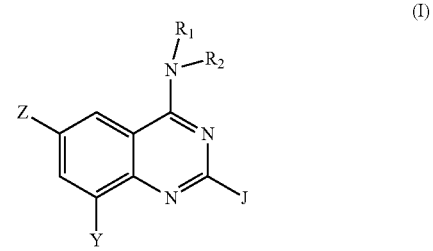<br>6-(5-methylpyridin-2-yl)-4-((6-methylpyridin-3-yl)methoxy)pyrido[2,3-d]pyrimidine | ¹H NMR (400 MHz, DMSO): δ 9.70 (d, J = 2.3 Hz, 1 H), 9.14 (d, J = 2.3 Hz, 1 H), 8.92 (s, 1 H), 8.66-8.60 (m, 2 H), 8.18 (d, J = 8.1 Hz, 1 H), 7.83 (d, J = 6.8 Hz, 1 H), 7.78 (dd, J = 1.9, 8.0 Hz, 1 H), 7.29 (d, J = 8.1 Hz, 1 H), 5.27 (s, 2 H), 2.49 (s, 3 H), 2.42 (s, 3 H).<br>LCMS (Method 3): [MH+] = 344 at 3.31 m |

The activity of the comparative examples A and B have been tested in the in vitro Electrophysiology Assay for P2X₃ as described above.

Results for individual compounds are provided below in Table 8 and are expressed as range of activity.

TABLE 8

| Comparative Example No. | h P2X₃ |
|---|---|
| A | inactive |
| B | inactive |

Inactive: pIC₅₀ h P2X₃ < 4.5.

The invention claimed is:
1. A compound of formula (I)

$$\text{(I)}$$

wherein
Z is selected from the group consisting of $(C_3-C_8)$ heterocycloalkyl, $(R^AR^B)N$, heteroaryl, aryl, wherein any of such alkyl, heteroaryl, heterocycloalkyl and aryl may be optionally substituted by one or more groups selected from $(C_1-C_3)$alkyl-, halo, CN, $(R^AR^B)NC(O)$-, $(C_1-C_6)$haloalkyl-, $R^AO$—, $(R^AR^B)N(C_1-C_6)$alkylene-, $(C_3-C_7)$cycloalkyl-, $R^CSO_2$-, $(R^AR^B)N$-;
$R_1$ is H or $(C_1-C_4)$alkyl;
$R_2$ is selected from the group consisting of heteroaryl $(C_1-C_4)$alkyl-, $(C_3-C_8)$heterocycloalkyl-$(C_1-C_6)$alkyl-, heteroaryl-$(C_1-C_6)$hydroxyalkyl, $(C_3-C_8)$heterocycloalkyl, $(C_3-C_8)$cycloalkyl-$(C_1-C_6)$alkyl-, aryl-$(C_1-C_4)$alkyl-, $(R^AR^B)N(C_1-C_6)$alkylene-, $(R^AR^B)N(O)C(C_1-C_4)$alkylene-, $R^AO(C_1-C_4)$alkylene-, wherein any of such alkyl, alkylene, aryl, heteroaryl and heterocycloalkyl may be optionally substituted by one or more groups selected from $(C_1-C_3)$alkyl, $R^AO(C_1-C_4)$alkylene-, $(C_1-C_6)$haloalkyl, halo, oxo, $R^AO$-, $(C_3-C_8)$heterocycloalkyl-$(C_1-C_6)$alkyl-, heteroaryl, $(R^AR^B)N$—, —NHC(O)$R^C$, —C(O)N($R^AR^B$), —SO$_2$N($R^AR^B$), —O($C_1-C_4$)alkylene-N($R^AR^B$), aryl optionally substituted by halo, —OR$^C$, aryl-($C_1-C_4$)alkyl-, —C(O)$R^A$, $R^A$ and $R^B$ are at each occurrence independently H or selected from the group consisting of $(C_1-C_4)$alkyl-, $(C_3-C_8)$cycloalkyl-, $(C_1-C_6)$haloalkyl-, or R$^A$ and R$^B$ may form together with the nitrogen atom to which they are attached 5- or 6-membered saturated heterocyclic monocyclic ring system optionally further consisting of a heteroatom which is nitrogen or oxygen, which may be optionally substituted by one or more groups selected from (C$_1$-C$_4$)alkyl and oxo;

R$^C$ is at each occurrence H or selected from the group consisting of (C$_1$-C$_6$)alkyl, (R$^A$R$^B$)N—, aryl-(C$_1$-C$_4$)alkyl-;

Y is selected from the group consisting of —OR$^D$, R$^C$SO$_2$, NHSO$_2$R$^C$, heteroaryl, (C$_3$-C$_8$)heterocycloalkyl, wherein any of such heteroaryl and heterocycloalkyl may be optionally substituted by one or more groups selected from (C$_1$-C$_3$)alkyl, and —C(O)N(R$^A$R$^B$);

R$^D$ is at each occurrence selected from the group consisting of H, (C$_1$-C$_6$)alkyl, (C$_3$-C$_8$)heterocycloalkyl-(C$_1$-C$_6$)alkyl-, R$^C$OC(O)(C$_1$-C$_4$)alkylene-, (R$^A$R$^B$)N(C$_1$-C$_6$)alkylene-, (C$_3$-C$_8$)heterocycloalkyl, (C$_3$-C$_8$)cycloalkyl-(C$_1$-C$_6$)alkyl, R$^C$O(C$_1$-C$_4$)alkylene-, (R$^A$R$^B$)N(O)C(C$_1$-C$_4$)alkylene, wherein any of such heterocycloalkyl may be optionally substituted by one or more groups selected from (C$_1$-C$_3$)alkyl-;

J is H or selected from the group consisting of (C$_1$-C$_6$)alkyl, (R$^A$R$^B$)N—, (C$_1$-C$_6$)haloalkyl, —OR$^C$ and halo.

2. The compound of formula I according to claim 1, selected from the group consisting of:

6-(1-((6-(4-Fluorophenyl)-8-methoxyquinazolin-4-yl) amino) ethyl) pyridin-2 (1H)-one,
6-(5-fluoropyridin-2-yl)-8-methoxy-N-(1-(3-methyl-1,2,4-oxadiazol-5-yl) ethyl) quinazolin-4-amine,
6-(5-fluoropyrimidin-2-yl)-8-methoxy-N-(1-(3-methyl-1,2,4-oxadiazol-5-yl) ethyl) quinazolin-4-amine,
((R)-6-(5-fluoropyrimidin-2-yl)-8-methoxy-N-(1-(6-methylpyridazin-3-yl) ethyl) quinazolin-4-amine,
(R)-8-methoxy-N-(1-(6-methylpyridazin-3-yl) ethyl)-6-(5-methylthiazol-2-yl) quinazolin-4-amine,
8-Methoxy-N-[(1R)-1-(5-methyl-1,2,4-oxadiazol-3-yl) ethyl]-6-(5-methylpyrimidin-2-yl) quinazolin-4-amine,
single enantiomer 1 of N—[1-(6-methylpyridazin-3-yl) ethyl]-6-(5-methylpyrimidin-2-yl)-8-tetrahydropyran-4-yloxy-quinazolin-4-amine,
single enantiomer 2 of N—[1-(6-methylpyridazin-3-yl) ethyl]-6-(5-methylpyrimidin-2-yl)-8-tetrahydropyran-4-yloxy-quinazolin-4-amine,
6-(5-fluoro-2-pyridyl)-N-[(6-methylpyridazin-3-yl) methyl]-8-tetrahydropyran-4-yloxy-quinazolin-4-amine,
N-[(6-methylpyridazin-3-yl) methyl]-6-(5-methylpyrimidin-2-yl)-8-tetrahydropyran-4-yloxy-quinazolin-4-amine,
(R)-6-(1-methyl-1H-pyrazol-3-yl)-N-(1-(6-methylpyridazin-3-yl) ethyl)-8-((tetrahydro-2H-pyran-4-yl) oxy) quinazolin-4-amine,
(R)-6-(5-methylthiazol-2-yl)-N-(1-(pyridazin-3-yl) ethyl)-8-((tetrahydro-2H-pyran-4-yl) oxy) quinazolin-4-amine,
8-(2-methoxyethoxy)-N—((6-methylpyridazin-3-yl) methyl)-6-(5-methylthiazol-2-yl) quinazolin-4-amine,
2-((4-(((6-methylpyridazin-3-yl) methyl) amino)-6-(5-methylthiazol-2-yl) quinazolin-8-yl) oxy) ethan-1-ol,
N—((6-methylpyridazin-3-yl) methyl)-6-(5-methylthiazol-2-yl)-8-(oxetan-3-ylmethoxy) quinazolin-4-amine,
N-[(6-methylpyridazin-3-yl) methyl]-6-(5-methylthiazol-2-yl)-8-tetrahydropyran-4-yloxy-quinazolin-4-amine,
(R)-2-((6-(4-fluorophenyl)-4-((1-(2-(trifluoromethyl) pyrimidin-5-yl) ethyl) amino) quinazolin-8-yl) oxy) acetic acid,
2-((4-(((6-methylpyridazin-3-yl) methyl) amino)-6-(5-methylpyrimidin-2-yl) quinazolin-8-yl) oxy) acetic acid dihydrochloride,
2-((6-(4-fluorophenyl)-4-(((1-methylpiperidin-4-yl) methyl) amino) quinazolin-8-yl) oxy) acetic acid hydrochloride,
6-(4-fluorophenyl)-N—((6-methylpyridazin-3-yl) methyl)-8-(oxetan-3-yloxy) quinazolin-4-amine,
N—[1-(5-methyl-1,3,4-thiadiazol-2-yl) ethyl]-6-(5-methylthiazol-2-yl)-8-tetrahydropyran-4-yloxy-quinazolin-4-amine,
6-(5-fluoro-2-pyridyl)-N-[(1R)-1-(5-methyl-1,2,4-oxadiazol-3-yl) ethyl]-8-tetrahydropyran-4-yloxy-quinazolin-4-amine,
Single enantiomer 1 of 6-(5-methyl-2-pyridyl)-N—[1-(5-methyl-1,3,4-thiadiazol-2-yl) ethyl]-8-tetrahydropyran-4-yloxy-quinazolin-4-amine,
Single enantiomer 2 of 6-(5-methyl-2-pyridyl)-N—[1-(5-methyl-1,3,4-thiadiazol-2-yl) ethyl]-8-tetrahydropyran-4-yloxy-quinazolin-4-amine,
Single enantiomer 1 of 6-(5-fluoro-2-pyridyl)-N—[1-(3-methyl-1,2,4-oxadiazol-5-yl) ethyl]-8-tetrahydropyran-4-yloxy-quinazolin-4-amine,
6-(3-Chloro-1H-pyrazol-1-yl)-8-methoxy-N-(1-(2-(trifluoromethyl) pyrimidin-5-yl) ethyl) quinazolin-4-amine,
6-(3-chloro-1H-pyrazol-1-yl)-8-methoxy-N-(1-(6-methylpyridazin-3-yl) ethyl) quinazolin-4-amine,
(R)-6-(4-fluoro-1H-pyrazol-1-yl)-8-methoxy-N-(1-(2-(trifluoromethyl) pyrimidin-5-yl) ethyl) quinazolin-4-amine,
(R)-6-(4-fluoro-1H-pyrazol-1-yl)-8-methoxy-N-(1-(6-methylpyridazin-3-yl) ethyl) quinazolin-4-amine,
(R)-8-methoxy-6-(4-methyl-1H-pyrazol-1-yl)-N-(1-(6-methylpyridazin-3-yl) ethyl) quinazolin-4-amine,
(R)-6-(4-chloro-1H-pyrazol-1-yl)-8-methoxy-N-(1-(6-methylpyridazin-3-yl) ethyl) quinazolin-4-amine,
(R)-6-(3-fluoro-1H-pyrazol-1-yl)-8-methoxy-N-(1-(6-methylpyridazin-3-yl) ethyl) quinazolin-4-amine,
(R)-8-methoxy-6-(5-methyl-1H-pyrazol-1-yl)-N-(1-(6-methylpyridazin-3-yl) ethyl) quinazolin-4-amine,
(R)-8-methoxy-6-(3-methyl-1H-pyrazol-1-yl)-N-(1-(6-methylpyridazin-3-yl) ethyl) quinazolin-4-amine,
(R)-6-(4-chloro-1H-pyrazol-1-yl)-8-methoxy-N-(1-(2-(trifluoromethyl) pyrimidin-5-yl) ethyl) quinazolin-4-amine,
(8-methoxy-N-(1-(5-methyl-1,3,4-oxadiazol-2-yl) ethyl)-6-(1-methyl-1H-pyrazol-3-yl) quinazolin-4-amine,
8-methoxy-N-(1-(5-methyl-1,3,4-thiadiazol-2-yl) ethyl)-6-(5-methylthiazol-2-yl) quinazolin-4-amine,
8-methoxy-N-(1-(5-methyl-1,2,4-oxadiazol-3-yl) ethyl)-6-(5-methylthiazol-2-yl) quinazolin-4-amine,
6-(5-fluoropyrimidin-2-yl)-8-methoxy-N-(1-(5-methyl-1,2,4-oxadiazol-3-yl) ethyl) quinazolin-4-amine,
6-(5-fluoropyrimidin-2-yl)-8-methoxy-N-(1-(5-methyl-1,3,4-thiadiazol-2-yl) ethyl) quinazolin-4-amine,
6-(5-fluoropyrimidin-2-yl)-8-methoxy-N-(1-(5-methyl-1,3,4-oxadiazol-2-yl)ethyl) quinazolin-4-amine,
8-methoxy-N-[(3-methylisoxazol-5-yl) methyl]-6-(5-methylthiazol-2-yl) quinazolin-4-amine, 8-methoxy-6-(5-methylthiazol-2-yl)-N—[[3-(trifluoromethyl)-1,2,4-oxadiazol-5-yl]methyl]quinazolin-4-amine,
8-methoxy-N-[(3-methyl-1,2,4-oxadiazol-5-yl) methyl]-6-(5-methylthiazol-2-yl) quinazolin-4-amine,
8-methoxy-N—((5-methyl-1,3,4-thiadiazol-2-yl) methyl)-6-(5-methylthiazol-2-yl) quinazolin-4-amine,
4-(((8-methoxy-6-(5-methylthiazol-2-yl) quinazolin-4-yl) amino) methyl)-1-methylpyridin-2 (1H)-one,
8-methoxy-6-(5-methylthiazol-2-yl)-N—((5-(trifluoromethyl) pyridin-2-yl) methyl) quinazolin-4-amine,
N—((5-chloropyridin-2-yl) methyl)-8-methoxy-6-(5-methylthiazol-2-yl) quinazolin-4-amine,
N—((3,5-difluoropyridin-2-yl) methyl)-8-methoxy-6-(5-methylthiazol-2-yl) quinazolin-4-amine,
N—((5-fluoropyridin-2-yl) methyl)-8-methoxy-6-(5-methylthiazol-2-yl) quinazolin-4-amine,
Single enantiomers of 8-methoxy-6-(5-methylpyrimidin-2-yl)-N—[1-[6-(trifluoromethyl) pyridazin-3-yl]ethyl] quinazolin-4-amine,
Single enantiomers of 8-methoxy-6-(5-methylpyrimidin-2-yl)-N—[1-[6-(trifluoromethyl) pyridazin-3-yl]ethyl] quinazolin-4-amine,
Single enantiomer 1 of 8-Methoxy-N—[1-(3-methyl-1,2,4-oxadiazol-5-yl) ethyl]-6-(5-methylpyrimidin-2-yl) quinazolin-4-amine,
Single enantiomer 2 of 8-Methoxy-N—[1-(3-methyl-1,2,4-oxadiazol-5-yl) ethyl]-6-(5-methylpyrimidin-2-yl) quinazolin-4-amine,
Single enantiomer 1 of 8-Methoxy-6-(5-methylpyrimidin-2-yl)-N—[1-(5-methyl-1,3,4-thiadiazol-2-yl) ethyl]quinazolin-4-amine,
Single enantiomer 2 of 8-Methoxy-6-(5-methylpyrimidin-2-yl)-N—[1-(5-methyl-1,3,4-thiadiazol-2-yl) ethyl]quinazolin-4-amine,
Single enantiomer 1 of 8-methoxy-6-(5-methyl-2-pyridyl)-N—[1-(5-methyl-1,3,4-thiadiazol-2-yl) ethyl] quinazolin-4-amine,
Single enantiomer 2 of 8-methoxy-6-(5-methyl-2-pyridyl)-N—[1-(5-methyl-1,3,4-thiadiazol-2-yl) ethyl] quinazolin-4-amine,
Single enantiomer 1 of 8-methoxy-N-[(1R)-1-(5-methyl-1,3,4-oxadiazol-2-yl) ethyl]-6-(5-methylpyrimidin-2-yl) quinazolin-4-amine,
Single enantiomer 2 of 8-methoxy-N-[(1R)-1-(5-methyl-1,3,4-oxadiazol-2-yl) ethyl]-6-(5-methylpyrimidin-2-yl) quinazolin-4-amine,
6-(5-Fluoropyridin-2-yl)-8-methoxy-N—((5-methyl-1,2,4-oxadiazol-3-yl) methyl) quinazolin-4-amine,
6-(5-fluoropyridin-2-yl)-8-methoxy-N—((3-methyl-1,2,4-oxadiazol-5-yl) methyl) quinazolin-4-amine,
6-(5-fluoropyridin-2-yl)-8-methoxy-N—((5-methyl-1,3,4-oxadiazol-2-yl) methyl) quinazolin-4-amine,
6-(5-fluoropyridin-2-yl)-8-methoxy-N—((3-methylisoxazol-5-yl) methyl) quinazolin-4-amine,
8-methoxy-N—((5-methyl-1,2,4-oxadiazol-3-yl) methyl)-6-(5-methylpyridin-2-yl) quinazolin-4-amine,
8-methoxy-N—((3-methylisoxazol-5-yl) methyl)-6-(5-methylpyridin-2-yl) quinazolin-4-amine,
6-(5-fluoro-2-pyridyl)-8-methoxy-N-[(5-methylisoxazol-3-yl) methyl]quinazolin-4-amine,
8-methoxy-N-[(5-methylisoxazol-3-yl) methyl]-6-(5-methyl-2-pyridyl) quinazolin-4-amine,
6-(5-fluoro-2-pyridyl)-8-methoxy-N-[(1-methylpyrazol-3-yl) methyl]quinazolin-4-amine,
8-methoxy-N-[(1-methylpyrazol-3-yl) methyl]-6-(5-methyl-2-pyridyl) quinazolin-4-amine,
8-methoxy-N-[(3-methyl-1,2,4-oxadiazol-5-yl) methyl]-6-(5-methyl-2-pyridyl) quinazolin-4-amine,
8-methoxy-N-[(5-methyl-1,3,4-oxadiazol-2-yl) methyl]-6-(5-methyl-2-pyridyl) quinazolin-4-amine,
8-methoxy-6-(5-methylpyrimidin-2-yl)-N—[[3-(trifluoromethyl)-1,2,4-oxadiazol-5-yl]methyl]quinazolin-4-amine,
8-methoxy-6-(5-methylpyrimidin-2-yl)-N—[2-(trifluoromethyl) pyrimidin-5-yl]methyl]quinazolin-4-amine,
6-(5-fluoropyridin-2-yl)-8-methoxy-N—((2-(trifluoromethyl) pyrimidin-5-yl) methyl) quinazolin-4-amine,
4-(((6-(5-fluoropyridin-2-yl)-8-methoxyquinazolin-4-yl) amino) methyl)-1-methylpyridin-2 (1H)-one,
4-(((6-(5-fluoropyridin-2-yl)-8-methoxyquinazolin-4-yl) amino) methyl) pyridin-2 (1H)-one,
6-(5-fluoropyridin-2-yl)-8-methoxy-N—((6-methylpyridin-3-yl) methyl) quinazolin-4-amine,
6-(5-fluoropyridin-2-yl)-8-methoxy-N—((6-(trifluoromethyl) pyridin-3-yl) methyl) quinazolin-4-amine,
4-(((8-methoxy-6-(5-methylpyrimidin-2-yl) quinazolin-4-yl) amino) methyl)-1-methylpyridin-2 (1H)-one,
6-(((8-methoxy-6-(5-methylpyrimidin-2-yl) quinazolin-4-yl) amino) methyl) pyridin-2 (1H)-one,
8-methoxy-N—((5-methyl-1,3,4-thiadiazol-2-yl) methyl)-6-(5-methylpyrimidin-2-yl) quinazolin-4-amine,
8-methoxy-N—((6-methylpyridin-3-yl) methyl)-6-(5-methylpyrimidin-2-yl) quinazolin-4-amine,
6-(5-fluoropyridin-2-yl)-8-methoxy-N—((6-(trifluoromethyl) pyridin-3-yl)methyl)quinazolin-4-amine,
8-Methoxy-N—((3-methyl-1,2,4-oxadiazol-5-yl) methyl)-6-(5-methylpyrimidin-2-yl) quinazolin-4-amine,
6-(3-fluoro-5-methyl-2-pyridyl)-8-methoxy-N-[(1R)-1-(5-methyl-1,2,4-oxadiazol-3-yl)ethyl]quinazolin-4-amine,
6-(5-fluoro-2-pyridyl)-8-methoxy-N-[(1R)-1-(1-methylpyrazol-3-yl) ethyl]quinazolin-4-amine,
8-methoxy-N-[(1R)-1-(1-methylpyrazol-3-yl) ethyl]-6-(5-methyl-2-pyridyl) quinazolin-4-amine,
6-(4-Fluorophenyl)-N-[(5-fluoro-2-pyridyl) methyl]-8-methoxy-quinazolin-4-amine,
Single enantiomer 1 of 8-Methoxy-N—[1-(3-methyl-1,2,4-oxadiazol-5-yl) ethyl]-6-(5-methyl-2-pyridyl) quinazolin-4-amine,
Single enantiomer 2 of 8-Methoxy-N—[1-(3-methyl-1,2,4-oxadiazol-5-yl) ethyl]-6-(5-methyl-2-pyridyl) quinazolin-4-amine,
Single enantiomer 1 of 8-methoxy-N-(1-(5-methyl-1,3,4-thiadiazol-2-yl) ethyl)-6-(5-methylthiazol-2-yl) quinazolin-4-amine,
Single enantiomer 2 of 8-methoxy-N-(1-(5-methyl-1,3,4-thiadiazol-2-yl) ethyl)-6-(5-methylthiazol-2-yl) quinazolin-4-amine,
Single enantiomer 2 of 2-((8-methoxy-6-(5-methylpyrimidin-2-yl) quinazolin-4-yl) amino)-2-(3-methyl-1,2,4-oxadiazol-5-yl) ethan-1-ol,
Single enantiomer 1 of 6-(5-fluoro-2-pyridyl)-8-methoxy-N—[1-[6-(trifluoromethyl) pyridazin-3-yl] ethyl]quinazolin-4-amine,
Single enantiomer 2 of 6-(5-fluoro-2-pyridyl)-8-methoxy-N—[1-[6-(trifluoromethyl) pyridazin-3-yl] ethyl]quinazolin-4-amine,
Single enantiomer 1 of N—[1-(5-methyl-1,3,4-thiadiazol-2-yl) ethyl]-6-(5-methylthiazol-2-yl)-8-tetrahydropyran-4-yloxy-quinazolin-4-amine, Single enantiomer 2 of N—[1-(5-methyl-1,3,4-thiadiazol-2-yl) ethyl]-6-(5-methylthiazol-2-yl)-8-tetrahydropyran-4-yloxy-quinazolin-4-amine, Single enantiomer 1 of 6-(5-fluoropyridin-2-yl)-8-methoxy-N-(1-(5-methyl-1,3,4-thiadiazol-2-yl) ethyl) quinazolin-4-amine, Single enantiomer 2 of 6-(5-fluoropyridin-2-yl)-8-methoxy-N-(1-(5-methyl-1,3,4-thiadiazol-2-yl) ethyl) quinazolin-4-amine, Single enantiomer 1 of 6-(5-fluoropyridin-2-yl)-8-methoxy-N-(1-(3-methyl-1,2,4-oxadiazol-5-yl) ethyl) quinazolin-4-amine, Single enantiomer 2 of 6-(5-fluoropyridin-2-yl)-8-methoxy-N-(1-(3-methyl-1,2,4-oxadiazol-5-yl) ethyl) quinazolin-4-amine, 6-(4-fluorophenyl)-8-methoxy-N-[(1S)-1-[2-(trifluoromethyl) pyrimidin-5-yl]ethyl]quinazolin-4-amine formate, Single enantiomer 1 of 6-(1-((6-(4-Fluorophenyl)-8-methoxyquinazolin-4-yl) amino) ethyl) pyridin-2 (1H)-one, Single enantiomer 2 of 6-(1-((6-(4-Fluorophenyl)-8-methoxyquinazolin-4-yl) amino) ethyl) pyridin-2 (1H)-one.

3. The compound of formula I according to claim 1,

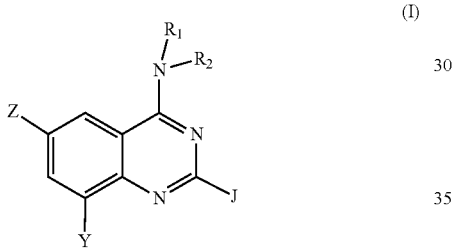

wherein
Z is selected from the group consisting of heteroaryl and aryl, wherein any of such heteroaryl and aryl may be optionally substituted by one or more groups selected from $(C_1-C_3)$ alkyl, halo, CN, $(R^AR^B)$ NC(O)-, $(C_1-C_6)$ haloalkyl, $R^AO$-, $(R^AR^B)$ $N(C_1-C_6)$ alkylene-, $(C_3-C_7)$ cycloalkyl-, $R^CSO_2$-, $(R^AR^B)$ N—;

$R_1$ is H or $(C_1-C_6)$ alkyl;

$R_2$ is selected from the group consisting of heteroaryl $(C_1-C_4)$ alkyl-, $(C_3-C_8)$ heterocycloalkyl-$(C_1-C_6)$ alkyl, heteroaryl-$(C_1-C_6)$ hydroxyalkyl, aryl-$(C_1-C_4)$ alkyl-, $(C_3-C_8)$ heterocycloalkyl, $(C_3-C_8)$ cycloalkyl-$(C_1-C_6)$ alkyl-, $(R^AR^B)$ $N(C_1-C_6)$ alkylene-; $R^AO(C_1-C_4)$ alkylene, wherein any of such alkyl, alkylene, aryl, heteroaryl, cycloalkyl and heterocycloalkyl may be optionally substituted by one or more groups selected from $(C_1-C_3)$ alkyl, $R^AO(C_1-C_4)$ alkylene, $(C_1-C_6)$ haloalkyl, oxo, $R^AO$-, $(C_3-C_8)$ heterocycloalkyl-$(C_1-C_6)$ alkyl, heteroaryl, aryl optionally substituted by halo, RCO-, $(R^AR^B)N$—, —NHC(O) $R^C$, C(O) $N(R^AR^B)$, halo, —SO$_2$N$(R^AR^B)$, —O$(R^AO(C_1-C_4)$ alkylene-N$(R^AR^B)$, aryl-$(C_1-C_4)$ alkyl-, —C(O) $R^A$;

$R^A$ and $R^B$ are at each occurrence independently H or selected from the group consisting of $(C_1-C_4)$ alkyl-, aryl, $(C_1-C_6)$ haloalkyl, or $R^A$ and $R^B$ may form together with the nitrogen atom to which they are attached a 6 membered saturated heterocyclic monocyclic ring system optionally further consisting of a heteroatom which is nitrogen or oxygen, which may be optionally substituted by $(C_1-C_4)$ alkyl- and oxo;

$R^C$ is H or selected from the group consisting of $(C_1-C_6)$ alkyl, $(R^AR^B)N$—, aryl-$(C_1-C_4)$ alkyl-, Y is selected from the group consisting of —OR$^D$, $R^CSO_2$-, NHSO$_2R^C$, heteroaryl, and $(C_3-C_8)$ heterocycloalkyl, wherein any of such heteroaryl and heterocycloalkyl may be optionally substituted by one or more groups selected from $(C_1-C_3)$ alkyl, —C(O) N$(R^AR^B)$;

J is H or selected from the group consisting of $(C_1-C_6)$ alkyl, —OR$^C$;

$R^D$ is H or $(C_1-C_6)$ alkyl.

4. The compound of formula I according to claim 1,

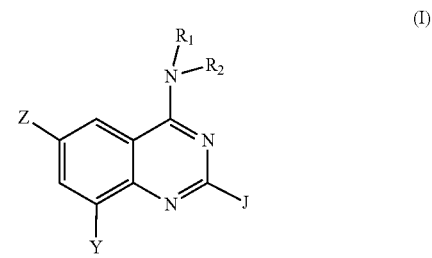

wherein
Z is selected from the group consisting of heteroaryl and aryl, wherein any of such heteroaryl and aryl may be optionally substituted by one or more groups selected from $(C_1-C_3)$ alkyl, halo, CN, $(R^AR^B)$ NC(O)-, $(C_1-C_6)$ haloalkyl, $R^AO$-, $(R^AR^B)$ $N(C_1-C_6)$ alkylene-, $(C_3-C_7)$ cycloalkyl-, $R^CSO_2$-, $(R^AR^B)$ N—;

$R_1$ is H;

$R_2$ is selected from the group consisting of $(C_1-C_6)$ alkyl, heteroaryl $(C_1-C_4)$ alkyl-, $(C_3-C_8)$ heterocycloalkyl-$(C_1-C_6)$ alkyl, heteroaryl-$(C_1-C_6)$ hydroxyalkyl, aryl-$(C_1-C_4)$ alkyl-, $(C_3-C_8)$ heterocycloalkyl, $(C_3-C_8)$ cycloalkyl-$(C_1-C_6)$ alkyl-, $(R^AR^B)$ $N(C_1-C_6)$ alkylene-; $R^AO(C_1-C_4)$ alkylene, wherein any of such alkyl, alkylene, aryl, heteroaryl, cycloalkyl and heterocycloalkyl may be optionally substituted by one or more groups selected from $(C_1-C_3)$ alkyl, $R^AO(C_1-C_4)$ alkylene, $(C_1-C_6)$ haloalkyl, oxo, $R^AO$-, $(C_3-C_8)$ heterocycloalkyl-$(C_1-C_6)$ alkyl, heteroaryl, aryl optionally substituted by halo, $R^CO$-, $(R^AR^B)$ N—, —NHC(O) $R^C$, —C(O) N$(R^AR^B)$, halo, —SO$_2$N$(R^AR^B)$, —O$(R^AO(C_1-C_4)$ alkylene-N $(R^AR^B)$, aryl-$(C_1-C_4)$ alkyl-, —C(O) $R^A$, $R^A$ and $R^B$ are at each occurrence independently H or selected from the group consisting of $(C_1-C_4)$ alkyl-, aryl, $(C_1-C_6)$ haloalkyl, or $R^A$ and $R^B$ may form together with the nitrogen atom to which they are attached a 6 membered saturated heterocyclic monocyclic ring system optionally further consisting of a heteroatom which is nitrogen or oxygen, which may be optionally substituted by $(C_1-C_4)$ alkyl- and oxo;

$R^C$ is H or selected from the group consisting of $(C_1-C_6)$ alkyl, $(R^AR^B)N$—, aryl-$(C_1-C_4)$ alkyl-, Y is selected from the group consisting of —OR$^D$, $R^CSO_2$-, —NHSO$_2R^C$, heteroaryl, $(C_3-C_8)$ heterocycloalkyl, wherein any of such heteroaryl and heterocycloalkyl may be optionally substituted by one or more groups selected from $(C_1-C_3)$ alkyl, —C(O)N($R^A R^B$);

J is H or selected from the group consisting of $(C_1-C_6)$ alkyl, —$OR^C$;

$R^D$ is H or $(C_1-C_6)$ alkyl.

5. The compound of formula I according to claim 1, selected from the group consisting of:

6-(1-((6-(4-Fluorophenyl)-8-methoxyquinazolin-4-yl) amino) ethyl) pyridin-2 (1H)-one, 6-(5-fluoropyridin-2-yl)-8-methoxy-N-(1-(3-methyl-1,2,4-oxadiazol-5-yl) ethyl) quinazolin-4-amine, 6-(5-fluoropyrimidin-2-yl)-8-methoxy-N-(1-(3-methyl-1,2,4-oxadiazol-5-yl) ethyl) quinazolin-4-amine, ((R)-6-(5-fluoropyrimidin-2-yl)-8-methoxy-N-(1-(6-methylpyridazin-3-yl) ethyl) quinazolin-4-amine, (R)-8-methoxy-N-(1-(6-methylpyridazin-3-yl) ethyl)-6-(5-methylthiazol-2-yl) quinazolin-4-amine, 8-methoxy-6-(5-methylpyrimidin-2-yl)-N-(1-(3-(pyridin-4-yl)-1,2,4-oxadiazol-5-yl) ethyl) quinazolin-4-amine, 8-Methoxy-N-[(1R)-1-(5-methyl-1,2,4-oxadiazol-3-yl) ethyl]-6-(5-methylpyrimidin-2-yl) quinazolin-4-amine, (R)-6-(4-fluorophenyl)-N-(1-(6-methylpyridazin-3-yl) ethyl)-8-(morpholinosulfonyl) quinazolin-4-amine, ((R)-6-(4-fluorophenyl)-8-(morpholinosulfonyl)-N-(1-(2-(trifluoromethyl) pyrimidin-5-yl) ethyl) quinazolin-4-amine, (Rac)-6-(4-fluorophenyl)-N-(1-(5-methyl-1,3,4-thiadiazol-2-yl) ethyl)-8-(morpholinosulfonyl) quinazolin-4-amine, (R)-6-(4-fluorophenyl)-N,N-dimethyl-4-((1-(6-methylpyridazin-3-yl) ethyl) amino) quinazoline-8-sulfonamide, 6-(4-fluorophenyl)-N,N-dimethyl-4-((1-(5-methyl-1,3,4-thiadiazol-2-yl) ethyl) amino) quinazoline-8-sulfonamide, 6-(4-fluorophenyl)-N,N-dimethyl-4-((1-(5-methyl-1,2,4-oxadiazol-3-yl) ethyl) amino) quinazoline-8-sulfonamide, (R)-6-(4-fluorophenyl)-N-methyl-4-((1-(6-methylpyridazin-3-yl) ethyl) amino) quinazoline-8-sulfonamide, (R)-6-(4-fluorophenyl)-N-methyl-4-((1-(5-methyl-t,2,4-oxadiazol-3-yl) ethyl) amino) quinazoline-8-sulfonamide, (6-(4-fluorophenyl)-N-methyl-4-((1-(5-methyl-1,3,4-thiadiazol-2-yl) ethyl) amino) quinazoline-8-sulfonamide, (R)-6-(4-fluorophenyl)-N-(1-(6-methylpyridazin-3-yl) ethyl)-8-(piperazin-1-ylsulfonyl) quinazolin-4-amine, (R)-6-(4-fluorophenyl)-N-(1-(5-methyl-1,2,4-oxadiazol-3-yl) ethyl)-8-(piperazin-1-ylsulfonyl) quinazolin-4-amine, (R)-6-(4-fluorophenyl)-8-(pyridazin-4-yl)-N-(1-(2-(trifluoromethyl) pyrimidin-5-yl) ethyl) quinazolin-4-amine, (R)-6-(4-fluorophenyl)-8-(pyrimidin-5-yl)-N-(1-(2-(trifluoromethyl) pyrimidin-5-yl) ethyl) quinazolin-4-amine, (R)-6-(4-fluorophenyl)-8-(tetrahydro-2H-pyran-4-yl)-N-(1-(2-(trifluoromethyl) pyrimidin-5-yl) ethyl) quinazolin-4-amine, (R)-6-(4-fluorophenyl)-8-(1,2,3,6-tetrahydropyridin-4-yl)-N-(1-(2-(trifluoro-methyl) pyrimidin-5-yl) ethyl) quinazolin-4-amine, single enantiomer 1 of N—[1-(6-methylpyridazin-3-yl) ethyl]-6-(5-methylpyrimidin-2-yl)-8-tetrahydropyran-4-yloxy-quinazolin-4-amine, single enantiomer 2 of N—[1-(6-methylpyridazin-3-yl) ethyl]-6-(5-methylpyrimidin-2-yl)-8-tetrahydropyran-4-yloxy-quinazolin-4-amine, 6-(5-fluoro-2-pyridyl)-N-[(6-methylpyridazin-3-yl) methyl]-8-tetrahydropyran-4-yloxy-quinazolin-4-amine, N-[(6-methylpyridazin-3-yl) methyl]-6-(5-methylpyrimidin-2-yl)-8-tetrahydropyran-4-yloxy-quinazolin-4-amine, (R)-6-(1-methyl-1H-pyrazol-3-yl)-N-(1-(6-methylpyridazin-3-yl) ethyl)-8-((tetrahydro-2H-pyran-4-yl) oxy) quinazolin-4-amine, (R)-6-(5-methylthiazol-2-yl)-N-(1-(pyridazin-3-yl) ethyl)-8-((tetrahydro-2H-pyran-4-yl) oxy) quinazolin-4-amine, 4-[[4-[1-(6-methylpyridazin-3-yl) ethylamino]-6-(5-methylpyrimidin-2-yl) quinazolin-8-yl]oxymethyl]tetrahydropyran-4-ol, 8-(2-methoxyethoxy)-N—((6-methylpyridazin-3-yl) methyl)-6-(5-methylthiazol-2-yl) quinazolin-4-amine, 2-((4-(((6-methylpyridazin-3-yl) methyl) amino)-6-(5-methylthiazol-2-yl) quinazolin-8-yl) oxy) ethan-1-ol, N—((6-methylpyridazin-3-yl) methyl)-6-(5-methylthiazol-2-yl)-8-(oxetan-3-ylmethoxy) quinazolin-4-amine, N-[(6-methylpyridazin-3-yl) methyl]-6-(5-methylthiazol-2-yl)-8-tetrahydropyran-4-yloxy-quinazolin-4-amine, 8-(5-azaspiro [3.5]nonan-8-yloxy)-6-(4-fluorophenyl)-N-[(1R)-1-[2-(trifluoromethyl) pyrimidin-5-yl]ethyl]quinazolin-4-amine, 8-((2-azabicyclo [2.2.1]heptan-5-yl) oxy)-6-(4-fluorophenyl)-N—((R)-1-(2-(trifluoromethyl) pyrimidin-5-yl) ethyl) quinazolin-4-amine, (R)-2-((6-(4-fluorophenyl)-4-((1-(2-(trifluoromethyl) pyrimidin-5-yl) ethyl) amino) quinazolin-8-yl) oxy) acetic acid, 2-((4-(((6-methylpyridazin-3-yl) methyl) amino)-6-(5-methylpyrimidin-2-yl) quinazolin-8-yl) oxy) acetic acid dihydrochloride, 2-((6-(4-fluorophenyl)-4-(((1-methylpiperidin-4-yl) methyl) amino) quinazolin-8-yl) oxy) acetic acid hydrochloride, 6-(4-fluorophenyl)-8-[(3-methyloxetan-3-yl) methoxy]-N-[(6-methylpyridazin-3-yl) methyl]quinazolin-4-amine, 3-[6-(4-fluorophenyl)-4-[(6-methylpyridazin-3-yl) methylamino]quinazolin-8-yl]oxy-1-methyl-pyrrolidin-2-one, 2-[6-(4-fluorophenyl)-4-[(6-methylpyridazin-3-yl) methylamino]quinazolin-8-yl]oxy-N-(2,2,2-trifluoroethyl) acetamide, 6-(4-fluorophenyl)-N—((6-methylpyridazin-3-yl) methyl)-8-(oxetan-3-yloxy) quinazolin-4-amine, N—[1-(5-methyl-1,3,4-thiadiazol-2-yl) ethyl]-6-(5-methylthiazol-2-yl)-8-tetrahydropyran-4-yloxy-quinazolin-4-amine, 6-(5-fluoro-2-pyridyl)-N-[(1R)-1-(5-methyl-1,2,4-oxadiazol-3-yl) ethyl]-8-tetrahydropyran-4-yloxy-quinazolin-4-amine, Single enantiomer 1 of 6-(5-methyl-2-pyridyl)-N—[1-(5-methyl-1,3,4-thiadiazol-2-yl) ethyl]-8-tetrahydropyran-4-yloxy-quinazolin-4-amine, Single enantiomer 2 of 6-(5-methyl-2-pyridyl)-N—[1-(5-methyl-1,3,4-thiadiazol-2-yl) ethyl]-8-tetrahydropyran-4-yloxy-quinazolin-4-amine,
Single enantiomer 1 of 6-(5-fluoro-2-pyridyl)-N—[1-(3-methyl-1,2,4-oxadiazol-5-yl) ethyl]-8-tetrahydropyran-4-yloxy-quinazolin-4-amine,
6-(4-fluorophenyl)-8-(2-methylpyrazol-3-yl)-N-[(6-methylpyridazin-3-yl) methyl]quinazolin-4-amine,
6-(3-Chloro-1H-pyrazol-1-yl)-8-methoxy-N-(1-(2-(trifluoromethyl) pyrimidin-5-yl) ethyl) quinazolin-4-amine,
6-(3-chloro-1H-pyrazol-1-yl)-8-methoxy-N-(1-(6-methylpyridazin-3-yl) ethyl) quinazolin-4-amine,
(R)-6-(4-fluoro-1H-pyrazol-1-yl)-8-methoxy-N-(1-(2-(trifluoromethyl) pyrimidin-5-yl) ethyl) quinazolin-4-amine,
(R)-6-(4-fluoro-1H-pyrazol-1-yl)-8-methoxy-N-(1-(6-methylpyridazin-3-yl) ethyl) quinazolin-4-amine,
(R)-8-methoxy-6-(4-methyl-1H-pyrazol-1-yl)-N-(1-(6-methylpyridazin-3-yl) ethyl) quinazolin-4-amine,
(R)-6-(4-chloro-1H-pyrazol-1-yl)-8-methoxy-N-(1-(6-methylpyridazin-3-yl) ethyl) quinazolin-4-amine,
(R)-6-(3-fluoro-1H-pyrazol-1-yl)-8-methoxy-N-(1-(6-methylpyridazin-3-yl) ethyl) quinazolin-4-amine,
(R)-8-methoxy-6-(5-methyl-1H-pyrazol-1-yl)-N-(1-(6-methylpyridazin-3-yl) ethyl) quinazolin-4-amine,
(R)-8-methoxy-6-(3-methyl-1H-pyrazol-1-yl)-N-(1-(6-methylpyridazin-3-yl) ethyl) quinazolin-4-amine,
(R)-6-(4-chloro-1H-pyrazol-1-yl)-8-methoxy-N-(1-(2-(trifluoromethyl) pyrimidin-5-yl) ethyl) quinazolin-4-amine,
(8-methoxy-N-(1-(5-methyl-1,3,4-oxadiazol-2-yl) ethyl)-6-(1-methyl-1H-pyrazol-3-yl) quinazolin-4-amine,
8-methoxy-N-(1-(5-methyl-1,3,4-thiadiazol-2-yl) ethyl)-6-(5-methylthiazol-2-yl) quinazolin-4-amine,
8-methoxy-N-(1-(5-methyl-1,2,4-oxadiazol-3-yl) ethyl)-6-(5-methylthiazol-2-yl) quinazolin-4-amine,
6-(5-fluoropyrimidin-2-yl)-8-methoxy-N-(1-(5-methyl-1,2,4-oxadiazol-3-yl) ethyl) quinazolin-4-amine,
6-(5-fluoropyrimidin-2-yl)-8-methoxy-N-(1-(5-methyl-1,3,4-thiadiazol-2-yl) ethyl) quinazolin-4-amine,
6-(5-fluoropyrimidin-2-yl)-8-methoxy-N-(1-(5-methyl-1,3,4-oxadiazol-2-yl) ethyl) quinazolin-4-amine,
8-methoxy-N-[(3-methylisoxazol-5-yl) methyl]-6-(5-methylthiazol-2-yl) quinazolin-4-amine,
8-methoxy-6-(5-methylthiazol-2-yl)-N—[[3-(trifluoromethyl)-1,2,4-oxadiazol-5-yl]methyl]quinazolin-4-amine,
8-methoxy-N-[(3-methyl-1,2,4-oxadiazol-5-yl) methyl]-6-(5-methylthiazol-2-yl) quinazolin-4-amine,
8-methoxy-N—((5-methyl-1,3,4-thiadiazol-2-yl) methyl)-6-(5-methylthiazol-2-yl) quinazolin-4-amine,
4-(((8-methoxy-6-(5-methylthiazol-2-yl) quinazolin-4-yl) amino) methyl)-1-methylpyridin-2 (1H)-one,
8-methoxy-6-(5-methylthiazol-2-yl)-N—((5-(trifluoromethyl) pyridin-2-yl) methyl) quinazolin-4-amine,
N—((5-chloropyridin-2-yl) methyl)-8-methoxy-6-(5-methylthiazol-2-yl) quinazolin-4-amine,
N—((3,5-difluoropyridin-2-yl) methyl)-8-methoxy-6-(5-methylthiazol-2-yl) quinazolin-4-amine,
N—((5-fluoropyridin-2-yl) methyl)-8-methoxy-6-(5-methylthiazol-2-yl) quinazolin-4-amine,
Single enantiomers of 8-methoxy-6-(5-methylpyrimidin-2-yl)-N—[1-[6-(trifluoromethyl) pyridazin-3-yl]ethyl] quinazolin-4-amine,
Single enantiomers of 8-methoxy-6-(5-methylpyrimidin-2-yl)-N—[1-[6-(trifluoromethyl) pyridazin-3-yl]ethyl] quinazolin-4-amine,
Single enantiomer 1 of 8-Methoxy-N—[1-(3-methyl-1,2,4-oxadiazol-5-yl) ethyl]-6-(5-methylpyrimidin-2-yl) quinazolin-4-amine,
Single enantiomer 2 of 8-Methoxy-N—[1-(3-methyl-1,2,4-oxadiazol-5-yl) ethyl]-6-(5-methylpyrimidin-2-yl) quinazolin-4-amine,
Single enantiomer 1 of 8-Methoxy-6-(5-methylpyrimidin-2-yl)-N—[1-(5-methyl-1,3,4-thiadiazol-2-yl) ethyl]quinazolin-4-amine,
Single enantiomer 2 of 8-Methoxy-6-(5-methylpyrimidin-2-yl)-N—[1-(5-methyl-1,3,4-thiadiazol-2-yl) ethyl]quinazolin-4-amine,
Single enantiomer 1 of 8-methoxy-6-(5-methyl-2-pyridyl)-N—[1-(5-methyl-1,3,4-thiadiazol-2-yl) ethyl] quinazolin-4-amine,
Single enantiomer 2 of 8-methoxy-6-(5-methyl-2-pyridyl)-N—[1-(5-methyl-1,3,4-thiadiazol-2-yl) ethyl] quinazolin-4-amine,
Single enantiomer 1 of 8-methoxy-N-[(1R)-1-(5-methyl-1,3,4-oxadiazol-2-yl) ethyl]-6-(5-methylpyrimidin-2-yl) quinazolin-4-amine,
Single enantiomer 2 of 8-methoxy-N-[(1R)-1-(5-methyl-1,3,4-oxadiazol-2-yl) ethyl]-6-(5-methylpyrimidin-2-yl) quinazolin-4-amine,
6-(5-Fluoropyridin-2-yl)-8-methoxy-N—((5-methyl-1,2,4-oxadiazol-3-yl) methyl) quinazolin-4-amine,
6-(5-fluoropyridin-2-yl)-8-methoxy-N—((3-methyl-1,2,4-oxadiazol-5-yl) methyl) quinazolin-4-amine,
6-(5-fluoropyridin-2-yl)-8-methoxy-N—((5-methyl-1,3,4-oxadiazol-2-yl) methyl) quinazolin-4-amine,
6-(5-fluoropyridin-2-yl)-8-methoxy-N—((3-methyl-isoxazol-5-yl) methyl) quinazolin-4-amine,
8-methoxy-N—((5-methyl-1,2,4-oxadiazol-3-yl) methyl)-6-(5-methylpyridin-2-yl) quinazolin-4-amine,
8-methoxy-N—((3-methylisoxazol-5-yl) methyl)-6-(5-methylpyridin-2-yl) quinazolin-4-amine,
6-(5-fluoro-2-pyridyl)-8-methoxy-N-[(5-methylisoxazol-3-yl) methyl]quinazolin-4-amine,
8-methoxy-N-[(5-methylisoxazol-3-yl) methyl]-6-(5-methyl-2-pyridyl) quinazolin-4-amine,
6-(5-fluoro-2-pyridyl)-8-methoxy-N-[(1-methylpyrazol-3-yl) methyl]quinazolin-4-amine,
8-methoxy-N-[(1-methylpyrazol-3-yl) methyl]-6-(5-methyl-2-pyridyl) quinazolin-4-amine,
8-methoxy-N-[(3-methyl-1,2,4-oxadiazol-5-yl) methyl]-6-(5-methyl-2-pyridyl) quinazolin-4-amine,
8-methoxy-N-[(5-methyl-1,3,4-oxadiazol-2-yl) methyl]-6-(5-methyl-2-pyridyl) quinazolin-4-amine,
8-methoxy-6-(5-methylpyrimidin-2-yl)-N—[3-(trifluoromethyl)-1,2,4-oxadiazol-5-yl]methyl]quinazolin-4-amine,
8-methoxy-6-(5-methylpyrimidin-2-yl)-N—[2-(trifluoromethyl) pyrimidin-5-yl]methyl]quinazolin-4-amine,
6-(5-fluoropyridin-2-yl)-8-methoxy-N—((2-(trifluoromethyl) pyrimidin-5-yl) methyl) quinazolin-4-amine,
4-(((6-(5-fluoropyridin-2-yl)-8-methoxyquinazolin-4-yl) amino) methyl)-1-methylpyridin-2 (1H)-one,
4-(((6-(5-fluoropyridin-2-yl)-8-methoxyquinazolin-4-yl) amino) methyl) pyridin-2 (1H)-one,
6-(5-fluoropyridin-2-yl)-8-methoxy-N—((6-methylpyridin-3-yl) methyl) quinazolin-4-amine,
6-(5-fluoropyridin-2-yl)-8-methoxy-N—((6-(trifluoromethyl) pyridin-3-yl) methyl) quinazolin-4-amineamine, 4-(((8-methoxy-6-(5-methylpyrimidin-2-yl) quinazolin-4-yl) amino) methyl)-1-methylpyridin-2 (1H)-one,
6-(((8-methoxy-6-(5-methylpyrimidin-2-yl) quinazolin-4-yl) amino) methyl) pyridin-2 (1H)-one,
8-methoxy-N—((5-methyl-1,3,4-thiadiazol-2-yl) methyl)-6-(5-methylpyrimidin-2-yl) quinazolin-4-amine,
8-methoxy-N—((6-methylpyridin-3-yl) methyl)-6-(5-methylpyrimidin-2-yl) quinazolin-4-amine,
6-(5-fluoropyridin-2-yl)-8-methoxy-N—((6-(trifluoromethyl) pyridin-3-yl) methyl) quinazolin-4-amine,
8-Methoxy-N—((3-methyl-1,2,4-oxadiazol-5-yl) methyl)-6-(5-methylpyrimidin-2-yl) quinazolin-4-amine,
6-(3-fluoro-5-methyl-2-pyridyl)-8-methoxy-N-[(1R)-1-(5-methyl-1,2,4-oxadiazol-3-yl) ethyl]quinazolin-4-amine,
6-(5-fluoro-2-pyridyl)-8-methoxy-N-[(1R)-1-(1-methylpyrazol-3-yl) ethyl]quinazolin-4-amine,
8-methoxy-N-[(1R)-1-(1-methylpyrazol-3-yl) ethyl]-6-(5-methyl-2-pyridyl) quinazolin-4-amine,
2-((8-methoxy-6-(5-methylpyrimidin-2-yl) quinazolin-4-yl) amino)-1-morpholinoethan-1-one,
6-(4-Fluorophenyl)-N-[(5-fluoro-2-pyridyl) methyl]-8-methoxy-quinazolin-4-amine,
Single enantiomer 1 of 8-Methoxy-N—[1-(3-methyl-1,2,4-oxadiazol-5-yl) ethyl]-6-(5-methyl-2-pyridyl) quinazolin-4-amine,
Single enantiomer 2 of 8-Methoxy-N—[1-(3-methyl-1,2,4-oxadiazol-5-yl) ethyl]-6-(5-methyl-2-pyridyl) quinazolin-4-amine,
Single enantiomer 1 of 8-methoxy-N-(1-(5-methyl-1,3,4-thiadiazol-2-yl) ethyl)-6-(5-methylthiazol-2-yl) quinazolin-4-amine,
Single enantiomer 2 of 8-methoxy-N-(1-(5-methyl-1,3,4-thiadiazol-2-yl) ethyl)-6-(5-methylthiazol-2-yl) quinazolin-4-amine,
Single enantiomer 2 of 2-((8-methoxy-6-(5-methylpyrimidin-2-yl) quinazolin-4-yl) amino)-2-(3-methyl-1,2,4-oxadiazol-5-yl) ethan-1-ol,
Single enantiomer 1 of 8-methoxy-6-(5-methylpyrimidin-2-yl)-N-(1-(3-(pyridin-4-yl)-1,2,4-oxadiazol-5-yl) ethyl) quinazolin-4-amine,
Single enantiomer 2 of 8-methoxy-6-(5-methylpyrimidin-2-yl)-N-(1-(3-(pyridin-4-yl)-1,2,4-oxadiazol-5-yl) ethyl) quinazolin-4-amine,
Single enantiomer 1 of 6-(5-fluoro-2-pyridyl)-8-methoxy-N—[1-[6-(trifluoromethyl) pyridazin-3-yl] ethyl]quinazolin-4-amine,
Single enantiomer 2 of 6-(5-fluoro-2-pyridyl)-8-methoxy-N—[1-[6-(trifluoromethyl) pyridazin-3-yl] ethyl]quinazolin-4-amine,
Single enantiomer 1 of N—[1-(5-methyl-1,3,4-thiadiazol-2-yl) ethyl]-6-(5-methylthiazol-2-yl)-8-tetrahydropyran-4-yloxy-quinazolin-4-amine,
Single enantiomer 2 of N—[1-(5-methyl-1,3,4-thiadiazol-2-yl) ethyl]-6-(5-methylthiazol-2-yl)-8-tetrahydropyran-4-yloxy-quinazolin-4-amine,
Single enantiomer 1 of 6-(5-fluoropyridin-2-yl)-8-methoxy-N-(1-(5-methyl-1,3,4-thiadiazol-2-yl) ethyl) quinazolin-4-amine,
Single enantiomer 2 of 6-(5-fluoropyridin-2-yl)-8-methoxy-N-(1-(5-methyl-1,3,4-thiadiazol-2-yl) ethyl) quinazolin-4-amine,
Single enantiomer 1 of 6-(5-fluoropyridin-2-yl)-8-methoxy-N-(1-(3-methyl-1,2,4-oxadiazol-5-yl) ethyl) quinazolin-4-amine,
Single enantiomer 2 of 6-(5-fluoropyridin-2-yl)-8-methoxy-N-(1-(3-methyl-1,2,4-oxadiazol-5-yl) ethyl) quinazolin-4-amine,
6-(4-fluorophenyl)-8-methoxy-N-[(1S)-1-[2-(trifluoromethyl) pyrimidin-5-yl]ethyl]quinazolin-4-amine formate,
6-(3,6-Dihydro-2H-pyran-4-yl)-8-methoxy-N—((6-methylpyridazin-3-yl) methyl) quinazolin-4-amine,
Single enantiomer 1 of 6-(1-((6-(4-Fluorophenyl)-8-methoxyquinazolin-4-yl) amino) ethyl) pyridin-2 (1H)-one,
Single enantiomer 2 of 6-(1-((6-(4-Fluorophenyl)-8-methoxyquinazolin-4-yl) amino) ethyl) pyridin-2 (1H)-one,
Single enantiomer 1 of 6-(4-fluorophenyl)-8-methoxy-N-(1-(3-(pyridin-4-yl)-1,2,4-oxadiazol-5-yl) ethyl) quinazolin-4-amine,
Single enantiomer 2 of 6-(4-fluorophenyl)-8-methoxy-N-(1-(3-(pyridin-4-yl)-1,2,4-oxadiazol-5-yl) ethyl) quinazolin-4-amine.

6. The compound of formula (1) according to claim 1, wherein Y is-OR$^D$, represented by formula (Ia)

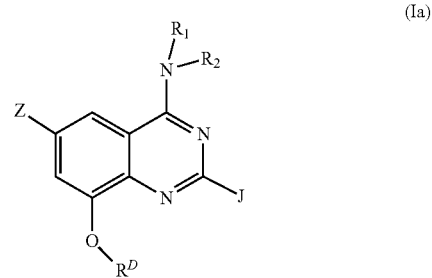

(Ia)

wherein
Z is selected from the group consisting of aryl, wherein any of such aryl may be optionally substituted by one or more groups selected from halo;
$R_1$ is H;
$R_2$ is selected from the group consisting of heteroaryl ($C_1$-$C_4$) alkyl-, wherein any of such heteroaryl may be optionally substituted by one or more groups selected from ($C_1$-$C_3$) alkyl, ($C_1$-$C_6$) haloalkyl;
$R^A$ and $R^B$ are at each occurrence independently H or selected from the group consisting of ($C_1$-$C_4$) alkyl-;
$R^C$ is at each occurrence H or selected from the group consisting of ($C_1$-$C_6$) alkyl;
$R^D$ is selected in the group consisting of H, ($C_1$-$C_6$) alkyl, ($C_3$-$C_8$) heterocycloalkyl-($C_1$-$C_6$) alkyl-, $R^C$OC(O)($C_1$-$C_4$)alkylene-, ($R^AR^B$) N($C_1$-$C_6$) alkylene-, ($C_3$-$C_8$) heterocycloalkyl, $R^C$O($C_1$-$C_4$) alkylene-, ($R^AR^B$) N(O) C($C_1$-$C_4$) alkylene, ($C_3$-$C_8$) cycloalkyl-($C_1$-$C_6$) alkyl-, wherein any of such heterocycloalkyl may be optionally substituted by one or more groups selected from ($C_1$-$C_3$) alkyl;
J is H.

7. The compound of formula I according to claim 6, selected from:
(R)-2-((6-(4-fluorophenyl)-4-((1-(2-(trifluoromethyl) pyrimidin-5-yl) ethyl) amino) quinazolin-8-yl) oxy) acetic acid,
6-(4-fluorophenyl)-8-[(3-methyloxetan-3-yl) methoxy]-N-[(6-methylpyridazin-3-yl) methyl]quinazolin-4-amine, 3-[6-(4-fluorophenyl)-4-[(6-methylpyridazin-3-yl) methylamino]quinazolin-8-yl]oxy-1-methyl-pyrrolidin-2-one, 6-(4-fluorophenyl)-N—((6-methylpyridazin-3-yl) methyl)-8-(oxetan-3-yloxy) quinazolin-4-amine, Single enantiomer 1 of 6-(1-((6-(4-Fluorophenyl)-8-methoxyquinazolin-4-yl) amino) ethyl) pyridin-2 (1H)-one, Single enantiomer 2 of 6-(1-((6-(4-Fluorophenyl)-8-methoxyquinazolin-4-yl) amino) ethyl) pyridin-2 (1H)-one.

8. A pharmaceutical composition comprising a compound as defined in claim 1, or a pharmaceutically acceptable salt thereof, either alone or in combination with another one or more active ingredients, in admixture with one or more pharmaceutically acceptable carriers or excipients.

9. The pharmaceutical composition according to claim 8, for oral administration.

* * * * *

UNITED STATES PATENT AND TRADEMARK OFFICE
CERTIFICATE OF CORRECTION

| | | |
|---|---|---|
| PATENT NO. | : 12,466,820 B2 | Page 1 of 1 |
| APPLICATION NO. | : 17/615017 | |
| DATED | : November 11, 2025 | |
| INVENTOR(S) | : Paolo Bruno et al. | |

It is certified that error appears in the above-identified patent and that said Letters Patent is hereby corrected as shown below:

In the Claims

In Column 244, Claim 4, Lines 38-39, please delete "(C1-C6) alkyl,"

Signed and Sealed this
Tenth Day of February, 2026

John A. Squires
*Director of the United States Patent and Trademark Office*